(12) United States Patent
Rogers et al.

(10) Patent No.: US 10,840,536 B2
(45) Date of Patent: Nov. 17, 2020

(54) STRETCHABLE ELECTRONIC SYSTEMS WITH CONTAINMENT CHAMBERS

(71) Applicants: THE BOARD OF TRUSTEES OF THE UNIVERSITY OF ILLINOIS, Urbana, IL (US); NORTHWESTERN UNIVERSITY, Evanston, IL (US)

(72) Inventors: John A. Rogers, Champaign, IL (US); Sheng Xu, Urbana, IL (US); Jonathan A. Fan, Columbus, OH (US); Yonggang Huang, Glencoe, IL (US); Yihui Zhang, Evanston, IL (US); Lin Jia, Boston, MA (US)

(73) Assignees: The Board of Trustees of the University of Illinois, Urbana, IL (US); Northwestern University, Evanston, IL (US)

( * ) Notice: Subject to any disclaimer, the term of this patent is extended or adjusted under 35 U.S.C. 154(b) by 523 days.

(21) Appl. No.: 14/766,301

(22) PCT Filed: Feb. 5, 2014

(86) PCT No.: PCT/US2014/014944
§ 371 (c)(1),
(2) Date: Aug. 6, 2015

(87) PCT Pub. No.: WO2014/124049
PCT Pub. Date: Aug. 14, 2014

(65) Prior Publication Data
US 2015/0373831 A1    Dec. 24, 2015

Related U.S. Application Data

(63) Continuation-in-part of application No. 13/835,284, filed on Mar. 15, 2013, now Pat. No. 10,497,633.
(Continued)

(51) Int. Cl.
*H05K 1/00* (2006.01)
*H01M 10/02* (2006.01)
(Continued)

(52) U.S. Cl.
CPC ............ *H01M 10/02* (2013.01); *H01G 11/78* (2013.01); *H01L 21/54* (2013.01); *H01L 23/18* (2013.01);
(Continued)

(58) Field of Classification Search
CPC ........ H01L 2924/00; H01L 2924/00014; H01L 2924/12042; H01L 2924/12043;
(Continued)

(56) References Cited

U.S. PATENT DOCUMENTS 5,171,482 A    12/1992    Asai
5,477,067 A    12/1995    Isomura et al.
(Continued)

FOREIGN PATENT DOCUMENTS

CN    102311092    1/2012
DE    102010030960   1/2012
(Continued)

OTHER PUBLICATIONS

U.S. Appl. No. 11/001,689, filed Dec. 1, 2004, 2006/0286488, Dec. 21, 2006, U.S. Pat. No. 7,704,684, Apr. 27, 2010.
(Continued)

*Primary Examiner* — Yuriy Semenenko
(74) *Attorney, Agent, or Firm* — Leydig, Voit & Mayer, Ltd.

(57) ABSTRACT

The present invention provides electronic systems, including device arrays, comprising functional device(s) and/or device component(s) at least partially enclosed via one or more containment chambers, such that the device(s) and/or device component(s) are at least partially, and optionally entirely,
(Continued)

immersed in a containment fluid. Useful containment fluids for use in containment chambers of electronic devices of the invention include lubricants, electrolytes and/or electronically resistive fluids. In some embodiments, for example, electronic systems of the invention comprise one or more electronic devices and/or device components provided in free-standing and/or tethered configurations that decouple forces originating upon deformation, stretching or compression of a supporting substrate from the free standing or tethered device or device component.

73 Claims, 109 Drawing Sheets

Related U.S. Application Data

(60) Provisional application No. 61/761,412, filed on Feb. 6, 2013, provisional application No. 61/930,732, filed on Jan. 23, 2014.

(51) Int. Cl.
| | |
|---|---|
| *H01M 2/02* | (2006.01) |
| *H01M 2/20* | (2006.01) |
| *H01M 10/0525* | (2010.01) |
| *H01L 23/18* | (2006.01) |
| *H01L 23/22* | (2006.01) |
| *H01L 21/54* | (2006.01) |
| *H01M 8/02* | (2016.01) |
| *H01G 11/78* | (2013.01) |
| *H05K 1/18* | (2006.01) |
| *H05K 1/02* | (2006.01) |
| *H01G 11/26* | (2013.01) |

(52) U.S. Cl.
CPC .......... *H01L 23/22* (2013.01); *H01M 2/0202* (2013.01); *H01M 2/0237* (2013.01); *H01M 2/204* (2013.01); *H01M 2/206* (2013.01); *H01M 8/02* (2013.01); *H01M 10/0525* (2013.01); *H05K 1/0283* (2013.01); *H05K 1/189* (2013.01); *H01G 11/26* (2013.01); *H01L 2224/16225* (2013.01); *H01L 2924/12032* (2013.01); *H01L 2924/12041* (2013.01); *H01L 2924/12042* (2013.01); *H01L 2924/12043* (2013.01); *H05K 2201/0133* (2013.01); *H05K 2201/09263* (2013.01); *H05K 2201/10037* (2013.01); *Y10T 29/49126* (2015.01)

(58) Field of Classification Search
CPC . H01L 2924/12041; H01L 2924/12032; H01L 2224/05644; H01L 2924/00012; H01L 2924/0002; H01L 2924/13063; H01L 2924/13091; H01L 2924/1461; H01L 2924/15788; H01L 2224/03; H01L 2224/05144; H01L 2224/05155; H01L 2224/05166; H01L 2224/97; H01L 2924/01032; H01L 2224/0332; H01L 2224/05073; H01L 2224/05082; H01L 2224/05124; H01L 2224/05552; H01L 2224/05553; H01L 2224/05554; H01L 2224/05555; H01L 2224/05666; H01L 2224/2919; H01L 2224/32225; H01L 2224/80; H01L 2224/80121; H01L 2224/83; H01L 2224/83121; H01L 2224/83192; H01L 2224/9202; H01L 2224/94; H01L 2924/0665; H01L 2924/12036; H01L 2924/12044; H01L 2924/1305; H01L 2924/13055; H01L 2924/1306; H01L 2924/14; H01L 2924/181; H01L 2924/351; H01L 29/78603; H01L 2224/16225; H01L 24/97; H01L 25/0753; H01L 29/78696; H01L 21/02164; H01L 21/0217; H01L 21/02274; H01L 21/0228; H01L 21/02521; H01L 21/02603; H01L 21/02628; H01L 21/308; H01L 21/31111; H01L 21/31133; H01L 21/322; H01L 21/54; H01L 21/56; H01L 21/568; H01L 21/6835; H01L 2221/68368; H01L 2221/68381; H01L 2224/0345; H01L 2224/03614; H01L 2224/0362; H01L 2224/08225; H01L 2224/24137; H01L 2224/73267; H01L 2224/80006; H01L 2224/80862; H01L 2224/80895; H01L 2224/83005; H01L 2224/83193; H01L 2224/8385; H01L 2224/83862; H01L 2224/95; H01L 23/02; H01L 23/18; H01L 23/22; H01L 23/291; H01L 23/293; H01L 23/3121; H01L 23/3192; H01L 23/49894; H01L 23/538; H01L 23/5386; H01L 23/5387; H01L 23/5389; H01L 23/552; H01L 23/564; H01L 24/00; H01L 24/03; H01L 24/05; H01L 24/08; H01L 24/24; H01L 24/29; H01L 24/32; H01L 24/80; H01L 24/82; H01L 24/83; H01L 24/94; H01L 25/0655; H01L 27/016; H01L 27/1285; H01L 27/1292; H01L 28/10; H01L 28/20; H01L 28/40; H01L 2924/10253; H01L 2924/10329; H01L 2924/15159; H01L 2924/15162; H01L 2924/1579; H01L 29/04; H01L 29/06; H01L 29/0665; H01L 29/0669; H01L 29/0673; H01L 29/0676; H01L 29/068; H01L 29/12; H01L 29/66; H01L 29/66007; H01L 29/67; H01L 29/7787; H01L 29/78681; H01L 29/7869; H01L 29/812; H01L 29/861; H01L 29/872; H01L 31/0392; H01L 31/03926; H01L 31/08; H01L 31/1804; H01L 31/1864; H01L 31/1896; H01L 33/007; H01L 33/0079; H01L 33/32; H01L 33/647; H05K 1/0283; H05K 1/0275; H05K 1/0286; H05K 2201/0133; H05K 2201/10151; H05K 2201/10196; H05K 2201/10212; H05K 2203/0271; H05K 2203/0292; H05K 2203/0769; H05K 2203/0776; H05K 2203/0786; H05K 2203/175; H05K 2203/178; H05K 3/22; H05K 3/285; H05K 3/287; H05K 3/288; H05K 13/00; H05K 1/0201; H05K 1/0212; H05K 1/028; H05K 1/0306; H05K 1/0386; H05K 1/095; H05K 1/097; H05K 1/144; H05K 1/16; H05K 1/185; H05K 1/189; H05K 2201/0266; H05K 2201/041; H05K 2201/09263; H05K 2201/10037; H05K 2201/10083; H05K 2201/10098; H05K 2203/0514; H05K 2203/105; H05K 2203/1105; H05K 2203/1142; H05K 2203/17; H05K 3/1216; H05K 3/207; H05K 3/4626; H05K 5/069
See application file for complete search history.

(56) References Cited

U.S. PATENT DOCUMENTS

| | | |
|---|---|---|
| 5,663,106 A | 9/1997 | Karavakis et al. |
| 5,686,162 A | 11/1997 | Polak et al. |
| 5,739,463 A | 4/1998 | Diaz et al. |
| 5,967,986 A | 10/1999 | Cimochowski et al. |
| 6,020,219 A | 2/2000 | Dudderar et al. |
| 6,489,669 B2 | 12/2002 | Shimada et al. |
| 6,614,108 B1 | 9/2003 | Sanftleben et al. |
| 6,617,683 B2 | 9/2003 | Lebonheur et al. |
| 6,993,392 B2 | 1/2006 | Nicolelis et al. |
| 7,195,733 B2 | 3/2007 | Rogers et al. |
| 7,491,892 B2 | 2/2009 | Wagner et al. |
| 7,521,292 B2 | 4/2009 | Rogers et al. |
| 7,557,367 B2 | 7/2009 | Rogers et al. |
| 7,622,367 B1 | 11/2009 | Nuzzo et al. |
| 7,704,684 B2 | 4/2010 | Rogers et al. |
| 7,705,280 B2 | 4/2010 | Nuzzo et al. |
| 7,799,699 B2 | 9/2010 | Nuzzo et al. |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 7,982,296 B2 | 7/2011 | Nuzzo et al. |
| 8,039,847 B2 | 10/2011 | Nuzzo et al. |
| 8,198,621 B2 | 6/2012 | Rogers et al. |
| 8,217,381 B2 | 7/2012 | Rogers et al. |
| 8,367,035 B2 | 2/2013 | Rogers et al. |
| 8,394,706 B2 | 3/2013 | Nuzzo et al. |
| 8,440,546 B2 | 5/2013 | Nuzzo et al. |
| 8,470,701 B2 | 6/2013 | Rogers et al. |
| 8,552,299 B2 | 10/2013 | Rogers et al. |
| 8,562,095 B2 | 10/2013 | Alleyene et al. |
| 8,664,699 B2 | 3/2014 | Nuzzo et al. |
| 8,666,471 B2 | 3/2014 | Rogers et al. |
| 8,679,888 B2 | 3/2014 | Rogers et al. |
| 8,722,458 B2 | 5/2014 | Rogers et al. |
| 8,729,524 B2 | 5/2014 | Rogers et al. |
| 8,754,396 B2 | 6/2014 | Rogers et al. |
| 8,865,489 B2 | 10/2014 | Rogers et al. |
| 8,895,406 B2 | 11/2014 | Rogers et al. |
| 8,905,772 B2 | 12/2014 | Rogers et al. |
| 8,934,965 B2 | 1/2015 | Rogers et al. |
| 8,946,683 B2 | 2/2015 | Rogers et al. |
| 9,057,994 B2 | 6/2015 | Rogers et al. |
| 9,061,494 B2 | 6/2015 | Rogers et al. |
| 9,105,555 B2 | 8/2015 | Rogers et al. |
| 9,105,782 B2 | 8/2015 | Rogers et al. |
| 9,117,940 B2 | 8/2015 | Rogers et al. |
| 9,278,522 B2 | 3/2016 | Rogers et al. |
| 9,324,733 B2 | 4/2016 | Rogers et al. |
| 9,349,900 B2 | 5/2016 | Rogers et al. |
| 9,442,285 B2 | 9/2016 | Rogers |
| 9,450,043 B2 | 9/2016 | Nuzzo et al. |
| 9,487,002 B2 | 11/2016 | Rogers et al. |
| 9,496,229 B2 | 11/2016 | Rogers et al. |
| 9,515,025 B2 | 12/2016 | Rogers et al. |
| 9,554,484 B2 | 1/2017 | Rogers et al. |
| 9,555,644 B2 | 1/2017 | Rogers et al. |
| 9,601,671 B2 | 3/2017 | Rogers et al. |
| 9,613,911 B2 | 4/2017 | Rogers et al. |
| 9,647,171 B2 | 5/2017 | Rogers et al. |
| 9,691,873 B2 | 6/2017 | Rogers et al. |
| 9,761,444 B2 | 9/2017 | Nuzzo et al. |
| 9,765,934 B2 | 9/2017 | Rogers et al. |
| 9,768,086 B2 | 9/2017 | Nuzzo et al. |
| 2002/0094701 A1* | 7/2002 | Biegelsen ............ B25J 13/084 439/32 |
| 2002/0109219 A1 | 8/2002 | Yang |
| 2004/0188136 A1 | 9/2004 | Sunohara et al. |
| 2005/0238967 A1 | 10/2005 | Rogers et al. |
| 2005/0253273 A1 | 11/2005 | Tai et al. |
| 2006/0038182 A1 | 2/2006 | Rogers et al. |
| 2006/0071349 A1 | 4/2006 | Tokushige et al. |
| 2006/0286488 A1 | 12/2006 | Rogers et al. |
| 2006/0286785 A1 | 12/2006 | Rogers et al. |
| 2007/0032089 A1 | 2/2007 | Nuzzo et al. |
| 2007/0092712 A1* | 4/2007 | Hodson ............ B29C 63/0065 428/304.4 |
| 2008/0055581 A1 | 3/2008 | Rogers et al. |
| 2008/0108171 A1 | 5/2008 | Rogers et al. |
| 2008/0157095 A1 | 7/2008 | Son et al. |
| 2008/0157235 A1* | 7/2008 | Rogers ............ H01L 21/8258 257/415 |
| 2008/0193855 A1 | 8/2008 | McDonald |
| 2008/0212102 A1 | 9/2008 | Nuzzo et al. |
| 2009/0199960 A1 | 8/2009 | Nuzzo et al. |
| 2009/0294803 A1 | 12/2009 | Nuzzo et al. |
| 2010/0002402 A1 | 1/2010 | Rogers et al. |
| 2010/0052112 A1 | 3/2010 | Rogers et al. |
| 2010/0059863 A1 | 3/2010 | Rogers et al. |
| 2010/0072577 A1 | 3/2010 | Nuzzo et al. |
| 2010/0116526 A1 | 5/2010 | Arora et al. |
| 2010/0143848 A1 | 6/2010 | Jain et al. |
| 2010/0157804 A1 | 6/2010 | Bugenhagen |
| 2010/0178722 A1 | 7/2010 | De Graff et al. |
| 2010/0283069 A1 | 11/2010 | Rogers et al. |
| 2010/0289124 A1 | 11/2010 | Nuzzo et al. |
| 2010/0317132 A1 | 12/2010 | Rogers et al. |
| 2011/0147715 A1 | 6/2011 | Rogers et al. |
| 2011/0170225 A1 | 7/2011 | Rogers et al. |
| 2011/0171813 A1 | 7/2011 | Rogers et al. |
| 2011/0187798 A1 | 8/2011 | Rogers et al. |
| 2011/0220890 A1 | 9/2011 | Nuzzo et al. |
| 2011/0230747 A1 | 9/2011 | Rogers et al. |
| 2011/0266561 A1 | 11/2011 | Rogers et al. |
| 2011/0277813 A1 | 11/2011 | Rogers et al. |
| 2011/0316120 A1 | 12/2011 | Rogers et al. |
| 2012/0038027 A1 | 2/2012 | Broekaart |
| 2012/0051005 A1 | 3/2012 | Vanfleteren et al. |
| 2012/0052268 A1 | 3/2012 | Axisa et al. |
| 2012/0083099 A1 | 4/2012 | Nuzzo et al. |
| 2012/0105528 A1 | 5/2012 | Alleyne et al. |
| 2012/0121963 A1 | 5/2012 | Kwon et al. |
| 2012/0157804 A1 | 6/2012 | Rogers et al. |
| 2012/0165759 A1* | 6/2012 | Rogers ............... A61B 5/6867 604/264 |
| 2012/0176764 A1* | 7/2012 | Loher ................ H05K 1/0283 361/820 |
| 2012/0261551 A1 | 10/2012 | Rogers et al. |
| 2012/0320581 A1 | 12/2012 | Rogers et al. |
| 2012/0321785 A1 | 12/2012 | Rogers et al. |
| 2012/0327608 A1 | 12/2012 | Rogers et al. |
| 2013/0036928 A1 | 2/2013 | Rogers et al. |
| 2013/0041235 A1 | 2/2013 | Rogers et al. |
| 2013/0072775 A1 | 3/2013 | Rogers et al. |
| 2013/0100618 A1 | 4/2013 | Rogers et al. |
| 2013/0140649 A1 | 6/2013 | Rogers et al. |
| 2013/0313713 A1 | 11/2013 | Arora et al. |
| 2013/0320503 A1 | 12/2013 | Nuzzo et al. |
| 2013/0333094 A1 | 12/2013 | Rogers et al. |
| 2014/0022745 A1* | 1/2014 | Ehrenpfordt ......... B81B 7/0058 361/749 |
| 2014/0092158 A1 | 4/2014 | Alleyne et al. |
| 2014/0097010 A1 | 4/2014 | Plant |
| 2014/0110859 A1* | 4/2014 | Rafferty ............ H01L 23/4985 257/774 |
| 2014/0124257 A1 | 5/2014 | Yoshihara et al. |
| 2014/0140020 A1 | 5/2014 | Rogers et al. |
| 2014/0163390 A1 | 6/2014 | Rogers et al. |
| 2014/0191236 A1 | 7/2014 | Nuzzo et al. |
| 2014/0216524 A1 | 8/2014 | Rogers et al. |
| 2014/0220422 A1 | 8/2014 | Rogers et al. |
| 2014/0305900 A1 | 10/2014 | Rogers et al. |
| 2014/0323968 A1 | 10/2014 | Rogers et al. |
| 2014/0361409 A1 | 12/2014 | Rogers et al. |
| 2014/0373898 A1 | 12/2014 | Rogers et al. |
| 2014/0374872 A1 | 12/2014 | Rogers et al. |
| 2015/0001462 A1 | 1/2015 | Rogers et al. |
| 2015/0080695 A1 | 3/2015 | Rogers et al. |
| 2015/0132873 A1 | 5/2015 | Rogers et al. |
| 2015/0141767 A1 | 5/2015 | Rogers et al. |
| 2015/0181700 A1 | 6/2015 | Rogers et al. |
| 2015/0207012 A1 | 7/2015 | Rogers et al. |
| 2015/0237711 A1 | 8/2015 | Rogers et al. |
| 2015/0290938 A1 | 10/2015 | Rogers et al. |

(56) References Cited

U.S. PATENT DOCUMENTS

| | | |
|---|---|---|
| 2015/0373831 A1 | 12/2015 | Rogers et al. |
| 2015/0380355 A1 | 12/2015 | Rogers et al. |
| 2016/0005700 A1 | 1/2016 | Rogers et al. |
| 2016/0027737 A1 | 1/2016 | Rogers et al. |
| 2016/0050750 A1 | 2/2016 | Rogers et al. |
| 2016/0066789 A1 | 3/2016 | Rogers et al. |
| 2016/0072027 A1 | 3/2016 | Rogers et al. |
| 2016/0133843 A1 | 5/2016 | Rogers et al. |
| 2016/0136877 A1 | 5/2016 | Rogers et al. |
| 2016/0284544 A1 | 9/2016 | Nuzzo et al. |
| 2016/0293794 A1 | 10/2016 | Nuzzo et al. |
| 2016/0381789 A1 | 12/2016 | Rogers et al. |
| 2017/0020402 A1 | 1/2017 | Rogers et al. |
| 2017/0128015 A1 | 5/2017 | Rogers et al. |
| 2017/0164482 A1 | 6/2017 | Rogers et al. |
| 2017/0179085 A1 | 6/2017 | Rogers et al. |
| 2017/0179100 A1 | 6/2017 | Rogers et al. |
| 2017/0179356 A1 | 6/2017 | Rogers et al. |
| 2017/0181704 A1 | 6/2017 | Rogers et al. |
| 2017/0200679 A1 | 7/2017 | Rogers et al. |
| 2017/0200707 A1 | 7/2017 | Rogers et al. |
| 2017/0210117 A1 | 7/2017 | Rogers et al. |
| 2017/0224257 A1 | 8/2017 | Rogers et al. |
| 2017/0231571 A1 | 8/2017 | Rogers et al. |
| 2017/0291817 A1 | 10/2017 | Rogers et al. |

FOREIGN PATENT DOCUMENTS

| | | |
|---|---|---|
| DE | 102011003195 A1 | 7/2012 |
| GB | 2489508 | 10/2012 |
| JP | S60-007056 A | 1/1985 |
| JP | 10125825 A * | 5/1998 |
| JP | H10-125825 | 5/1998 |
| JP | 2001-237351 A | 8/2001 |
| JP | 2005-518074 A | 6/2005 |
| JP | 2012-231018 A | 11/2012 |
| TW | 201247050 | 11/2012 |
| WO | WO1992020096 | 11/1992 |
| WO | WO 2003/069700 A2 | 8/2003 |
| WO | WO 2010/086034 | 8/2010 |
| WO | WO 2011/008459 | 1/2011 |
| WO | WO 2012/131352 | 10/2012 |
| WO | WO 2013/144738 | 10/2013 |
| WO | PCT/US2015/044573 | 8/2015 |
| WO | PCT/US2015/044588 | 8/2015 |
| WO | PCT/US2015/044638 | 8/2015 |
| WO | PCT/US2015/053452 | 10/2015 |
| WO | WO 2016/196673 | 12/2016 |
| WO | WO 2016/196675 | 12/2016 |
| WO | WO 2017/004531 | 1/2017 |
| WO | WO 2017/004576 | 1/2017 |

OTHER PUBLICATIONS

U.S. Appl. No. 11/115,954, filed Apr. 27, 2005, 2005/0238967, Oct. 27, 2005, U.S. Pat. No. 7,195,733, Mar. 27, 2007.
U.S. Appl. No. 11/145,574, filed Jun. 2, 2005, 2009/0294803, Dec. 3, 2009, U.S. Pat. No. 7,622,367, Nov. 24, 2009.
U.S. Appl. No. 11/145,542, filed Jun. 2, 2005, 2006/0038182, Feb. 23, 2006, U.S. Pat. No. 7,557,367, Jul. 7, 2009.
U.S. Appl. No. 11/421,654, filed Jun. 1, 2006, 2007/0032089, Feb. 8, 2007, U.S. Pat. No. 7,799,699, Sep. 21, 2010.
U.S. Appl. No. 11/423,287, filed Jun. 9, 2006, 2006/0286785, Dec. 21, 2006, U.S. Pat. No. 7,521,292 ,Apr. 21, 2009.
U.S. Appl. No. 11/423,192, filed Jun. 9, 2006, 2009/0199960, Aug. 13, 2009, U.S. Pat. No. 7,943,491, May 17, 2011.
U.S. Appl. No. 11/465,317, filed Aug. 17, 2006.
U.S. Appl. No. 11/675,659, filed Feb. 16, 2007, 2008/0055581, Mar. 6, 2008.
U.S. Appl. No. 11/782,799, filed Jul. 25, 2007, 2008/0212102, Sep. 4, 2008, U.S. Pat. No. 7,705,280, Apr. 27, 2010.
U.S. Appl. No. 11/851,182, filed Sep. 6, 2007, 2008/0157235, Jul. 3, 2008, U.S. Pat. No. 8,217,381, Jul. 10, 2012.
U.S. Appl. No. 11/858,788, filed Sep. 20, 2007, 2008/0108171, May 8, 2008, U.S. Pat. No. 7,932,123, Apr. 26, 2011.
U.S. Appl. No. 11/981,380, filed Oct. 31, 2007, 2010/0283069, Nov. 11, 2010, U.S. Appl. No. 7,972,875, Jul. 5, 2011.
U.S. Appl. No. 12/372,605, filed Feb. 17, 2009.
U.S. Appl. No. 12/398,811, filed Mar. 5, 2009, 2010/0002402, Jan. 7, 2010, U.S. Pat. No. 8,552,299, Oct. 8, 2013.
U.S. Appl. No. 12/405,475, filed Mar. 17, 2009, 2010/0059863, Mar. 11, 2010, U.S. Pat. No. 8,198,621, Jun. 12, 2012.
U.S. Appl. No. 12/418,071, filed Apr. 3, 2009, 2010/0052112, Mar. 4, 2010, U.S. Pat. No. 8,470,701, Jun. 25, 2013.
U.S. Appl. No. 12/564,566, filed Sep. 22, 2009, 2010/0072577, Mar. 25, 2010, U.S. Pat. No. 7,982,296, Jul. 19, 2011.
U.S. Appl. No. 12/669,287, filed Jan. 15, 2010, 2011/0187798, Aug. 4, 2011, U.S. Pat. No. 9,061,494 Jun. 23, 2015.
U.S. Appl. No. 12/778,588, filed May 12, 2010, 2010/0317132, Dec. 16, 2010, U.S. Pat. No. 8,865,489, Oct. 21, 2014.
U.S. Appl. No. 12/844,492, filed Jul. 27, 2010, 2010/0289124, Nov. 18, 2010, U.S. Pat. No. 8,039,847, Oct. 18, 2011.
U.S. Appl. No. 12/892,001, filed Sep. 28, 2010, 2011/0230747, Sep. 22, 2011, U.S. Pat. No. 8,666,471, Mar. 4, 2014.
U.S. Appl. No. 12/916,934, filed Nov. 1, 2010, 2012/0105528, May 3, 2012, U.S. Pat. No. 8,562,095, Oct. 22, 2013.
U.A. Appl. No. 12/947,120, filed Nov. 16, 2010, 2011/0170225, Jul. 14, 2011, U.S. Appl. No. 9,057,994, Jun. 16, 2015.
U.S. Appl. No. 12/996,924, filed Dec. 8, 2010, 2011/0147715, Jun. 23, 2011, U.S. Pat. No. 8,946,683, Feb. 3, 2015.
U.S. Appl. No. 12/968,637, filed Dec. 15, 2010, 2012/0157804, Jun. 21, 2012.
U.S. Appl. No. 13/046,191, filed Mar. 11, 2011, 2012/0165759, Jun. 28, 2012.
U.S. Appl. No. 13/071,027, filed Mar. 24, 2011, 2011/0171813, Jul. 14, 2011, U.S. Pat. No. 8,895,406, Nov. 25, 2014.
U.S. Appl. No. 13/095,502, filed Apr. 27, 2011.
U.S. Appl. No. 13/100,774, filed May 4, 2011, 2011/0266561, Nov. 3, 2011, U.S. Pat. No. 8,722,458, May 13, 2014.
U.S. Appl. No. 13/113,504, filed May 23, 2011, 2011/0220890, Sep. 15, 2011, U.S. Pat. No. 8,440,546, May 14, 2013.
U.S. Appl. No. 13/120,486, filed Aug. 4, 2011, 2011/0277813, Nov. 17, 2011, U.S. Pat. No. 8,679,888, Mar. 25, 2014.
U.S. Appl. No. 13/228,041, filed Sep. 8, 2011, 2011/0316120, Dec. 29, 2011.
U.S. Appl. No. 13/270,954, filed Oct. 11, 2011, 2012/0083099, Apr. 5, 2012, U.S. Pat. No. 8,394,706, Mar. 12, 2013.
U.S. Appl. No. 13/349,336, filed Jan. 12, 2012, 2012/0261551, Oct. 18, 2012.
U.S. Appl. No. 13/441,618, filed Apr. 6, 2012, 2013/0100618, Apr. 25, 2013, U.S. Pat. No. 8,754,396, Jun. 17, 2014.
U.S. Appl. No. 13/441,598, filed Apr. 6, 2012, 2012/0327608, Dec. 27, 2012, U.S. Pat. No. 8,729,524, May 20, 2014.
U.S. Appl. No. 13/472,165, filed May 15, 2012, 2012/0320581, Dec. 20, 2012.
U.S. Appl. No. 13/486,726, filed Jun. 1, 2012, 2013/0072775, Mar. 21, 2013, U.S. Pat. No. 8,934,965, Jan. 13, 2015.
U.S. Appl. No. 13/492,636, filed Jun. 8, 2012, 2013/0041235, Feb. 14, 2013.
U.S. Appl. No. 13/549,291, filed Jul. 13, 2012, 2013/0036928, Feb. 14, 2013.
U.S. Appl. No. 13/596,343, filed Aug. 28, 2012, 2012/0321785, Dec. 20, 2012, U.S. Pat. No. 8,367,035, Feb. 5, 2013.
U.S. Appl. No. 13/624,096, filed Sep. 21, 2012, 2013/0140649, Jun. 6, 2013.
U.S. Appl. No. 13/801,868, filed Mar. 13, 2013, 2013/0320503, Dec. 5, 2013, U.S. Pat.. No. 8,664,699, Mar. 4, 2014.
U.S. Appl. No. 13/835,284, filed Mar. 15, 2013, 2014/0220422, Aug. 7, 2014.
U.S. Appl. No. 13/853,770, filed Mar. 29, 2013, 2013/0333094, Dec. 19, 2013.
U.S. Appl. No. 14/140,299, filed Dec. 24, 2013, 2014/0163390, Jun. 12, 2014.
U.S. Appl. No. 14/155,010, filed Jan. 14, 2014, 2014/0191236, Jul. 10, 2014.

(56) References Cited

OTHER PUBLICATIONS

U.S. Appl. No. 14/173,525, filed Feb. 5, 2014, 2014/0216524, Aug. 7, 2014, U.S. Pat. No. 9/105,782, Aug. 11, 2015.
U.S. Appl. No. 14/209,481, filed Mar. 13, 2014, 2014/0373898, Dec. 25, 2014, U.S. Pat. No. 9,117,940, Aug. 25, 2015.
U.S. Appl. No. 14/220,910, filed Mar. 20, 2014, 2014/0374872, Dec. 25, 2014.
U.S. Appl. No. 14/220,923, filed Mar. 20, 2014, 2015/0001462, Jan. 1, 2015, U.S. Pat. No. 9,105,555, Aug. 11, 2015.
U.S. Appl. No. 14/246,962, filed Apr. 7, 2014, 2014/0361409, Dec. 11, 2014.
U.S. Appl. No. 14/251,259, filed Apr. 11, 2014, 2014/0323968, Oct. 30, 2014.
U.S. Appl. No. 14/250,671, filed Apr. 11, 2014, 2014/0305900, Oct. 16, 2014.
U.S. Appl. No. 14/479,100, filed Sep. 5, 2014, 2015/0132873, May 14, 2015.
U.S. Appl. No. 14/504,736, filed Oct. 2, 2014, 2015/0141767, May 21, 2015.
U.S. Appl. No. 14/521,319, filed Oct. 22, 2014, 2015/0181700, Jun. 25, 2015.
U.S. Appl. No. 14/532,687, filed Nov. 4, 2014, 2015/0080695, Mar. 19, 2015.
U.S. Appl. No. 14/599,290, filed Jan. 16, 2015, 2015/0207012, Jul. 23, 2015.
U.S. Appl. No. 14/686,304, filed Apr. 14, 2015, 2015/0290938, Oct. 15, 2015.
U.S. Appl. No. 14/706,733, filed May 7, 2015, 2015/0237711, Aug. 20, 2015.
U.S. Appl. No. 14/789,645, filed Jul. 1, 2015, 2016/0027737, Jan. 28, 2016.
U.S. Appl. No. 14/800,363, filed Jul. 15, 2015.
U.S. Appl. No. 14/818,109, filed Aug. 4, 2015.
U.S. Appl. No. 14/766,333, filed Aug. 6, 2015, 2015/0380355, Dec. 31, 2015.
U.S. Appl. No. 14/766,926, filed Aug. 10, 2015.
U.S. Appl. No. 14/772,354, filed Sep. 2, 2015, 2016/0005700, Jan. 7, 2016.
U.S. Appl. No. 14/772,312, filed Sep. 2, 2015.
U.S. Appl. No. 14/944,039, filed Nov. 17, 2015.
U.S. Appl. No. 14/766,301, filed Dec. 24, 2015, 2015/0373831, Dec. 24, 2015.
Axisa et al. (2007) "Biomedical Stretchable Sytems using MID Based Stretchable Electronics Technology," In; The Conference Proceedings of the 29th Annual International Conference of the IEEE Engineering in Medicine and Biology Society, 2007. EMBS 2007. pp. 5687-5690.
Bluestar Silicones (Nov. 2012) "Silbion® RT GEL 4717 A & B," Bluestar Silicones Technical Data Sheet n° SIL 12 326 3.
Bowden et al. (May 14, 1998) "Spontaneous Formation of Ordered Structures in Thin Films of Metals Supported on an Elastomeric Polymer," Nature. 393:146-149.
Chow et al. (Jun. 2013) "Implantable RF medical devices: The benefits of high-speed communication and much greater communication distances in biomedical applications," IEEE Microw. Mag. 14:64-73.
Digikey (publication date unknown) "Datasheet for BAT 62-02LS E6327," Accessible on the Internet at URL: http://www.digikey.com/product-detail/en/BAT%2062-02LS%20E6327/BAT%2062-02LS%20E6327CT-ND/2410146. [Last Accessed Oct. 24, 2013].
Ferg et al. (1994) "Spinel Anodes for Lithium-Ion Batteries," J. Electrochem. Soc. 141:L147-L150.
Gaikwad et al. (Jul. 3, 2012) "Highly Stretchable Alkaline Batteries Based on an Embedded Conductive Fabric," Adv. Mater. 24:5071-5076.
Garnier et al. (1994) "All-Polymer Field-Effect Transistor Realized by Printing Techniques," Science. 265:1684-1686.
Gonzalez et al. (Jun. 2011) "Design and implementation of flexible and stretchable systems," Microelectron. Reliab. 51:1069-1076.
Gowda et al. (Dec. 6, 2010) "Conformal Coating of Thin Polymer Electrolyte Layer on Nanostructured Electrode Materials for Three-Dimensional Battery Applications," Nano Lett. 11:101-106.
Hu et al. (2009) "Highly conductive paper for energy-storage devices," Proc. Natl. Acad. Sci. USA. 106:21490-21494.
Hu et al. (2010) "Stretchable, Porous, and Conductive Energy Textiles," Nano Lett. 10:708-714.
Hu et al. (2010) "Thin, Flexible Secondary Li-Ion Paper Batteries," ACS Nano. 4:5843-5848.
Hu et al. (2011) "Stretchable Inorganic-Semiconductor Electronic Systems," Adv. Mater. 23(26):2933-2936.
Huck et al. (2000) "Ordering of Spontaneously Formed Buckles on Planar Surfaces," Langmuir. 16:3497-3501.
International Search Report with Written Opinion corresponding to International Patent Application No. PCT/US2014/014944, dated Dec. 18, 2014.
Jeong et al. (Sep. 25, 2013) "Materials and Optimized Designs for Human-Machine Interfaces Via Epidermal Electronics," Adv. Mater. 25(47):6839-6846.
Jones et al. (2004) "Stretchable Wavy Metal Interconnects," J. Vac. Sci. Technol. A. 22(4):1723-1725.
Kaltenbrunner et al. (2010) "Arrays of Ultracompliant Electrochemical Dry Gel Cells for Stretchable Electronics," Adv. Mater. 22:2065-2067.
Kaltenbrunner et al. (Jul. 24, 2013) "An ultra-lightweight design for imperceptible plastic electronics," Nature. 499:458-463.
Keplinger et al. (Aug. 30, 2013) "Stretchable, Transparent, Ionic Conductors," Science 341:984-987.
Khang et al. (2006) "A stretchable form of single-crystal silicon for high-performance electronics on rubber substrates," Science. 311:208-212.
Kim et al. (Aug. 12, 2011) "Epidermal Electronics," Science. 333:838-843.
Kim et al. (Mar. 6, 2011) "Materials for multifunctional balloon catheters with capabilities in cardiac electrophysiological mapping and ablation therapy," Nature Mater. 10:316-323.
Kim et al. (May 17, 2013) "Midfield Wireless Powering of Subwavelength Autonomous Devices," Phys. Rev. Lett. 110:203905.
Ko et al. (2008) "A hemispherical electronic eye camera based on compressible silicon optoelectronics," Nature. 454:748-753.
Krieger (Aug. 8, 2012) "Extreme mechanics: Buckling down," Nature. 488:146-147.
Kubo et al. (2010) "Stretchable Microfluidic Radiofrequency Antennas," Adv. Mater. 22:2749-2752.
Lacour et al. (2003) "Stretchable Gold Conductors on Elastomeric Substrates," Appl. Phys. Lett. 82(15):2404.
Lacour et al. (2004) "An Elastically Stretchable TFT Circuit," IEEE Electron Dev. Lett. 25(12):792-794.
Lacour et al. (2005) "Stretchable Interconnects for Elastic Electronic Surfaces," Proc. IEEE. 93:1459-1467.
Lacour et al. (2006) "Stiff subcircuit islands of diamondlike carbon for stretchable electronics," J. Appl. Phys. 100:014913.
Lee et al. (Aug. 15, 2013) "A Sub-nW Multi-stage Temperature Compensated Timer for Ultra-Low-Power Sensor Nodes," IEEE J. Solid-State Circuits. 48:2511-2521.
Lee et al. (Dec. 12, 2012) "A Modular 1 mm$^3$ Die-Stacked Sensing Platform With Low Power I$^2$ C Inter-Die Communication and Multi-Modal Energy Harvesting," IEEE J. Solid-State Circuits. 48:229-243.
Lee et al. (Feb. 22, 2011) "Stretchable GaAs Photovoltaics with Designs That Enable High Areal Coverage," Adv. Mater. 23:986-991.
Lee et al. (Mar. 29, 2012) "Stretchable Semiconductor Technologies with High Areal Coverages and Strain-Limiting Behavior: Demonstration in High-Efficiency Dual-Junction GaInP/GaAs Photovoltaics," Small. 8:1851-1856.
Lipomi et al. (Oct. 23, 2011) "Skin-like pressure and strain sensors based on transparent elastic films of carbon nanotubes," Nature Nanotech. 6:788-792.
Mandlik et al. (Aug. 2006) "Fully Elastic Interconnects on Nanopatterned Elastomeric Substrates," IEEE Electron Dev. Lett. 27(8):650-652.

(56) References Cited

OTHER PUBLICATIONS

Mannoor et al. (Mar. 27, 2012) "Graphene-based wireless bacteria detection on tooth enamel," Nat. Commun. 3:763.
Mannsfeld et al. (Sep. 12, 2010) "Highly sensitive flexible pressure sensors with microstructured rubber dielectric layers," Nature Mater. 9:859-864.
Medina et al. (1989) "Comparison of electrode site preparation techniques," Heart Lung. 18:456-460.
Nishide et al. (2008) "Toward flexible batteries," Science. 319:737-738.
Ouyang et al. (2000) "Conversion of some siloxane polymers to silicon oxide by UV/ozone photochemical processes," Chem. Mater. 12:1591-1596.
Owen (1997) "Rechargeable lithium batteries," Chem. Soc. Rev. 26:259-267.
Palleau et al. (Jan. 18, 2013) "Self-Healing Stretchable Wires for Reconfigurable Circuit Wiring and 3D Microfluidics," Adv. Mater. 25:1589-1592.
Pelrine et al. (2000) "High-speed electrically actuated elastomers with strain greater than 100%," Science. 287:836-839.
Pushparaj et al. (2007) "Flexible energy storage devices based on nanocomposite paper," Proc. Natl. Acad. Sci. USA. 104:13574-13577.
Rogers et al. (Aug. 31, 2011) "Synthesis, assembly and applications of semiconductor nanomembranes," Nature 477:45-53.
Romeo et al. (Apr. 2, 2013) "Elastomeric substrates with embedded stiff platforms for stretchable electronics," Appl. Phys. Lett. 102:131904.
Schwartz et al. (May 14, 2013) "Flexible polymer transistors with high pressure sensitivity for application in electronic skin and health monitoring," Nature Communications 4:1859.
Scrosati (2007) "Nanomaterials—Paper powers battery breakthrough," Nature Nanotechnol. 2:598-599.
Scrosati et al. (2010) "Lithium batteries: Status, prospects and future," J. Power Sources. 195:2419-2430.
Sekitani et al. (2008) "A rubberlike stretchable active matrix using elastic conductors," Science. 321:1468-1472.
Sekitani et al. (Mar. 2012) "Stretchable organic integrated circuits for large-area electronic skin surfaces," MRS Bull. 37:236-245.
Someya et al. (2004) "A large-area, flexible pressure sensor matrix with organic field-effect transistors for artificial skin application," Proc. Natl. Acad. Sci. USA 101:9966-9970.
Sterken et al. (Aug. 30-Sep. 3, 2011) "Ultra-thin chip package (UTCP) and stretchable circuit technologies for wearable ECG system," In; The Conference Proceedings of the Annual International Conference of the IEEE Engineering in Medicine and Biology Society, EMBC, 2011. pp. 6886-6889.
Sun et al. (2006) "Controlled buckling of semiconductor nanoribbons for stretchable electronics," Nature Nanotechnol. 1:201-207.
Sun et al. (Aug. 6, 2012) "A Trust-Based Framework for Fault-Tolerant Data Aggregation in Wireless Multimedia Sensor Networks," IEEE Trans. Dependable Secur. Comput. 9:785-797.
Suo (Mar. 2012) "Mechanics of stretchable electronics and soft machines," MRS Bull. 37:218-225.
Takei et al. (2010) "Nanowire active-matrix circuitry for low-voltage macroscale artificial skin," Nature Mater. 9:821-826.
Tarascon et al. (2001) "Issues and challenges facing rechargeable lithium batteries," Nature. 414:359-367.
Thanawala et al. (2000) "Surface modification of silicone elastomer using perfluorinated ether," Langmuir. 16:1256-1260.
Thomas et al. (Nov. 16, 2012) "A Battery-Free Multichannel Digital Neural/EMG Telemetry System for Flying Insects," IEEE Trans. Biomed. Circuit Syst. 6:424-436.
Vandeparre et al. (Apr. 30, 2013) "Localization of Folds and Cracks in Thin Metal Films Coated on Flexible Elastomer Foams," Adv. Mater. 25:3117-3121.
Verlinden (2006) "Silver solar cells: A new thin-crystalline silicon photovoltaic technology," Solar Energy Materials and Solar Cells. 90:3422-3430.
Vogt et al. (Oct. 2013) "Design and Characterization of A Soft Multi-Axis Force Sensor Using Embedded Microfluidic Channels," IEEE Sensors J. 13, 4056-4064 (2013).
Wagner et al. (2004) "Electronic skin: architecture and components," Physica E Low Dimens. Syst. Nanostruct. 25:326-334.
Wagner et al. (Mar. 2012) "Materials for stretchable electronics," MRS Bull. 37:207-217.
Wang et al. (Jul. 21, 2013) "User-interactive electronic skin for instantaneous pressure visualization," Nature Mater. 12:899-904.
White et al. (Jul. 28, 2013) "Ultrathin, highly flexible and stretchable PLEDs," Nature Photon. 7:811-816.
Wu et al. (Apr. 25, 2013) "Taxel-Addressable Matrix of Vertical-Nanowire Piezotronic Transistors for Active and Adaptive Tactile Imaging," Science. 340:952-957.
Yoon et al. (2008) "Ultrathin silicon solar microcells for semitransparent, mechanically flexible and microconcentrator module designs," Nature Mater. 7:907-915.
Yoshima et al. (Jun. 15, 2012) "Fabrication of micro lithium-ion battery with 3D anode and 3D cathode by using polymer wall," J. Power Sources. 208:404-408.
Yu et al. (2009) "Stretchable supercapacitors based on buckled single-walled carbon nanotube macrofilms," Adv. Mater. 21:4793-4797.
Supplementary Partial European Search Report corresponding to European Patent Application No. 14749472.8, dated Aug. 1, 2016, 6 pages.
Ahn et al. (2009) "Omnidirectional Printing of Flexible, Stretchable, and Spanning Silver Microelectrodes," Science. 323:1590-1593.
Brosteaux et al. (2007) "Design and fabrication of elastic interconnections for stretchable electronic circuits," IEEE Electron Device Lett. 28:552-554.
Carlson et al. (Aug. 31, 2012) "Transfer printing techniques for materials assembly and micro/nanodevice fabrication," Adv. Mater. 24:5284-5318.
Chasiotis et al. (2002) "A new microtensile tester for the study of MEMS materials with the aid of atomic force microscopy," Experimental Mechanics. 42:51-57.
Chasiotis et al. (2007) "Strain rate effects on the mechanical behavior of nanocrystalline Au films," Thin Solid Films. 515:3183-3189.
Chen et al. (1993) "Control of Strength and Toughness of Ceramic-Metal Laminates Using Interface Design," Journal of Materials Research. 8:2362-2369.
Cohen (1995) "Fractal Antennas: Part 1," Communications Quarterly: The Journal of Communications Technology. pp. 7-22.
Connor et al. (1998) "Broadband ac conductivity of conductor-polymer composites," Physical Review B. 57:2286-2294.
Cotton et al. (2009) "A Multifunctional Capacitive Sensor for Stretchable Electronic Skins," IEEE Sensors Journal. 9:2008-2009.
Duan et al. (Dec. 16, 2013) "Non-wrinkled, highly stretchable piezoelectric devices by electrohydrodynamic direct-writing," Nanoscale. 6:3289-3295.
Duan et al. (Oct. 1, 2013) "Transfer printing and patterning of stretchable electrospun film," Thin Solid Films. 544:152-156.
Espinosa et al. (2004) "Plasticity size effects in free-standing submicron polycrystalline FCC films subjected to pure tension," Journal of the Mechanics and Physics of Solids. 52:667-689.
Fairbanks et al. (2011) "Fractal electronic devices: simulation and implementation," Nanotechnology. 22(36):365304.
Fan et al. (Feb. 7, 2014) "Fractal Design Concepts for Stretchable Electronics," Nat Commun. 5:3266.
Gao et al. (2005) "Mechanics of hierarchical adhesion structures of geckos," Mechanics of Materials. 37:275-285.
Gianvittorio et al. (2002) "Y. Fractal antennas: A novel antenna miniaturization technique, and applications," IEEE Antennas and Propagation Magazine. 44:20-36.
Goldberger et al. (1987) "Fractals in Physiology and Medicine," Yale Journal of Biology and Medicine. 60:421-435.
Golestanirad et al. (Jul. 12, 2013) "Analysis of fractal electrodes for efficient neural stimulation," Frontiers in Neuroengineering. 6:3.
Gonzalez et al. (2008) "Design and performance of metal conductors for stretchable electronic circuits," Circuit World. 35:22-29.

(56) References Cited

OTHER PUBLICATIONS

Gonzalez et al. (2008) "Design of metal interconnects for stretchable electronic circuits," Microelectronics Reliability. 48:825-832.
Graudejus et al. (Dec. 8, 2011) Encapsulating Elastically Stretchable Neural Interfaces: Yield, Resolution, and Recording/Stimulation of Neural Activity, Advanced Functional Materials. 22:640-651.
Gray et al. (2004) "High-Conductivity Elastomeric Electronics," Adv. Mater. 16:393-397.
Hajji et al. (1999) "Synthesis, structure, and morphology of polymer-silica hybrid nanocomposites based on hydroxyethyl methacrylate," Journal of Polymer Science Part B—Polymer Physics. 37:3172-3187.
Hao et al. (Mar. 8, 2013) "A Transforming Metal Nanocomposite with Large Elastic Strain, Low Modulus, and High Strength," Science. 339:1191-1194.
Harris et al. (2011) "Elastically Stretchable Insulation and Bilevel Metallization and Its Application in a Stretchable RLC Circuit," J. Eletron. Mater. 40:1335-1344.
Hsu et al. (2009) "In situ observations on deformation behavior and stretching-induced failure of fine pitch stretchable interconnect," J. Mater. Res. 24:3573-3582.
Hsu et al. (2010) "The effect of pitch on deformation behavior and the stretching-induced failure of a polymer-encapsulated stretchable circuit," J. Micromech. Microeng. 20:075036.
Hsu et al. (Aug. 2011) "Polyimide-Enhanced Stretchable Interconnects: Design, Fabrication, and Characterization," IEEE Trans. Electron. Dev. 58:2680-2688.
Huang et al. (Jul. 9, 2012) "Controllable self-organization of colloid microarrays based on finite length effects of electrospun ribbons," Soft Matter. 8:8302-8311.
International Search Report with Written Opinion corresponding to International Patent Application No. PCT/US2014/014932, dated May 14, 2014.
Jiang et al. (2007) "Finite deformation mechanics in buckled thin films on compliant supports," Proc. Natl. Acad. Sci. USA. 104:15607-15612
Jiang et al. (2008) "Finite width effect of thin-films buckling on compliant substrate: Experimental and theoretical studies," Journal of the Mechanics and Physics of Solids 56:2585-2598.
Kim et al. (2008) "Materials and noncoplanar mesh designs for integrated circuits with linear elastic responses to extreme mechanical deformations," Proc. Natl. Acad. Sci. USA. 105:18675-18680.
Kim et al. (2008) "Stretchable and Foldable Silicon Integrated Circuits," Science 320:507-511.
Kim et al. (2009) "Optimized Structural Designs for Stretchable Silicon Integrated Circuits," Small. 5:2841-2847.
Kim et al. (2010) "Stretchable, Curvilinear Electronics Based on Inorganic Materials," Adv. Mater. 22:2108-2124.
Kim et al. (2010) "Waterproof AlInGaP optoelectronics on stretchable substrates with applications in biomedicine and robotics," Nature Materials. 9:929-937.
Kim et al. (Aug. 14, 2012) "Thin, Flexible Sensors and Actuators as 'Instrumented' Surgical Sutures for Targeted Wound Monitoring and Therapy," Small 8:3263-3268.
Kim et al. (Aug. 2012) "Flexible and Stretchable Electronics for Biointegrated Devices," Annual Review of Biomedical Engineering. 14:113-128.
Kim et al. (Jul. 17, 2013) "Stretchable nanoparticle conductors with self-organized conductive pathways," Nature. 500:59-63.
Kim et al. (Jun. 29, 2012) "Materials and Designs for Wirelessly Powered Implantable Light-Emitting Systems," Small 8:2812-2818.
Kim et al. (Nov. 12, 2012) "Electronic sensor and actuator webs for large-area complex geometry cardiac mapping and therapy," Proc. Natl. Acad. Sci. USA. 109:19910-19915.
Lee et al. (2011) "Flexible Inorganic Nanostructure Light-Emitting Diodes Fabricated on Graphene Films," Advanced Materials. 23:4614-4619.
Li et al. (2005) "Compliant thin film patterns of stiff materials as platforms for stretchable electronics," Journal of Materials Research. 20:3274-3277.
Li et al. (Apr. 2013) "A generalized mechanical model for suture interfaces of arbitrary geometry," Journal of the Mechanics and Physics of Solids. 61:1144-1167.
Li et al. (Mar. 1, 2012) "Bioinspired, mechanical, deterministic fractal model for hierarchical suture joints," Physical Review E. 85(3):031901.
Lipomi et al. (Feb. 25,2011) "Stretchable Organic Solar Cells," Advanced Materials. 23:1771-1775.
Lu et al. (2007) "Metal films on polymer substrates stretched beyond 50%," Applied Physics Letters. 91(3): 221909.
Lu et al. (Jul. 12, 2012) "Highly Sensitive Skin-Mountable Strain Gauges Based Entirely on Elastomers," Advanced Functional Materials. 22:4044-4050.
Masters (2004) "Fractal analysis of the vascular tree in the human retina," Annual Review of Biomedical Engineering. 6:427-452.
Meitl et al. (2006) "Transfer printing by kinetic control of adhesion to an elastomeric stamp," Nat. Mater. 5:33-38.
Nelson et al. (2011) "Epitaxial growth of three-dimensionally architectured optoelectronic devices," Nature Materials 10:676-681.
Office Action corresponding to Chinese Patent Application No. 2014800184126, dated Jul. 27, 2017—English translation provided.
Office Action corresponding to Chinese Patent Application No. 2014800184785, dated Sep. 4, 2017—with English translation.
Puente et al. (1998) "Small but long Koch fractal monopole," Electronics Letters. 34:9-10.
Ramuz et al. (May 29, 2012) "Transparent, Optical, Pressure-Sensitive Artificial Skin for Large-Area Stretchable Electronics," Advanced Materials 24:3223-3227.
Robinson et al. (Jul. 1, 2011) "Microstructured Silicone Substrate for Printable and Stretchable Metallic Films," Langmuir. 27:4279-4284.
Rogers et al. (2010) "Materials and Mechanics for Stretchable Electronics," Science. 327:1603-1607.
Saeidpourazar et al. (Jul. 5, 2012) "Laser-Driven Micro Transfer Placement of Prefabricated Microstructures," J. Microelectromech. Syst. 21:1049-1058.
Sato et al. (1998) "Tensile testing of silicon film having different crystallographic orientations carried out on a silicon chip," Sensors and Actuators A—Physical. 70:148-152.
Search Report corresponding to European Patent Application No. 14748754.0, dated Apr. 6, 2017.
Sekitani et al. (2009) "Stretchable active-matrix organic light-emitting diode display using printable elastic conductors," Nature Materials. 8:494-499.
Song et al. (2008) "Buckling of a stiff thin film on a compliant substrate in large deformation," International Journal of Solids and Structures. 45:3107-3121.
Song et al. (2009) "Mechanics of noncoplanar mesh design for stretchable electronic circuits," Journal of Applied Physics. 105:123516.
Song et al. (May 2, 2013) "Digital cameras with designs inspired by the arthropod eye," Nature. 497:95-99.
Su et al. (2012) "Postbuckling analysis and its application to stretchable electronics," J. Mech. Phys. Solids. 60:487-508.
Taylor (2011) "Vision of beauty," Physics World. 24:22-27.
Tian et al. (Aug. 26, 2012) "Macroporous nanowire nanoelectronic scaffolds for synthetic tissues," Nat. Mater. 11:986-994.
Van der Sluis et al. (Dec. 22, 2010) "Stretching-induced interconnect delamination in stretchable electronic circuits," J. Phys. D—Appl. Phys. 44:034008.
Vanfleteren et al. (Mar. 14, 2012) "Printed circuit board technology inspired stretchable circuits," MRS Bull. 37:254-260.
Viventi et al. (2010) "A Conformal, Bio-Interfaced Class of Silicon Electronics for Mapping Cardiac Electrophysiology," Science Translational Medicine. 2:24ra22.
Webb et al. (Sep. 15, 2013) "Ultrathin conformal devices for precise and continuous thermal characterization of human skin," Nat. Mater. 12:938-944.
Wu et al. (May 19, 2013) "A transparent electrode based on a metal nanotrough network," Nat. Nanotechnol. 8:421-425.

(56) References Cited

OTHER PUBLICATIONS

Xu et al. (Feb. 26, 2013) "Stretchable batteries with self-similar serpentine interconnects and integrated wireless recharging systems," Nature Communications. 4:1543.

Yang et al. (Jul. 5, 2013) "Gauge Factor and Stretchability of Silicon-on-Polymer Strain Gauges," Sensors. 13:8577-8594.

Yao et al. (2006) "Mechanics of robust and releasable adhesion in biology: Bottom-up designed hierarchical structures of gecko," Journal of the Mechanics and Physics of Solids. 54:1120-1146.

Yao et al. (2007) "Multi-scale cohesive laws in hierarchical materials," International Journal of Solids and Structures. 44:8177-8193.

Yeo et al. (Feb. 26, 2013) "Multifunctional Epidermal Electronics Printed Directly Onto the Skin," Advanced Materials. 25:2773-2778.

Ying et al. (Aug. 10, 2012) "Silicon nanomembranes for fingertip electronics," Nanotechnology. 23:344004.

Yu et al. (2009) "Monitoring Hippocampus Electrical Activity In Vitro on an Elastically Deformable Microelectrode Array," Journal of Neurotrauma. 26:1135-1145.

Zhang et al. (Dec. 16, 2011) "Strain-Controlled Switching of Hierarchically Wrinkled Surfaces between Superhydrophobicity and Superhydrophilicity," Langmuir. 28:2753-2760.

Zhang et al. (Dec. 2013) "Mechanics of ultra-stretchable self-similar serpentine interconnects," Acta Materialia. 61:7816-7827.

Zhang et al. (Feb. 1997) "On the wear debris of polyetheretherketone: Fractal dimensions in relation to wear mechanisms," Tribology International 30:87-102.

Zhang et al. (Jun. 27, 2013) "Buckling in serpentine microstructures and applications in elastomer-supported ultra-stretchable electronics with high areal coverage," Soft Matter. 9:8062-8070.

Zhang et al. (Nov. 26, 2013) "Experimental and Theoretical Studies of Serpentine Microstructures Bonded to Prestrained Elastomers for Stretchable Electronics," Advanced Functional Materials. 24(14):2028-2037.

Zhang et al. (Sep. 1, 2010) "On optimal hierarchy of load-bearing biological materials," Proceedings of the Royal Society B—Biological Sciences. 278:519-525.

Office Action corresponding to Japanese Patent Application No. 2015-557038, dated Dec. 19, 2017—provided with English translation.

Office Action corresponding to U.S. Appl. No. 13/835,284, dated Jan. 18, 2018.

* cited by examiner

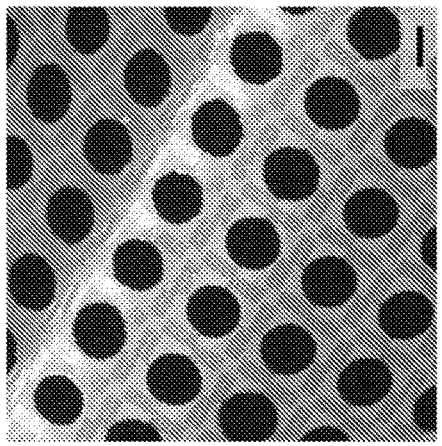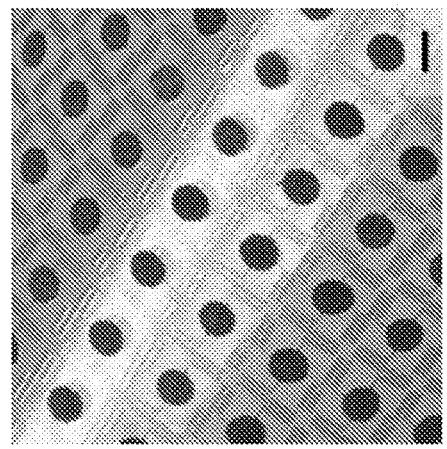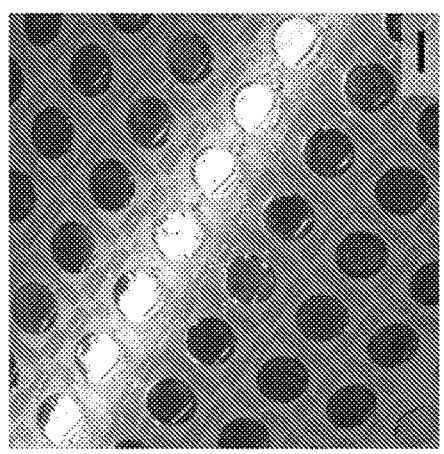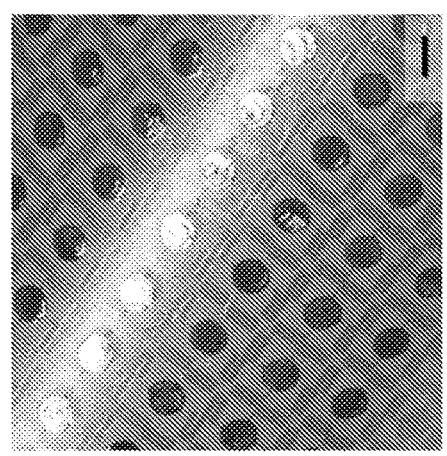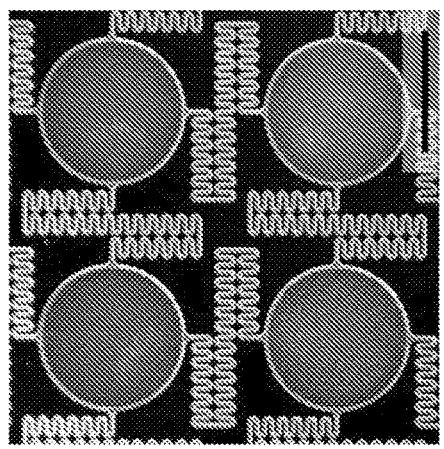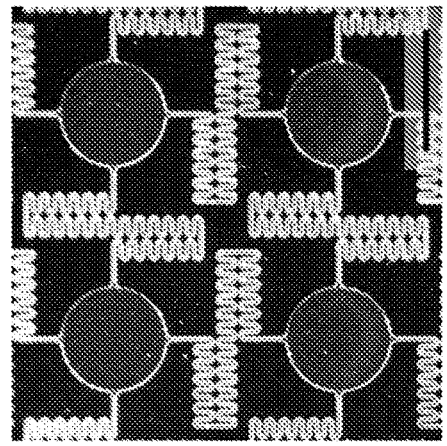
Figure 1D
Figure 1E

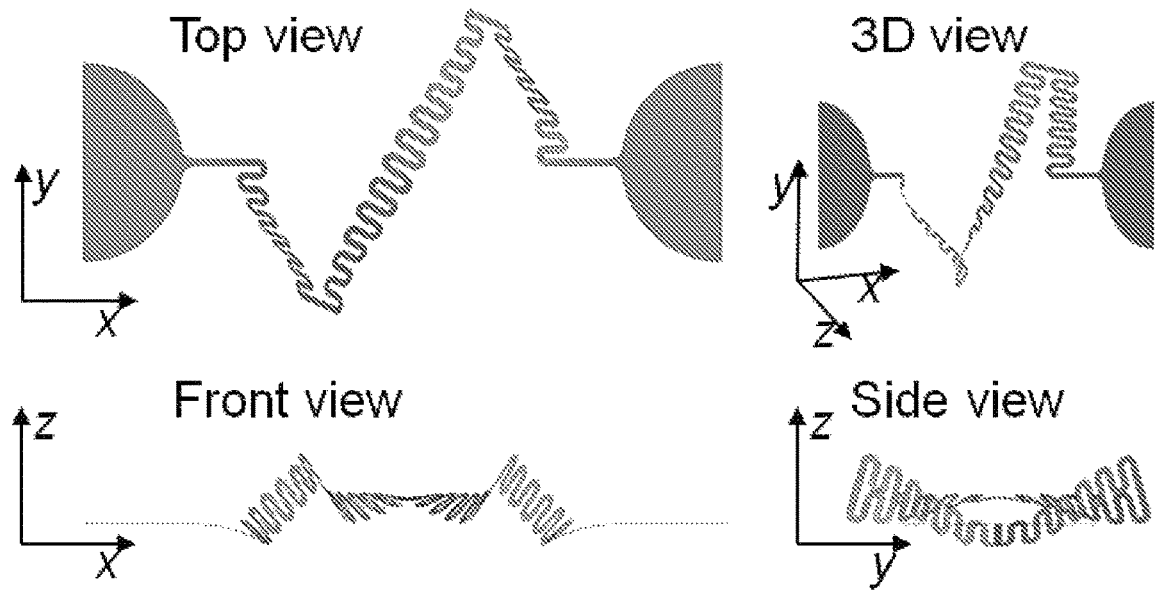
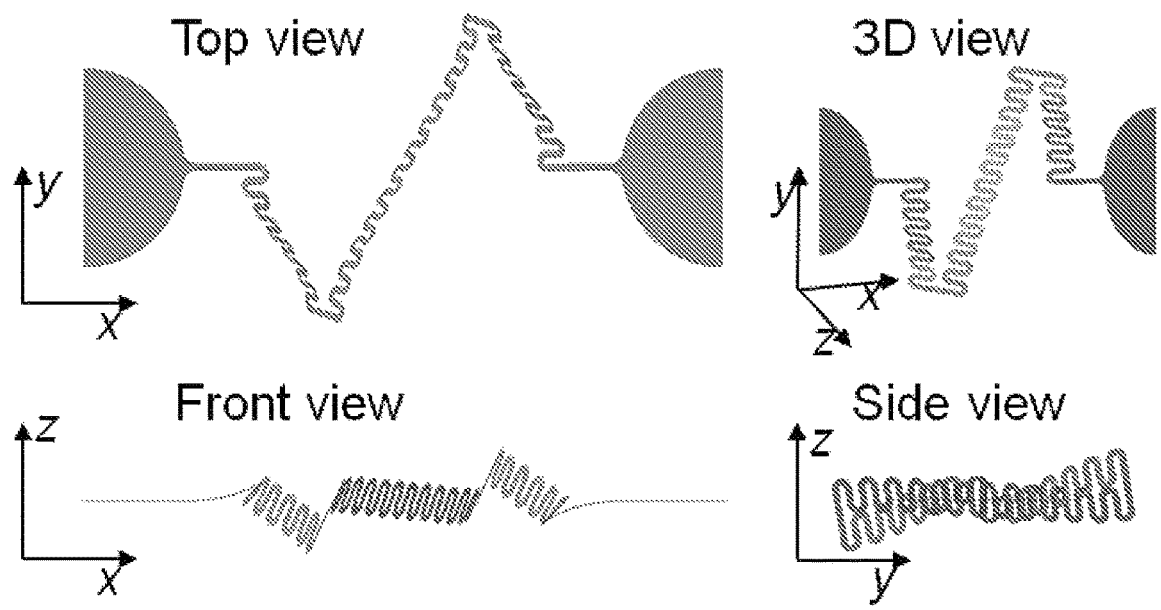
Figure 8

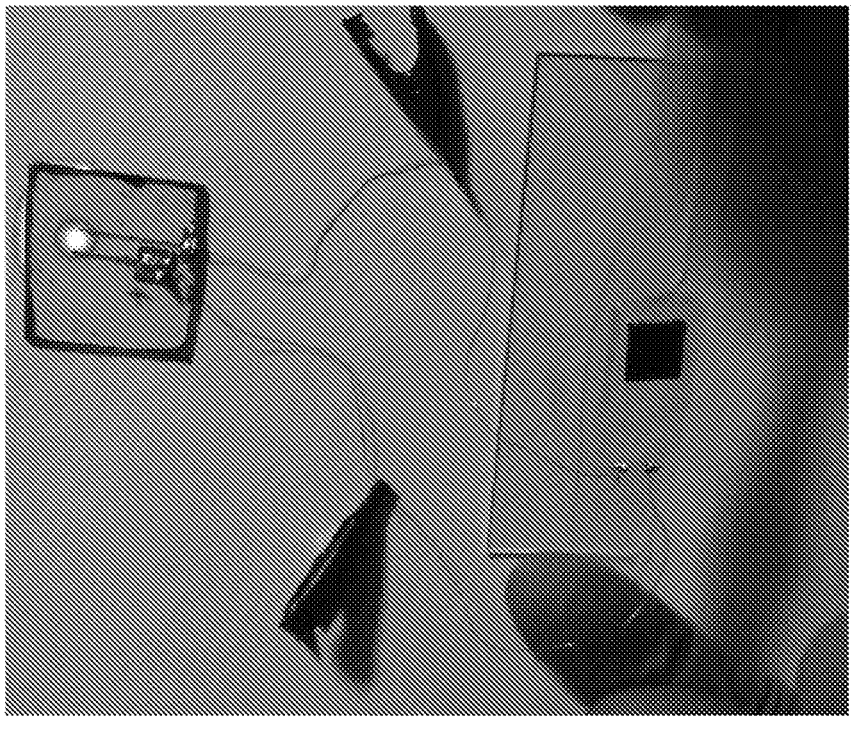
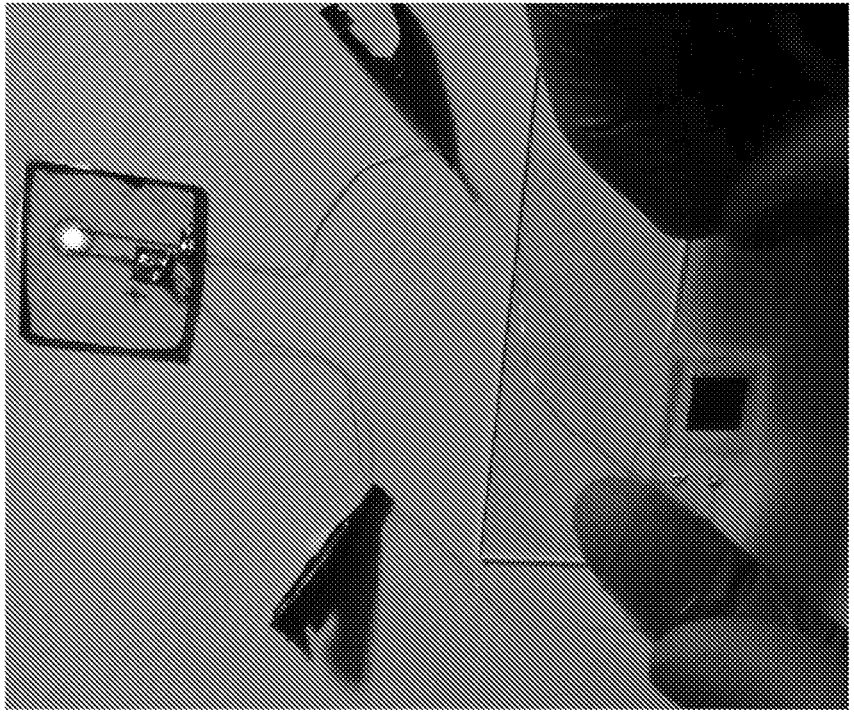
Battery chip in liquid chamber to power up a blue LED (a) before stretching and (b) under stretching. Stretchability limiting factor: bonded serpentines in the chamber wall.
Figure 29

Figure 33. Under the chip to facilitate the interconnect to glide in the liquid chamber.

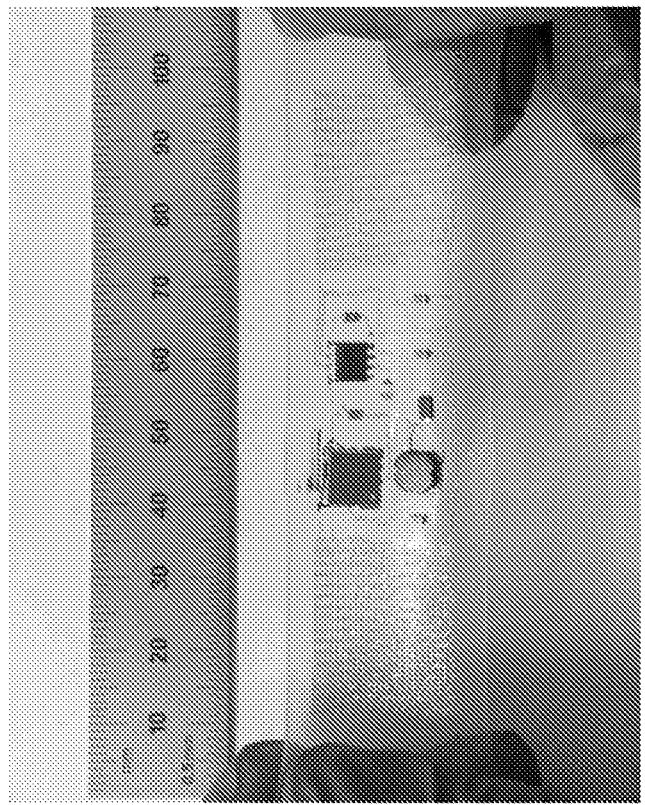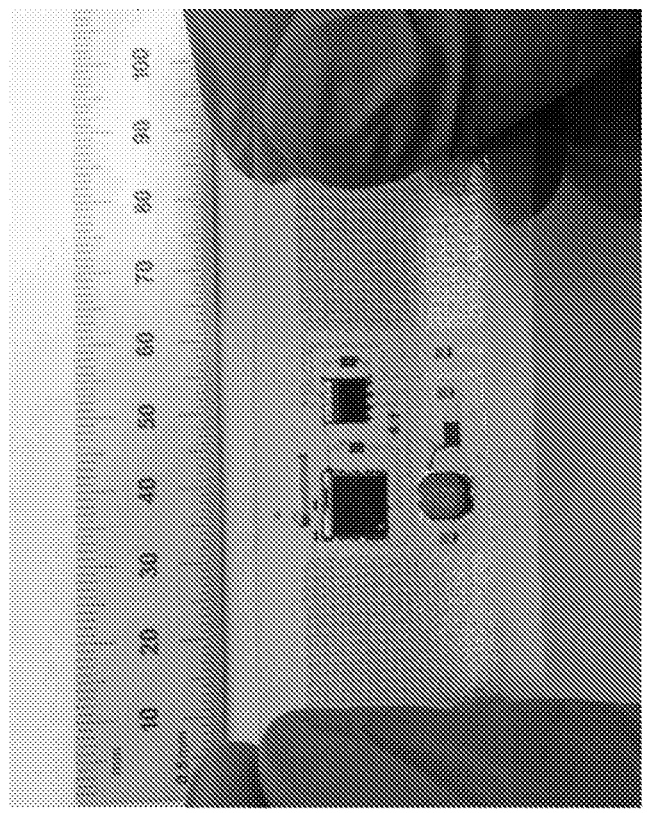
Figure 36

- Self-powered system with RF energy harvesting antenna.
- ECG/EMG/EEG and temperature multifunctional sensing capabilities.
- Wireless data transmission.

Figure 43

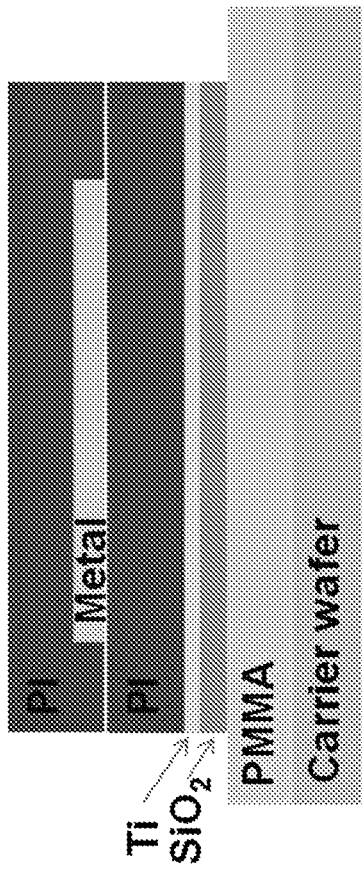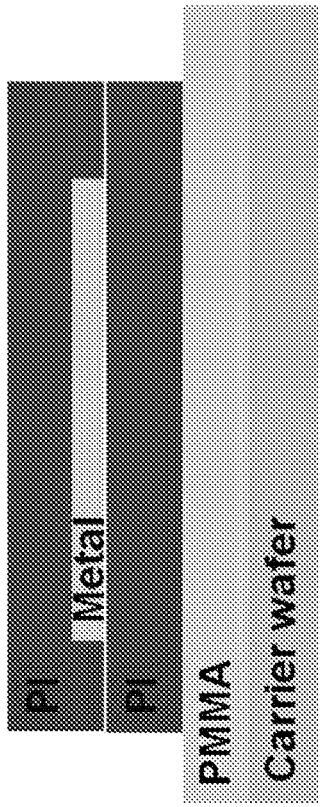
Figure 48

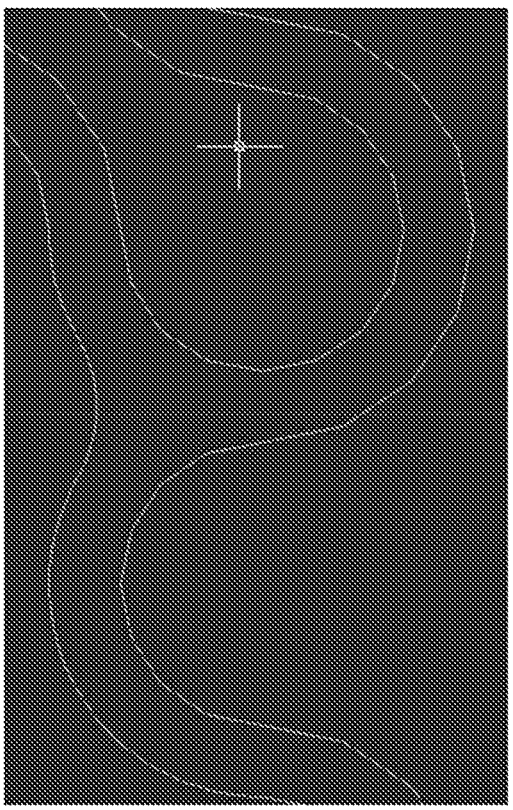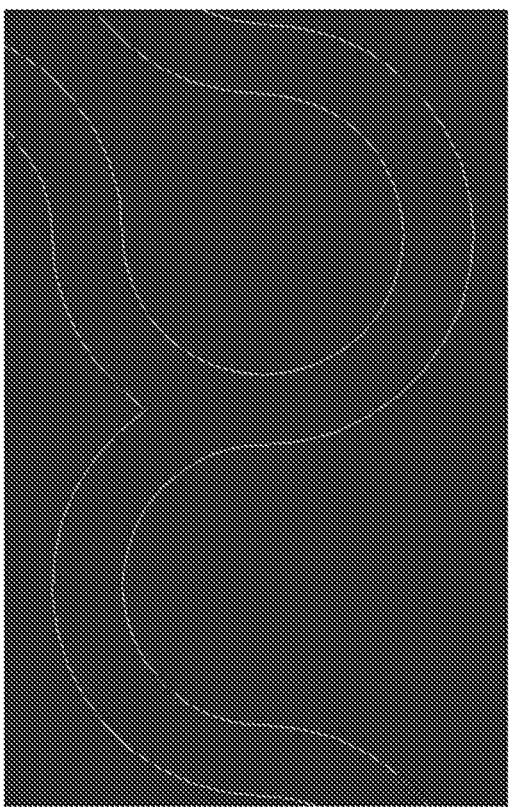
Figure 49
Replaced all of the sharp corners with rounded corners.

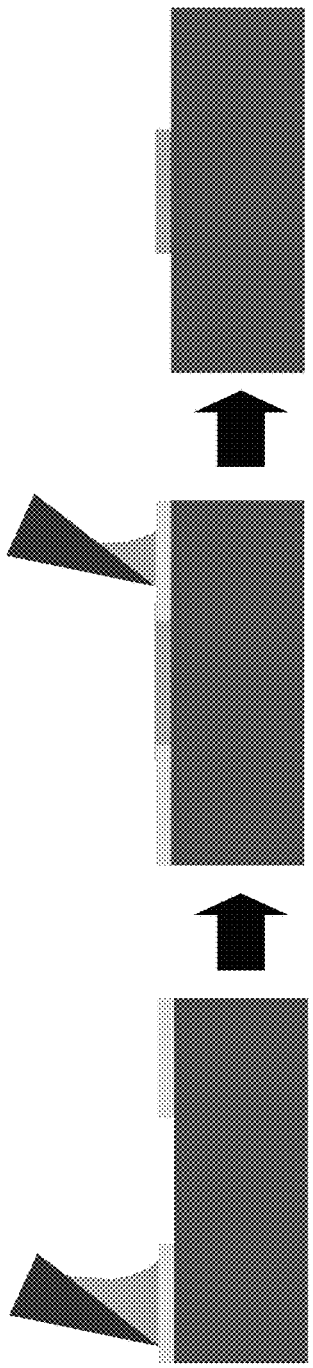
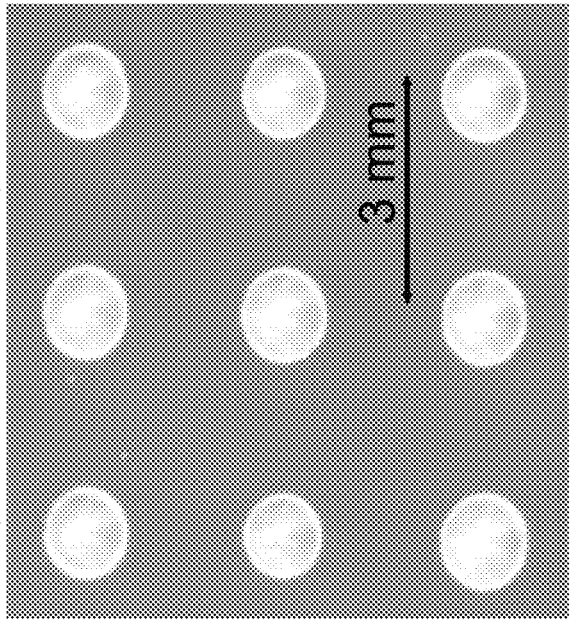
Figure 53

Wireless circuit stretching
- Stretchability: ~100%
- Fully bonded wires
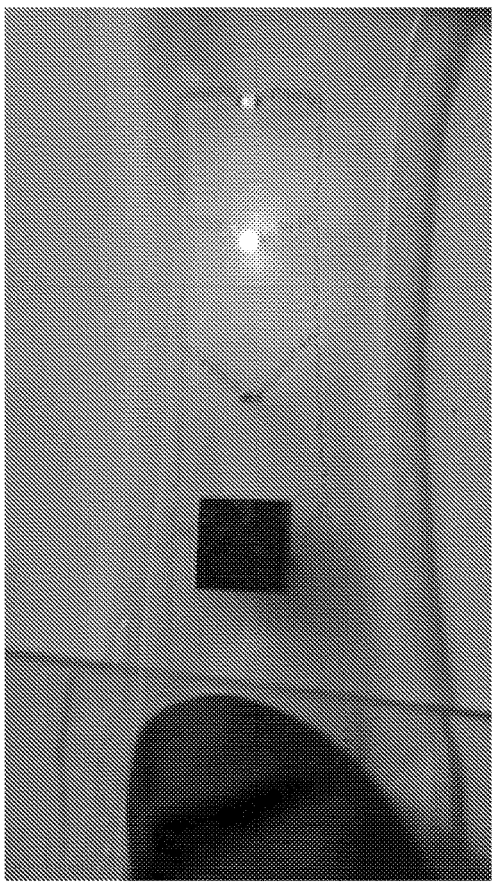
Figure 55

Layout design considerations (5)
**1. Self-similar *vs* conventional serpentine.**
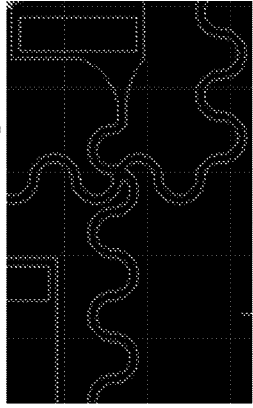
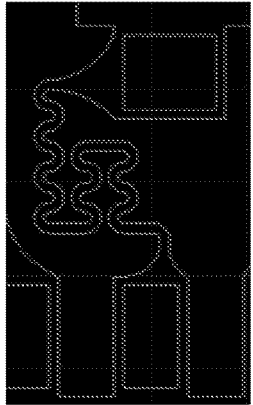
2. Replaced all of the sharp corners with rounded corners.
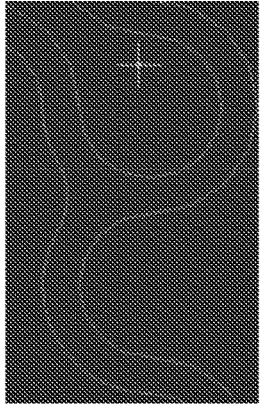
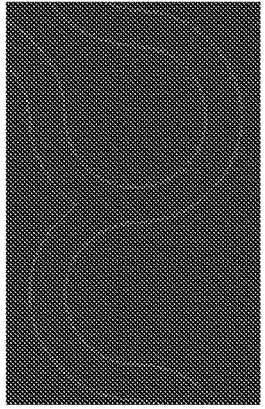
3. Selective bonding of the serpentine wires to avoid tangling.
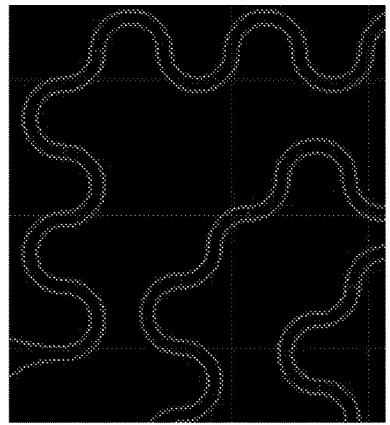
Figure 57

Layout design considerations (6)
Off-centered bonding to accommodate the small gap between the chips :

As fabricated interconnects
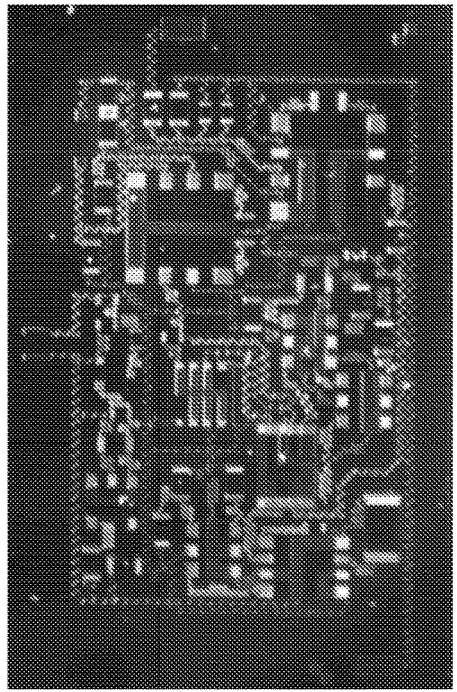
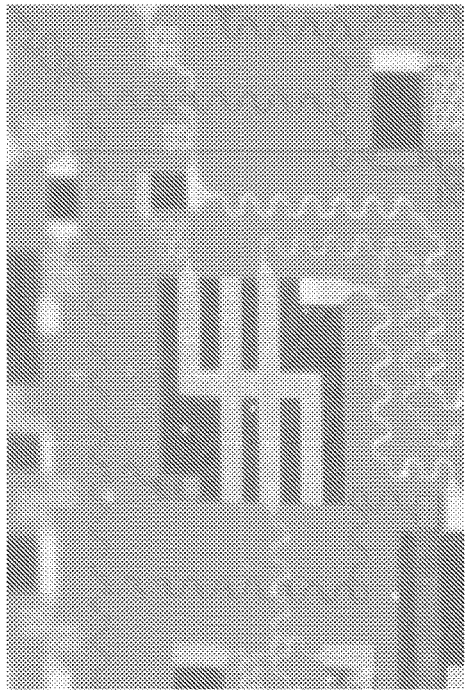
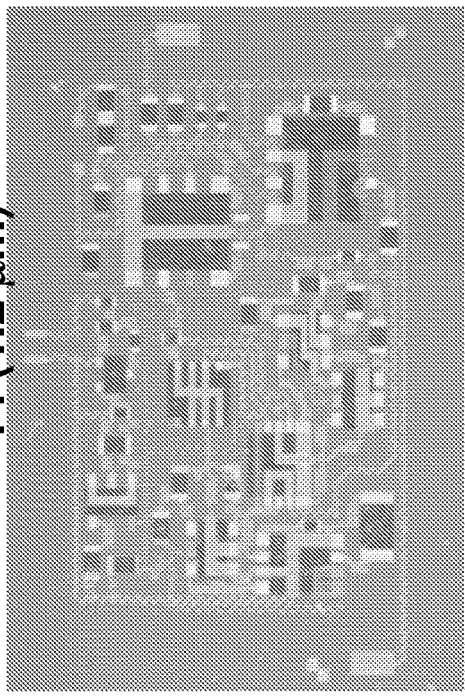
Layered structure:
- PI (1.2 μm)
- Data: Al (600 nm)
- PI (1.2 μm)
- Ground: Cu (600 nm)
- PI (1.2 μm)
- Power: Cu (500 nm)/Au (100 nm)
- PI (1.2 μm)
Figure 60

Selective bonding with new fabrication process
Conventional:
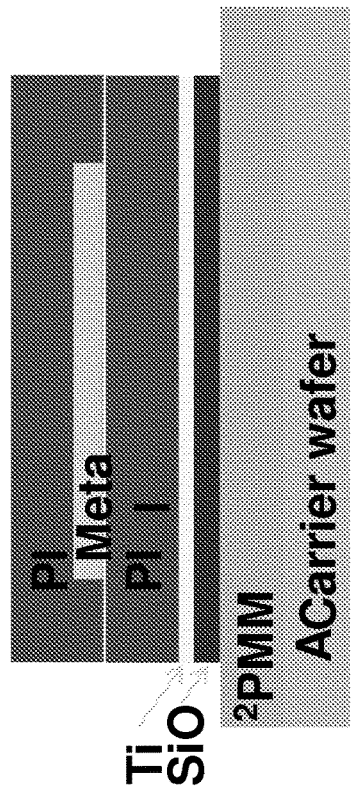
Modified:
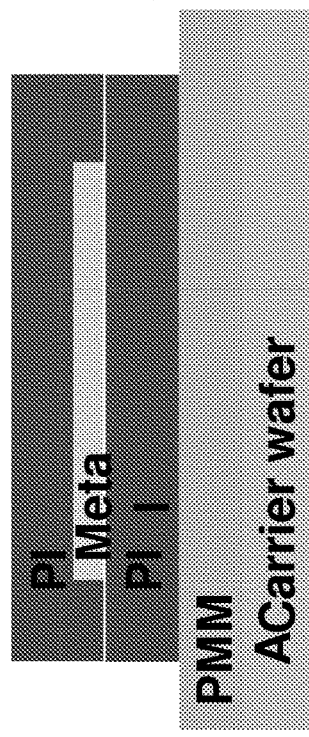
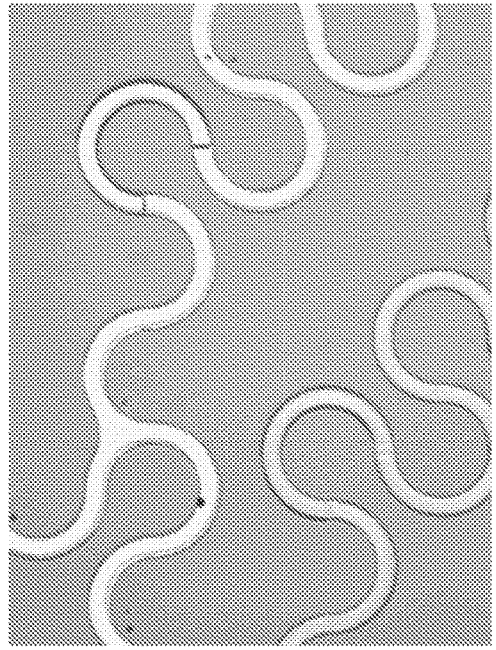
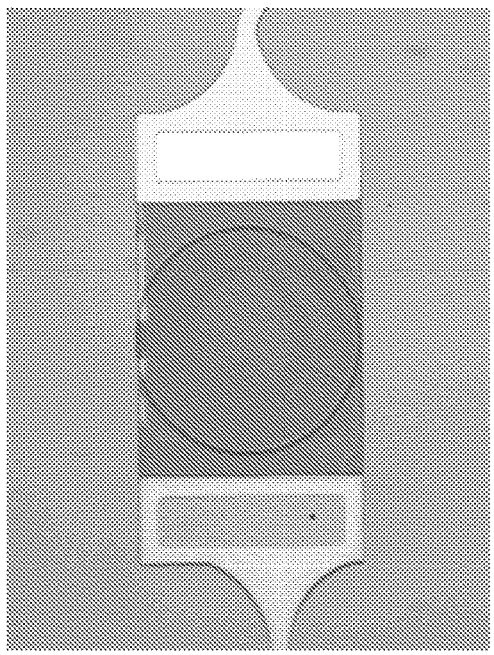
Figure 61

Chip depackaging
Fully depackaged by acid etching:
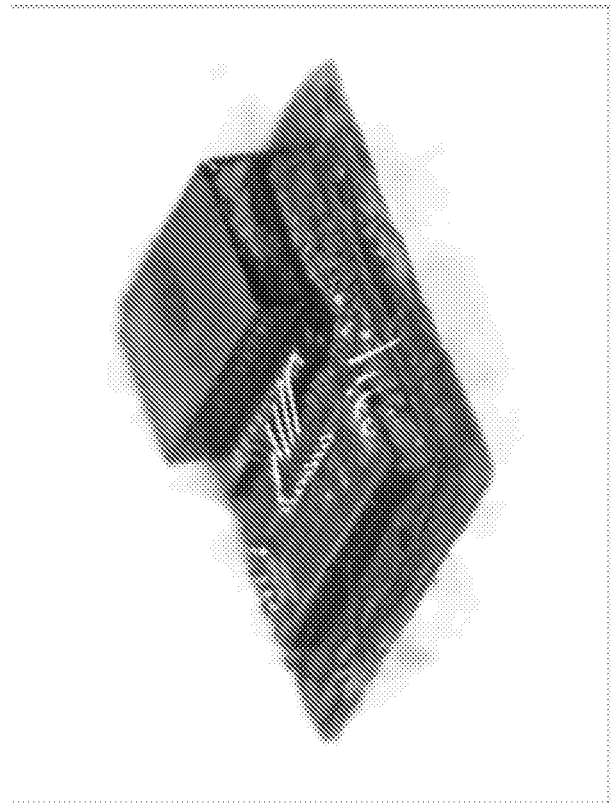
Halfly depackaged by mechanical polishing:
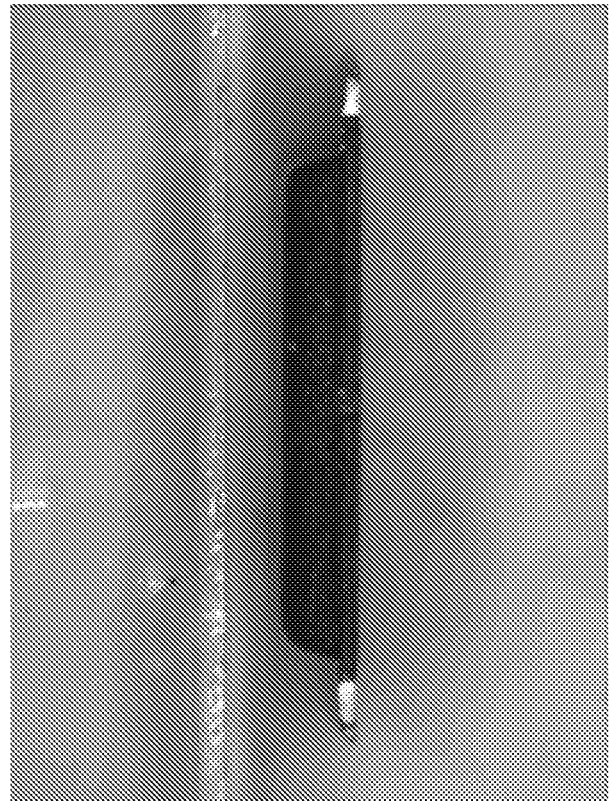
Figure 63

As fabricated device
Made of COTS chips (overall thickness ~3 mm):
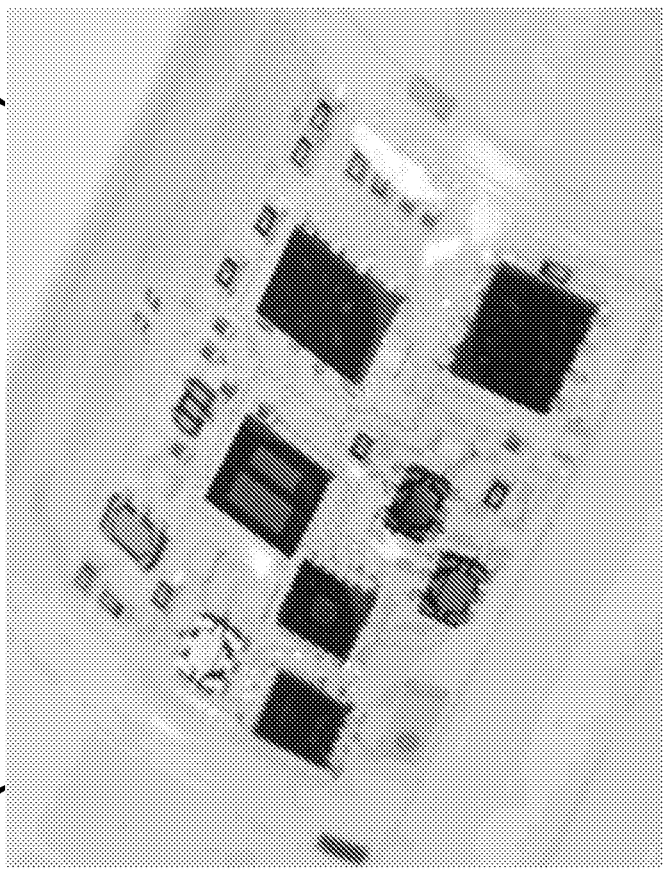
Made of depackaged chips (overall thickness ~ 0.6 mm):
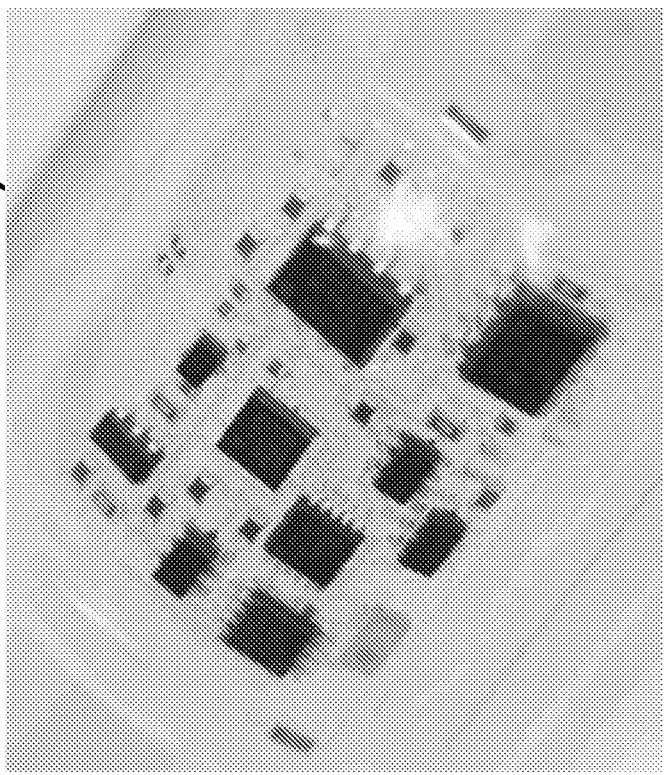
Figure 64

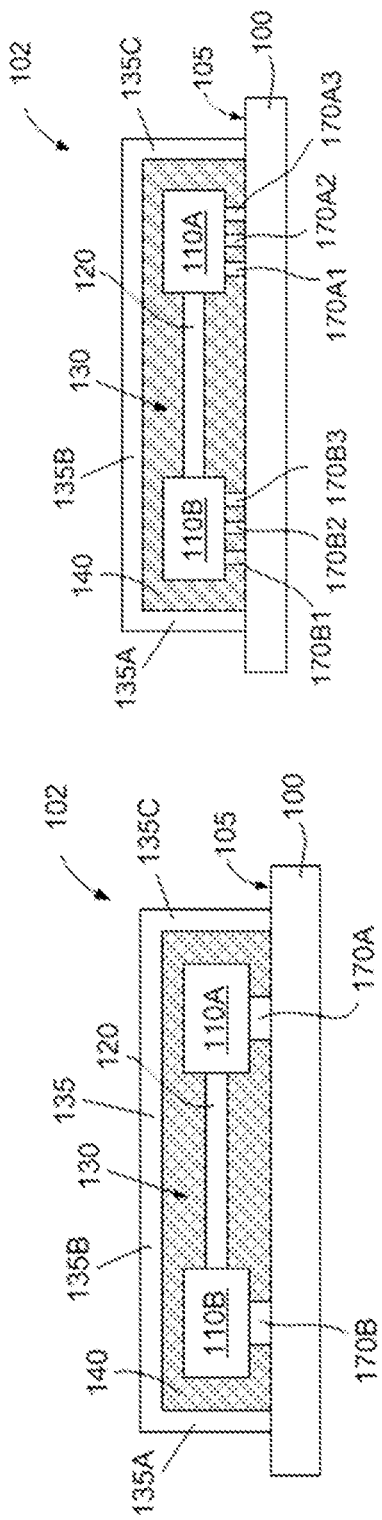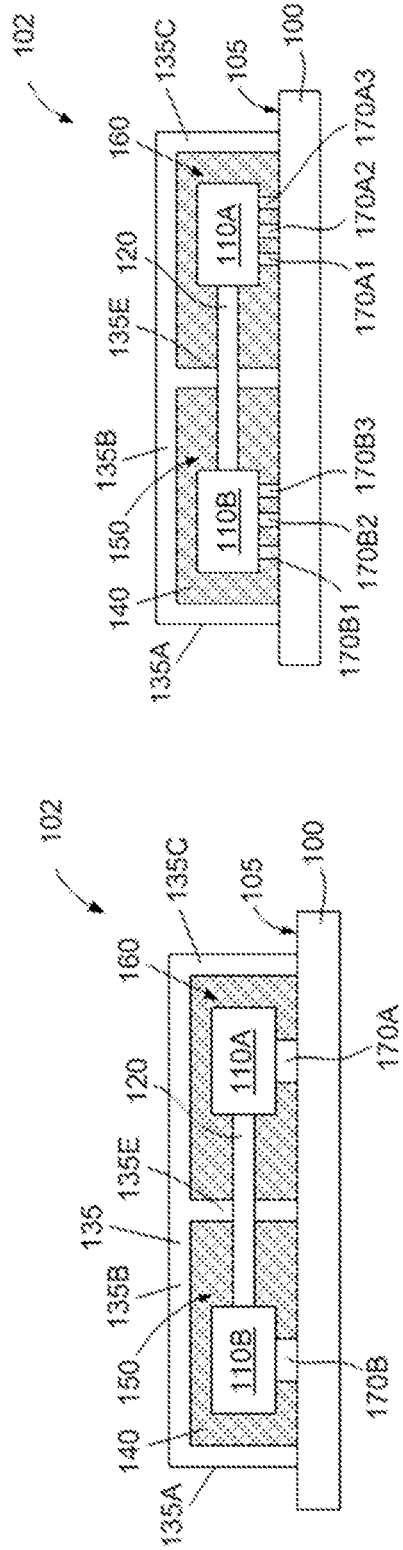

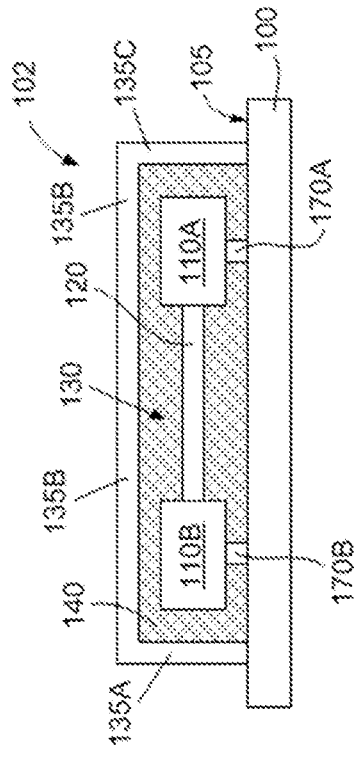
Figure 70I1
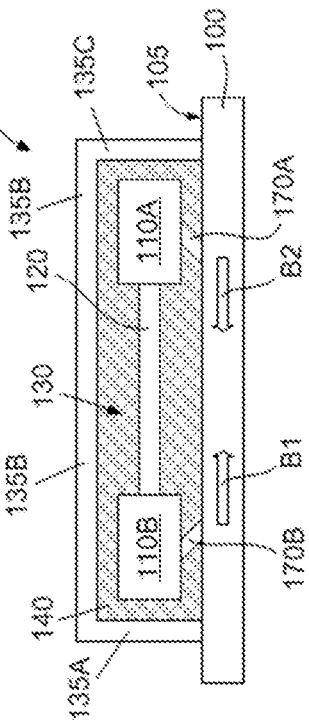
Figure 70J1
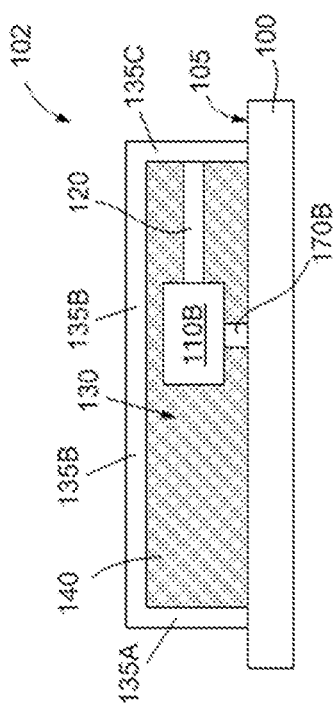
Figure 70I2
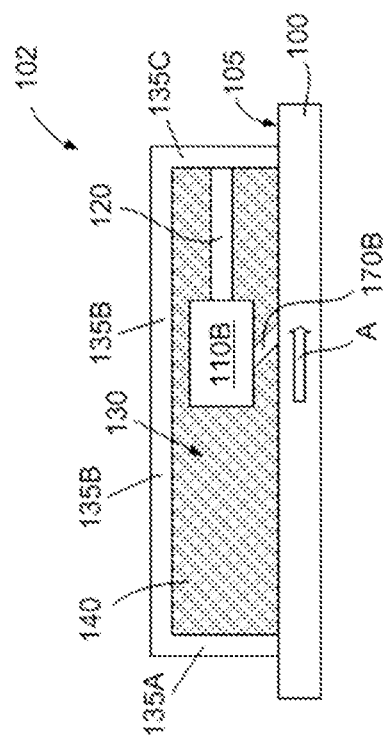
Figure 70J2

A. Initial (0%)
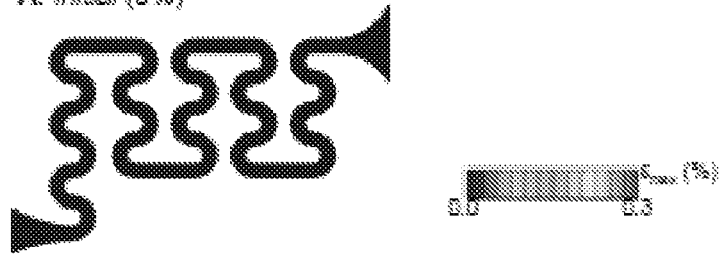
B. Bonded onto the top of Ecoflex at two ends, and the center part is freestanding
C. Fully bonded onto the top of Ecoflex (0.5 mm, 166.42 kPa)
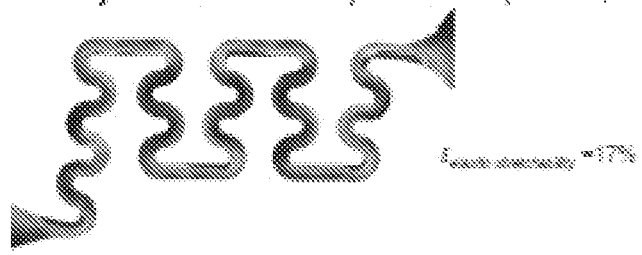
D. Fully embedded in the middle of Ecoflex (1.0 mm, 166.42 kPa)
Figure 75

STRETCHABLE ELECTRONIC SYSTEMS WITH CONTAINMENT CHAMBERS

CROSS-REFERENCE TO RELATED APPLICATIONS

This application is a U.S. National Stage Application under 35 U.S.C. § 371 of International Application No. PCT/US2014/014944, filed Feb. 5, 2014, which claims the benefit of and is a continuation-in-part of U.S. patent application Ser. No. 13/835,284, filed Mar. 15, 2013, U.S. Provisional Patent Application No. 61/761,412, filed Feb. 6, 2013, and U.S. Provisional Patent Application No. 61/930,732, filed Jan. 23, 2014. Each of these applications is hereby incorporated by reference in its entirety.

STATEMENT REGARDING FEDERALLY SPONSORED RESEARCH OR DEVELOPMENT

This invention was made at least in part with U.S. government support under OISE-1043143 and ECCS-0824129 awarded by the National Science Foundation and under DEFG02-91ER45439, DEFG02-07ER46471 and DEFG02-07ER46453 awarded by the Department of Energy. The U.S. government has certain rights in the invention.

BACKGROUND OF INVENTION

Since the first demonstration of a printed, all polymer transistor in 1994, a great deal of interest has been directed at a potential new class of electronic systems comprising flexible integrated electronic devices on plastic substrates. [Garnier, F., Hajlaoui, R., Yassar, A. and Srivastava, P., Science, Vol. 265, pgs 1684-1686] Recently, substantial research has been directed toward developing new solution processable materials for conductors, dielectrics and semiconductors for flexible plastic electronic devices. Progress in the field of flexible electronics, however, is not only driven by the development of new solution processable materials but also by new device component geometries, efficient device and device component processing methods and high resolution patterning techniques applicable to flexible electronic systems. It is expected that such materials, device configurations and fabrication methods will play an essential role in the rapidly emerging new class of flexible integrated electronic devices, systems and circuits.

Interest in the field of flexible electronics arises out of several important advantages provided by this technology. For example, the inherent flexibility of substrate materials allows them to be integrated into many shapes providing for a large number of useful device configurations not possible with brittle conventional silicon based electronic devices. In addition, the combination of solution processable component materials and flexible substrates enables fabrication by continuous, high speed, printing techniques capable of generating electronic devices over large substrate areas at low cost.

The design and fabrication of flexible electronic devices exhibiting good electronic performance, however, present a number of significant challenges. First, the well-developed methods of making conventional silicon based electronic devices are incompatible with most flexible materials. For example, traditional high quality inorganic semiconductor components, such as single crystalline silicon or germanium semiconductors, are typically processed by growing thin films at temperatures (>1000 degrees Celsius) that significantly exceed the melting or decomposition temperatures of most plastic substrates. In addition, most inorganic semiconductors are not intrinsically soluble in convenient solvents that would allow for solution based processing and delivery. Further, although many amorphous silicon, organic or hybrid organic-inorganic semiconductors are compatible with incorporation into flexible substrates and can be processed at relatively low temperatures, these materials do not have electronic properties capable of providing integrated electronic devices capable of good electronic performance. For example, thin film transistors having semiconductor elements made of these materials exhibit field effect mobilities approximately three orders of magnitude less than complementary single crystalline silicon based devices. As a result of these limitations, flexible electronic devices are presently limited to specific applications not requiring high performance, such as use in switching elements for active matrix flat panel displays with non-emissive pixels and in light emitting diodes.

Flexible electronic circuitry is an active area of research in a number of fields including flexible displays, electroactive surfaces of arbitrary shapes such as electronic textiles and electronic skin. These circuits often are unable to sufficiently conform to their surroundings because of an inability of the conducting components to stretch in response to conformation changes. Accordingly, those flexible circuits are prone to damage and electronic degradation and can be unreliable under rigorous and/or repeated conformation change. Flexible circuits require stretchable and bendable interconnects that remain intact while cycling through stretching and relaxation.

Conductors that are capable of both bending and elasticity are generally made by embedding metal particles in an elastomer such as silicone. Those conductive rubbers are both mechanically elastic and electrically conductive. The drawbacks of a conductive rubber include high electrical resistivity and significant resistance changes under stretching, thereby resulting in overall poor interconnect performance and reliability.

Gray et al. discuss constructing elastomeric electronics using microfabricated tortuous wires encased in a silicone elastomer capable of linear strains up to 54% while maintaining conductivity. In that study, the wires are formed as a helical spring-shape. In contrast to straight-line wires that fractured at low strains (e.g., 2.4%), tortuous wires remained conductive at significantly higher strains (e.g., 27.2%). Such a wire geometry relies on the ability of wires to elongate by bending rather than stretching. That system suffers limitations in the ability to controllably and precisely pattern in different shapes and in additional planes, thereby limiting the ability to tailor systems to different strain and bending regimes.

Studies suggest that elastically stretchable metal interconnects experience an increase in resistance with mechanical strain. (Mandlik et al. 2006). Mandlik et al. attempt to minimize this resistance change by depositing metal film on pyramidal nanopatterned surfaces. That study, however, relies on the relief feature to generate microcracks that impart stretchability to thin metal lines. The microcracks facilitate metal elastic deformation by out of plane twisting and deformation. Those metal cracks, however, are not compatible with thick metal films, and instead are compatible with a rather narrow range of thin metal films (e.g., on the order of less than 30 nm) that are deposited on top of patterned elastomers.

One manner of imparting stretchability to metal interconnects is by prestraining (e.g., 15%-25%) the substrate during conductor (e.g., metal) application, followed by spontaneous relief of the prestain, thereby inducing a waviness to the metal conductor interconnects. (see, e.g., Lacour et al. (2003); (2005); (2004), Jones et al. (2004); Huck et al. (2000); Bowden et al. (1998)). Lacour et al. (2003) report by initially compressing gold stripes to generate spontaneously wrinkled gold stripes, electrical continuity is maintained under strains of up to 22% (compared to fracture strains of gold films on elastic substrates of a few percent). That study, however, used comparatively thin layers of metal films (e.g., about 105 nm) and is relatively limited in that the system could potentially make electrical conductors that could be stretched by about 10%.

U.S. Pat. Nos. 7,557,367, 7,521,292, and 8,217,381 and US Patent Publication Nos. 2010/0002402, 2012/0157804, and 2011/0230747 describe flexible and/or stretchable electronic systems accessed by microfabrication pathways including printing-based techniques. The stretchable systems of these references include devices having distributed electronic device components interconnected via deformable electronic interconnects, optionally capable of elastic responses to large strain deformation. The systems of these references include electronic devices for applications including tissue mounted biomedical devices, solar energy and large area macroelectronic systems.

From the forgoing, it is apparent there is a need for electronic devices such as interconnects and other electronic components having improved stretchability, electrical properties and related processes for rapid and reliable manufacture of stretchable interconnects in a variety of different configurations. Progress in the field of flexible electronics is expected to play a critical role in a number of important emerging and established technologies. The success of these applications of flexible electronics technology depends strongly, however, on the continued development of new materials, device configurations and commercially feasible fabrication pathways for making integrated electronic circuits and devices exhibiting good electronic, mechanical and optical properties in flexed, deformed and bent conformations. Particularly, high performance, mechanically extensible materials and device configurations are needed exhibiting useful electronic and mechanical properties in folded, stretched and/or contracted conformations.

SUMMARY OF THE INVENTION

The present invention provides electronic systems, including device arrays, comprising functional device(s) and/or device component(s) at least partially enclosed via one or more containment chambers, such that the device(s) and/or device component(s) are at least partially, and optionally entirely, immersed in a containment fluid or low modulus solid. Useful containment fluids for use in containment chambers of electronic devices of the invention include lubricants, electrolytes and/or electronically resistive fluids. In some embodiments, for example, electronic systems of the invention comprise one or more electronic devices and/or device components provided in a free-standing and/or tethered configuration that decouples, or otherwise mechanically isolates, forces originating upon deformation, stretching or compression of a supporting substrate from the free standing or tethered device or device component, for example, so as to decrease the strain on the one or more electronic devices and/or device components caused by deformation, stretching or compression of the supporting substrate by a factor of 4 to 1000 times, and optionally greater than 10 times, relative to a comparable device having an equivalent device or device component provided in a configuration where it is directly bonded to the supporting substrate.

In an embodiment, for example, the invention provides systems combining elastomeric materials, fluid packaging and devices or device components having a free standing or tethered geometry enabling useful mechanical, electronic and/or optical properties, for example, when provided in compressed, elongated, stretched and/or deformed configurations. Devices of the invention are useful for a wide range of applications including power generation, communications, sensing, photovoltaics, displays, generation of electromagnetic radiation, medical devices, conformable electronics, large area electronics, wearable electronics, electronic paper, and the like.

In an aspect, for example, the invention provides an electronic system comprising: (i) a substrate; (ii) an electronic device or device component supported by the substrate; wherein the electronic device or device component is free standing or tethered to the substrate; and (iii) a containment chamber at least partially enclosing the electronic device or device component; wherein the containment chamber is at least partially filled with a containment fluid or a low modulus solid.

In an aspect, for example, the invention provides an electronic system comprising: (i) an ultra low modulus layer; (ii) a substrate supported by the ultra low modulus layer; (iii) an electronic device or device component supported by the substrate; wherein the electronic device or device component is free standing or tethered to the substrate; and a containment chamber, comprising a plurality of side walls and a top wall, at least partially enclosing the electronic device or device component; wherein the containment chamber is at least partially filled with a containment fluid or a low modulus solid; wherein the substrate has a Young's modulus greater than a Young's modulus of the ultra low modulus layer and the top wall has a Young's modulus greater than a Young's modulus of the containment fluid or the low modulus solid such that a Young's modulus profile of the system spatially varies along an axis substantially perpendicular to the ultra low modulus layer.

In an embodiment, for example, the free standing or tethered configuration of the electronic device or device component at least partially decouples motion and/or deformation of the substrate from the electronic device or device component. In an embodiment, for example, the free standing or tethered configuration of the electronic device or device component at least partially decouples forces generated by elongation, compression or deformation of the substrate from the electronic device or device component.

In an embodiment, an ultra low modulus layer is provided on one surface of a substrate. For example, the ultra low modulus layer may improve adherence of the substrate to a surface. In an embodiment, the ultra low modulus layer may comprise ECOFLEX® silicone elastomer. In an embodiment, the ultra low modulus layer has a Young's modulus less than or equal to 150 KPa, or less than or equal to 100 KPa, or less than or equal to 50 KPa. In an embodiment, the ultra low modulus layer has a Young's modulus selected from the range of 50 KPa to 150 Pa, or 50 KPa to 100 KPa.

An array of electronically interconnected devices is also described, where the device component layout on the substrate may be ordered, registered, random or arbitrary. A plurality of devices or device components may be enclosed within a single containment chamber and/or one or more devices or device components may be segregated into a compartmentalized or nested containment chamber. For example, a device or device component in a compartmentalized or nested containment chamber may be isolated from bulk devices or device components to perform a solitary function, e.g. to communicate with exterior devices and/or to communicate or otherwise interface with an external environment. A geometry of a device component layout of certain aspects of the invention allows different components to communicate or interface with one another and/or allows device components to interface with an external environment, e.g. a tissue interface.

In an embodiment, the device of the invention is characterized by an integrated electronic device and/or electronic circuit comprising a plurality of integrated device components, wherein the integrated electronic device and/or electronic circuit is provided as a free standing or tethered structure enclosed within a single containment chamber. Devices of this aspect may communicate with other devices (e.g. in a device array) or with an external environment via a range of systems including wired communication and/or power systems, optical communication systems, radio frequency systems, and/or electrical interconnects which connect the device or circuit provided within the containment chamber to devices or device components external to the containment chamber. In an embodiment, for example, a single freestanding or tethered integrated circuit or chip is provided in a single containment chamber.

In an embodiment, an electronic device or device component is provided on a receiving surface of a substrate or on an intermediate structure provided between the substrate and the electronic device or device component. As will be understood a wide range of intermediate structures may be used to support devices and device components of the invention including functional device component structures (e.g. electrodes, electrical insulators, dielectric structures, semiconductor structures, etc.) and structural device component structures (e.g., thin film structures, low modulus solids, relief features, particles, pedestals, membranes, etc.).

In an embodiment, a containment chamber comprises one or more enclosing structures positioned to at least partially surround an exterior portion of an electronic device or device component, optionally entirely enclosing the device or device component. The one or more enclosing structures of the containment chamber may be operationally coupled to a supporting surface or an intermediate structure provided between the supporting surface and the one or more enclosing structures, for example via lamination, chemical bonding and/or use of adhesives. In an embodiment, the one or more enclosing structures of the containment chamber are not in physical contact with the electronic device or device component, and optionally for some embodiments all of the enclosing structures of the containment chamber are not in physical contact with the electronic device or device component. For example, the enclosing structures may comprise one or more chamber walls or barrier structures each positioned at least 1000 microns from a side of the electronic device or device component, optionally for some embodiments at least 100 microns from a side of the electronic device or device component and optionally for some embodiments at least 10 microns from a side of the electronic device or device component. In an embodiment, for example, a barrier structure or chamber wall is provided that constrains movement of the device or device component, for example, by physically impeding or otherwise blocking movement of the device or component. In an embodiment, for example, a barrier structure or chamber wall is provided that constrains movement of the device or device component in a direction parallel to a surface of the substrate, e.g., a supporting surface of the substrate directly or indirectly supporting the device or device component, to less than or equal to 1000 microns, optionally for some embodiments less than or equal to 100 microns and optionally for some embodiments less than or equal to 10 microns. In an embodiment, for example, a barrier structure or chamber wall is provided that constrains movement of the device or device component in a direction orthogonal to a surface of the substrate, e.g., a supporting surface of the substrate directly or indirectly supporting the device or device component, to less than or equal to 1000 microns, optionally for some embodiments less than or equal to 100 microns and optionally for some embodiments less than or equal to 10 microns. In an embodiment, for example, one or more of the enclosing structures of the containment chamber are in physical contact with the device or device component. In an embodiment, for example, one or more of the enclosing structures of the containment chamber are not in physical contact with the device or device component, for example, when provided in an undeformed state.

In an embodiment, the containment chamber further comprises one or more recessed features provided in the substrate to accommodate the device or device component, for example, partially surrounding the electronic device or device component, where the one or more enclosing structures are provided to at least partially enclose the recessed features. For example, the recessed features of the containment chamber may comprise one or more chamber walls or barrier structures each positioned at least 1000 microns from a side of the electronic device or device component, optionally for some embodiments at least 100 microns from a side of the electronic device or device component and optionally for some embodiments at least 10 microns from a side of the electronic device or device component. Typically, at least a portion of the enclosing structures of the containment chamber is physically or chemically bonded (e.g., laminated, glued etc.) to the substrate or an intermediate structure provided between the substrate and the enclosing structure. For example, a flip chip bonder may be used to bond commercial off the shelf (COTS) chips and/or bare dies with anisotropic conductive film or solder bumper at the chip/metal interconnect interface. In some embodiments, COTS chips or bare die have a modulus from 10 GPa to 100 GPa, and a tensile rigidity from 0.01 GPa·mm$^2$ to 1000 GPa·mm$^2$.

In an embodiment, a barrier structure limits or otherwise restricts movement of a free standing or tethered device or device component, for example limiting movement in a direction parallel and/or orthogonal to a supporting surface or receiving surface of a substrate. Exemplary barrier structures include but are not limited to corrals, relief features, embossed features, indentations or depressions, inner chamber walls of the containment chamber, the containment chamber itself, bumpers and the like. In an embodiment, barrier structures are positioned at least 1000 microns from a side of the electronic device or device component, optionally for some embodiments at least 100 microns from a side of the electronic device or device component and optionally for some embodiments at least 10 microns from a side of the electronic device or device component. In an embodiment, barrier structures are positioned between 10 microns and 100 millimeters from a side of an electronic device or device component, or optionally between 100 microns and 5 millimeters from a side of an electronic device or device component, or optionally between 100 microns and 1 millimeter from a side of an electronic device or device component. In some embodiments, barrier structures have a height, h, that is less than (e.g., 90% or less, optionally 60% or less) the full height of the containment chamber, such that a gap exists between the barrier structure and the top wall of the containment chamber. Alternatively, the invention includes barrier structures that extend the entire height of a containment chamber. The height of a barrier structure is, however, at least sufficient to prevent a free standing device or device component from moving or otherwise extending over the barrier structure through a gap between the barrier structure and a top region of the containment chamber.

In an embodiment, for example, the containment fluid or low modulus solid mitigates forces of friction acting on the electronic device or device component, for example by functioning as a lubricant, for example to decrease the force of friction between moving surfaces of the device or device component. In some embodiments, for example, the containment fluid or low modulus solid decreases friction so as to prevent degradation or failure of the device of device component, for example, by decreasing friction generated by rubbing or other physical interactions of surfaces of the device or device components. In an embodiment, for example, the containment fluid or low modulus solid functions as a lubricant to decrease friction generated by physical interaction of an electrical interconnect with itself and/or other electrical interconnects or other components of a device. In an embodiment, the containment fluid or low modulus solid decreases the extent of friction between one or more devices or device components by more than a factor of 2, optionally for some embodiments by more than a factor of 10 and optionally for some embodiments by more than a factor of 100, relative to a configuration not having the containment fluid present.

In an embodiment, the electronic device or device component is a free standing or tethered fully formed chip or integrated circuit or a compound thereof. By utilizing the tethering, selective bonding and/or floating of the fluid containment strategy described herein, mechanical loads of the chips/integrated circuit to the elastomeric substrate are minimized. In an embodiment, the electronic device or device component is a single crystalline semiconductor structure or electronic device, such as a single crystalline inorganic semiconductor structure or electronic device including high purity inorganic single crystalline materials and/or doped inorganic single crystalline materials. In an embodiment, the electronic device or device component is a single crystalline semiconductor structure or device component, which may be operationally connected to at least one additional device component or structure selected from the group consisting of a conducting structure, a dielectric structure, an electrode, a cathode, an anode, and an additional semiconductor structure. In an embodiment, for example, the device or device component comprises single crystalline silicon, germanium, III-V semiconductor (e.g., GaAs) or diamond. In an embodiment, for example, the device or device component comprises a piezoelectric material, such as a piezoelectric semiconductor material.

A single crystalline semiconductor electronic device or device component may, for example, comprise one or more electronic devices selected from the group consisting of a transistor, an electrochemical cell, a fuel cell, an integrated circuit, a solar cell, a laser, a light emitting diode, a nanoelectromechanical device, a microelectromechanical device, a photodiode, a P-N junction, a sensor, a memory device, an integrated circuit, a complementary logic circuit and arrays or combinations of these.

In an embodiment, the electronic device or device component has a thickness selected from the range of 10 nanometers to about 1000 microns, a width selected from the range of 100 nanometers to about 10 millimeter and a length selected from the range of 500 nanometers to about 10 millimeter. In an embodiment, the electronic device or device component has a thickness selected from the range of 10 nanometers to about 100 microns, a width selected from the range of 100 nanometers to about 1 millimeter and a length selected from the range of 1 micron to about 1 millimeter. In an embodiment, the electronic device or device component has a thickness selected from the range of 500 nanometers to about 1000 microns, a width selected from the range of 1 micron to about 1 millimeter and a length selected from the range of 1 micron to about 1 millimeter.

In an embodiment, and electronic system may further comprise one or more additional electronic devices or device components at least partially enclosed by a containment chamber or at least partially enclosed by one or more additional containment chambers. The invention includes devices comprising an array of electronic devices or device components, optionally electrically interconnected with each other, provided in the same or a plurality of containment chambers. In an embodiment, for example, a device of the invention includes 5 or more devices or device components provided in a containment chamber, optionally 20 or more devices or device components provided in a containment chamber, and optionally 100 or more devices or device components provided in a containment chamber.

In an embodiment, the electronic device or device component is an electrical interconnect, such as a stretchable electrical interconnect. For example, one or more stretchable electrical interconnects may be in electrical contact with an electronic device or device component, and at least a portion of the one or more stretchable electrical interconnects may be at least partially embedded in an enclosing structure of a containment chamber.

In an embodiment, an enclosing structure of a containment chamber, such as a chamber wall or barrier structure, has a Young's modulus selected from the range of 1 KPa to 1 GPa, or selected from the range of 1 KPa to 100 MPa, or selected from the range of 100 KPa to 1 MPa, or selected from the range of 250 KPa to 750 KPa. In an embodiment, for example, an enclosing structure of a containment chamber, such as a chamber wall or barrier structure, has a Young's modulus that is less than or equal to 10 MPa, optionally less than or equal to 1 MPa, and, optionally less than or equal to 500 KPa, optionally less than or equal to 200 KPa. In an embodiment, an enclosing structure of a containment chamber, such as a chamber wall or barrier structure, has a flexural rigidity selected from the range of $10^{-13}$ N·m to $10^5$ N·m, or selected from the range of $10^{-10}$ N·m to $10^3$ N·m, or selected from the range of $10^{-5}$ N·m to 10 N·m. In an embodiment, an enclosing structure of a containment chamber has a permeability selected from the range of 1 fg·mm/m$^2$·day to 1 g·mm/m$^2$·day, or selected from the range of 1 ng·mm/m$^2$·day to 0.5 g·mm/m$^2$·day, or selected from the range of 1 mg·mm/m$^2$·day to 0.1 g·mm/m$^2$·day. In an embodiment, an enclosing structure of a containment chamber has a coefficient of thermal expansion selected from the range of $10^{-7}$° C.$^{-1}$ to $10^{-2}$° C.$^{-1}$, or selected from the range of $10^{-5}$° C.$^{-1}$ to $10^{-1}$° C.$^{-1}$, or selected from the range of $10^{-3}$° C.$^{-1}$ to $10$° C.$^{-1}$.

In an embodiment, the containment chamber comprises a material that is not permeable to the containment fluid. For example, a wide range of polymers are useful for containment chambers of the invention. For example, the containment chamber may comprise a soft material capable of being physically stretched, such as an elastomer. A wide range of polymers are useful for containment chambers of the invention. In an embodiment, for example, the containment chamber comprises a material selected form the group consisting of polydimethylsiloxane (PDMS), ECOFLEX® silicone elastomer, a silicone, a rubber, and a polymer. In an embodiment, PDMS base may be used without the addition of any curing agent.

In an embodiment, the containment chamber has a height selected from the range of 10 µm to 10 cm, or selected from the range of 100 µm to 5 cm, or selected from the range of 1 mm to 0.5 cm, or selected from the range of 5 mm to 50 mm. In an embodiment, for example, the containment chamber has a height that is greater than or equal to 10 µm, and optionally for some embodiments greater than or equal to 100 µm, and optionally for some embodiments greater than or equal to 1000 µm. In an embodiment, the containment chamber has lateral dimensions (e.g., length and width) selected from the range of 10 µm to 10 m, or selected from the range of 100 µm to 1 m, or selected from the range of 1 mm to 0.1 m, or selected from the range of 50 mm to 50 cm. In an embodiment, for example, the containment chamber has a lateral dimensions that are greater than or equal to 10 µm, and optionally for some embodiments greater than or equal to 100 µm, and optionally for some embodiments greater than or equal to 1000 µm. In an embodiment, the containment chamber has a volume selected from the range of 1000 µm$^3$ to 10 m$^3$, or selected from the range of 1 µm$^3$ to 1 m$^3$, or selected from the range of 100 mm$^3$ to 100 cm$^3$, or selected from the range of 10 mm$^3$ to 1 cm$^3$. In an embodiment, for example, the containment chamber has a volume that is greater than or equal to 1000 µm$^3$, and optionally for some embodiments greater than or equal to 1 µm$^3$ µm, and optionally for some embodiments greater than or equal to 100 mm$^3$. In an embodiment, the containment chamber is structurally self-supporting.

In an embodiment, the containment chamber is formed of two thin sheets of elastomer sealed along an outer border to form a pouch. The fluid container may have a form factor or geometry selected from a 3D square, a 3D rectangle, a sphere, a prism, or an arbitrary form, depending on the layout of the electronic device or device component contained in the chamber.

In an embodiment, at least 50% of the volume of containment chamber is occupied by a containment fluid or low modulus solid, and optionally at least 90% of the volume of the containment chamber is occupied by a containment fluid or low modulus solid, and optionally at least 98% of the volume of the containment chamber is occupied by a containment fluid or low modulus solid. In an embodiment, the containment fluid occupies a percentage of the containment chamber selected from the range of 1% to 99.9%, or selected from the range of 1% to 99%, or selected from the range of 25% to 90%, or selected from the range of 50% to 90%, or selected from the range of 50% to 75%. In an embodiment, at least 0.1% of the volume of the containment chamber is occupied by an electronic device or device component. In an embodiment, the electronic device or device component occupies a percentage of the containment chamber selected from the range of 1% to 99%, or selected from the range of 2% to 50%, or selected from the range of 5% to 30%, or selected from the range of 5% to 15%. The containment fluid may, for example, be in physical contact with the electronic device or device component, for example, in physical contact with one or all external surfaces of the device or device component.

In an embodiment, the electronic device or device component is entirely immersed in the containment fluid or low modulus solid. Suitable containment fluids include but are not limited to functional fluids, such as liquids, colloids, gels, gases, lubricants, electrolytes, thermally functional fluids, fluids having a low viscosity, chemically inert fluids, fluids having a low ionic resistance, and fluids having a high ionic resistance (e.g., electrically insulating fluids). For example, suitable lubricants include oils (natural or synthetic) and uncured silicone elastomer precursors, such as a polydimethylsiloxane precursor. For example, suitable lubricants include silicones, halocarbons or fluorocarbons. Suitable electrolytes include non-aqueous lithium ion battery electrolytes, such as lithium salts, e.g. $LiPF_6$, $LiBF_4$ or $LiClO_4$ in an organic solvent, such as ethylene carbonate, dimethyl carbonate, and diethyl carbonate. Suitable thermally functional fluids include heat transfer fluids, such as fluids having a finite heat transfer coefficient, in order to dissipate the heat generated from the electronic device components. In an embodiment, the containment fluid is a material selected from the group consisting of a prepolymer, a solvent, a nonaqueous electrolyte, a silicone, a natural oil, a synthetic oil, a polyolefin and a fluorocarbon. In an embodiment, one or more colloids may be added to the containment fluid to adjust the fluid's viscosity, optical properties, and/or electrical properties. In an embodiment, for example, the containment fluid is a thermally stable fluid.

In an embodiment, a containment fluid has a vapor pressure less than or equal to 760 Torr at 298 K. In an embodiment, a containment fluid has a viscosity selected from 0.1 cP to 10000 cP at 298 K, or selected from 10 cP to 500 cP at 298 K. In an embodiment, a containment fluid has an ionic resistance selected from $10^7$ ohm·cm to infinity, or selected from $10^{10}$ ohm·cm to $10^{70}$ ohm·cm. In an embodiment, a containment fluid has an electronic resistance selected from $10^7$ ohm·cm to infinity, or selected from $10^{10}$ ohm·cm to $10^{70}$ ohm·cm. In an embodiment, a containment fluid has a vapor pressure selected from 100 Pa to 1 MPa, or selected from 500 Pa to 1 KPa. In an embodiment, a containment fluid has a vapor pressure selected from $10^{-7 \circ}$ C.$^{-1}$ to $10^{-1 \circ}$ C.$^{-1}$, or selected from $10^{-5 \circ}$ C.$^{-1}$ to $10^{-3 \circ}$ C.$^{-1}$. In an embodiment, a containment fluid has a surface tension or wetting property, depending on the materials used for constructing the liquid chamber, such that the fluid should has a contact angle below 90°, e.g., selected from 1 dyne/cm to 70 dynes/cm. In an embodiment, a containment fluid has a high ionic conductivity, for example, so as to function as an electrolyte in an electrochemical system, such as an ionic conductivity greater than or equal to 0.001 S cm$^{-1}$, optionally greater than or equal to 0.01 S cm$^{-1}$, optionally greater than or equal to 0.005 S cm$^{-1}$.

Use of low modulus solids as containment materials addresses important design considerations, for example, by reducing or eliminating leakage of the containment material and/or drying of the containment chamber due to evaporation of the containment material. Other containment material properties that are important for the design of systems using containment chambers include, but are not limited to, viscosity, vapor pressure, porosity, elastic modulus, and temperature dependence of the elastic modulus. For example, the elastic modulus of a material typically decreases with increasing temperature, and some electronic systems with containment chambers may be operated in variable temperature environments (e.g., in unregulated environments, in vivo, in electronic systems that generate heat as a waste product, etc). In an embodiment, the low modulus solid is a material selected from the group consisting of a gel, a prepolymer, a silicone, a natural oil, a synthetic oil, a polyolefin or a fluorocarbon. In an embodiment, the low modulus solid has a Young's modulus less than or equal to 1 MPa, or less than or equal to 0.5 MPa, or less than or equal to 200 KPa. In an embodiment, the low modulus solid has a Young's modulus selected from the range of 2 KPa to 1 MPa, or selected from the range of 2 KPa to 500 KPa, or selected from the range of 2 KPa to 200 KPa, or selected from the range of 2 KPa to 100 KPa, or selected from the range of 2 KPa to 50 KPa. In an embodiment, the low modulus solid has a Young's modulus that is lower than a Young's modulus of the substrate or the top wall of the containment chamber by a factor of 100, or by a factor of 10, or by a factor of 5, or by a factor of 2. In an embodiment, the low modulus solid has a Young's modulus that is lower than a Young's modulus of the substrate or the top wall of the containment chamber by a factor of 2 or more. In an embodiment, a low modulus solid is selected from the group consisting of silbione, Exoflex®, solaris, PDMS and combinations of these. Silbione® RT Gel 4717 A&B (Bluestar Silicones USA, East Brunswick, N.J.) is a biocompatible, two-component silicone elastomer that crosslinks at room temperature to produce an elastic and resistant gel. Solaris® is a low viscosity, clear and colorless liquid platinum cure silicone rubber distributed by Smooth-On, Inc., Easton, Pa. In an embodiment, low modulus solid materials that are typically cured or crosslinked by mixing with a curing agent may be used in the absence of any curing agent.

In an embodiment, a level of containment fluid or low modulus solid within a containment chamber is monitored, adjusted or controlled through one or more microfluidic channels operationally connecting one or more containment chambers to a reservoir of containment fluid or low modulus solid.

In an embodiment, the electronic device or device component is a free standing structure supported by or in physical contact with the substrate. As used herein, free standing refers to a configuration wherein the device or device component is supported by, but not bonded to, a surface of the substrate or an intermediate substrate between the substrate and the device or device component. In an embodiment, for example, a free standing device or device component is capable of movement relative to a substrate surface, such as movement in a direction parallel and/or orthogonal to a substrate surface, such as a supporting or receiving surface of the substrate. A free standing structure may, however, undergo and/or participate in one or more associative interactions with the substrate or an intermediate structure provided between the substrate and the free standing structure, for example wherein the associative interaction is a dipole-dipole interaction or a Van der Waals interaction. In some embodiments, associative interactions between electronic devices or device components and a supporting layer or substrate may cause stiction. To reduce or eliminate stiction, in some embodiments, a supporting layer or substrate may be textured, microstructured or nanostructured to reduce the contact area between the electronic device or device component and the supporting layer or substrate.

In an embodiment, an electronic device or device component, such as a semiconductor device component, electrode and/or electrical interconnect, is a tethered structure supported by one or more tethering structures, such as relief features of a substrate or one or more relief features supported by the substrate. In an embodiment, for example, a tethered device or device component is capable of movement relative to a substrate surface, such as movement in a direction parallel and/or orthogonal to a substrate surface, such as a supporting or receiving surface of the substrate. In an embodiment, for example, a tethering structure, such as one or more relief features, is bonded to the substrate or an intermediate structure provided between the tethering structure and the substrate. In an embodiment, for example, a tethering structure, such as one or more relief features, is bonded to a portion, but not all, of a surface of the device or device component, such as 30% or less than the area of a bottom surface of the device or device component, optionally 10% or less than the area of a bottom surface of the device or device component, optionally 5% or less than the area of a bottom surface of the device or device component and optionally 1% or less than the area of a bottom surface of the device or device component. In an embodiment, for example, a tethering structure, such as one or more relief features, is bonded to a portion, but not all, of a surface of the device or device component, such as between 1% and 30% of the area of a bottom surface of the device or device component, optionally between 1% and 10% of the area of a bottom surface of the device or device component and optionally between 1% and 5% of the area of a bottom surface of the device or device component. Such embodiments having selective bonding between the tethering structure, such as one or more relief features, and some but not all of a surface of device or device component is particularly useful for achieving at least partial mechanical decoupling of the device or device component from motion and/or deformation of the substrate. The tethered geometry of some embodiments is useful for mechanically isolating the device component from the substrate, for example, providing mechanical isolation from movement and/or deformation of the substrate. In some embodiments, the tethered geometry of some embodiments is useful for holding the position of the device component, such as a semiconductor device component, electrode and/or electrical interconnect. In some embodiments, the tethered geometry is useful for preventing tangling of the device component, such as tangling of a semiconductor device component, electrode and/or electrical interconnect, for example, during or after stretching and release cycles.

In an embodiment, for example, an electronic device or device component is a tethered structure supported by array of 5 to 1000 relief features, and optionally for some examples an array of 5 to 100 relief features, and optionally for some examples an array of 5 to 20 relief features. In an embodiment, for example, an electronic device or device component is a tethered structure supported by at least 5 relief features, optionally for some embodiments supported by at least 10 relief features and optionally for some embodiments supported by at least 100 relief features. A wide range of tethering structures are useful in the present invention including one or more columns, pedestals, pillars, platforms, fingers, and the like. Tethering structures of the invention may have a wide range of cross sectional shapes, such as circular, triangular, elliptical, rectangular, trapezoidal and any combination of these. In an embodiment, for example, a tethering structure of the invention extends a length along a direction orthogonal or substantially orthogonal (e.g. within 20 degrees of absolute orthogonal orientation) relative to the substrate surface.

For example, the one or more relief features may comprise a pedestal, or the one or more relief features may comprise an array of at least 10 pedestals, optionally for some embodiments an array of at least 20 pedestals, optionally for some embodiments an array of at least 100 pedestals, and optionally for some embodiments an array of at least 1000 pedestals. In an embodiment, the tethered structure is bonded to the one or more relief features comprising the tethering structure. In an embodiment, relief features of the tethering structure comprise an elastomer, PDMS, ECO-FLEX® silicone elastomer, or a silicone. In an embodiment, for example, the tether comprises a materials different than that of the device or device component.

In an embodiment, for example, each of the one or more relief structures of the tethering structure independently extends a length selected over the range of 100 nm to 1 mm and independently has one or more cross sectional physical dimensions selected over the range of 100 nm to 10 mm, and optionally for some embodiments a length selected over the range of 100 nm to 1000 microns and independently has one or more cross sectional physical dimensions selected over the range of 100 nm to 1000 microns, and optionally for some embodiments a length selected over the range of 1 micron to 1000 microns and independently has one or more cross sectional physical dimensions selected over the range of 1 micron to 1000 microns, and optionally for some embodiments a length selected over the range of 10 micron to 1000 microns and independently has one or more cross sectional physical dimensions selected over the range of 10 micron to 1000 microns.

In an embodiment, a substrate is a flexible substrate or a stretchable substrate, such as a polymer substrate. For example, a wide range of polymers are useful for substrates of the present invention. For example, the substrate may comprise one or more materials selected from the group consisting of an elastomer, PDMS, ECOFLEX® silicone elastomer, spandex, adhesive bandages and silicone. Typically, the substrate has a Young's modulus selected from the range of 1 KPa to 100 MPa, or selected from the range of 10 KPa to 10 MPa, or selected from the range of 20 KPa to 1 MPa. In some embodiments, the substrate has a thickness selected from the range of 100 microns to 100 mm, or selected from the range of 100 microns to 50 mm, or selected from the range of 1 mm to 10 mm. In some embodiments, the substrate has a thickness less than or equal to 1000 mm, optionally less than or equal to 10 mm and optionally less than or equal to 1 mm. In some embodiments, a substrate may have spatially varying elastic properties within a plane of the substrate (e.g. shown by the coordinate axes of FIG. 70S), which may for example provide progressive elasticity and/or strain limiting behavior to prevent overstretching that could damage or break device components or connections. In an embodiment, a substrate may have an in-plane spatially varying Young's modulus that varies within a range of 1 KPa to 100 MPa, or within a range of 10 KPa to 10 MPa, or within a range of 20 KPa to 1 MPa.

In an embodiment, an electronic system may have spatially varying elastic properties out of the plane of the substrate (e.g. along an axis, such as axis N of FIG. 70N, that is substantially perpendicular to the plane of the substrate). In an embodiment, an electronic system may have an out-of-plane spatially varying Young's modulus that varies within a range of 1 KPa to 10 GPa.

In an embodiment, an electronic system comprises one or more electrical interconnects in electrical contact with an electronic device or device component. For example, the one or more electrical interconnects may establish electrical contact between the electronic device or device component and one or more additional electronic devices or device components. The electronic device or device component, the one or more additional electronic devices or device components and the one or more electrical interconnects may be provided in an island bridge geometry, where the electronic devices or device components comprise the islands and where the electrical interconnects comprise the bridges. The electronic device or device component, the one or more additional electronic devices or device components and the one or more electrical interconnects may be provided in a rigid island bridge geometry, where the electronic devices or device components comprise rigid islands and where the electrical interconnects comprise the flexible and/or stretchable bridges.

In an embodiment, an electronic system comprises an array of device components comprising rigid device islands, wherein the one or more electrical interconnects electrically connect adjacent rigid device islands. For example, at least one of the electrical interconnects may electrically connect a device component comprising a first rigid device island with a second device component comprising a second rigid device island. In an embodiment, an electronic system comprises a plurality of device components, where each of the rigid device islands corresponds to a device component. Generally, the physical dimension and geometry of the islands correspond to those of the electronic device or device component.

In an embodiment, one or more electrical interconnects may be a stretchable electrical interconnect configured to provide elasticity, bendability, or both to the electronic system. For example, at least a portion of the one or more stretchable electrical interconnects may have a bent, buckled, folded, curved or serpentine geometry. Further, at least a portion of the one or more stretchable electrical interconnects may have a geometry that is in plane, out of plane, or both in plane and out of plane, relative to a plane defined by a support surface of the substrate, which may curved or substantially flat. In an embodiment, at least a portion of the one or more electrical interconnects has an in plane serpentine geometry.

In an embodiment, an as-fabricated multilayer (polyimide (1.2 μm)/Cu (500 nm)/Au (100 nm)/polyimide (1.2 μm)/(Cu (600 nm)/polyimide (1.2 μm)/Al (600 nm)/polyimide (1.2 μm)) interconnect has an in-plane (or non-coplanar) serpentine geometry, or arc-shaped pop-up layout, with a lateral width of 50 μm-100 μm. The Young's moduli of these materials are polyimide 2.5 GPa, Cu 120 GPa, Au 78 GPa, and Al 70 GPa.

In some embodiments, the free standing and/or tether device geometries of the present invention provide an efficient means of achieving mechanical isolation of the electronic device, or components thereof, from the substrate. This aspect of the invention is beneficial, for example, for reducing the extent of strain on an electronic device component caused by movement or deformation of the substrate. In an embodiment, a free standing or tethered electronic device or device component, such as semiconductor device, chip, etc., is mechanically isolated from the substrate. For comparison, the strain level of a device without mechanical isolation is 4 to 1000 times larger than the strain level of a device that is free standing or tethered according to the present invention.

In an embodiment of a tethered configuration, a plurality of tethers (e.g., a pillar array) are used to support an electronic device, device component or interconnect. The number of tethers will vary depending on the number of devices or device components and the sophistication of the circuit layout. The function of the tethers is to substantially maintain the position of an electronic device or device component or interconnect to prevent physical or electrical interaction (e.g., tangling) during stretching and releasing. In an embodiment, a tether may be cylindrical, conical, rectangular, square, or irregularly shaped. Typically, the lateral dimensions of a tether range from 0.5 mm to 1 mm in diameter when used to support an electronic device or device component having lateral dimensions ranging from 1 mm to 10 mm. Thus, the rigid islands are bonded to tethers on a small portion of their overall area in a selective bonding configuration. In an embodiment, a tether has a height of about 100 µm, a Young's modulus of about 1 KPa to 1 GPa and a flexural rigidity of about $10^{-13}$ N·m to $10^5$ N·m.

In an embodiment, tethers and the substrate are mounted in an etched Si wafer as a single, unitary piece and standard procedures are used to laminate multilayered metal serpentine interconnects onto the tether's surface by UV ozone activation and $SiO_2$ bonding.

In an embodiment, tethers are used to prevent drifting of the rigid device islands and stretchable interconnects are used to prevent entangling of the interconnects during repetitive stretching and releasing processes.

In an embodiment, devices or device components, such as COTS chips as received and after mechanical decapsulation, bare dies and in-house fabricated thin film sensors/devices, are embedded in enclosing structures of a containment chamber. In another embodiment, interconnects are embedded in enclosing structures (e.g. walls) of a containment chamber.

In an embodiment, interconnects are single or multilayered with vias, and conducting metal traces may be insulated, for example, by dielectric polymers, such as polyimide or parylene C or SU8.

In an embodiment, at least a portion of the one or more stretchable electrical interconnects comprises a plurality of electrically conductive structures each independently having a primary unit cell shape comprising a plurality of spatially offset and opposing segments, wherein the conductive structures are connected in a sequence characterized by a secondary shape comprising at least one pair of spatially offset and opposing regions formed from the sequence of electrically conductive structures, where the sequence of conductive structures is capable of undergoing deformation thereby providing stretchability of the stretchable electronic device. In an embodiment, at least a portion of the one or more electrical interconnects comprising the sequence of electrically conductive structures provides an overall self-similar geometry for the stretchable electrical interconnect. For example, the sequence of conductive structures may comprise a monolithic structure and/or the sequence of conductive structures may comprise a wire.

In an embodiment, the secondary shape is similar to the primary unit cell shape but has a different scale. For example, the secondary shape may be similar to the primary unit cell shape but at least 10 times larger than the primary unit cell shape, or at least 25 times larger than the primary unit cell shape, or at least 50 times larger than the primary unit cell shape.

In an embodiment, the sequence of electrically conductive structures is further characterized by a tertiary shape comprising at least one pair of spatially offset and opposing regions formed from a repeating series of the electrically conductive structures comprising the secondary shape.

In an embodiment, the spatially offset and opposing segments of the primary unit cell shape comprise convex and concave regions. For example, the unit cell shape may be a serpentine shape.

In an embodiment an electronic system comprises a transistor, an electrochemical cell, a fuel cell, an integrated circuit, a solar cell, a laser, a light emitting diode, a nanoelectromechanical device, a microelectromechanical device, a photodiode, a P-N junction, a sensor, a memory device, a complementary logic circuit or an array of any of these.

In an aspect, an electrochemical cell comprises: a substrate; a positive electrode forming part of a first electronic device component supported by the substrate; wherein the first electronic device component is free standing or tethered to the substrate; a negative electrode forming part of a second electronic device component supported by the substrate; wherein the second electronic device component is free standing or tethered to the substrate; and a containment chamber at least partially enclosing the positive electrode, the negative electrode or both the positive electrode and the negative electrode; wherein the containment chamber is at least partially filled with an electrolyte fluid allowing for ionic transport between the positive electrode and the negative electrode. In the embodiment, an electrochemical cell further comprises one or more stretchable electrical interconnects in electrical contact with the positive electrode, the negative electrode or both the positive electrode and the negative electrode. For example, each of the one or more stretchable electrical interconnects may independently have a self-similar serpentine geometry. An array comprising a plurality of electronically interconnected electrochemical cells is also described.

In an aspect, a method of making an electronic system comprises: providing a substrate; providing an electronic device or device component that is free standing or tethered to the substrate in a containment chamber on the substrate such that the containment chamber at least partially encloses the electronic device or device component; and at least partially filling the containment chamber with a containment fluid or low modulus solid.

In an aspect, a method of using an electronic system comprises providing an electronic system comprising: a substrate; an electronic device or device component supported by the substrate; wherein the electronic device or device component is free standing or tethered to the substrate; and a containment chamber at least partially enclosing the electronic device or device component; wherein the containment chamber is at least partially filled with a containment fluid or low modulus solid; and applying an electric current to the electronic system.

Stretchable and flexible electronics having the configuration described herein may be used for a variety of device applications. The use of free floating interconnects in a fluid allows the interconnects to freely buckle and deform, which greatly increases the stretchability and flexibility of electronic devices in various fields of use. For example, a free floating interconnect may be used in a lithium ion battery having an array of active material islands connected by wavy interconnects. The islands may be firmly bonded on the substrate, while the wavy interconnects can freely buckle and deform. Stretchable interconnects may also be used in optical systems, such as light emitting diode and photo diode arrays formed as rigid island arrays. Rigid island sensor arrays be also be used to monitor temperature, hydration, pressure, strain and/or biological parameters. For example, by design specific functional circuits, electrophysiological parameters of humans and/or animals can be measured, such as skin temperature, electrocardiograms, electromyograms, electroencephalograms, electrooculograms.

The invention also provides methods of making and using electronic systems including stretchable and/or deformable electronic devices and device arrays. These methods are explicitly intended to be commensurate in scope with the entirety of the description and may be practiced with all devices and embodiments disclosed herein.

Without wishing to be bound by any particular theory, there may be discussion herein of beliefs or understandings of underlying principles relating to the devices and methods disclosed herein. It is recognized that regardless of the ultimate correctness of any mechanistic explanation or hypothesis, an embodiment of the invention can nonetheless be operative and useful.

The invention is further set forth, exemplified and described by the following examples and claims.

BRIEF DESCRIPTION OF THE DRAWINGS

FIG. 8. Deformed configurations (FEA results) of the self-similar electrode for symmetric (a) and anti-symmetric (b) buckling modes under an applied strain of 50%, from different viewing angles (i.e., top, front, side, and three-dimensional (3D) views).

FIG. 29. Illustration an exemplary battery of the present invention undergoing ~100% stretching.

FIG. 36. Images demonstrating stretching of an electronic system.

FIG. 43. List of example circuit functions.

FIG. 48. Illustration of fabrication process of precise selective bonding (2).

FIG. 49. Illustration of reduced sharp corners.

FIG. 53. Exemplary basic fabrication scheme.

FIG. 55. Demonstration of wireless circuit stretching.

FIG. 57. Illustration of exemplary layout design considerations.

FIG. 60. Illustration of exemplary fabricated interconnects.

FIG. 61. Illustration of selective bonding using a fabrication process.

FIG. 63. Illustration of chip depackaging.

FIG. 64. Illustration of a fabricated device.

FIG. 75. 3D-FEA results that illustrate the mechanics advantage of free-floating interconnects in comparison with fully bonded or embedded ones. (A) Initial configuration of one of the interconnects shown in FIG. 72C; (B) the strain distribution of the interconnect only with two ends bonded onto the top of the ECOFLEX® silicone elastomer, when the applied strain reaches the corresponding elastic stretchability (167%) of the interconnect; (C) the strain distribution of the interconnect fully bonded onto the top of the ECOFLEX® silicone elastomer, when the applied strain reaches its elastic stretchability (17%); (D) the strain distribution of the interconnect fully embedded in the middle of the ECOFLEX® silicone elastomer, when the applied strain reaches its elastic stretchability (8%).

DETAILED DESCRIPTION OF THE INVENTION

Figure 1A:
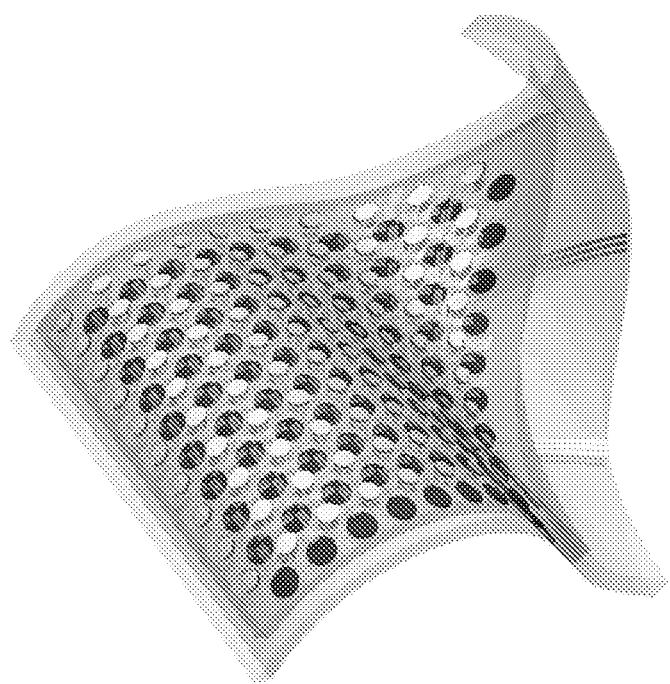
FIG. 1. Aspects in battery layout and design. (a) Schematic illustration of a completed device, in a state of stretching and bending. (b) Exploded view layout of the various layers in the battery structure. (c) Illustration of 'self-similar' serpentine geometries used for the interconnects (black: $1^{st}$ level serpentine; grey: $2^{nd}$ level serpentine). (d) Optical images of the Al electrode pads and self-similar interconnects on Si wafer (left panel; top down view; ~4 unit cells), after transfer printing on a sheet of silicone (middle panel; top down view, in a bent geometry), and with moulded slurries of $LiCoO_2$ (right panel; top down view, in a bent geometry). (e) Optical images of the Cu electrode pads and self-similar interconnects on Si wafer (left panel; top down view; ~4 unit cells), after transfer printing on a sheet of silicone (middle panel; top down view, in a bent geometry), and with moulded slurries of $Li_4Ti_5O_{12}$ (right panel; top down view, in a bent geometry). Scale bars in d and e are 2 mm.

In general, the terms and phrases used herein have their art-recognized meaning, which can be found by reference to standard texts, journal references and contexts known to those skilled in the art. The following definitions are provided to clarify their specific use in the context of the invention.

"Functional layer" refers to a layer that imparts some functionality to the device. For example, the functional layer may contain semiconductor components. Alternatively, the functional layer may comprise multiple layers, such as multiple semiconductor layers separated by support layers. The functional layer may comprise a plurality of patterned elements, such as interconnects running between or below electrodes or islands. The functional layer may be homogeneous or may have one or more properties or materials that are inhomogeneous. "Inhomogeneous property" refers to a physical parameter that can spatially vary, thereby effecting the position of the neutral mechanical plane within a multilayer device.

"Structural layer" refers to a layer that imparts structural functionality, for example by supporting and/or encapsulating and/or partitioning device components.

"Semiconductor" refers to any material that is an insulator at a very low temperature, but which has an appreciable electrical conductivity at a temperature of about 300 Kelvin. In the present description, use of the term semiconductor is intended to be consistent with use of this term in the art of microelectronics and electronic devices. Useful semiconductors include those comprising elemental semiconductors, such as silicon, germanium and diamond, and compound semiconductors, such as group IV compound semiconductors such as SiC and SiGe, group III-V semiconductors such as AlSb, AlAs, AlN, AlP, BN, BP, BAs, GaSb, GaAs, GaN, GaP, InSb, InAs, InN, and InP, group III-V ternary semiconductors such as $Al_xGa_{1-x}As$, group II-VI semiconductors such as CsSe, CdS, CdTe, ZnO, ZnSe, ZnS, and ZnTe, group I-VII semiconductors such as CuCl, group IV-VI semiconductors such as PbS, PbTe, and SnS, layer semiconductors such as $PbI_2$, $MoS_2$, and GaSe, and oxide semiconductors such as CuO and $Cu_2O$. The term semiconductor includes intrinsic semiconductors and extrinsic semiconductors that are doped with one or more selected materials, including semiconductors having p-type doping materials and n-type doping materials, to provide beneficial electronic properties useful for a given application or device. The term semiconductor includes composite materials comprising a mixture of semiconductors and/or dopants. Specific semiconductor materials useful for some embodiments include, but are not limited to, Si, Ge, Se, diamond, fullerenes, SiC, SiGe, SiO, $SiO_2$, SiN, AlSb, AlAs, AlIn, AlN, AlP, AlS, BN, BP, BAs, $As_2S_3$, GaSb, GaAs, GaN, GaP, GaSe, InSb, InAs, InN, InP, CsSe, CdS, CdSe, CdTe, $Cd_3P_2$, $Cd_3As_2$, $Cd_3Sb_2$, ZnO, ZnSe, ZnS, ZnTe, $Zn_3P_2$, $Zn_3As_2$, $Zn_3Sb_2$, $ZnSiP_2$, CuCl, PbS, PbSe, PbTe, FeO, $FeS_2$, NiO, EuO, EuS, PtSi, TlBr, $CrBr_3$, SnS, SnTe, $PbI_2$, $MoS_2$, GaSe, CuO, $Cu_2O$, HgS, HgSe, HgTe, $HgI_2$, MgS, MgSe, MgTe, CaS, CaSe, SrS, SrTe, BaS, BaSe, BaTe, $SnO_2$, TiO, $TiO_2$, $Bi_2S_3$, $Bi_2O_3$, $Bi_2Te_3$, $BiI_3$, $UO_2$, $UO_3$, $AgGaS_2$, $PbMnTe$, $BaTiO_3$, $SrTiO_3$, $LiNbO_3$, $La_2CuO_4$, $La_{0.7}Ca_{0.3}MnO_3$, CdZnTe, CdMnTe, $CuInSe_2$, copper indium gallium selenide (CIGS), HgCdTe, HgZnTe, HgZnSe, PbSnTe, $Tl_2SnTe_5$, $Tl_2GeTe_5$, AlGaAs, AlGaN, AlGaP, AlInAs, AlInSb, AlInP, AlInAsP, AlGaAsN, GaAsP, GaAsN, GaMnAs, GaAsSbN, GaInAs, GaInP, AlGaAsSb, AlGaAsP, AlGaInP, GaInAsP, InGaAs, InGaP, InGaN, InAsSb, InGaSb, InMnAs, InGaAsP, InGaAsN, InAlAsN, GaInNAsSb, GaInAsSbP, and any combination of these. Porous silicon semiconductor materials are useful for aspects described herein. Impurities of semiconductor materials are atoms, elements, ions and/or molecules other than the semiconductor material(s) themselves or any dopants provided to the semiconductor material. Impurities are undesirable materials present in semiconductor materials which may negatively impact the electronic properties of semiconductor materials, and include but are not limited to oxygen, carbon, and metals including heavy metals. Heavy metal impurities include, but are not limited to, the group of elements between copper and lead on the periodic table, calcium, sodium, and all ions, compounds and/or complexes thereof.

A "semiconductor component" broadly refers to any semiconductor material, composition or structure, and expressly includes high quality single crystalline and polycrystalline semiconductors, semiconductor materials fabricated via high temperature processing, doped semiconductor materials, inorganic semiconductors, and composite semiconductor materials.

A "component" is used broadly to refer to an individual part of a device. An "interconnect" is one example of a component, and refers to an electrically conducting structure capable of establishing an electrical connection with another component or between components. In particular, an interconnect may establish electrical contact between components that are separate. Depending on the desired device specifications, operation, and application, an interconnect is made from a suitable material. Suitable conductive materials include semiconductors.

Other components include, but are not limited to, thin film transistors (TFTs), transistors, electrodes, integrated circuits, circuit elements, control elements, microprocessors, transducers, islands, bridges and combinations thereof. Components may be connected to one or more contact pads as known in the art, such as by metal evaporation, wire bonding, and application of solids or conductive pastes, for example.

"Neutral mechanical plane" (NMP) refers to an imaginary plane existing in the lateral, b, and longitudinal, l, directions of a device. The NMP is less susceptible to bending stress than other planes of the device that lie at more extreme positions along the vertical, h, axis of the device and/or within more bendable layers of the device. Thus, the position of the NMP is determined by both the thickness of the device and the materials forming the layer(s) of the device.

"Coincident" refers to the relative position of two or more objects, planes or surfaces, for example a surface such as a neutral mechanical plane that is positioned within or is adjacent to a layer, such as a functional layer, substrate layer, or other layer. In an embodiment, a neutral mechanical plane is positioned to correspond to the most strain-sensitive layer or material within the layer.

"Proximate" refers to the relative position of two or more objects, planes or surfaces, for example a neutral mechanical plane that closely follows the position of a layer, such as a functional layer, substrate layer, or other layer while still providing desired conformability without an adverse impact on the strain-sensitive material physical properties. "Strain-sensitive" refers to a material that fractures or is otherwise impaired in response to a relatively low level of strain. In general, a layer having a high strain sensitivity, and consequently being prone to being the first layer to fracture, is located in the functional layer, such as a functional layer containing a relatively brittle semiconductor or other strain-sensitive device element. A neutral mechanical plane that is proximate to a layer need not be constrained within that layer, but may be positioned proximate or sufficiently near to provide a functional benefit of reducing the strain on the strain-sensitive device element.

"Unitary" refers to an object formed as a single piece or undivided whole.

The terms "direct and indirect" describe the actions or physical positions of one component relative to another component, or one device relative to another device. For example, a component that "directly" acts upon or touches another component does so without intervention from an intermediary. Contrarily, a component that "indirectly" acts upon or touches another component does so through an intermediary (e.g., a third component).

"Electronic device" generally refers to a device incorporating a plurality of components, and includes large area electronics, printed wire boards, integrated circuits, component arrays, electrophysiological and/or biological and/or chemical sensors, and physical sensors (e.g., temperature, acceleration, etc.).

"Sensing" refers to detecting the presence, absence, amount, magnitude or intensity of a physical and/or chemical property. Useful electronic device components for sensing include, but are not limited to electrode elements, chemical or biological sensor elements, pH sensors, accelerometers, temperature sensors and capacitive sensors.

"Island" refers to a relatively rigid component of an electronic device comprising a plurality of semiconductor components. "Bridge" refers to structures interconnecting two or more islands or one island to another component. The invention includes electronic devices having bridge structures comprising electrical interconnects, such as stretchable electrical interconnects provided between and in electrical contact with semiconductor device components.

"Encapsulate" refers to the orientation of one structure such that it is at least partially, and in some cases completely, surrounded by one or more other structures. "Partially encapsulated" refers to the orientation of one structure such that it is partially surrounded by one or more other structures, for example, wherein 30%, or optionally 50% or optionally 90%, of the external surfaces of the structure is surrounded by one or more structures. "Completely encapsulated" refers to the orientation of one structure such that it is completely surrounded by one or more other structures.

"Contiguous" refers to materials or layers that are touching or connected throughout in an unbroken sequence. In one embodiment, a contiguous layer of a device has not been manipulated to remove a substantial portion (e.g., 10% or more) of the originally provided material or layer.

"Active circuit" and "active circuitry" refer to one or more components configured for performing a specific function. Useful active circuits include, but are not limited to, amplifier circuits, multiplexing circuits, current limiting circuits, integrated circuits, impedance matching circuits, wireless power harvesting circuits, wireless data transmission circuits, transistors and transistor arrays.

"Substrate" refers to a material, layer or other structure having a surface, such as a receiving surface or supporting surface, that is capable of supporting one or more components or electronic devices. A component that is "bonded" to the substrate refers to a component that is in physical contact with the substrate and unable to substantially move relative to the substrate surface to which it is bonded. Unbonded components or portions of a component, in contrast, are capable of substantial movement relative to the substrate. In an embodiment, the invention includes electronic devices having one or more free standing semiconductor device components supported by a substrate, optionally in physical contact with the substrate or in physical contact with one or more intermediate structures supported by the substrate. In an embodiment, the invention includes electronic devices having one or more tethered semiconductor device components supported by, or optionally bonded to, one or more structures, such as a pedestal or array of pedestals, independently connecting the semiconductor device components to the substrate.

A "containment chamber" is a structure that encloses or encapsulates an electronic device or device component. In one embodiment, a containment chamber is shaped as a rectangular or square structure comprising a substrate or bottom wall, a lid or top wall, and a plurality of walls to support the top wall. In another embodiment, a containment chamber is shaped as a sphere, half sphere, pyramid, or an irregular three-dimensional structure. In an embodiment, a containment chamber is self-supporting, such that the containment chamber retains its shape when hollow or partially hollow. In an embodiment, the containment chamber is a fluid containment chamber. In an embodiment, a containment chamber is a low modulus solid containment chamber.

"Free standing" refers to a configuration wherein a device or device component is supported by, but not bonded to, a substrate or intermediate structure provided between the device or device component and the substrate. In an embodiment, for example, a substrate is able to move relative to a free standing device or component supported by the substrate. In an embodiment, for example, a free standing device or component is able to move relative to a substrate supporting the free standing device or component. In some embodiments, for example, a free standing configuration of a device or device component decouples movement and/or deformation of the substrate from the device or device component. In some embodiments, for example, a free standing configuration of a device or device component decouples forces generated by elongation, compression or deformation of the substrate from the device or device component. In some embodiments, a free standing device or component is characterized by undergoing an associative interaction with a substrate surface or intermediate structure provided thereon, such as a Van der Waals interaction, dipole-dipole interaction or other non-covalent associative interaction. In an embodiment, a free standing device or component is not covalently bonded to the supporting surface of a substrate.

"Tethered" refers to a configuration wherein a device or component is connected to a substrate via one or more tethering structures, such as a pedestal or array of pedestals. In an embodiment, for example, a substrate is able to move relative to a tethered device or component supported by the substrate. In an embodiment, for example, a tethered device or component is able to move relative to a substrate supporting the tethered device or component. In some embodiments, for example, a tethered configuration of a device or device component decouples movement and/or deformation of the substrate from the device or device component. In some embodiments, for example, a tethered configuration of a device or device component decouples forces generated by elongation, compression or deformation of the substrate from the device or device component. In some embodiments, less than 20%, optionally less than 5%, and optionally less than 1%, of the area of a bottom surface of a device or component is covalently bonded to the tethering structure connected to the substrate.

"Nanostructured surface" and "microstructured surface" refer to device surfaces having nanometer-sized and micrometer-sized relief features, respectively. The relief features extend a length, x, from a substantially contiguous plane of the device surface. Quantitative descriptors of a structured surface include surface roughness parameters, such as $R_{max}$, $R_a$, and normalized roughness ($R_a/R_{max}$), all of which may be measured by atomic force microscopy (AFM). $R_{max}$ is the maximum height between a highest peak to a lowest valley. $R_a$ is the center-line-mean roughness, which is the average of an absolute value of a deviation from a center line of a roughness curve to the roughness curve. The surface of a substrate or layer is "substantially smooth", for the purposes of this disclosure, if the surface has an $R_a$ value of 100 nm or less. If the surface has an $R_a$ value greater than 100 nm, the surface is considered to be a "structured surface" for purposes of this disclosure.

"Dielectric" refers to a non-conducting or insulating material. In an embodiment, an inorganic dielectric comprises a dielectric material substantially free of carbon. Specific examples of inorganic dielectric materials include, but are not limited to, silicon nitride, silicon dioxide and non-conjugated polymers.

"Polymer" refers to a macromolecule composed of repeating structural units connected by covalent chemical bonds or the polymerization product of one or more monomers, often characterized by a high molecular weight. The term polymer includes homopolymers, or polymers consisting essentially of a single repeating monomer subunit. The term polymer also includes copolymers, or polymers consisting essentially of two or more monomer subunits, such as random, block, alternating, segmented, grafted, tapered and other copolymers. Useful polymers include organic polymers or inorganic polymers that may be in amorphous, semi-amorphous, crystalline or partially crystalline states. Crosslinked polymers having linked monomer chains are particularly useful for some applications. Polymers useable in the methods, devices and components include, but are not limited to, plastics, elastomers, thermoplastic elastomers, elastoplastics, thermoplastics and acrylates. Exemplary polymers include, but are not limited to, acetal polymers, biodegradable polymers, cellulosic polymers, fluoropolymers, nylons, polyacrylonitrile polymers, polyamide-imide polymers, polyimides, polyarylates, polybenzimidazole, polybutylene, polycarbonate, polyesters, polyetherimide, polyethylene, polyethylene copolymers and modified polyethylenes, polyketones, poly(methyl methacrylate), polymethylpentene, polyphenylene oxides and polyphenylene sulfides, polyphthalamide, polypropylene, polyurethanes, styrenic resins, sulfone-based resins, vinyl-based resins, rubber (including natural rubber, styrene-butadiene, polybutadiene, neoprene, ethylene-propylene, butyl, nitrile, silicones), acrylic, nylon, polycarbonate, polyester, polyethylene, polypropylene, polystyrene, polyvinyl chloride, polyolefin or any combinations of these.

"Elastomeric stamp" and "elastomeric transfer device" are used interchangeably and refer to an elastomeric material having a surface that can receive as well as transfer a material. Exemplary elastomeric transfer devices include stamps, molds and masks. The transfer device affects and/or facilitates material transfer from a donor material to a receiver material.

"Elastomer" refers to a polymeric material which can be stretched or deformed and returned to its original shape without substantial permanent deformation. Elastomers commonly undergo substantially elastic deformations. Useful elastomers include those comprising polymers, copolymers, composite materials or mixtures of polymers and copolymers. Elastomeric layer refers to a layer comprising at least one elastomer. Elastomeric layers may also include dopants and other non-elastomeric materials. Useful elastomers include, but are not limited to, thermoplastic elastomers, styrenic materials, olefinic materials, polyolefin, polyurethane thermoplastic elastomers, polyamides, synthetic rubbers, PDMS, polybutadiene, polyisobutylene, poly(styrene-butadiene-styrene), polyurethanes, polychloroprene and silicones. In some embodiments, an elastomeric stamp comprises an elastomer. Exemplary elastomers include, but are not limited to silicon containing polymers such as polysiloxanes including poly(dimethyl siloxane) (i.e. PDMS and h-PDMS), poly(methyl siloxane), partially alkylated poly(methyl siloxane), poly(alkyl methyl siloxane) and poly(phenyl methyl siloxane), silicon modified elastomers, thermoplastic elastomers, styrenic materials, olefinic materials, polyolefin, polyurethane thermoplastic elastomers, polyamides, synthetic rubbers, polyisobutylene, poly(styrene-butadiene-styrene), polyurethanes, polychloroprene and silicones. In an embodiment, a polymer is an elastomer.

"Conformable" refers to a device, material or substrate which has a bending stiffness that is sufficiently low to allow the device, material or substrate to adopt any desired contour profile, for example a contour profile allowing for conformal contact with a surface having a pattern of relief features.

"Conformal contact" refers to contact established between a device and a receiving surface. In one aspect, conformal contact involves a macroscopic adaptation of one or more surfaces (e.g., contact surfaces) of a device to the overall shape of a surface. In another aspect, conformal contact involves a microscopic adaptation of one or more surfaces (e.g., contact surfaces) of a device to a surface resulting in an intimate contact substantially free of voids. In an embodiment, conformal contact involves adaptation of a contact surface(s) of the device to a receiving surface(s) such that intimate contact is achieved, for example, wherein less than 20% of the surface area of a contact surface of the device does not physically contact the receiving surface, or optionally less than 10% of a contact surface of the device does not physically contact the receiving surface, or optionally less than 5% of a contact surface of the device does not physically contact the receiving surface.

"Young's modulus" is a mechanical property of a material, device or layer which refers to the ratio of stress to strain for a given substance. Young's modulus may be provided by the expression:

$$E = \frac{(\text{stress})}{(\text{strain})} = \left(\frac{L_0}{\Delta L}\right)\left(\frac{F}{A}\right), \quad (I)$$

where E is Young's modulus, $L_0$ is the equilibrium length, $\Delta L$ is the length change under the applied stress, F is the force applied, and A is the area over which the force is applied. Young's modulus may also be expressed in terms of Lame constants via the equation:

$$E = \frac{\mu(3\lambda + 2\mu)}{\lambda + \mu}, \quad (II)$$

where $\lambda$ and $\mu$ are Lame constants. High Young's modulus (or "high modulus") and low Young's modulus (or "low modulus") are relative descriptors of the magnitude of Young's modulus in a given material, layer or device. In some embodiments, a high Young's modulus is larger than a low Young's modulus, preferably about 10 times larger for some applications, more preferably about 100 times larger for other applications, and even more preferably about 1000 times larger for yet other applications. In an embodiment, a low modulus layer has a Young's modulus less than 100 MPa, optionally less than 10 MPa, and optionally a Young's modulus selected from the range of 0.1 MPa to 50 MPa. In an embodiment, a high modulus layer has a Young's modulus greater than 100 MPa, optionally greater than 10 GPa, and optionally a Young's modulus selected from the range of 1 GPa to 100 GPa.

"Inhomogeneous Young's modulus" refers to a material having a Young's modulus that spatially varies (e.g., changes with surface location). A material having an inhomogeneous Young's modulus may optionally be described in terms of a "bulk" or "average" Young's modulus for the entire material.

"Low modulus" refers to materials having a Young's modulus less than or equal to 1 MPa, less than or equal to 0.5 MPa, or less than or equal to 200 KPa. A low modulus material may have a Young's modulus selected from the range of 1 MPa to 1 KPa, or 0.5 MPa to 1 KPa, or 200 KPa to 1 KPa, 100 KPa to 1 KPa, or 50 KPa to 1 KPa.

"Ultra low modulus" refers to materials having a Young's modulus less than or equal to 150 KPa, less than or equal to 100 KPa or less than or equal to 50 KPa.

"Bending stiffness" is a mechanical property of a material, device or layer describing the resistance of the material, device or layer to an applied bending moment. Generally, bending stiffness is defined as the product of the modulus and area moment of inertia of the material, device or layer. A material having an inhomogeneous bending stiffness may optionally be described in terms of a "bulk" or "average" bending stiffness for the entire layer of material.

Example 1: Stretchable Batteries with Self-Similar Serpentine Interconnects and Integrated Wireless Recharging Systems An important trend in electronics involves the development of materials, mechanical designs and manufacturing strategies that enable the use of unconventional substrates, such as polymer films, metal foils, paper sheets or rubber slabs. The last possibility is particularly challenging because the systems must accommodate not only bending but also stretching, sometimes to high levels of strain (>100%). Although several approaches are available for the electronics, a persistent difficulty is in energy storage devices and power supplies that have similar mechanical properties, to allow their co-integration with the electronics. In this Example, we provide a set of materials and design concepts for a rechargeable lithium ion battery technology that exploits thin, low modulus, silicone elastomers as substrates, with a segmented design of the active materials, and unusual 'self-similar' interconnect structures. The result enables reversible levels of stretchability up to 300%, while maintaining capacity densities of ~1.1 mAh/cm$^2$. Stretchable wireless power transmission systems provide means to charge these types of batteries, without direct physical contact.

Development of classes of electronic and optoelectronic technologies that offer elastic responses to large strain (>>1%) deformations has accelerated in recent years[1-6]. Combinations of materials, device layouts, mechanics designs and manufacturing approaches are now beginning to emerge for realistic applications in areas ranging from wearable photovoltaics[7] to 'epidermal' health/wellness monitors[8], to sensitive robotic skins[9-11], to soft surgical tools[12] and electronic 'eyeball' imaging devices[13]. In many cases, stretchability represents a key, enabling characteristic. For many of these and other uses, a critical need lies in energy storage devices with similar physical properties, to allow for direct and natural integration with the electronics[14]. Many important storage devices have been developed with flexible characteristics, including supercapacitors[15-17] and batteries[17,18]. Here, sufficiently thin geometrical forms lead to flexibility, by virtue of bending induced strains (typically to values of ~1% or less) that decrease linearly with thickness, for a given bend radius. Stretchability, on the other hand, represents a more challenging type of mechanics, in which the systems must accommodate large strain deformation (>>1%), typically of arbitrary form, including not only bending, but also twisting, stretching, compressing and others, and thickness is typically not a critical factor. Stretchable supercapacitors using buckled thin films of CNTs[19] or CNT-soaked fibrous textiles[20], and stretchable non-rechargeable zinc carbon batteries based on conductive fabrics[21,22] represent two examples. Although these technologies each have attractive features, none offers multiple capabilities in recharging with high storage capacity, stretching to large levels of deformation (>100%), or establishing wireless electrical interfaces to external power supplies. The materials and integration schemes provided in this example achieve these characteristics in a type of lithium ion battery that exploits segmented layouts and deformable electrical interconnects in specialized, 'self-similar' geometries. The resulting devices offer biaxial stretchability up to strains of 300%, with capacity densities of ~1.1 mAh/cm$^2$, and little loss in capacity for up to 20 cycles of recharging. The designs also allow integration of stretchable, inductive coils to enable charging through external supplies without the need for physical connections. This set of attributes satisfies requirements for many applications that are being contemplated for stretchable electronics.

Results

Battery Design.

Figure 5:
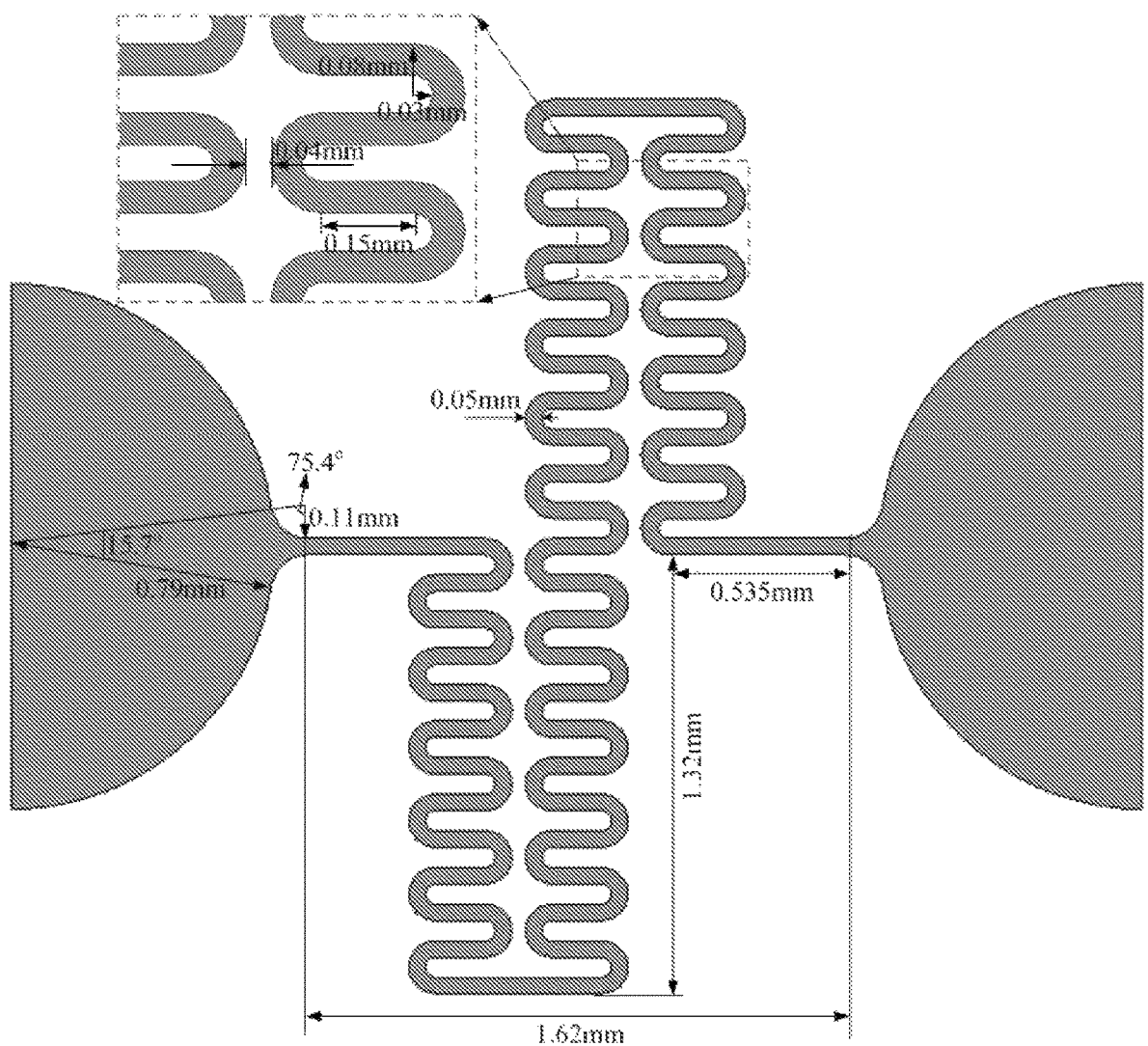
FIG. 5. Illustration of the dimensions for the self-similar interconnect (copper layer).
Figure 6:
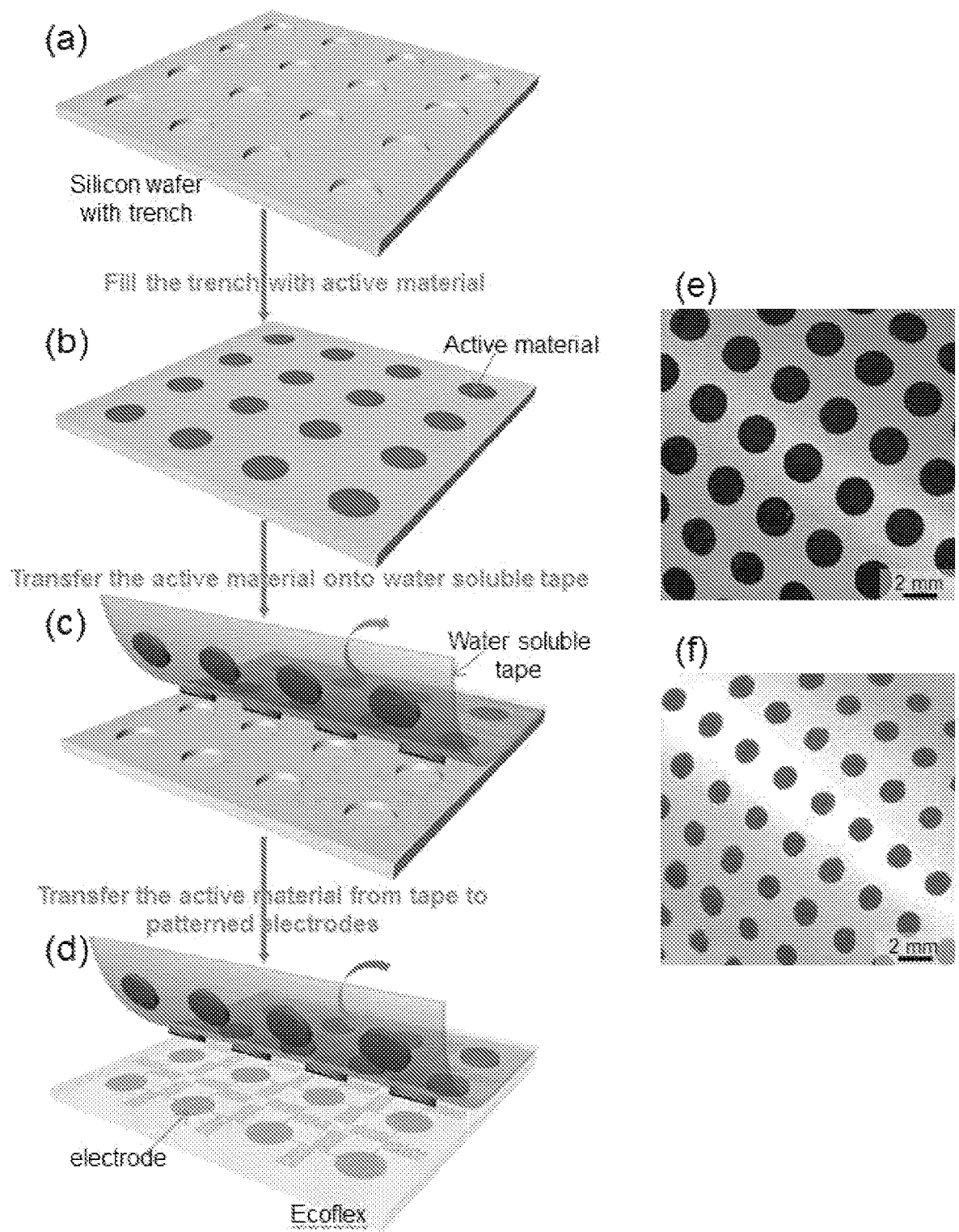
FIG. 6. (a)-(d) Schematic illustration of the fabrication process, and images of the moulded (e) cathode and (f) anode slurry on water soluble tape.
Figure 7:
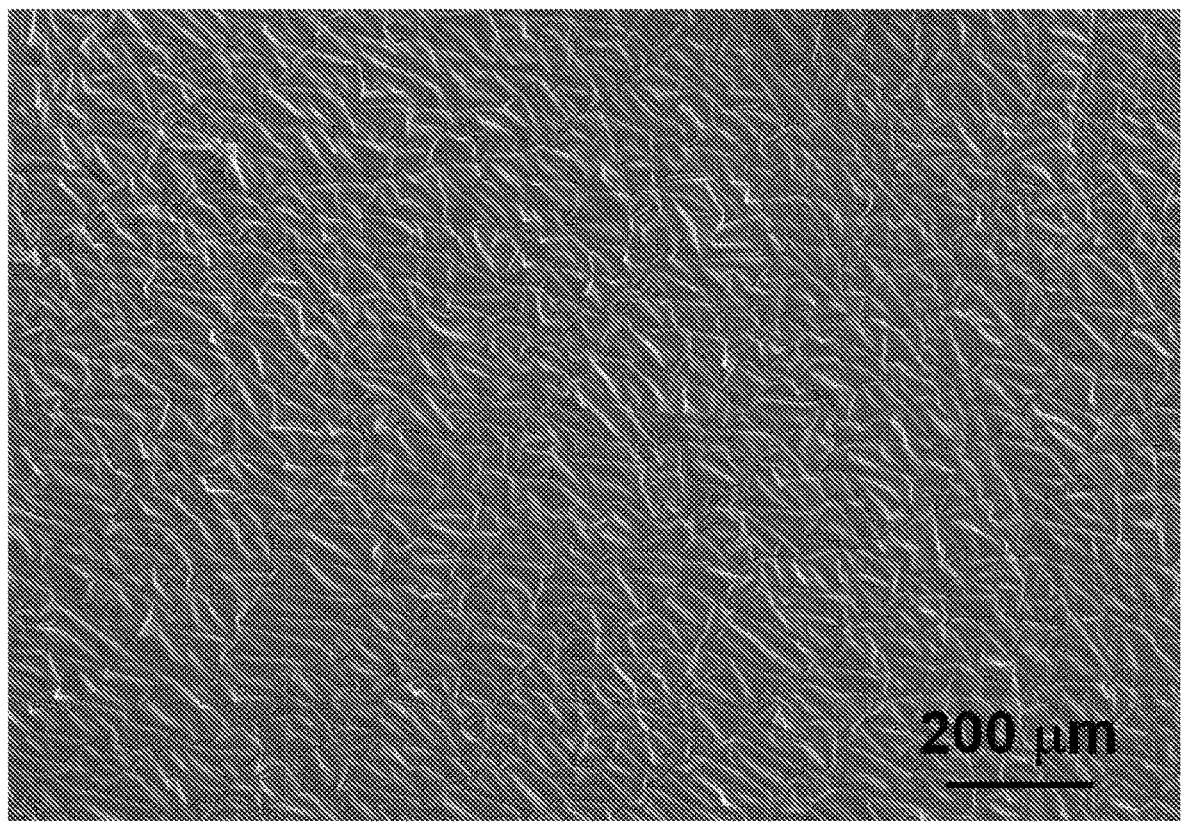
FIG. 7. SEM image of a buckled Al foil (600 nm)/PI (1200 nm) bilayer on the surface of a sheet of ECOFLEX® silicone elastomer after releasing a prestrain of ~30%. This bilayer structure resembles the types of laminated Al/polymer packaging materials that are used in pouch cells, to block the permeation of water, air and solvent.

The devices of this example exploit pouch cells in which arrays of small-scale storage components are connected by conducting frameworks with extraordinary stretchable characteristics. A schematic illustration of the system, an exploded view of the multilayer construction of a unit cell, and a representation of the 'self-similar' interconnect geometries appear in FIG. 1a,b,c, and FIG. 5 in Supplementary Information (SI). The current collectors consist of photo-lithographically patterned circular disks of aluminum (600 nm) and copper (600 nm). Layers of polyimide (PI; 1.2 μm) encapsulate interconnecting traces between these disks in a way that places the metals close to the neutral mechanical plane (FIGS. 1d and 1e, left panel). Thin (0.25 mm), low modulus (60 KPa) sheets of silicone elastomer form top and bottom substrates that support these structures (FIGS. 1d and 1e, middle panel) and other components of the batteries. The overall construct consists of a square array of 100 electrode disks, electrically connected in parallel. Molded pads of slurries based on $LiCoO_2$ and $Li_4Ti_5O_{12}$ serve as active materials at the cathode and anode[23,24], respectively (FIGS. 1d and 1e, right panel, and FIG. 6). The two sheets laminate together in a way that involves spatial offsets between the active materials to avoid electrical shortage between them and to eliminate the need for a separator. A spacer, made of the same silicone elastomer and applied around the periphery of the system, prevents direct contact of the top and bottom sheets. A gel electrolyte injected into the gap provides media for ionic transport. Thin encapsulating layers of an acryloxy perfluoropolyether elastomer bonded to the outer surfaces help to prevent moisture from diffusing into the battery and solvents in the gel from leaking out[25]. Long term operation requires more sophisticated packages consisting, for example, of buckled bilayer sheets of aluminum/polyimide that bond to the outer surfaces of the battery (FIG. 7). The materials and fabrication details appear in the Methods section.

The devices must accommodate two competing design goals: (1) achieving high areal capacity, which requires large coverage of the active regions, and (2) affording high mechanical stretchability, which requires large distances between these regions. Strategic features of relief on the elastomer substrates provide a partial solution to this challenge, as demonstrated recently in photovoltaic modules[26,27]. A disadvantage is that levels of stretchability beyond ~30% can be difficult to achieve without sacrificing coverage. Here, we take a different, but complementary, approach in which the focus is on deformable interconnects with advanced designs. In particular, we introduce layouts that use 'self-similar' structures of wires in serpentine configurations to offer, simultaneously, high system-level stretchability, and low interconnect resistances. A conventional serpentine consists of circular arcs connected by straight lines. 'Self-similar' designs follow from iteratively applying this basic geometry, beginning with a unit cell as illustrated schematically in the red box of FIG. 1c. Here, reducing the scale of the cell, and then connecting multiple copies of it in a fashion that reproduces the layout of the original cell geometry corresponds to one iteration. The yellow line in FIG. 1c represents a 2nd order serpentine geometry, created in this fashion. Although higher orders can be designed and implemented easily, the 2nd order construct satisfies requirements for the applications considered here, as described in the detailed experimental and theoretical study below.

Mechanical Characteristics of the 'Self-Similar' Interconnects.

Figure 2:
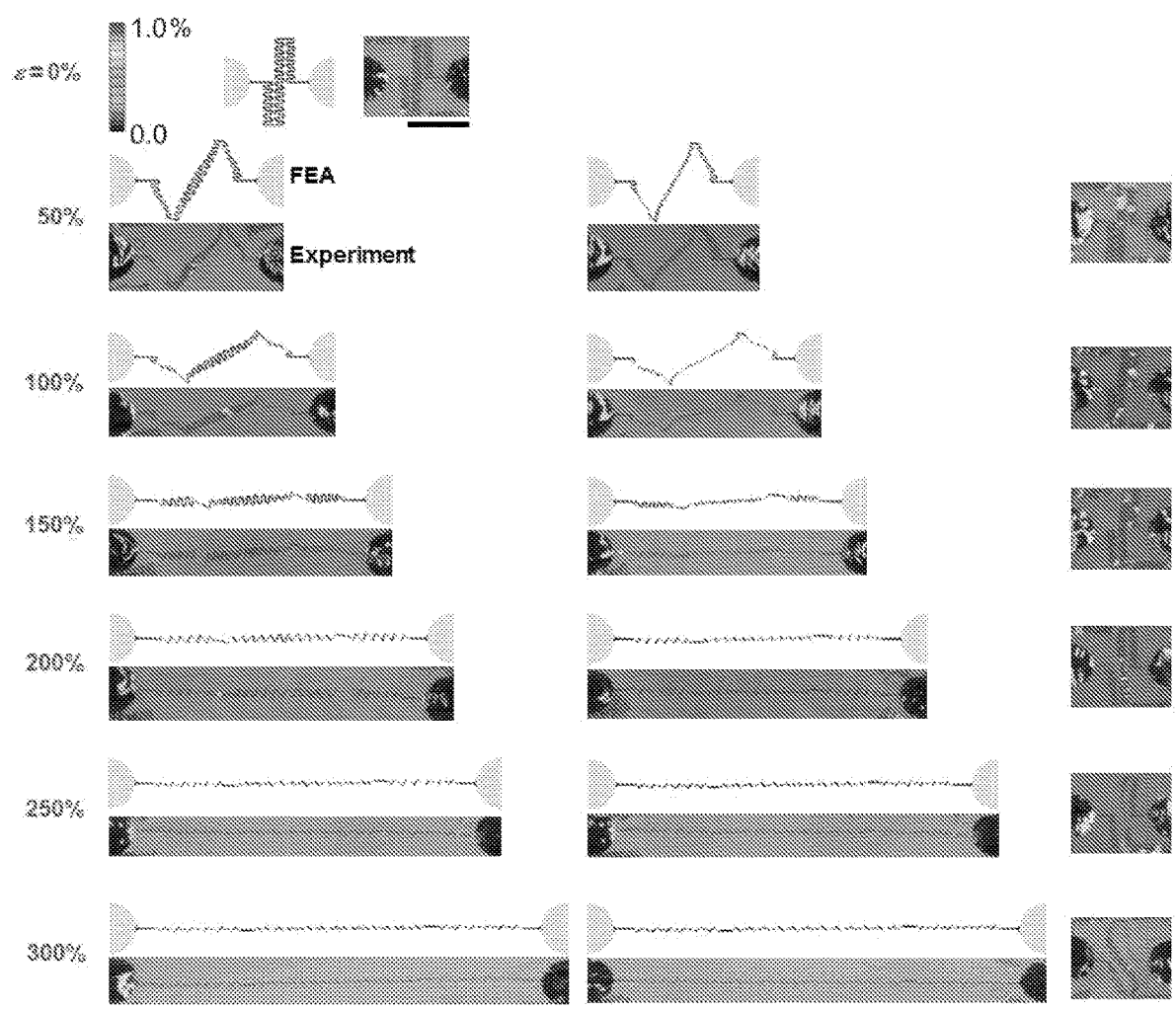
FIG. 2. Experimental and computational studies of buckling physics in interconnects with self-similar serpentine layouts. Optical images and corresponding finite element analysis (FEA) of symmetric (left column) and anti-symmetric (middle column) deformation modes, for various levels of applied tensile strain ($\varepsilon$). The color in the FEA results represents the maximum principal strains of the metal layer. The scale bar is 2 mm. The right column shows the interconnect structures after releasing the applied strain.

Three-dimensional (3D) finite element analysis (FEA) (SI text) and experimental measurements illustrate the essential mechanics. Test samples fabricated for this purpose consist of free-standing, multilayer traces, with materials and multilayer stack designs (PI (1.2 µm)/Cu (0.6 µm)/PI (1.2 µm)) that match those used in the batteries, between circular pads that bond to posts molded onto underlying elastomer substrates. The self-similar geometry leads to hierarchical buckling physics that ensure ultra-low strains in the materials, even under extreme stretching[3,28]. For the entire range of tensile strains examined, from 0% to 300%, the configurations predicted by FEA agree remarkably well with optical images collected during the experiments, as shown in FIG. 2. Both symmetric and anti-symmetric buckling modes exist (see FIG. 8 for detailed illustrations of the two modes). The trace consists of three columns of serpentine wires connected by two horizontal straight lines. We refer to the construct that corresponds to the 'short' wavelength serpentine within each column as the 1st level; the 2nd level corresponds to the large-scale serpentine shape, with 'long' wavelength. For the symmetric buckling mode (FIG. 8(a)), the left and right columns undergo mainly an overall bending deformation along the vertical direction, resulting in the collective upward motion of the entire middle column of serpentine wires. In this sense, the out-of-plane displacement is symmetric with respect to the center line (x=0) in the "Front view" of FIG. 8(a). For the anti-symmetric buckling mode (FIG. 8(b)), the serpentines in the left and right columns mainly undergo an overall twisting deformation along the vertical direction. Here, the two ends of the middle serpentine move in opposite directions (i.e. one moves up, and the other moves down). In this case, the out-of-plane displacement is anti-symmetric with respect to the center line (x=0) in the "Front view" of FIG. 8(b). The critical buckling strains obtained by FEA for the symmetric (0.078%) and anti-symmetric (0.087%) modes are much lower than those (>0.172%) for all other buckling modes. This result is consistent with experimental observation of only these two modes. In both cases, the physics associated with stretching involves a mechanism of "ordered unraveling", which begins at the 2nd level, at a well-defined, critical buckling strain, ~0.08% for the example investigated here. Next, the 2nd level gradually "unravels" via bending and twisting as the applied strain increases from 0.08% to ~150%, during which there is essentially no further deformation in the 1st level. The motions in the 1st level start when the 2nd level is almost fully extended, corresponding to an applied strain of ~150% in this case. As the "unraveling" of the 1st level serpentine approaches its end, the strain in the materials begins to increase rapidly, thereby defining the practical limit in stretchability.

Figure 9:
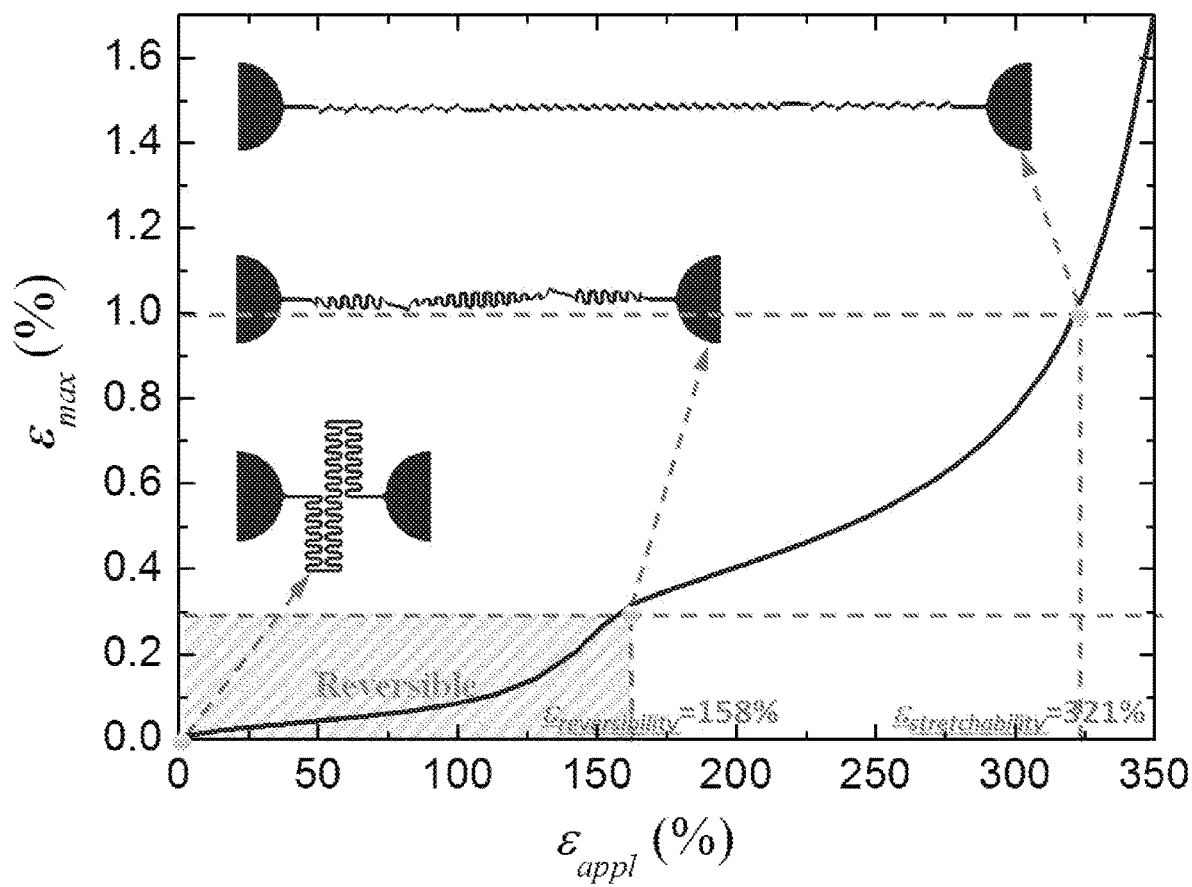
FIG. 9. The maximum value ($\varepsilon_{max}$) of the maximum principal strain in the metal layer of the self-similar interconnect as a function of the applied strain ($\varepsilon_{appl}$), together with the evolution of the deformations.

For applied strains below this limit, the deformation mechanisms of ordered unraveling processes ensure low levels of strain in the materials (FIG. 9). For a representative failure strain of 1% for copper, FEA predicts a stretchability of 321%, which is in good agreement with the experimental observations (300%<$\varepsilon_{stretchability}$<350%). (Simulations suggest that the copper reaches its failure point before the PI.) For reversible behavior (i.e., the interconnects return to their initial configuration after release), the maximum material strain must be less than the yield strain. For a representative yield strain of 0.3% for copper, FEA suggests reversibility for applied strains up to ~168%. This value is lower than experimental observations, where reversibility occurs even for strains of between 200% and 250% (FIG. 2). The likely explanation for this discrepancy is that yield occurs first in only small portions of the interconnect (e.g., one element in the FEA). In this case, the effects on reversibility might not be easily observed in experiments.

Figure 10:
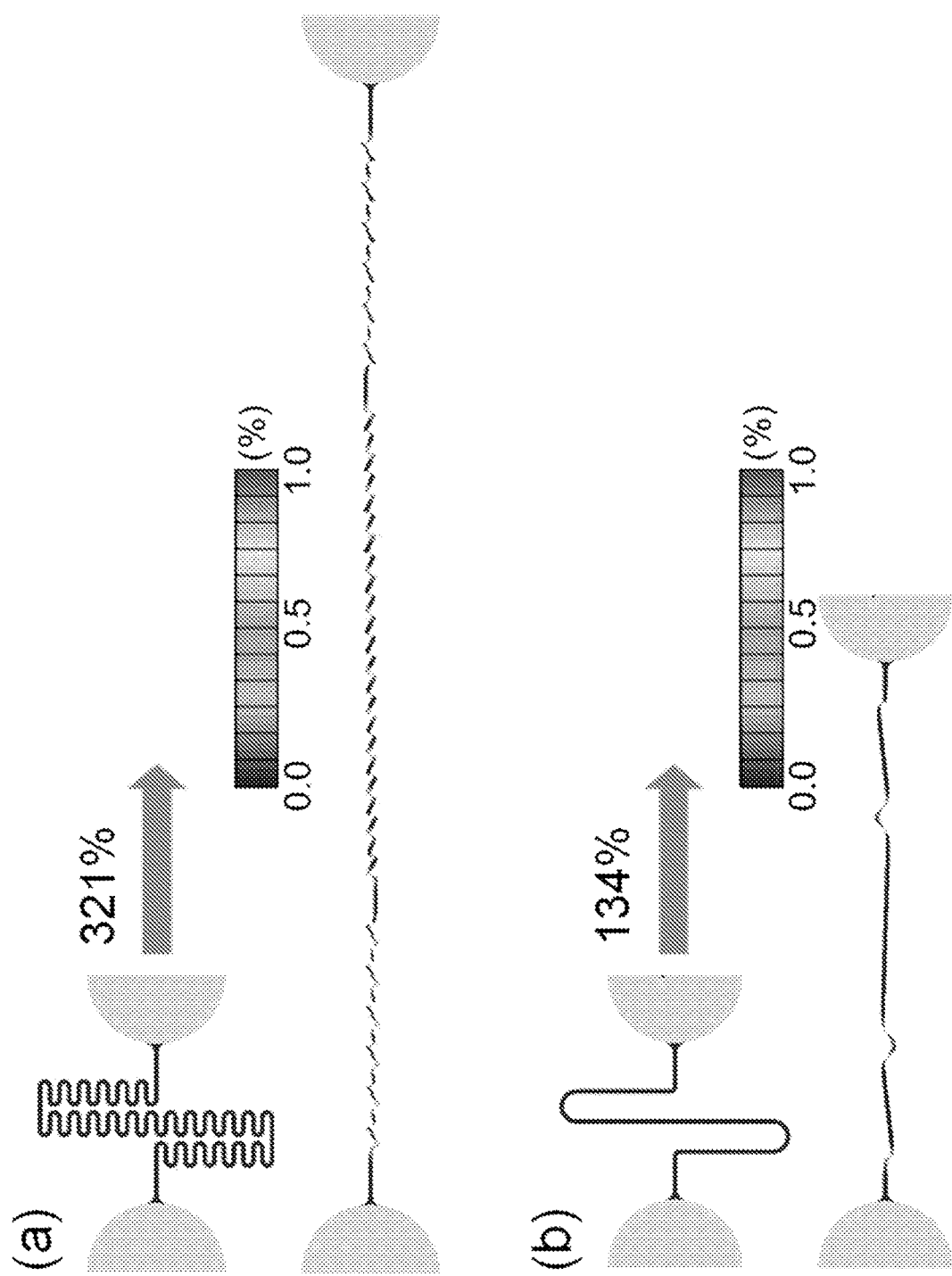
FIG. 10. The distribution of maximum principal strain in the metal layer when its maximum value reaches 1%: (a) the 2-order self-similar interconnect; and (b) the 1-order interconnect. The two structures have the same overall dimensions, and cross-sections.
Figure 11:
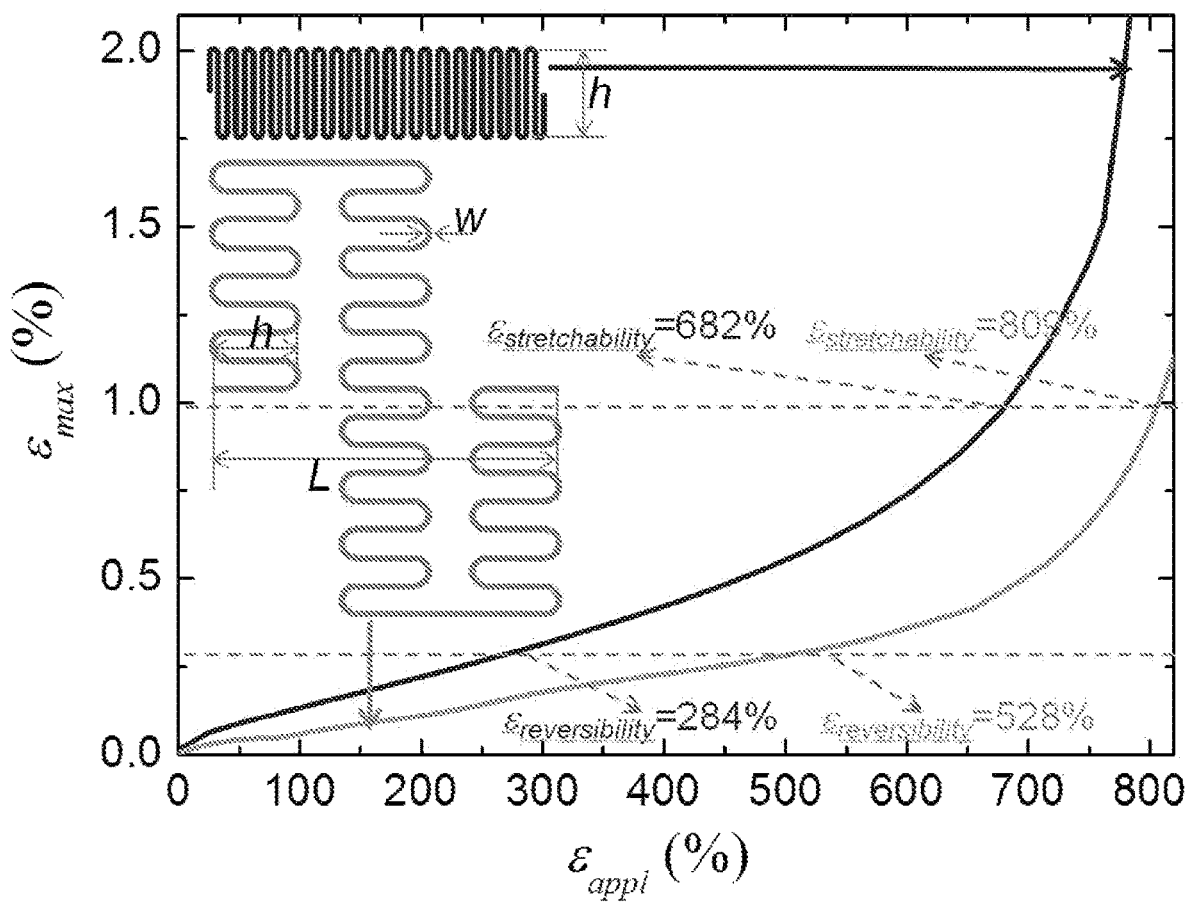
FIG. 11. The maximum value ($\varepsilon_{max}$) of the maximum principal strain in the metal layer of the interconnect as a function of the applied strain ($\varepsilon_{appl}$), for the self-similar and simple serpentine designs. The two interconnects have the same total length ($l_{total}$), span (L), amplitude (h), width (w), and thickness (t).
Figure 12:
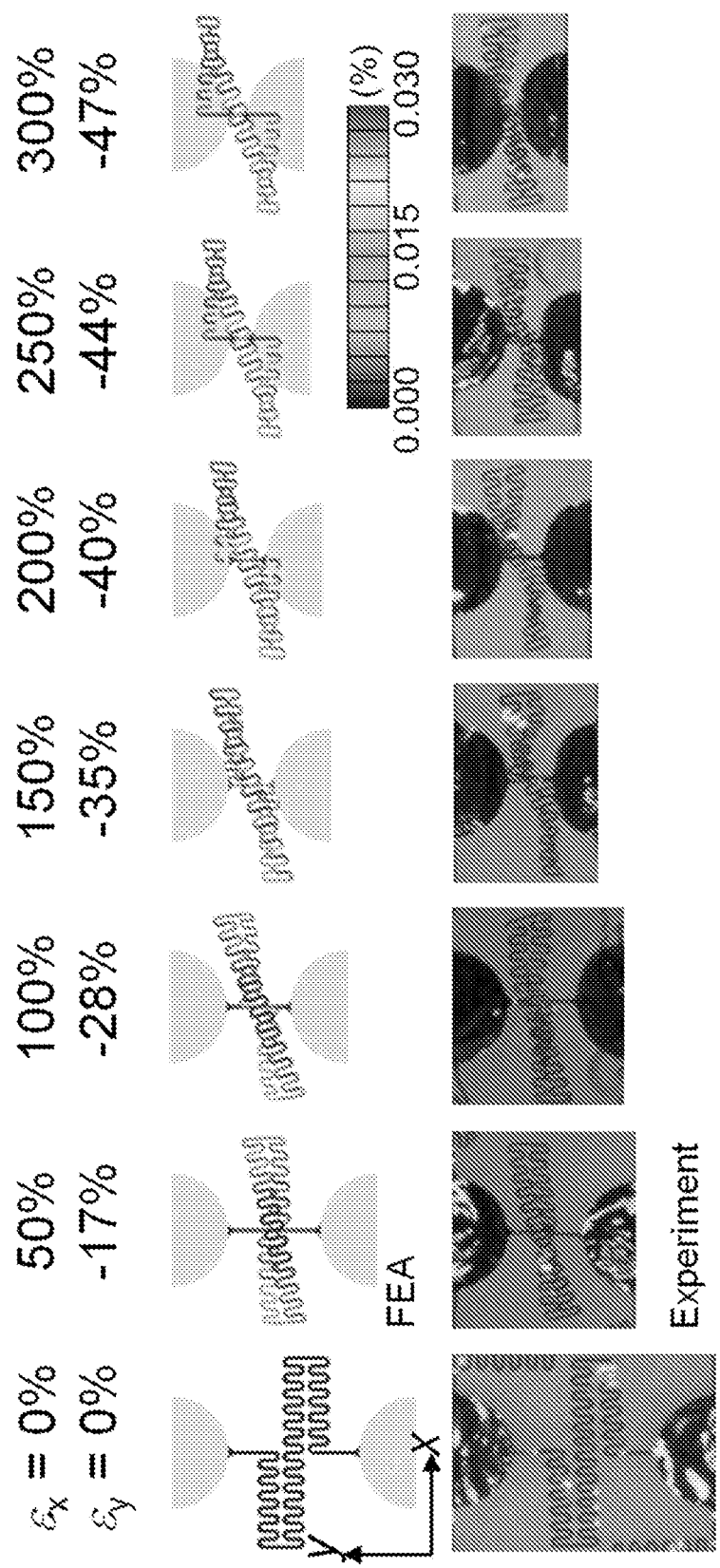
FIG. 12. Finite element analyses of the buckling profiles of a vertically aligned self-similar interconnect under compression, and its comparison with optical images from experiment. The color contours in the FEA results represent the distribution of maximum principal strain in the metal layer.

These levels of stretchability (>300%) and reversibility (>200%) significantly exceed those of previous reports in stretchable batteries and/or battery electrodes; they are also greater than those of any other reports of stretchable interconnects that use lithographically defined patterns of conventional metals. The importance of the self-similar designs can be assessed through comparisons of stretchability to otherwise similar, but conventional serpentine structures: the former exhibits a stretching range of 321%, while the latter is 134%, determined by FEA (FIG. 10). Furthermore, even for the same total length ($l_{total}$), span (L), amplitude (h), and cross section (width w and thickness t), the self-similar design again outperforms the conventional serpentine, both in stretchability (809% vs 682%) and reversibility (528% vs 284%) (FIG. 11). We note that in all cases of uniaxial stretching, the Poisson effect leads to compression in the orthogonal direction. The buckling profiles in these regions have behaviors that are consistent with FEA (FIG. 12).

Electrochemical and Mechanical Behavior of the Battery.

Figure 13A:
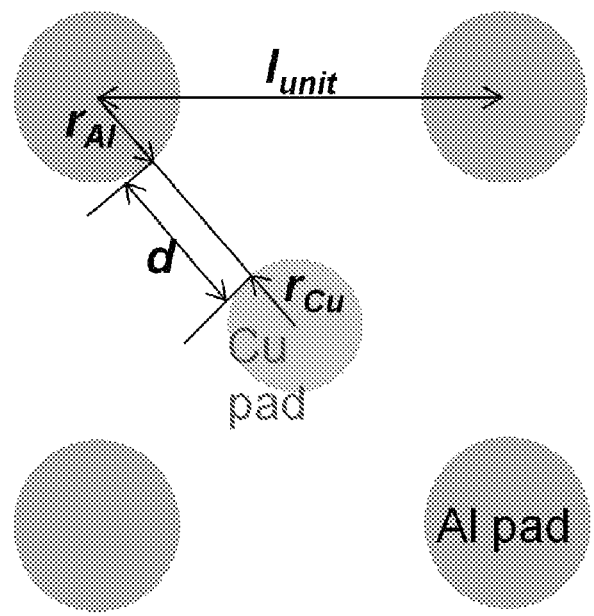
FIG. 13. The layout of Al and Cu pads (a), and the dependences of fill factor on the size of a representative unit cell and the radius of the Al pad (b). The offset distance (d) is set to be 0.5 mm in the model to avoid possible short circuits as the battery is stretched.
Figure 13B:
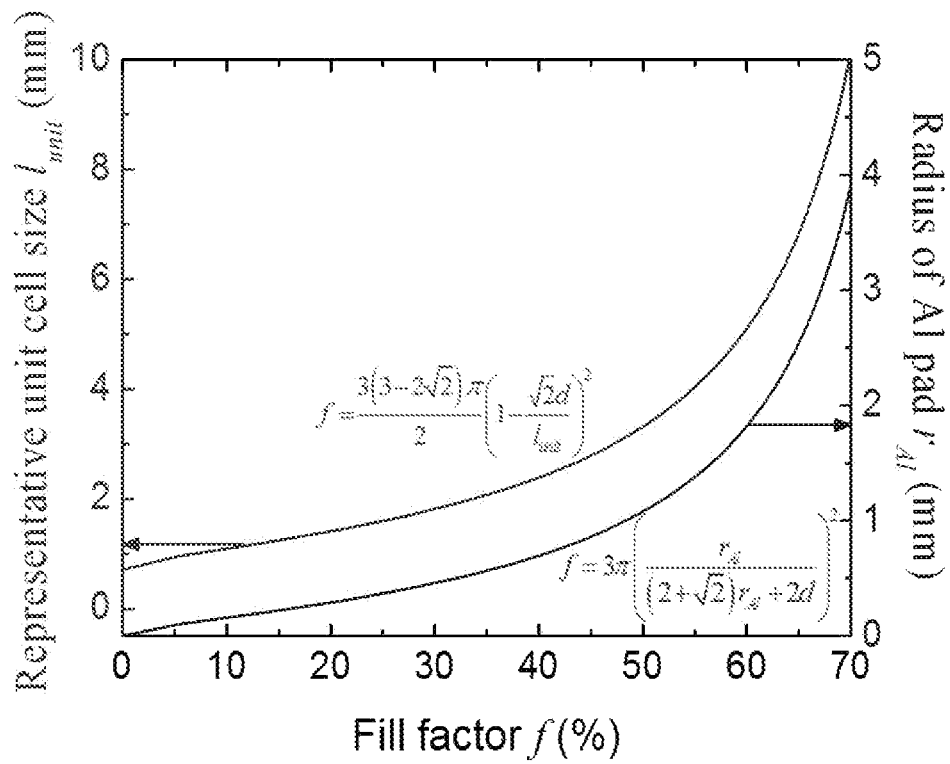

After choosing a set of dimensions that offers excellent system level stretchability, with good areal capacity density, and modest interconnect resistance, we observed the best electrical performance for layouts in which the diameters of the disks for the cathode and anode are 2.20 mm and 1.58 mm, respectively, and the offset distances are 0.51 mm. This configuration corresponds to an areal coverage of 33% for the cathode, 17% for the anode, and 50% for the entire battery (in the undeformed configuration) (FIG. 13). The interconnects have thicknesses of 600 nm and widths of 50 µm. For these parameters, the resistance between adjacent disks is 24Ω, and that between the connection lead and the most distant disk is 45Ω. The leads for external connection are thin and narrow to avoid strain at the interface, and facilitate connection to flexible (but not stretchable) cables that connect to external characterization equipment. The gel electrolyte combines the flow properties of viscous liquids with the cohesive properties of a solid, thereby allowing it to accommodate large strains while maintaining ionic conduction pathways.

Figure 3A:
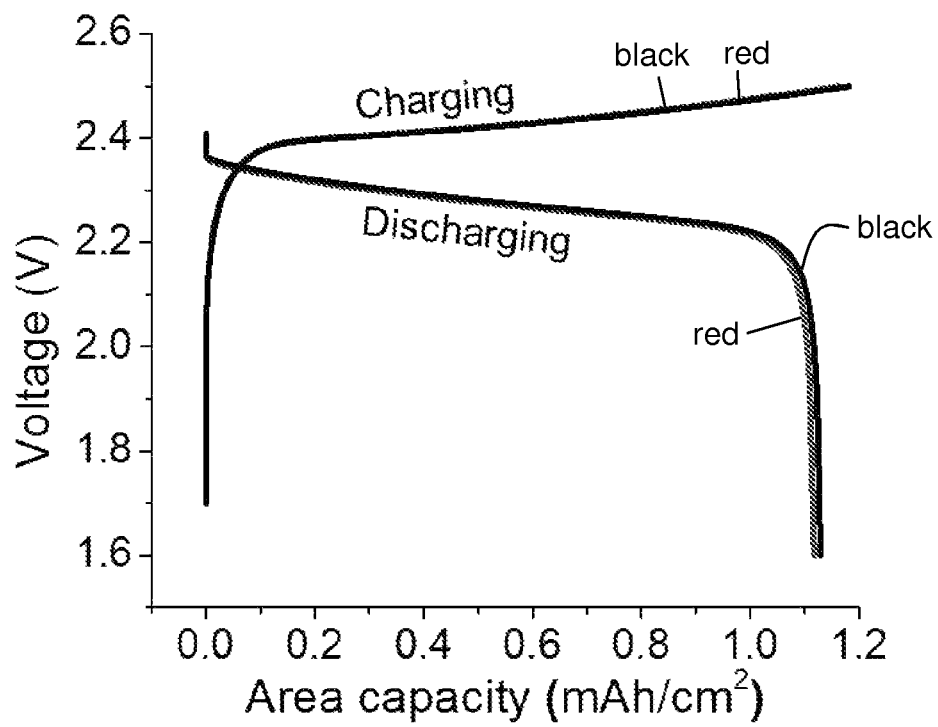
FIG. 3. Electrochemical and mechanical properties of the battery. (a) Galvanostatic charging and discharging of the battery electrodes without (black) and with 300% uniaxial strain (red). (b) Capacity retention (squares) and coulombic efficiency (circles) over 20 cycles with a cutoff voltage of 2.5-1.6 V. (c) Output power as a function of applied biaxial strain. (d) Operation of a battery connected to a red LED while (e) biaxially stretched to 300%, (f) folded, (g) twisted, and (h) compliant when mounted on the human elbow.
Figure 3B:
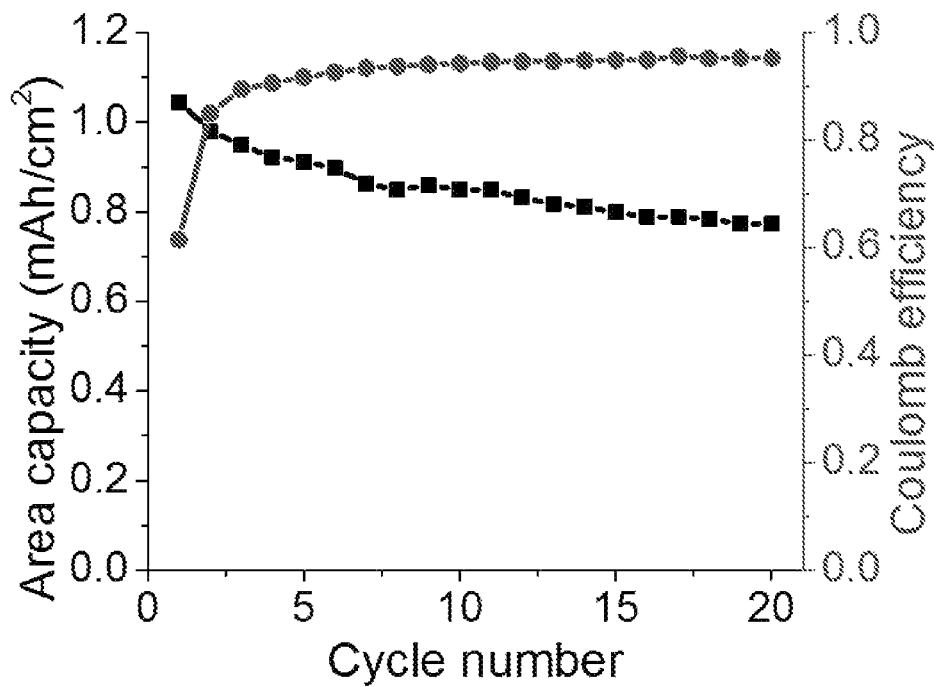
Figure 3C:
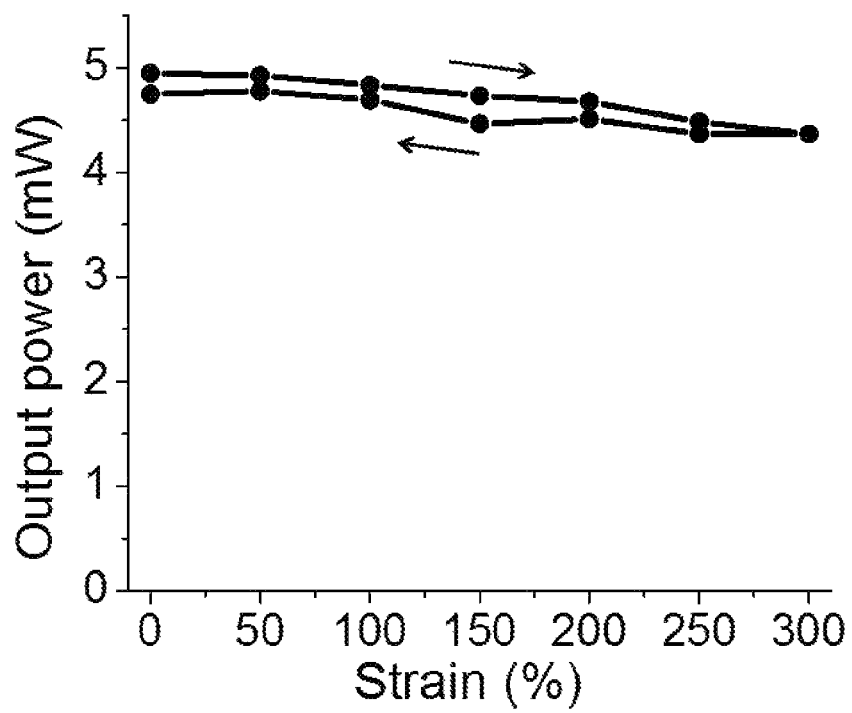
Figure 3D:
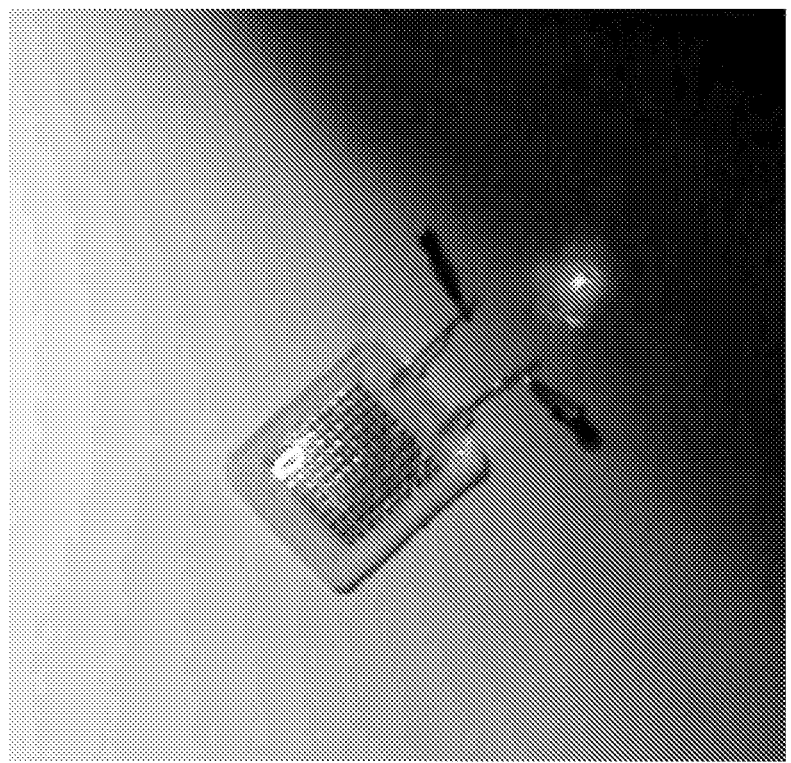
Figure 3E:
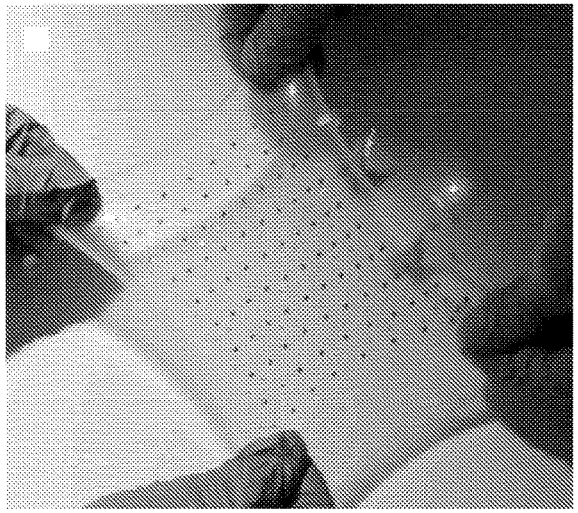
Figure 3F:
Figure 3G:
Figure 3H:
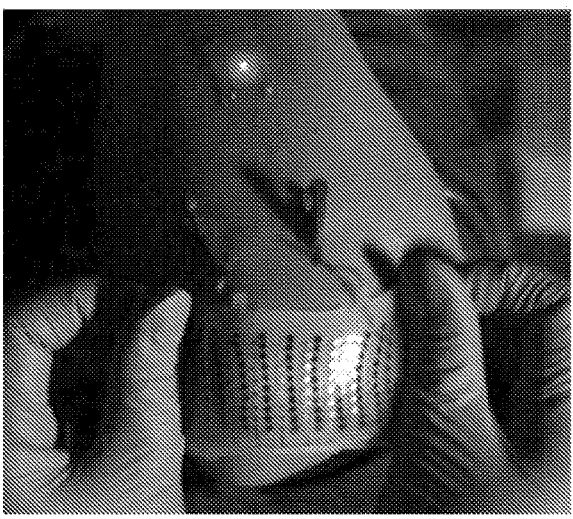
Figure 14:
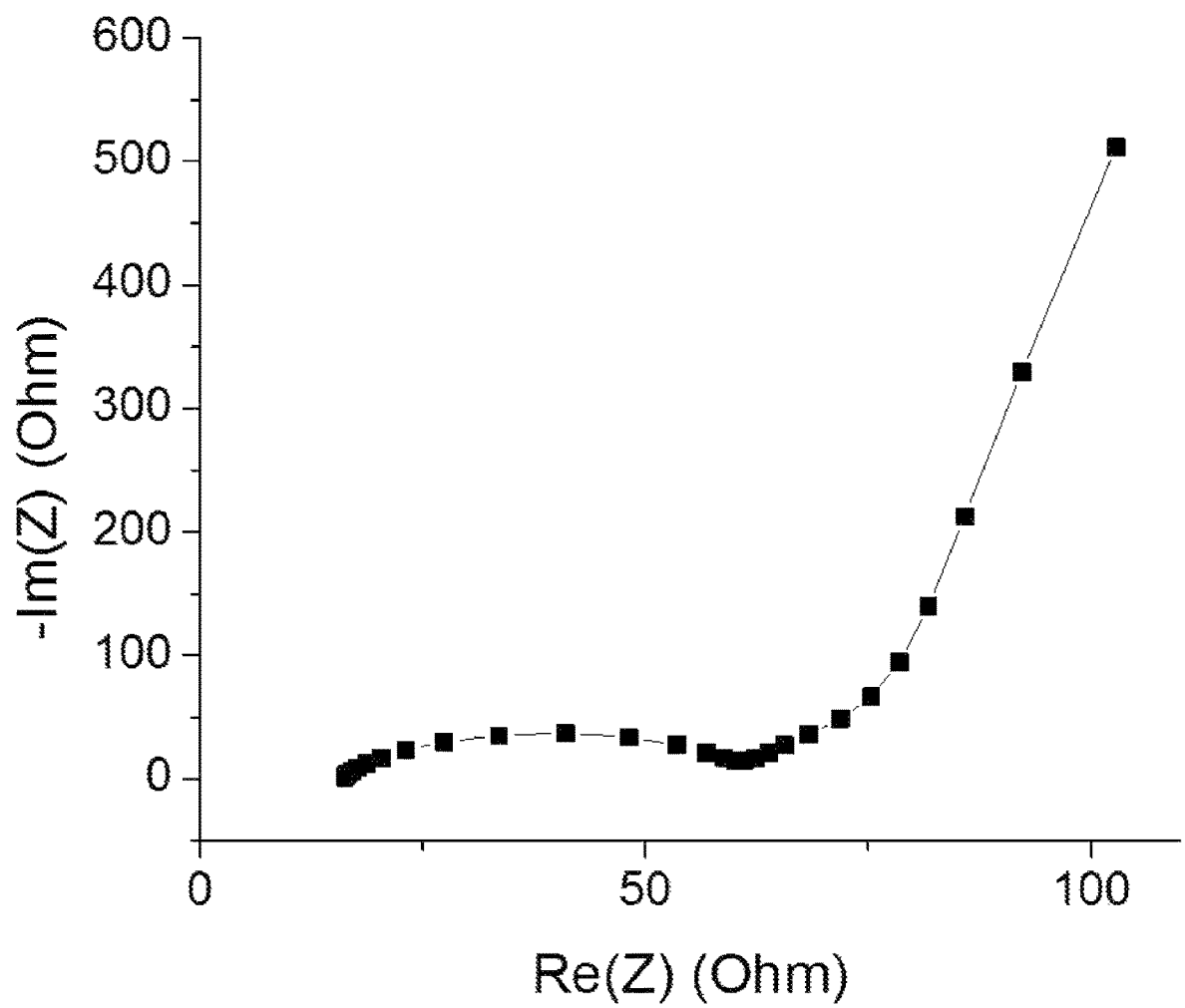
FIG. 14. Nyquist impedance plot for the pouch type stretchable battery from 1 MHz to 10 mHz with an a.c. perturbation amplitude of 10 mV.
Figure 15:
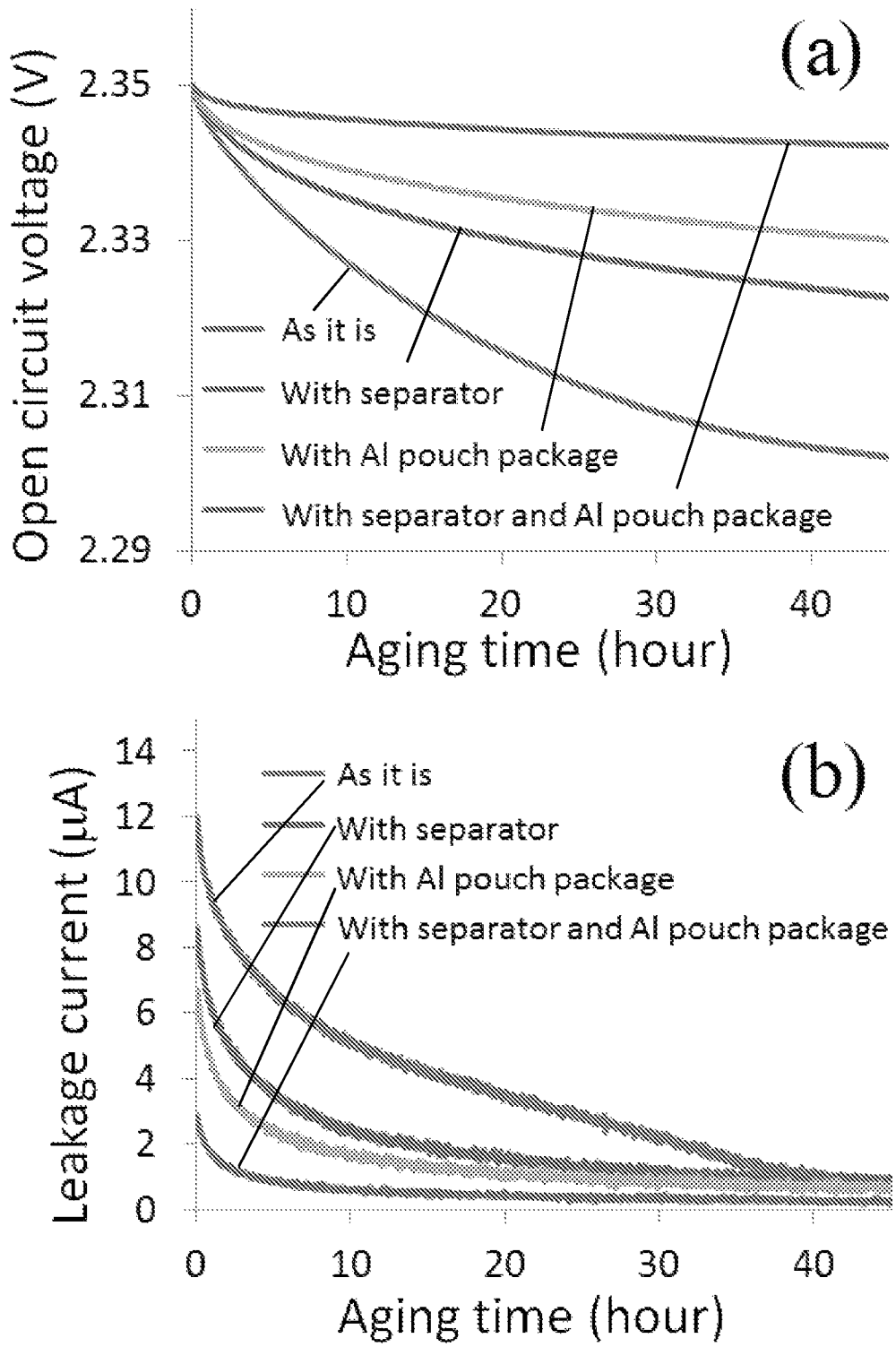
FIG. 15. (a) Open circuit voltage decay curves and (b) leakage current curves for batteries in various configurations, measured at room temperature.
Figure 16:
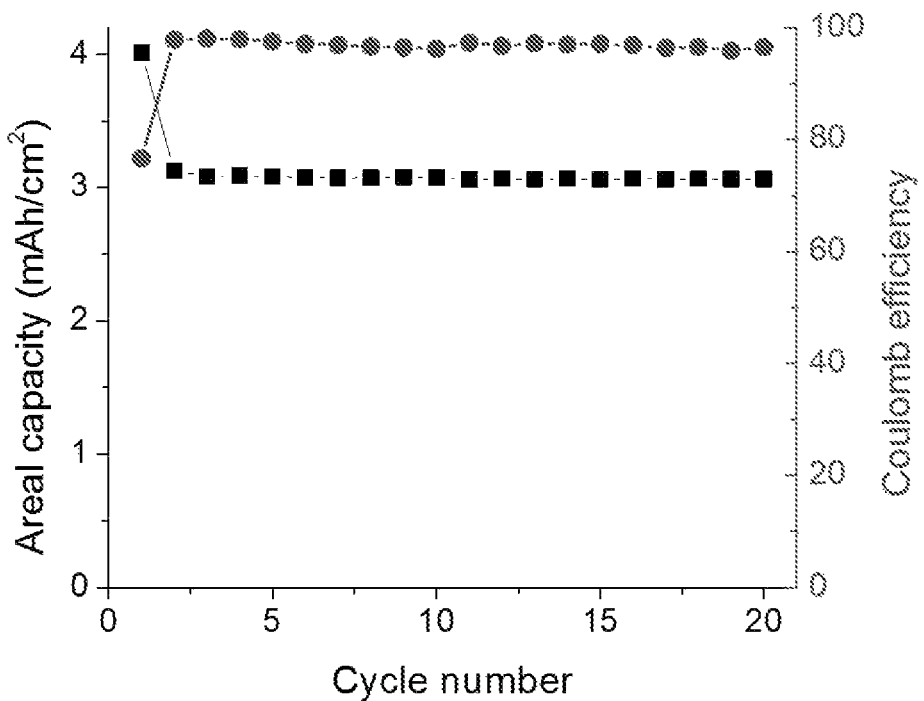
FIG. 16. Capacity retention (squares) and coulombic efficiency (circles) over 20 cycles with a cutoff voltage of 2.5-1.6 V for coin cell geometries with exactly the same slurries and the capacitance matched cathode and anode geometries.
Figure 17:
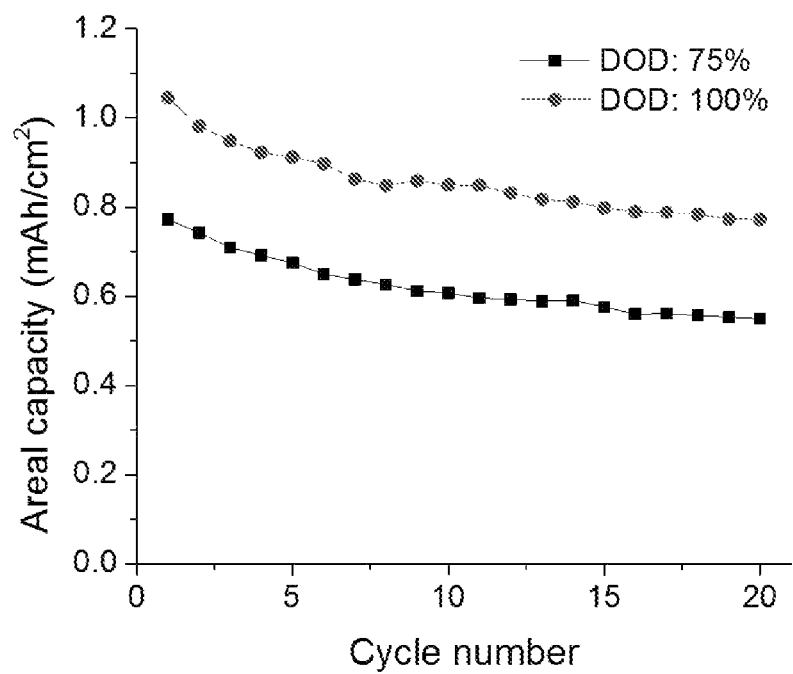
FIG. 17. Capacity retention curves with depth of discharge of 100% (circles curve, cut-off voltage of 1.60-2.50 V) and ~75% (squares, cut-off voltage of 2.25-2.50 V).
Figure 18:
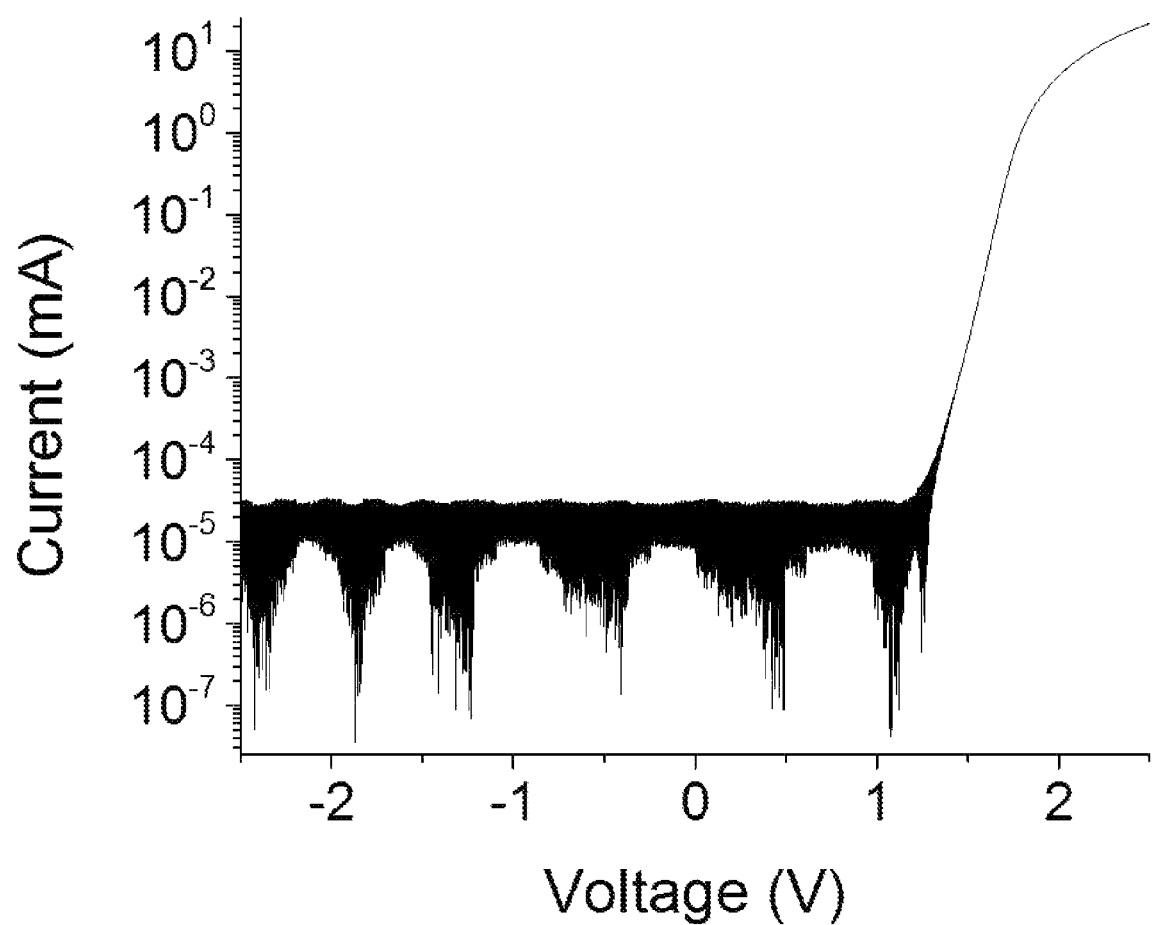
FIG. 18. I-V curve of the commercial red light emitting diode, showing its turn on voltage at around 1.7 V.

Electrochemical properties of the battery electrodes without and with 300% uniaxial strain appear in FIG. 3a. The results show two well defined plateaus at around 2.35 V corresponding to potentials of $Co^{3+/4+}$ and $Ti^{4+/3+}$ redox couples[29]. The thickness of the $LiCoO_2$ (specific capacity 145 mAh/g) at each unit is ~120 µm, corresponding to a mass of ~95 mg, and thus areal capacity density of 1.1 mAh/cm$^2$ at a charge/discharge rate of C/2. The mass of $Li_4Ti_5O_{12}$ (specific capacity 160 mAh/g) is ~90 mg, which corresponds to 5%-10% more anode capacity than cathode[30]. Slurry disks with thicknesses larger than those described here yield improved areal capacity density, but with reduced rate capability due to the concentration polarization in the disks[31,32]. The output resistance of the battery is ~70Ω (FIG. 14), and the leakage current is 1-10 µA. The leakage current arises from three main sources: (i) the reverse biased Schottky diode, (ii) internal ohmic self-discharge between the slurry disks at the anode and cathode and (iii) Faradaic effects, including shuttle reactions associated with impurities in the slurry materials, residual oxygen and/or moisture. Experimental results presented in the SI and FIG. 15 show that use of separators and enhanced packaging schemes can reduce the capacity loss from 161 µA·h to 23 µA·h in 44 hours. FIG. 3b shows the coulombic efficiency (red) and cycling performance (black) of the encapsulated battery. The coulombic efficiency rises from ~60% for the first cycle to over 90% after three cycles. The initial loss can be attributed to the formation cycle, during which a solid-electrolyte-interphase forms, and lithium is consumed in side reactions with impurities in the electrolyte. The gradually degrading capacity retention results rather from the cycle fade (FIG. 16) but more likely from the calendar fade due to some combination of reaction with residual water in the packaging materials, moisture penetration, and electrical discontinuity of slurry particles that detach from the disks (which are not hot-pressed), and can be sometimes observed in the electrolyte gel. Varying the depth of discharge from 100% to 75% did not have a significant effect on the degradation characteristics (FIG. 17). Further increasing the baking temperature and optimizing the composition of the slurries, such as increasing the binder ratio, could reduce the latter behaviors. Improved conditions for device assembly could reduce effects of the former. FIG. 3c shows the output power of the battery, when connected to a resistor (2020Ω), during biaxial stretching and releasing. The slight decrease in output power with strain likely results from increased internal resistances that arise from the significantly increased separations between slurry disks with strains at these large levels. The battery provides sufficient power to operate commercial light emitting diodes (LEDs), with turn on voltages of 1.7 V (FIG. 18), as shown in FIG. 3d. The battery could be stretched for up to 300% (FIG. 3e), folded (FIG. 3f), twisted (FIG. 3g), and compliant when mounted on human skin (FIG. 3h) without noticeable dimming of the LED. Furthermore, FEA demonstrates that the effective modulus (66.8 KPa) of the full composite structure of the battery is only slightly higher than the modulus (60.0 KPa) of substrate materials (ECOFLEX® silicone elastomer). As a result, the battery is not only stretchable but also exceptionally soft and compliant. The modulus is, in fact, lower than that of the human epidermis (140-600 KPa)[8], thereby offering the potential for integration onto the skin and biological tissues, without significant mechanical loading.

Stretchable Wireless Charging System for the Battery.

Figure 4A:
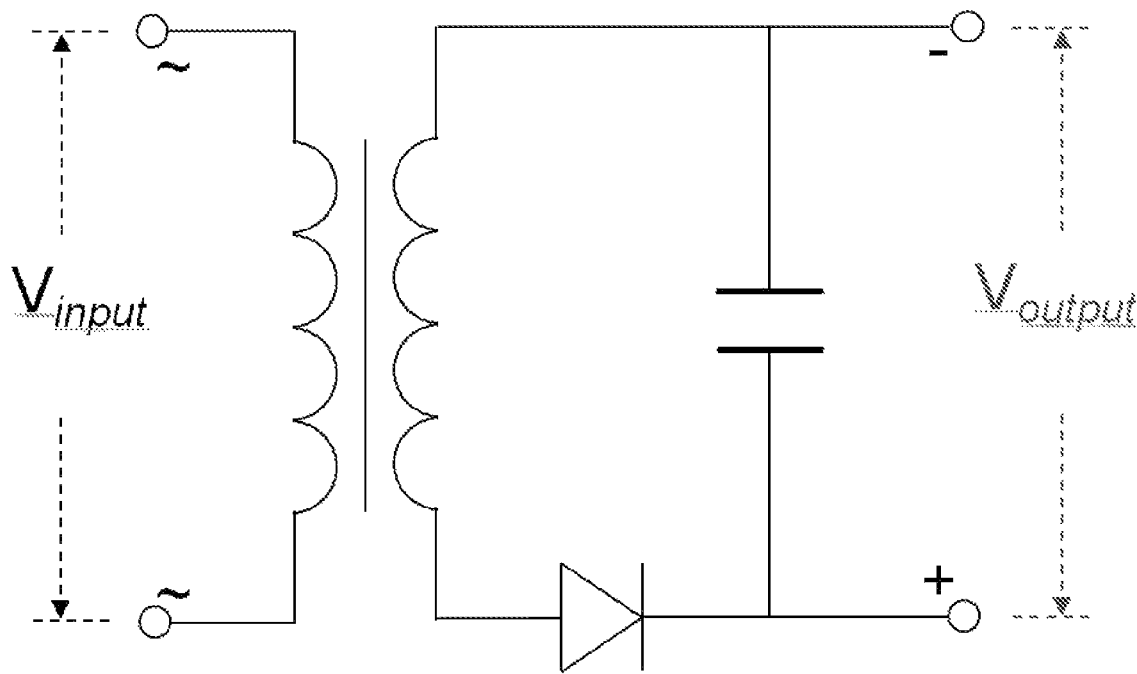
FIG. 4. Stretchable system for wireless charging. (a) Circuit diagram. (b) Image of the integrated system with different components labeled. (c) Characterization of the wireless coil with an alternating voltage input at a frequency of 44.5 MHz (black) and the resulting direct voltage output (red), as indicated in a. (d) Charging voltage (orange) and current (blue) curves as a stretchable battery is charged with 3 V output from the wireless circuit. The scale bar in b is 1 cm.
Figure 4B:
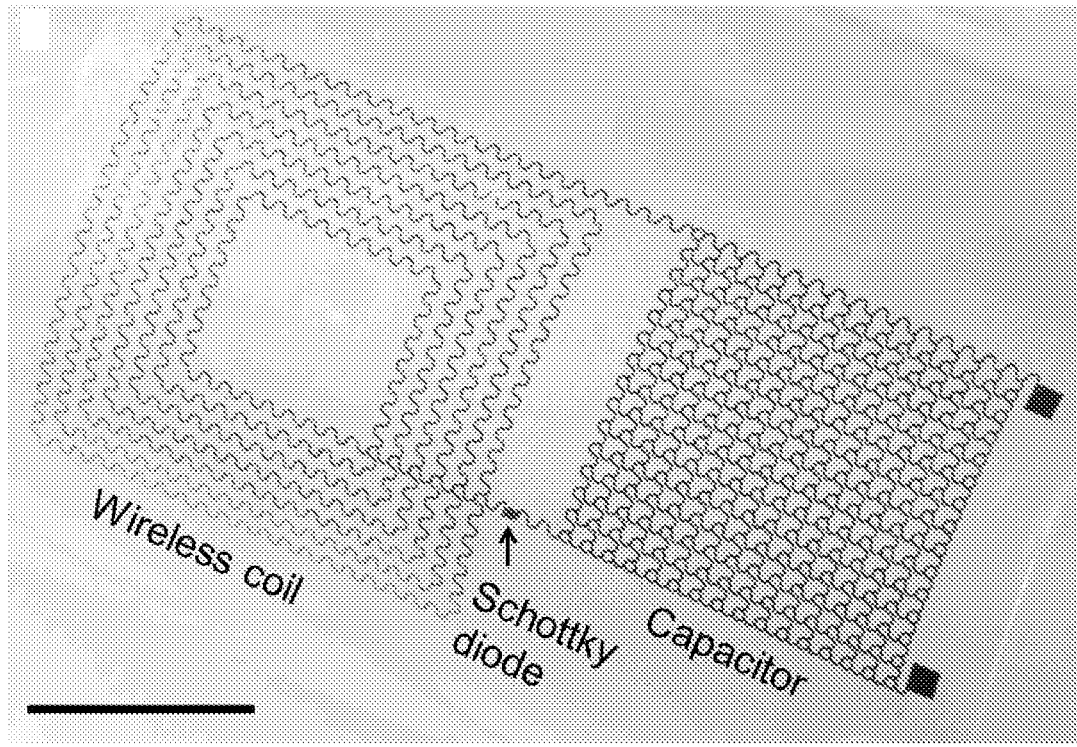
Figure 4C:
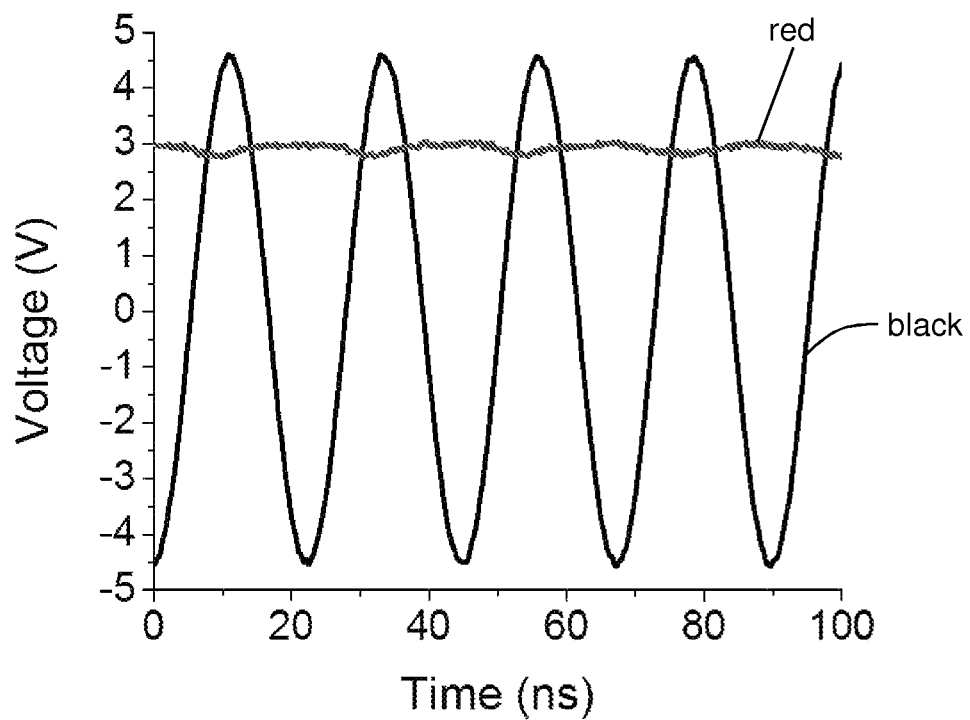
Figure 4D:
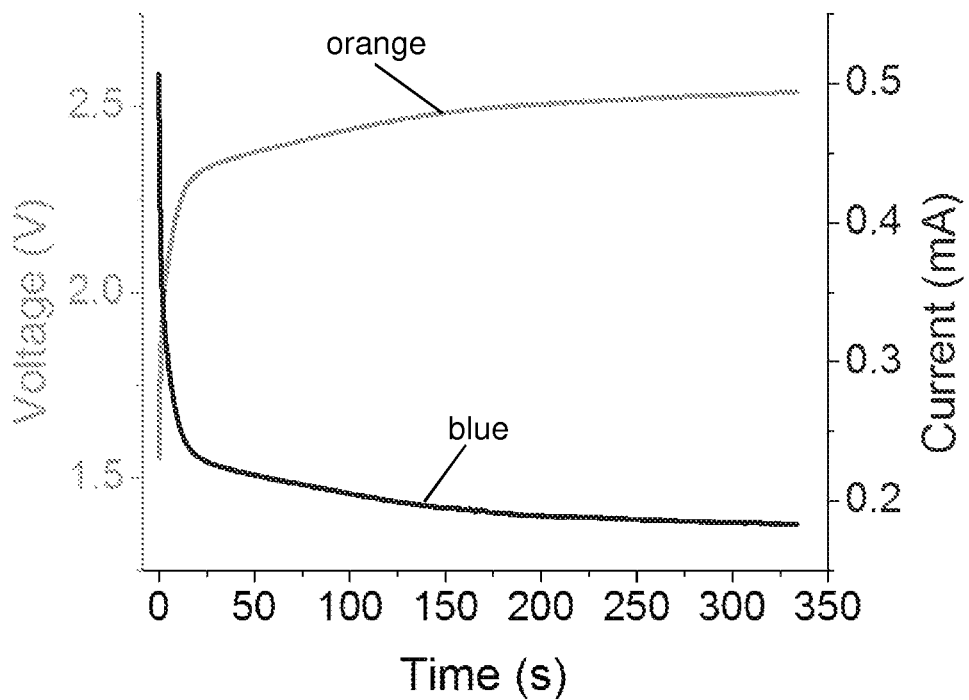
Figure 19:
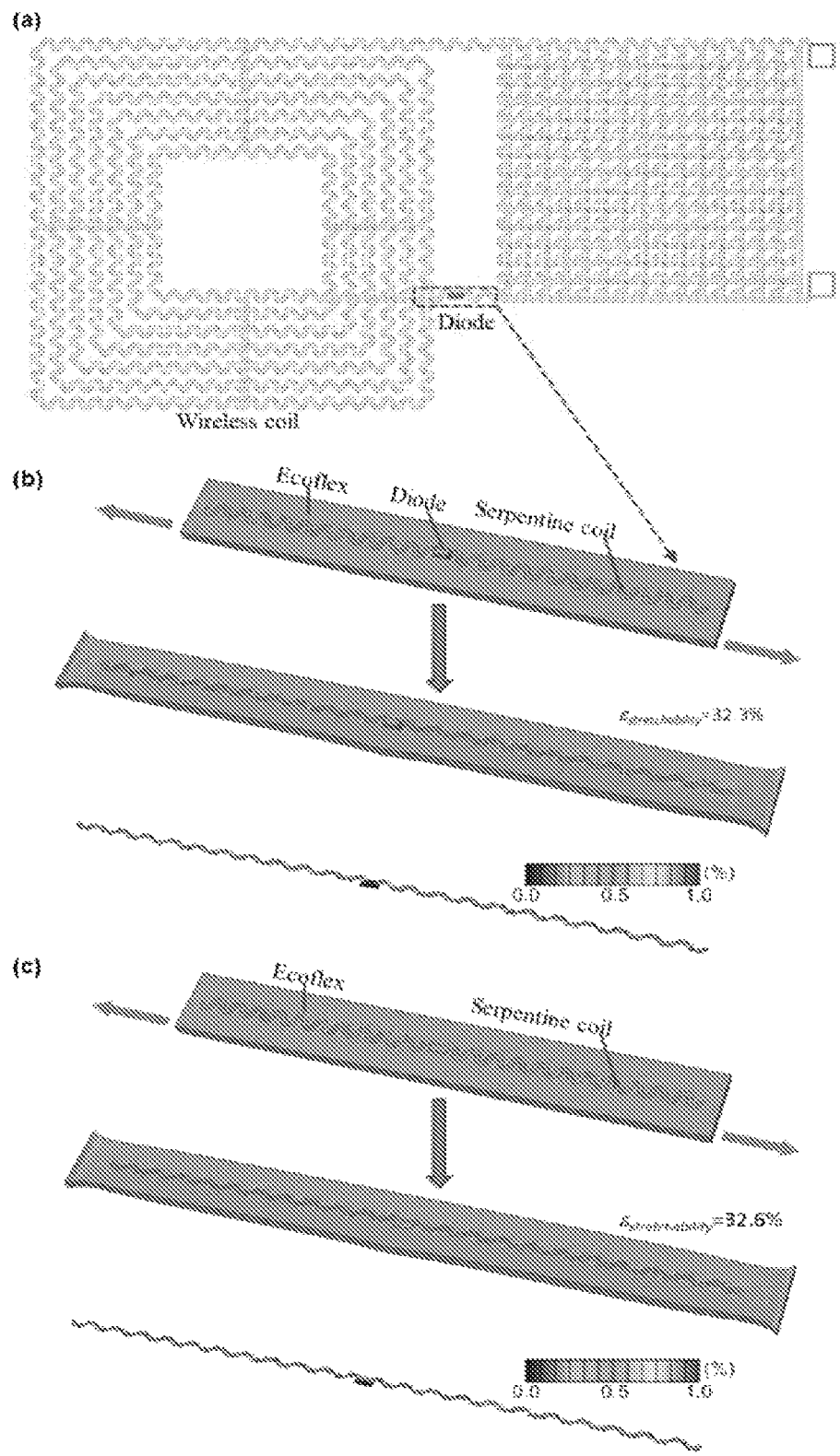
FIG. 19. (a) Schematic illustration of the layout of a wireless recharging system; (b) Calculated deformation and distribution of maximum principal strain under an applied strain of 32.3%, for a representative component of the wireless coil, with both the discrete diode and serpentine interconnect; (c) Calculated deformation and distribution of maximum principal strain under an applied strain of 32.6%, for a representative component of the wireless coil, with only the serpentine interconnect.
Figure 20:
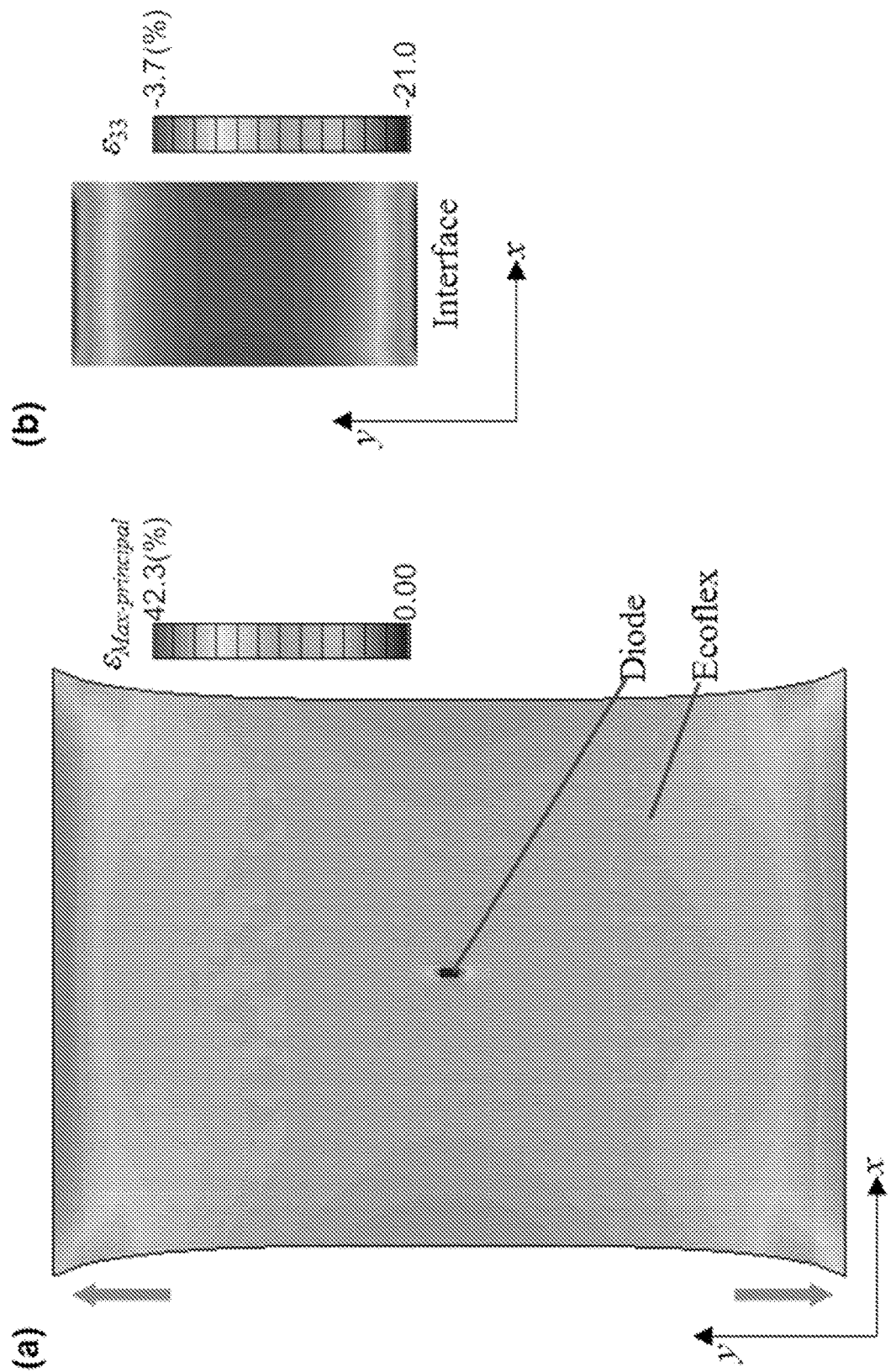
FIG. 20. Calculated distribution of (a) maximum principal strain in the whole structure, and (b) substrate normal strain ($\varepsilon_{33}$) at the diode/substrate interface, when the system is stretched by 30% along the vertical direction.
Figure 21:
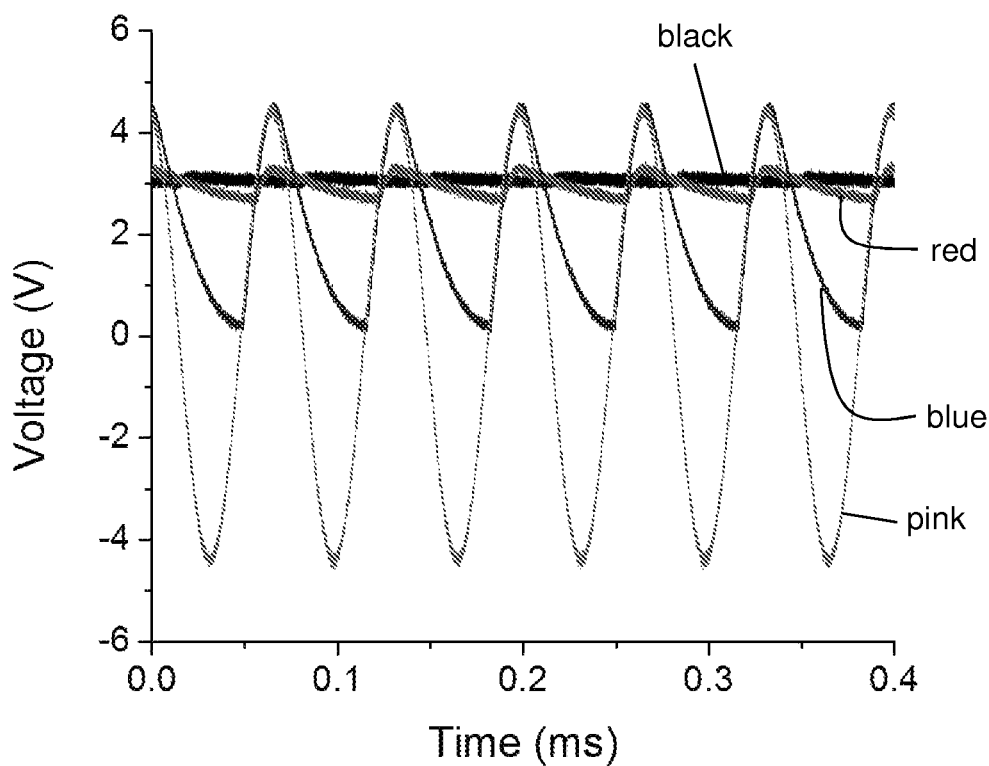
FIG. 21. The input and output electrical characteristics of the wireless charging systems. The Schottky diode rectifies the alternating voltage input from the functional generator (pink curve), to yield a rectified output (blue curve), which oscillates nominally from 0 V to 4.6 V. The parallel 1.7 nF capacitor integrates this oscillation to give a current source with a behavior closer to direct current (red curve). Increasing the capacitance (e.g. 17 nF) further smoothes the current (black curve).
Figure 22:
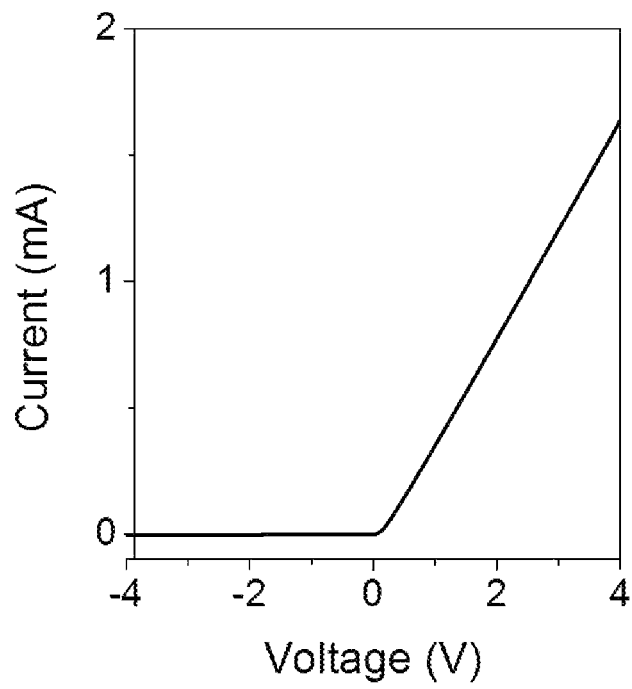
FIG. 22. I-V curve of the wireless coil with the rectifying chip, showing its series resistance of about 2.3 KΩ.

In many practical cases such as embedded devices, the ability to charge the battery without establishing physical connections to external supplies can be valuable. Even in systems where the charging terminals are accessible, such as in skin-mounted devices, there is value in wireless charging, simply because the process of establishing physical contacts can be mechanically destructive to thin, stretchable devices (or to the underlying soft tissue). Approaches that involve physical contact also have the danger of electrical shock to surrounding materials (e.g. the skin itself). The versatility of the materials and designs enable integration of wireless power transmission systems, monolithically with the battery itself. The design and an actual device appear in FIGS. 4a, b, respectively. A secondary coil couples the electromagnetic flux from a primary coil, and a Schottky diode provides rectification. The Schottky diode (packaged in epoxy, with a modulus of ~4.0 GPa) has a modulus of more than 4 orders of magnitude larger than that of the substrate (made of ECOFLEX® silicone elastomer, modulus ~60 KPa), but its size (length 0.62 mm, width 0.32 mm, and height 0.31 mm) is only a few percent (~2%) of the overall size (~30 mm×~20 mm) of the wireless system. As a result, the influence on the overall stretchability is still negligible, as demonstrated by finite element simulations shown in FIGS. 19 and 20. The capacitor smooths oscillations in the output voltages; its small size and thickness enable natural integration into the overall system. Larger capacitors can smooth the oscillations to an even greater extent (FIG. 21). The coil and rectifier add a series resistance of 2.3 KΩ (FIG. 22), which functions as a parallel resistance with the secondary coil, shunting away current from the battery. The resistance of the serpentine secondary coil is 1.92 kΩ/m; a coil with similar overall geometry but without the serpentine shape is calculated to be 1.22 kΩ/m. Improving the efficiency of the charging system can be achieved by increasing the width and thickness of the wires, but at the expense of reduced stretchability and increased modulus. Specific application requirements will define the right tradeoffs. In this case, the output power from the primary coil was 187 mW. With a working distance of 1 mm between the primary and secondary coil, the power received on the secondary coil is 9.2 mW, corresponding to an efficiency of 4.9%. The power coupling efficiency of the wireless charging system depends strongly on the resistance of the serpentine receiver coil. Increasing the thickness to 7 µm and using copper improves the efficiency from 4.9% to 17.2%. At this thickness, the coil retains stretchability to strains of 25%. Data and images appear in the SI. The capacitor has a capacitance of 1.7 nF, in a structure that uses a 1.2 µm thick layer of polyimide as the dielectric, with a layer of thiol molecules on the bottom Au electrodes to enhance adhesion. FIG. 4c shows the input and output of this wireless power transmission device. An input voltage at a frequency of 44.5 MHz matches the self-resonant frequency of the secondary coil, which is dependent on the coil area, number of turns, distance between each turn, and wire resistance. For a peak-to-peak input voltage of 9.1 V (FIG. 4c black curve), the DC output voltage is 3.0 V (FIG. 4c red curve). The charging curves of a small scale battery using the wireless coil appear in FIG. 4d. The battery voltage (FIG. 4d orange curve) rises to 2.5 V in about 6 mins. The charging current in the circuit (FIG. 4d blue curve) decreases from 0.5 mA to below 0.2 mA. We used a partial differential equation to model the charging circuit, and a numerical program to calculate the charging current curve. Simulation of this process agrees well with the experimental data (SI text and FIG. 20).

Discussion

The materials and schemes described in this example provide routes to energy storage devices and wireless charging systems with forms and properties that are attractive for powering stretchable electronic and optoelectronic devices. The slurry materials themselves are deployed in ways (a soft lithographic type casting process) that allow natural integration with unusual materials (low modulus silicone rubber sheets, embossed with surface relief). The stretchable interconnects exploit a 'self-similar' design that offers unique, 'spring within a spring' mechanics. The consequence is a level of stretchability that is more than 4× larger than previous reports, even while, at the same time, enabling coverages of active materials as high as 50%. The combination of these two aspects, together with comprehensive and experimentally validated models of the underlying mechanics, leads to a technology, i.e. a stretchable, rechargeable battery, which offers much different characteristics than anything that has been previously possible. As an additional advance, we introduce integrated stretchable, wireless charging systems that offer physical properties similar to those of the batteries.

The slurry chemistries, separator materials, and stretchable, air-impermeable packaging materials can be selected to provide high device performance. The self-similar serpentine interconnect structure possesses a geometry of space filling curve, and a buckling physics of ordered unraveling. This type of interconnect structure has immediate, and general utility, suitable for any class of stretchable technology that combines hard and soft materials. The topology-level interconnect geometry simultaneously provides for large mechanical stretchability and low electrical resistance. Wireless power transfer efficiency can be improved by reducing the coil input resistance, maximizing the mutual inductance between the primary and secondary coils, and increasing the self-resonant frequency of the coils. Regulation circuits may be incorporated to avoid over-charging the battery.

Methods

Fabrication of electrodes and mechanical testing of self-similar interconnects: Sequential spin casting defined a bilayer of poly(methyl methacrylate) (PMMA 495 A2, 3000 rpm for 30 s, baked on a hotplate at 180° C. for 2 mins) and then a layer of polyimide (PI, from poly(pyromellitic dianhydride-co-4,4'-oxydianiline) amic acid solution; 4000 rpm for 30 s, baked on a hotplate at 150° C. for 4 mins and then in a vacuum oven at 10 mT and 250° C. for 1 h) on a silicon wafer. The cathode and anodes consisted of 600 nm thick layers of Al or Cu, respectively, deposited by electron beam evaporation onto the PI. Photolithography (AZ5214E) and etching (Type A aluminum etchant on hotplate at 50° C. for 2 min; Type CE-100 copper etchant at room temperature for 10 s; Transene Company) defined patterns in these metals. After removing the residual photoresist, spin coating formed an additional layer of PI over the entire structure. Next, photolithography (AZ 4620, 2000 rpm for 30 s, baked at 110° C. for 4 mins) and oxygen plasma etching (300 mT, 20 sccm $O_2$, 200 W for 10 mins) patterned the layers of PI in a geometry matched to the metal traces.

Immersion in hot acetone partially removed the underlying PMMA layer, thereby allowing the entire structure to be retrieved from the silicon wafer onto the surface of a piece of water soluble tape (3M, Inc.). Electron beam evaporation of Ti (5 nm)/$SiO_2$ (50 nm) through a shadow mask formed backside coatings aligned to the metal disks[33]. Thin (250 μm) silicone substrates (ECOFLEX® silicone elastomer, Smooth-On, Inc., Easton, Pa.) were prepared by mixing the two components in a 1:1 weight ratio, spin-casting (300 rpm for 30 s) the resulting material into a petri dish and then partially curing it (30 mins at room temperature). Next, spin-casting (3000 rpm for 30 s) an allyl amide functional perfluorinated ether (DuPont), and then curing it under ultraviolet (UV) light for 30 mins formed a top encapsulation layer. The other side of the ECOFLEX® silicone elastomer substrate was surface-activated under UV light for 5 mins. Laminating the electrode structures onto this surface led to strong bonding, upon contact[34]. The water soluble tape was removed by immersing the substrate in tap water for overnight. As a final step, the electrodes were dipped in 1 mM HCl to remove oxides from the surfaces of the metals.

Mechanical testing of the self-similar interconnects was performed with a customized uniaxial stretcher. To ensure that the interconnects were decoupled from the substrate, each disk was mounted on top of a post (250 mm in height) molded into the silicone substrate. Images and video of the deformed interconnects were collected with a digital single-lens reflex camera.

Patterned Moulding of Slurries and their Integration with Current Collecting Electrodes:

Photolithography (AZ 4620, 7-8 μm thick) and inductively coupled plasma reactive ion etching (ICP RIE) defined arrays of cylindrical wells on the surface of a silicon wafer. The conditions were chosen to yield sloped sidewalls, which are important for effective transfer of the slurries, as described subsequently. Washing with acetone removed the photoresist. A layer of polytetrafluoroethylene (~200 nm) conformally deposited using the ICP RIE tool served as a coating to prevent adhesion. The slurry materials consisted of lithium cobalt oxide or lithium titanium oxide, acetylene black, and polyvinylidene fluoride, mixed in a weight ratio of 8:1:1 in a solvent of N-methyl-2-pyrrolidone (NMP) for the cathode and anode, respectively. The mixture was stirred for overnight, and then mechanically scraped across the etched surface of the silicon wafer. The cylindrical wells, filled with slurry in this manner, were baked on a hotplate at 90° C. for overnight, and then retrieved onto the surface of a piece of water soluble tape. The baking conditions were selected carefully to enable retrieval of the slurry with high yield. Registering the tape to the metal electrodes ensured that the molded slurry aligned to the metal disks. Immersion in tap water for overnight dissolved the tape. Baking the substrates at 170° C. for overnight in a vacuum oven removed the moisture and improved the strength of bonding between the slurry and the metal.

Assembly and Electrochemical Testing of the Battery:

Anisotropic conductive films, hot pressed onto the metal electrodes, served as points for external electrical connection. Application of Sylgard Prime Coat (Dow Corning, Inc.) to the periphery of the substrates prepared them for bonding. A thin silicone spacer layer (500 μm thick) at the periphery prevented direct contact as the two sheets were laminated together. A lateral spatial offset prevented electrical shorting between the active regions. The edges were sealed with an additional application of ECOFLEX® silicone elastomer followed by baking on a hotplate (90° C. for 2 h). The gel electrolyte consisted of a mixture of 100 g lithium perchlorate, 500 ml ethylene carbonate, 500 ml dimethylcarbonate, and 10 g polyethylene oxide ($4 \times 10^6$ g/mol), prepared in an argon filled glovebox as a homogenous gel. This material was injected into the battery using a syringe through an edge.

A BioLogic VMP3 electrochemical station with a cutoff voltage of 2.5-1.6 V at room temperature was used to charge and discharge the as-fabricated and stretched battery electrodes, and to evaluate cycling behavior of the full, integrated battery. Areal capacity density was calculated based on the active region. The output power was monitored with the battery connected to a 2020Ω resistor, using an ammeter. Values of current were recorded as a function of strain applied to the battery.

Fabrication and Testing of the Wireless Coil:

A silicon wafer, coated with layers of PMMA and PI using steps described previously, served as a substrate for deposition of Cr (5 nm)/Au (500 nm) by electron beam evaporation. Photolithography (AZ 5214E) and etching (Transene Company) defined patterns in the geometry of the bottom electrode of the capacitor and associated contact lines.

Removing the photoresist with acetone, and then immersing the substrate in a 1 mM poly(ethylene glycol) methyl ether thiol solution in isopropanol for 15 mins served to enhance the adhesion and coverage of a second layer of PI spin-cast (4000 rpm 30 s) and cured (on hotplate at 150° C. for 4 mins and then in vacuum oven at 250° C. for 1 h) on the electrodes. This layer of PI served as the dielectric for the capacitor. Photolithography (AZ 4620, 2000 rpm for 30 s, baked at 110° C. for 4 mins) defined a mask for etching vias through the PI layer, as points of connection between the coil and the bottom electrode of the capacitor. After immersion in acetone to remove the photoresist, sputter deposition formed a conformal layer of Cu (600 nm) over the entire surface, including the sidewalls. Photolithography (AZ 5214E) and etching defined the coil and the other top electrode of the capacitor. After removing the resist, a third spin-cast layer of PI formed a coating on the Cu electrodes. An oxygen plasma etching through the three PI layers in a patterned geometry defined the final device layout. Release by immersion in hot acetone partially removed the underlying PMMA, to enable the release of the entire structure onto water soluble tape. Deposition of Ti (5 nm)/$SiO_2$ (50 nm) and lamination onto the UV activated surface of an ECOFLEX® silicone elastomer substrate led to strong bonding. After the water soluble tape was removed, a Schottky diode chip (Digikey BAT 62-02LS E6327) was bonded between the coil and the capacitor using silver epoxy. The forward input resistance is ~500Ω, and the rectification ratio is ~1×104 at a bias voltage of ±1 V[35].

High frequency alternating current signals were generated by a KEITHLEY 3390 50 MHz arbitrary waveform generator. The input and output characterization of the wireless coil were performed using an Agilent infiniium DSO8104A oscilloscope (1 GHz, 4 channels). The wireless charging voltage and current to the battery were monitored using a BioLogic VMP3 electrochemical station.

REFERENCES

1 Pelrine, R., Kornbluh, R., Pei, Q. B. & Joseph, J. High-speed electrically actuated elastomers with strain greater than 100%. Science 287, 836-839 (2000).
2 Wagner, S. et al. Electronic skin: architecture and components. Physica E Low Dimens Syst Nanostruct 25, 326-334 (2004).
3 Khang, D. Y., Jiang, H. Q., Huang, Y. & Rogers, J. A. A stretchable form of single-crystal silicon for high-performance electronics on rubber substrates. Science 311, 208-212 (2006).
4 Sekitani, T. et al. A rubberlike stretchable active matrix using elastic conductors. Science 321, 1468-1472 (2008).
5 Sekitani, T. & Someya, T. Stretchable organic integrated circuits for large-area electronic skin surfaces. Mrs Bulletin 37, 236-245 (2012).
6 Suo, Z. G. Mechanics of stretchable electronics and soft machines. Mrs Bulletin 37, 218-225 (2012).
7 Yoon, J. et al. Ultrathin silicon solar microcells for semitransparent, mechanically flexible and microconcentrator module designs. Nature Mater. 7, 907-915 (2008).
8 Kim, D. H. et al. Epidermal Electronics. Science 333, 838-843 (2011).
9 Mannsfeld, S. C. B. et al. Highly sensitive flexible pressure sensors with microstructured rubber dielectric layers. Nature Mater. 9, 859-864 (2010).
10 Takei, K. et al. Nanowire active-matrix circuitry for low-voltage macroscale artificial skin. Nature Mater. 9, 821-826 (2010).
11 Someya, T. et al. A large-area, flexible pressure sensor matrix with organic field-effect transistors for artificial skin applications. Proc. Natl. Acad. Sci. U.S.A. 101, 9966-9970 (2004).
12 Kim, D. H. et al. Materials for multifunctional balloon catheters with capabilities in cardiac electrophysiological mapping and ablation therapy. Nature Mater. 10, 316-323 (2011).
13 Ko, H. C. et al. A hemispherical electronic eye camera based on compressible silicon optoelectronics. Nature 454, 748-753 (2008).
14 Nishide, H. & Oyaizu, K. Toward flexible batteries. Science 319, 737-738 (2008).
15 Pushparaj, V. L. et al. Flexible energy storage devices based on nanocomposite paper. Proc. Natl. Acad. Sci. U.S.A. 104, 13574-13577 (2007).
16 Scrosati, B. Nanomaterials—Paper powers battery breakthrough. Nature Nanotechnol. 2, 598-599 (2007).
17 Hu, L. B. et al. Highly conductive paper for energy-storage devices. Proc. Natl. Acad. Sci. U.S.A. 106, 21490-21494 (2009).
18 Hu, L., Wu, H., La Mantia, F., Yang, Y. & Cui, Y. Thin, Flexible Secondary Li-Ion Paper Batteries. ACS Nano 4, 5843-5848 (2010).
19 Yu, C. J., Masarapu, C., Rong, J. P., Wei, B. Q. & Jiang, H. Q. Stretchable Supercapacitors Based on Buckled Single-Walled Carbon Nanotube Macrofilms. Adv. Mater. 21, 4793-4797 (2009).
20 Hu, L. B. et al. Stretchable, Porous, and Conductive Energy Textiles. Nano Lett. 10, 708-714 (2010).
21 Kaltenbrunner, M., Kettlgruber, G., Siket, C., Schwodiauer, R. & Bauer, S. Arrays of Ultracompliant Electrochemical Dry Gel Cells for Stretchable Electronics. Adv. Mater. 22, 2065-2067 (2010).
22 Gaikwad, A. M. et al. Highly Stretchable Alkaline Batteries Based on an Embedded Conductive Fabric. Adv. Mater. 24, 5071-5076 (2012).
23 Tarascon, J. M. & Armand, M. Issues and challenges facing rechargeable lithium batteries. Nature 414, 359-367 (2001).
24 Scrosati, B. & Garche, J. Lithium batteries: Status, prospects and future. J. Power Sources 195, 2419-2430 (2010).
25 Thanawala, S. K. & Chaudhury, M. K. Surface modification of silicone elastomer using perfluorinated ether. Langmuir 16, 1256-1260 (2000).
26 Lee, J. et al. Stretchable GaAs Photovoltaics with Designs That Enable High Areal Coverage. Adv. Mater. 23, 986-991 (2011).
27 Lee, J. et al. Stretchable Semiconductor Technologies with High Areal Coverages and Strain-Limiting Behavior: Demonstration in High-Efficiency Dual-Junction GaInP/GaAs Photovoltaics. Small 8, 1851-1856 (2012).
28 Krieger, K. Extreme mechanics: Buckling down. Nature 488, 146-147 (2012).
29 Yoshima, K., Munakata, H. & Kanamura, K. Fabrication of micro lithium-ion battery with 3D anode and 3D cathode by using polymer wall. J. Power Sources 208, 404-408 (2012).
30 Ferg, E., Gummow, R. J., Dekock, A. & Thackeray, M. M. Spinel Anodes for Lithium-Ion Batteries. J. Electrochem. Soc. 141, L147-L150 (1994).
31 Owen, J. R. Rechargeable lithium batteries. Chem. Soc. Rev. 26, 259-267 (1997).

32 Gowda, S. R. et al. Conformal Coating of Thin Polymer Electrolyte Layer on Nanostructured Electrode Materials for Three-Dimensional Battery Applications. Nano Lett. 11, 101-106 (2011).

33 Sun, Y. G., Choi, W. M., Jiang, H. Q., Huang, Y. G. Y. & Rogers, J. A. Controlled buckling of semiconductor nanoribbons for stretchable electronics. Nature Nanotechnol. 1, 201-207 (2006).

34 Ouyang, M., Yuan, C., Muisener, R. J., Boulares, A. & Koberstein, J. T. Conversion of some siloxane polymers to silicon oxide by UV/ozone photochemical processes. Chem. Mater. 12, 1591-1596 (2000).

35 Datasheet for BAT 62-02LS E6327 on www.digikey.com

Supplementary Information

Fabrication of a Stretchable Encapsulating Layer, Consisting of a Buckled Sheet of Al/PI on a Silicone Substrate The first step involved fabrication of a trilayer of PMMA/PI/Al on a silicon substrate, using procedures similar to those employed for the Al battery electrodes. Photolithography with AZ5214E and wet etching the Al defined the lateral dimensions of the PI/Al sheet. Next, oxygen plasma etching (300 mT, 20 sccm $O_2$, 200 W for 5 mins) removed the PI layer in the exposed regions. Immersion in hot acetone partially removed the underlying PMMA layer, thereby allowing the entire structure to be retrieved from the silicon wafer onto the surface of a piece of water soluble tape (3M, Inc.). Electron beam evaporation of Ti (5 nm)/$SiO_2$ (50 nm) formed backside coatings. On a separate substrate, 500 µm thick silicone sheets (ECOFLEX® silicone elastomer, Smooth-On, Inc., Easton, Pa.) were prepared, then removed and prestrained biaxially to a level of ~30% and then fixed by lamination onto a glass slide. The silicone surface was activated by exposure to UV-induced ozone for 5 mins. Laminating the PI/Al bilayer onto this surface led to strong bonding, upon contact. The water soluble tape was removed by immersing the substrate in tap water for overnight. Peeling the entire assembly away from the glass slide released the prestrain, and led to an expected pattern of buckling. In this configuration, the overall system can be stretched to strains as large as those equal to the prestrain.

Mechanical Analyses of "Island-Bridge" Self-Similar Electrode Structures: FEA

Full three-dimensional (3D) FEA is adopted to analyze the postbuckling behaviors of "island-bridge" self-similar electrode structures under stretching and compression. Due to the structural periodicity of the electrode, a representative unit cell was studied, and its detailed geometry is shown in FIG. 5. The circular island of the electrode is mounted on a post (height 250 µm) molded on the surface of a silicone substrate (ECOFLEX® silicone elastomer; thickness 500 µm). The metal interconnect (thickness 0.6 µm), is encased, top and bottom, by a thin layer of polyimide (PI, thickness 1.2~m for each layer). The elastic modulus (E) and Poisson's ratio (v) are $E_{ecoflex}$=0.06 MPa and $v_{ecoflex}$=0.49 for ECOFLEX® silicone elastomer; $E_{Cu}$=119 GPa and $v_{Cu}$=0.34 for copper; $E_{Al}$=70 GPa and $v_{Al}$=0.35 for aluminum; and $E_{PI}$=2.5 GPa and $v_{PI}$=0.34 for PI. Eight-node 3D solid elements and four-node shell elements were used for the ECOFLEX® silicone elastomer and self-similar electrode, respectively, and refined meshes were adopted to ensure the accuracy. The evolution of deformed configurations with applied strains are obtained from FEA for both stretching and compression, as shown in FIG. 2 and FIG. 12, respectively. Good agreement between FEA and experiment results can be found. Here, we take the case of copper as a demonstration of the buckling profiles. The results for the aluminium layer are similar. For the comparison of stretchability and reversibility between self-similar and serpentine interconnects (FIG. 11), the key geometrical parameters are kept the same, including the total length ($l_{total}$=16.77 mm), span (L=1.6 mm), amplitude (h=0.4 mm), width (w=30 µm), and thickness (t=3.0 µm). The aluminum interconnect (thickness 0.6 µm) is encased by two thin layers of polyimide (thickness 1.2~m for each layer). FIG. 11 demonstrates that over the entire range of stretching from 0% to ~800%, the strain level of the self-similar interconnect is always lower than the serpentine one. The stretchability (809%) and reversibility (528%) of the self-similar design, are higher than those ($\varepsilon_{stretchability}$=682%, $\varepsilon_{reversibility}$=284%) of the simple serpentine design.

Battery Leakage Current Analysis

The leakage current arises from three sources. The first source is current through the reverse biased Schottky diode. This current is ~0.2 µA, and is relatively constant throughout the lifetime of the battery. Schottky diodes with smaller reverse current are available; such devices can reduce this contribution to the leakage.

The second source is the internal ohmic self-discharge current between the slurry disks at the anode and cathode. This contribution arises from finite electronic conductivity of the electrolyte and any parasitic physical contacts between the slurry disks at the cathode and anode. These losses can be dramatically reduced by electrolyte materials with enhanced purity and implementing separators. New experiments reveal the latter effects quantitatively. FIGS. 15a and b show the voltage decay and leakage current curves for otherwise similar batteries with and without a commercial separator (Celgard). This component reduces the capacity loss from 161 µA·h to 88 µA·h in 44 hours.

The third source is from current produced by Faradaic effects, including shuttle reactions associated with impurities in the slurry materials, residual oxygen and/or moisture. Improving the air-impermeability of the packaging materials can reduce currents that arise from such reactions. New experiments show that sealing the battery in an Al pouch (which can be configured in a wrinkled configuration to allow stretching) reduces the capacity loss from 161 µA·h to 62 µA·h. Combining the separator and the Al pouch packaging, suppresses the capacity loss to 23 µA·h. FIG. 15 summarizes all of these findings.

Discrete Schottky Diode Stretching Behavior Analysis

From a practical standpoint, we observe no significant constraints on the overall mechanical properties of the integrated system, due to the comparatively small size of the diode. In particular, although the Schottky diode, which is encapsulated in epoxy which has a modulus of ~4.0 GPa, is effectively more than 4 orders of magnitude larger than that of substrate (made of ECOFLEX® silicone elastomer, with a modulus of ~60 KPa), its dimensions (length 0.62 mm, width 0.32 mm, and height 0.31 mm) represent only a few percent (~2%) of the overall size (~30 mm×~20 mm) of the wireless system. Experimentally, we observe that the system is robust to stretching up to ~30% and beyond.

To study these effects quantitatively, we carried out full, three dimensional finite element simulations that examine the influence of the diode on the stretchability of the coil in the integrated system, as in FIG. 19a. Results in FIGS. 19b and 19c, indicate that: (1) The decrease in stretchability is modest, from 32.6% to 32.3%, when the diode is included and (2) The strain in the diode (i.e. the epoxy) is very small (<0.15%, much smaller than the strain needed to induce fracture), even when the overall system is stretched by 32.3%.

The normal interface strain is also important. FIG. 20a shows the distributions of maximum principal strains in a large ECOFLEX® silicone elastomer substrate with a diode mounted in its center, for stretching to 30%. FIG. 20b illustrates the distribution of the substrate normal strain at the diode/substrate interface. The normal interface strain in this case is negative, corresponding to compressive strain at the interface. This outcome, which is consistent with theoretical predictions based on energy release rates at an interface crack, minimizes the propensity for delamination.

Coil Resistance Effect on the Wireless Power Transfer Efficiency

Figure 23A:
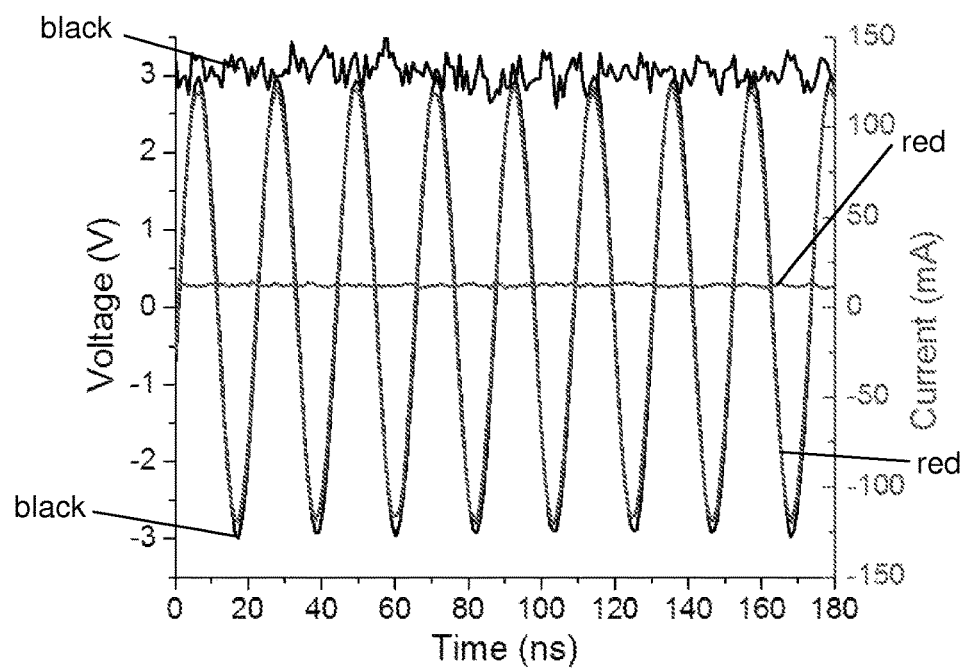
FIG. 23. (a) Input and output voltages (black) and currents (red) of the wireless coil 18 µm thick copper foil. (b) Optical micrographs of a 7 µm thick Cu coil at different levels of applied uniaxial strain. The scale bars are all 1 cm. (c) Finite element analysis of stretching of a segment of a serpentine coil with a thickness of 7 µm.

The coil resistance/qualify factor is a critical parameter that dictates the efficiency. In additional experiments to illustrate the effects, we replaced the 600 nm thick gold serpentine coils with otherwise similar ones fabricated with copper at increased thicknesses. The results show that coils formed using a 7 μm thick copper film (Dupont) have total resistances of 185Ω, and generate a received power of 30.8 mW with an input power of 179 mW (at a distance of 1 mm, similar to the previously reported results). The corresponding efficiency is 17.2%, which represents more than a factor of three improvement over the original, gold coils (4.9%). Further reducing the coil resistance to 38Ω by using 18 μm thick copper foil (MTI Corp.) improves the received power to 36.2 mW, and the efficiency to 20.2%. See FIG. 23a.

Figure 23B:
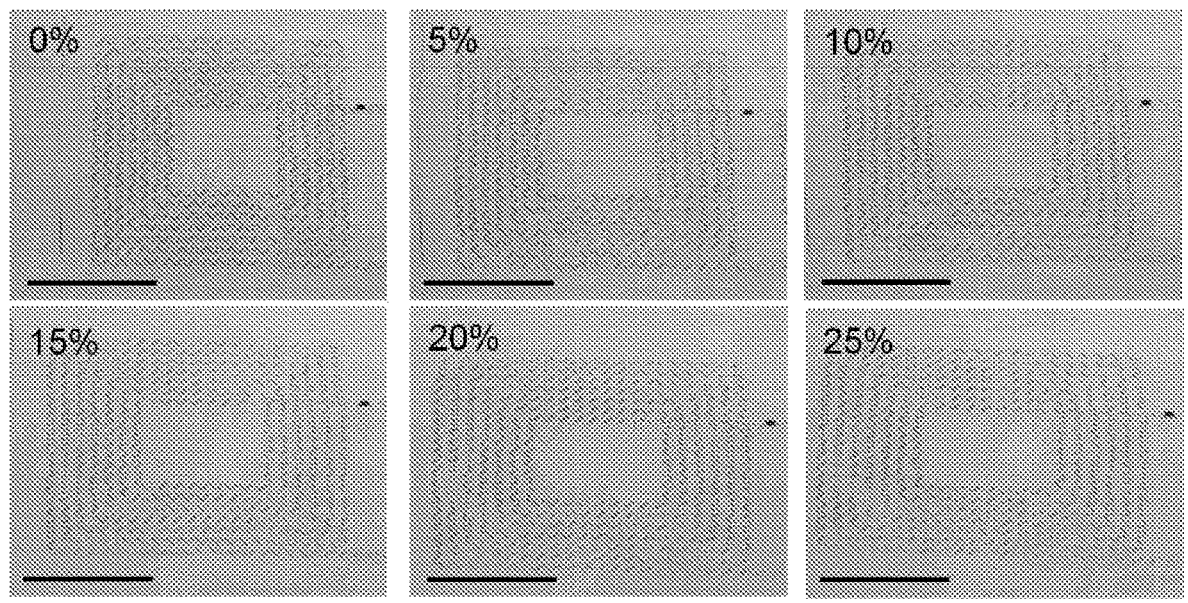
Figure 23C:
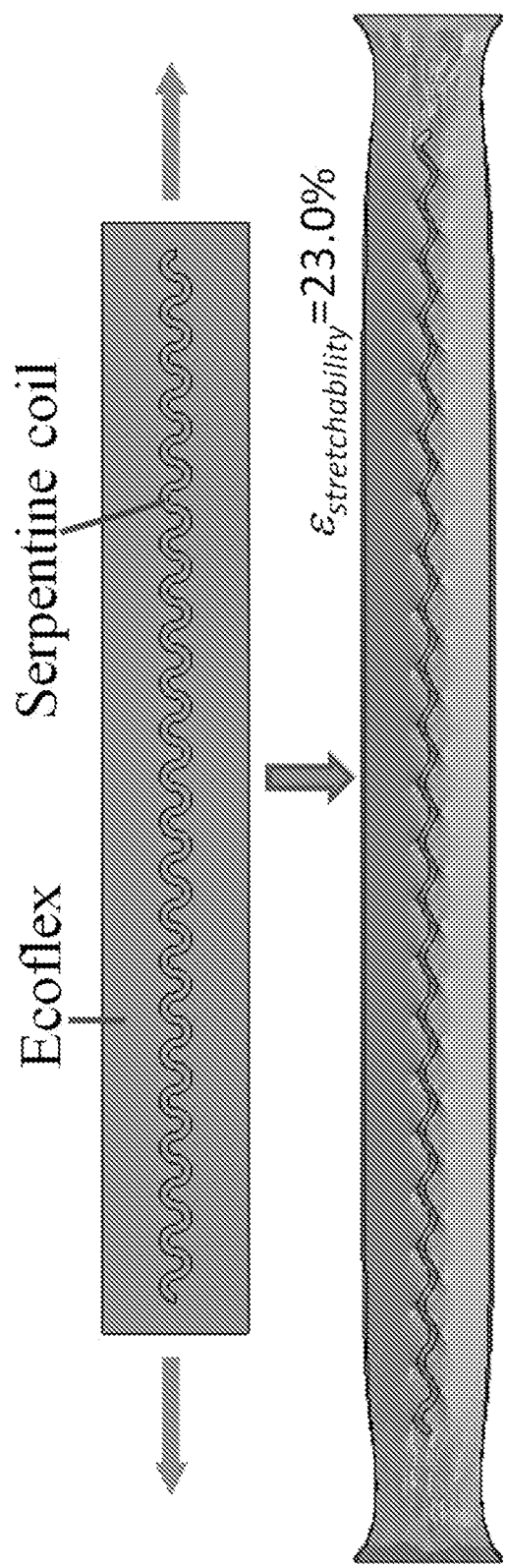
Figure 24A:
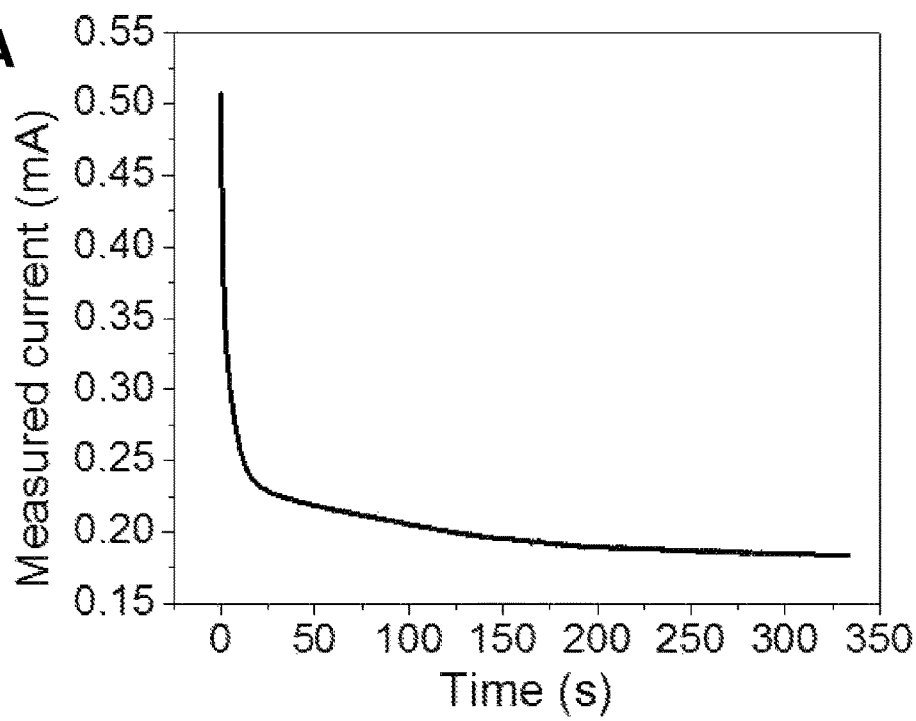
FIG. 24. Comparison between the (a) measured current change and the (b) simulated result in the wireless coil charging circuit.
Figure 24B:
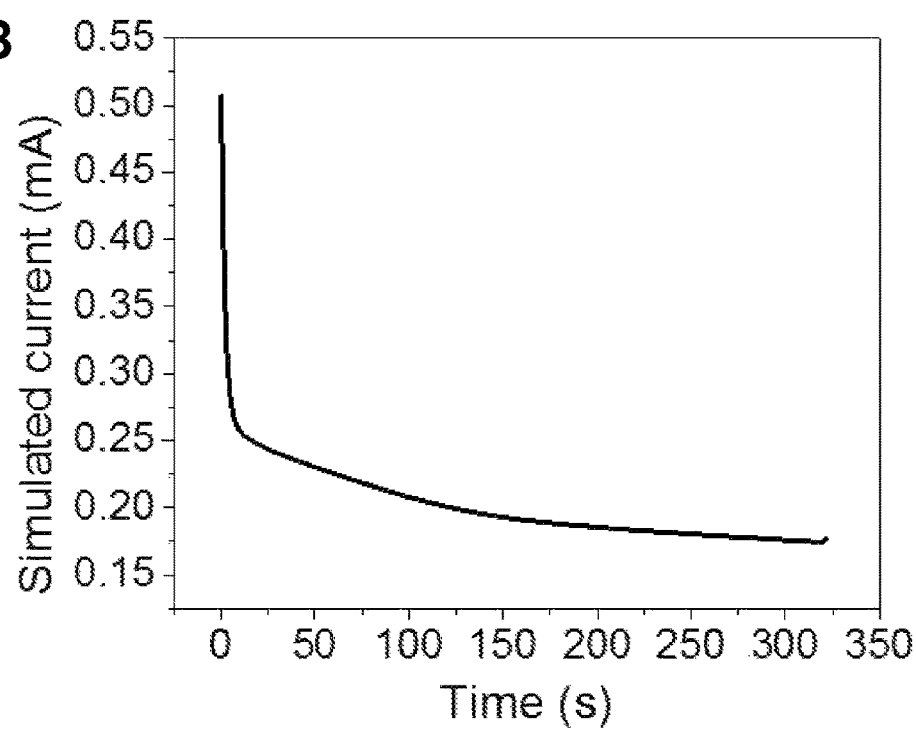

These increases in thickness, and therefore power transfer efficiencies, lead to changes in the essential mechanics associated with stretching. In particular, as the thickness increases, the stretchability decreases. The coil with thickness of 7 μm offers a good balance between efficiency and mechanical deformability, with ability to accommodate strains of ~25%. Images at various levels of strain appear in FIG. 23b, which agree well with the finite element analysis results in terms of both the maximum uniaxial strain and the geometry of the coil serpentines (FIG. 23c).

Modeling of the Charging Current in the Wireless Power Transmission Circuit

The charging circuit can be described using the model below:

$$U_0 = U(t) + L\frac{dI(t)}{dt} + I(t)R \quad (1)$$

Here $U_0$ is the charging source of 3 volts voltage. L and R are the associated inductance and the resistance of the circuit. U(t) is the time dependent readout of the voltmeter and I(t) is the time dependent readout of an ammeter.

A program has been developed to simulate the I-V curve based on the partial differential equation (1). The simulated time dependent current $I_s(t)$ based on U(t) is compared with measured I(t), and the results are shown in FIG. 20.

```
The program used to simulate the current:
#include<iostream.h>
#include<stdio.h>
#include<stdlib.h>
#include<math.h>
#include<time.h>
#define tim 3500
#define start 265
float curre[tim];
float nihe[tim];
float test[tim];
float voll[tim];
FILE *fp;
```

```
int main( )
{
    int i,j,k;
    fp=fopen("Cur.txt","r");
    for(i=0;i<tim;i++)
    {
        fscanf(fp,"%f",&curre[i]);
        curre[i]=-curre[i];
        cout<<curre[i]<<endl;
    }
    fclose(fp);
    fp=fopen("Vol.txt","r");
    for(i=0;i<tim;i++)
    {
        fscanf(fp,"%f",&voll[i]);
        cout<<voll[i]<<endl;
    }
    fclose(fp);
    double coef1;
    double coef2;
    coef2=curre[1]/(voll[1]-voll[0]);
    cout<<coef2<<endl;
    test[0]=curre[0];
    test[start]=curre[start];
    double coef1th;
    double maxh=1000000000;
    double coef2th;
    for(coef2=0;coef2<0.04; coef2=coef2+0.0001)
    {
        cout<<coef2<<endl;
        for(coef1=0.94; coef1<=0.96; coef1=coef1+0.0001)
        {
            // cout<<coef1<<endl;
            for(i=start+1;i<tim;i++)
            {
                test[i]=coef1*test [i-1]+(3-(voll[i]+voll
                    [i-1])*0.5)*coef2;
            }
            double poi=0;
            for(i=start;i<tim;i++)
            {
                poi+=(test[i]-curre[i])*(test[i]-curre[i]);
            }
            if(poi<maxh)
            {
                coef1th=coef1;
                coef2th=coef2;
                maxh=poi;
                for(int j=0;j<tim;j++)
                {
                    nihe[j]=test[j];
                }
            }
        }
    }
    cout<<coef1th<<endl;
    cout<<coef2th<<endl;
    cout<<maxh<<endl;
    fp=fopen("nihe.txt","w");
    for(i=0;i<tim;i++)
    {
        fprintf(fp, "%f", -nihe[i]);
        fprintf(fp, "\n");
    }
    fclose(fp);
    fp=fopen("canshu.txt","w");
    fprintf(fp, "%f", coef1th);
    fprintf(fp, "\n");
    fprintf(fp, "%f", coef2th);
    fprintf(fp, "\n");
    fclose(fp);
    return(1);
}
```

Figure 25:
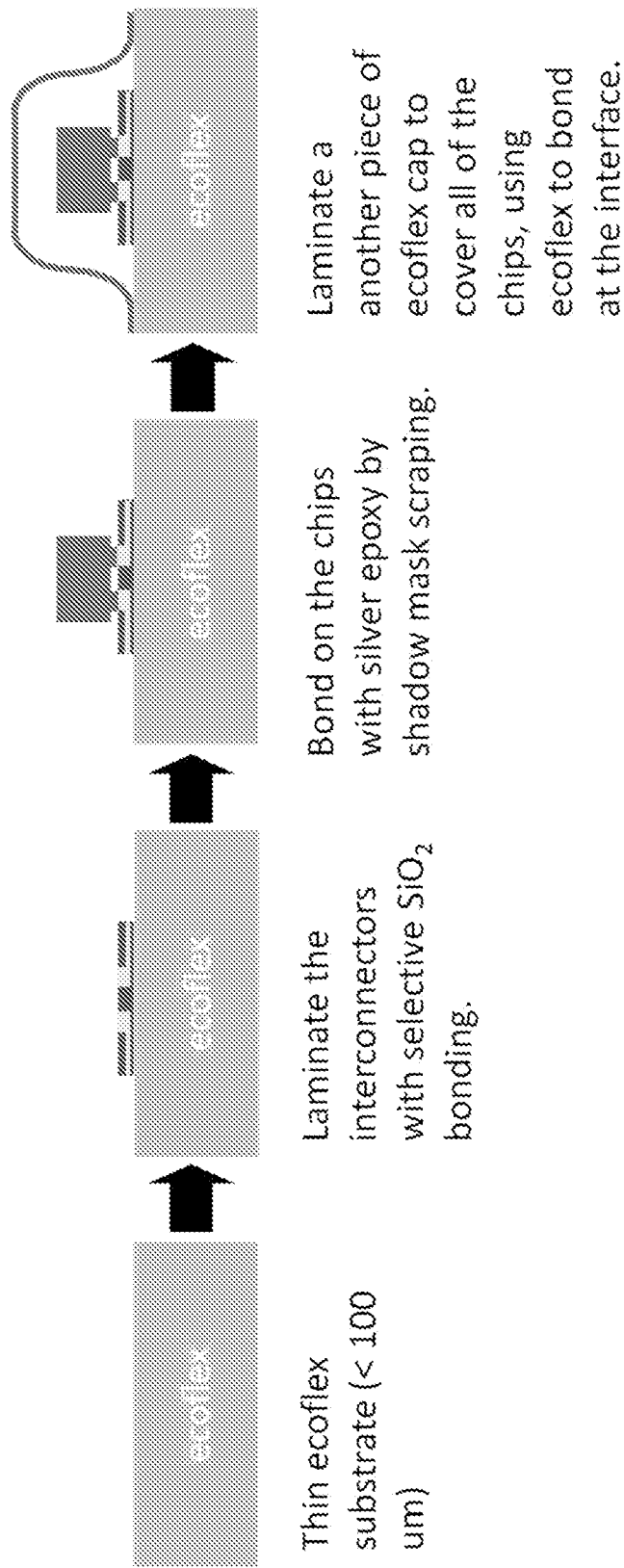
FIG. 25. Exemplary overall fabrication flow chart for making some electronic systems, according to an embodiment of the present invention.
Figure 26:
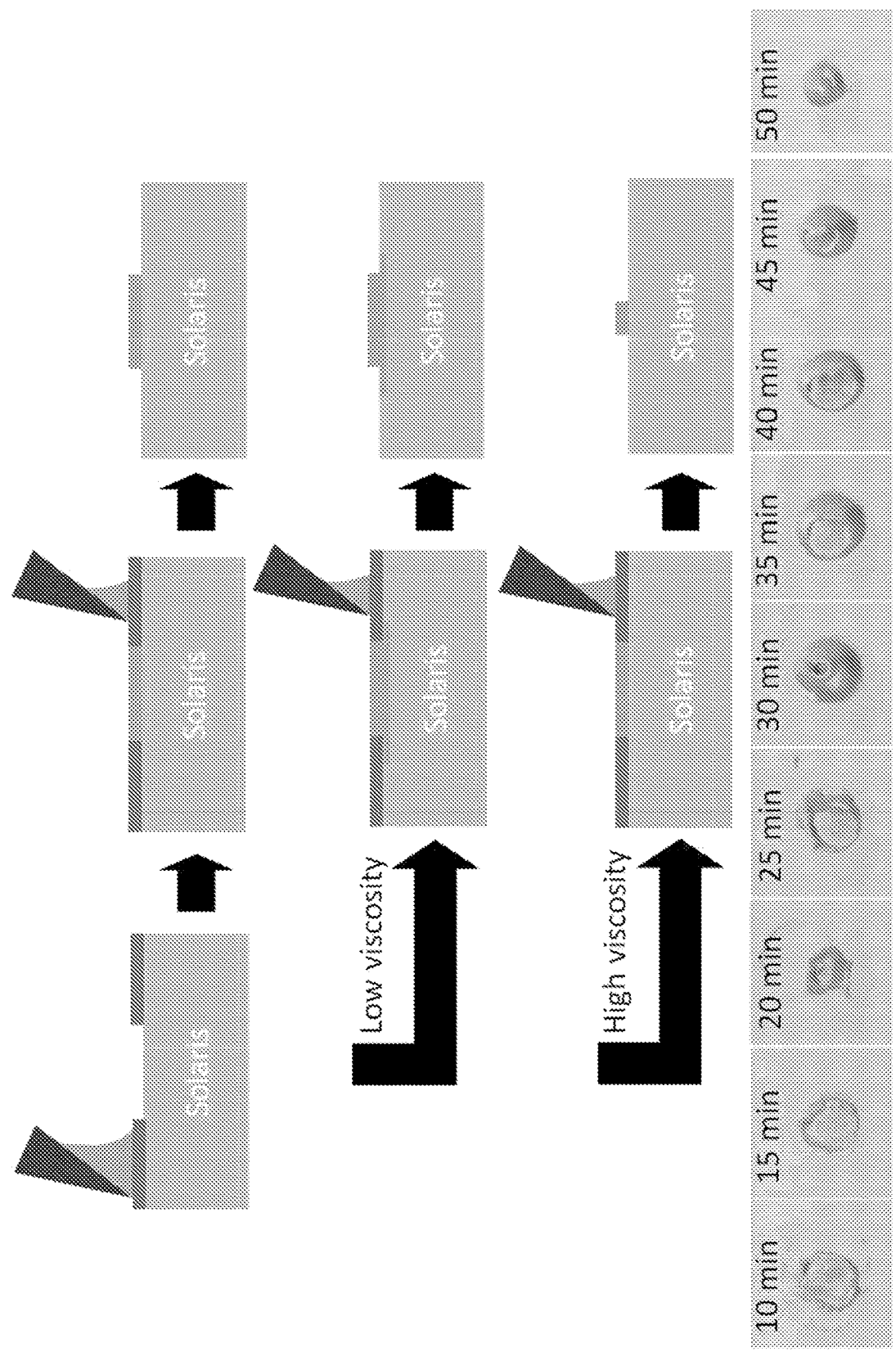
FIG. 26. Illustration of silver epoxy scraping.
Figure 27:
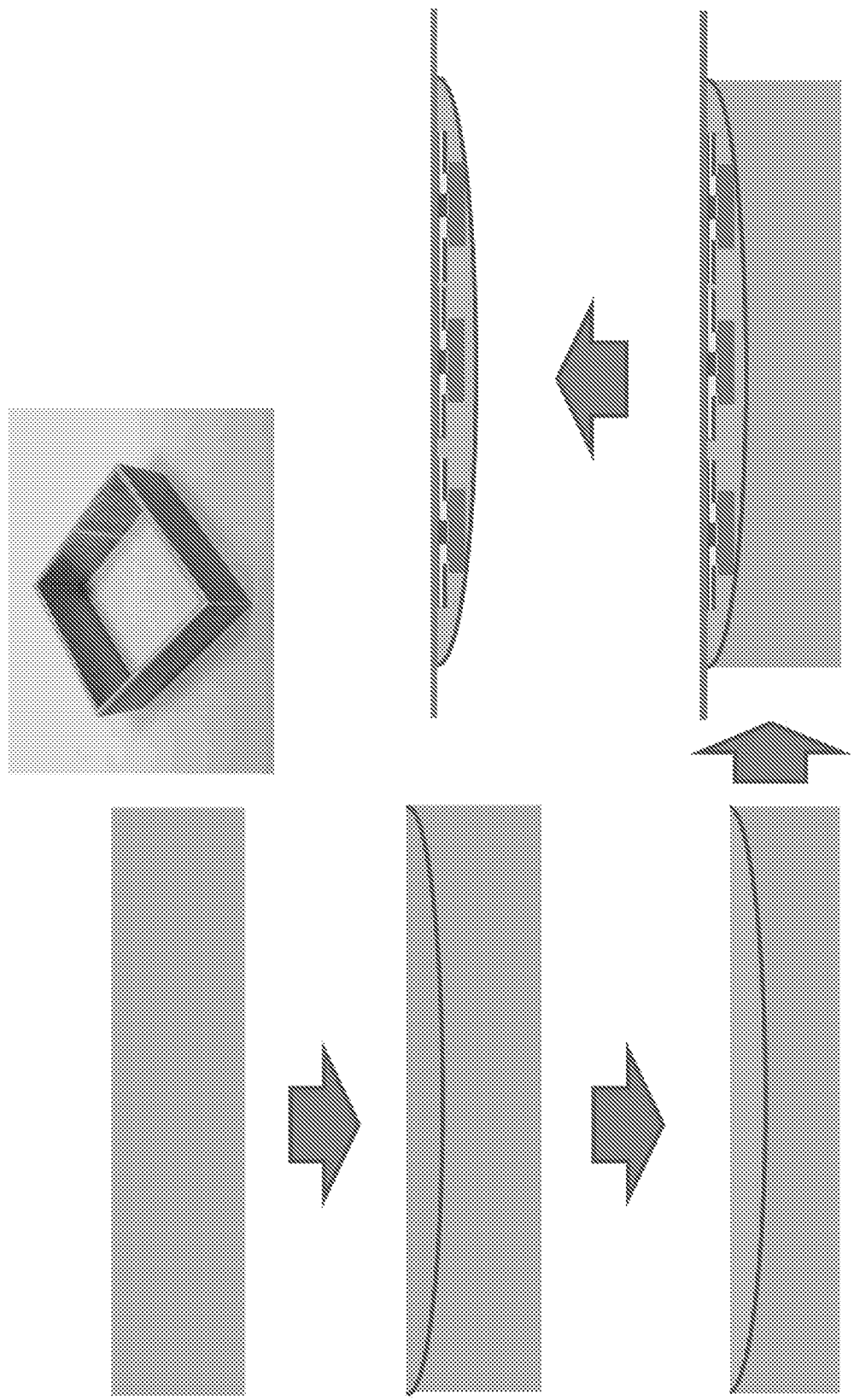
FIG. 27. Illustration of liquid chamber fabrication, according to an embodiment of the present invention.

Example 2: Device Geometries and Materials Strategies for Stretchable Electronic Systems FIGS. 25 and 27 provide example fabrication process flow diagrams for making some electronic systems of the invention. FIG. 25 provides an overall fabrication flow chart. FIG. 26 illustrates silver epoxy scraping for making the electrical contact between the serpentine interconnects and COTS chips. FIG. 27 illustrates liquid chamber fabrication. The cavity or pouch is formed by laminating a thin piece of elastomer sheet on top of the substrate, and sealing at the surrounding periphery is achieved under heat and pressure with the uncured elastomer as glue. Fluid is injected into the as-formed cavity by injection through the cavity side edge with a syringe.

Figure 28:
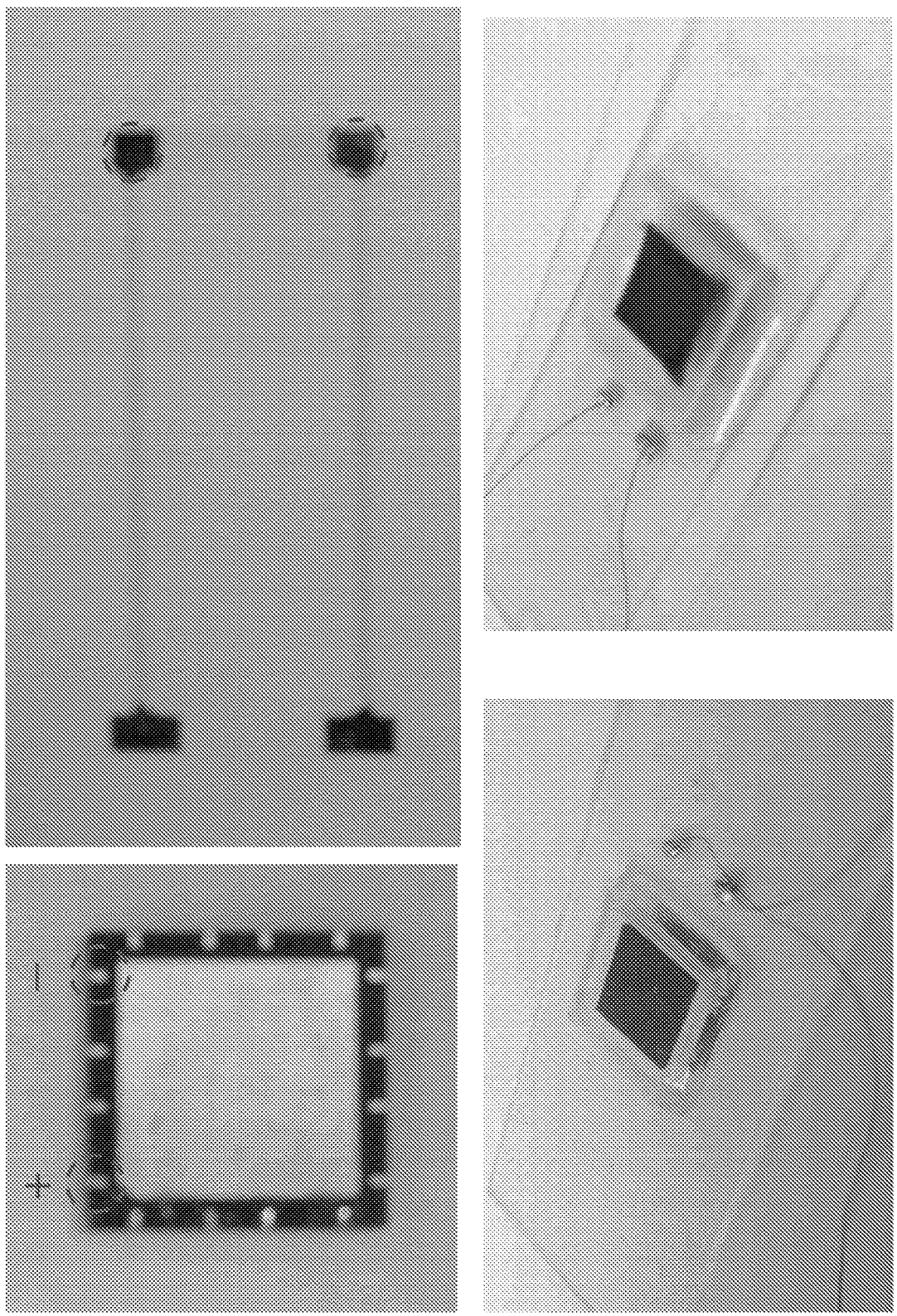
FIG. 28. Illustration of a single battery according to an embodiment of the present invention.

FIG. 28 illustrates a single battery of the present invention. FIG. 29 Illustrates a battery undergoing ~100% uniaxial stretching.

Figure 30:
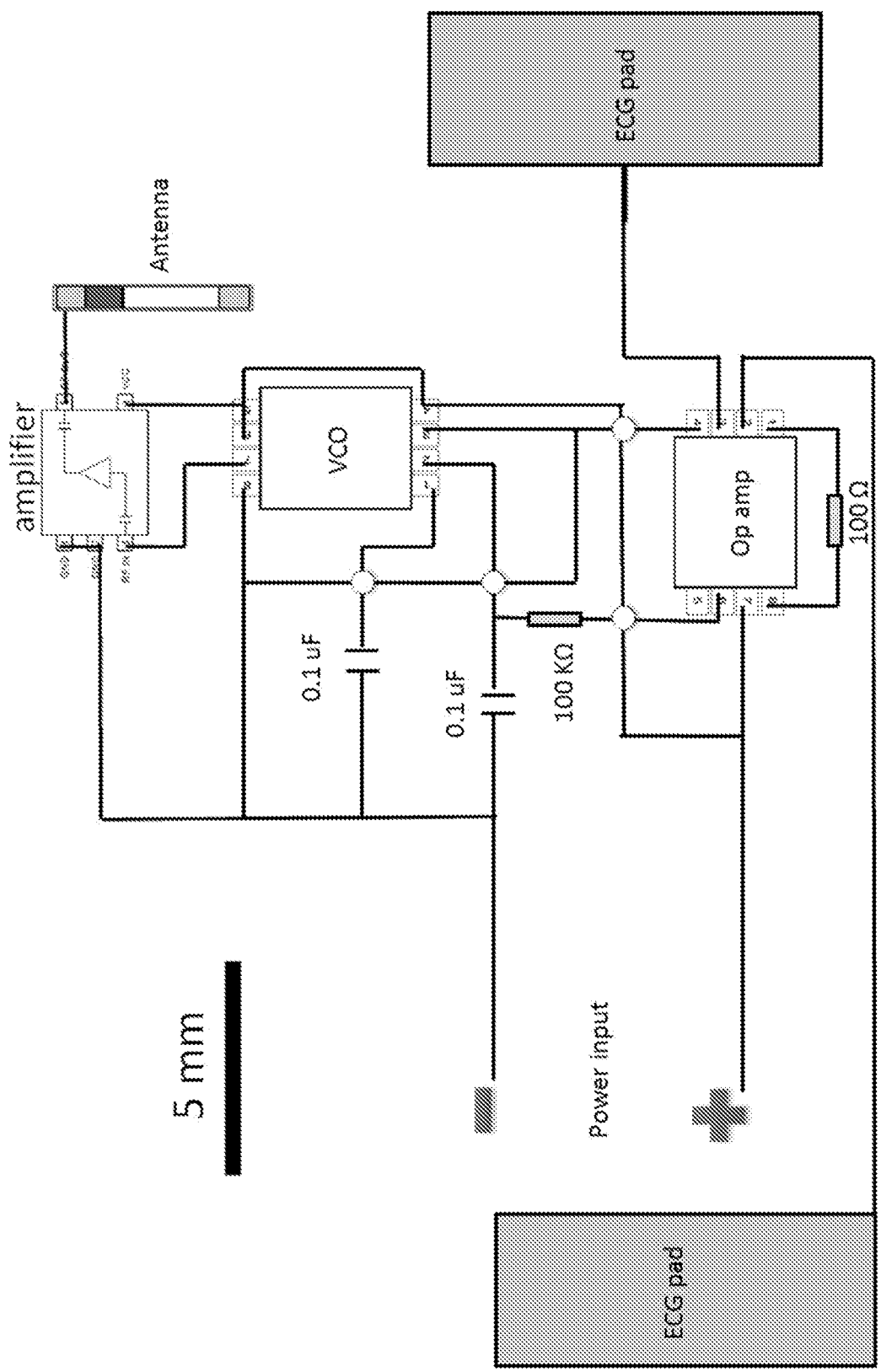
FIG. 30. ECG circuit with wireless power and telecommunication.
Figure 31:
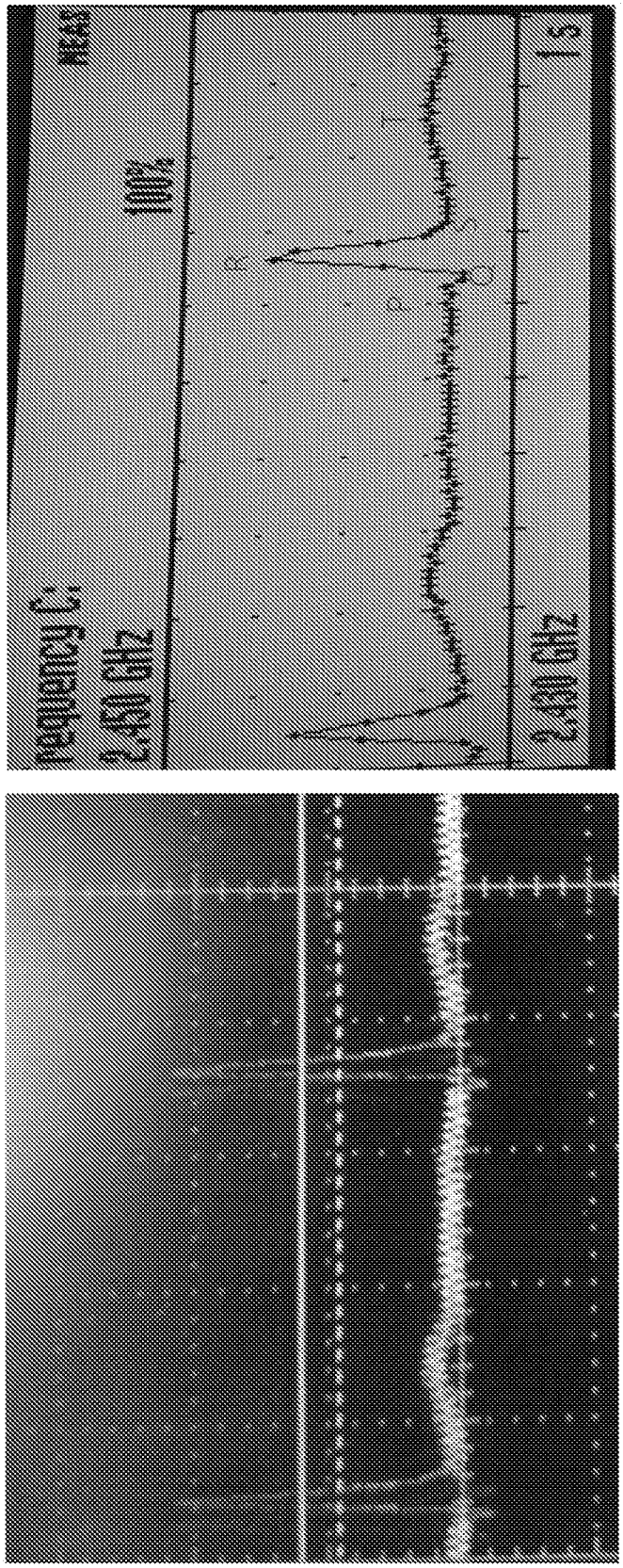
FIG. 31. Exemplary ECG data.

FIG. 30 provides an ECG circuit with wireless power and telecommunication. FIG. 31 provides an example of ECG data on wired oscilloscope, and on frequency counter by wireless telecommunication, where the data fidelity is very high, and the QRS complexes can be clearly distinguished.

Figure 32:
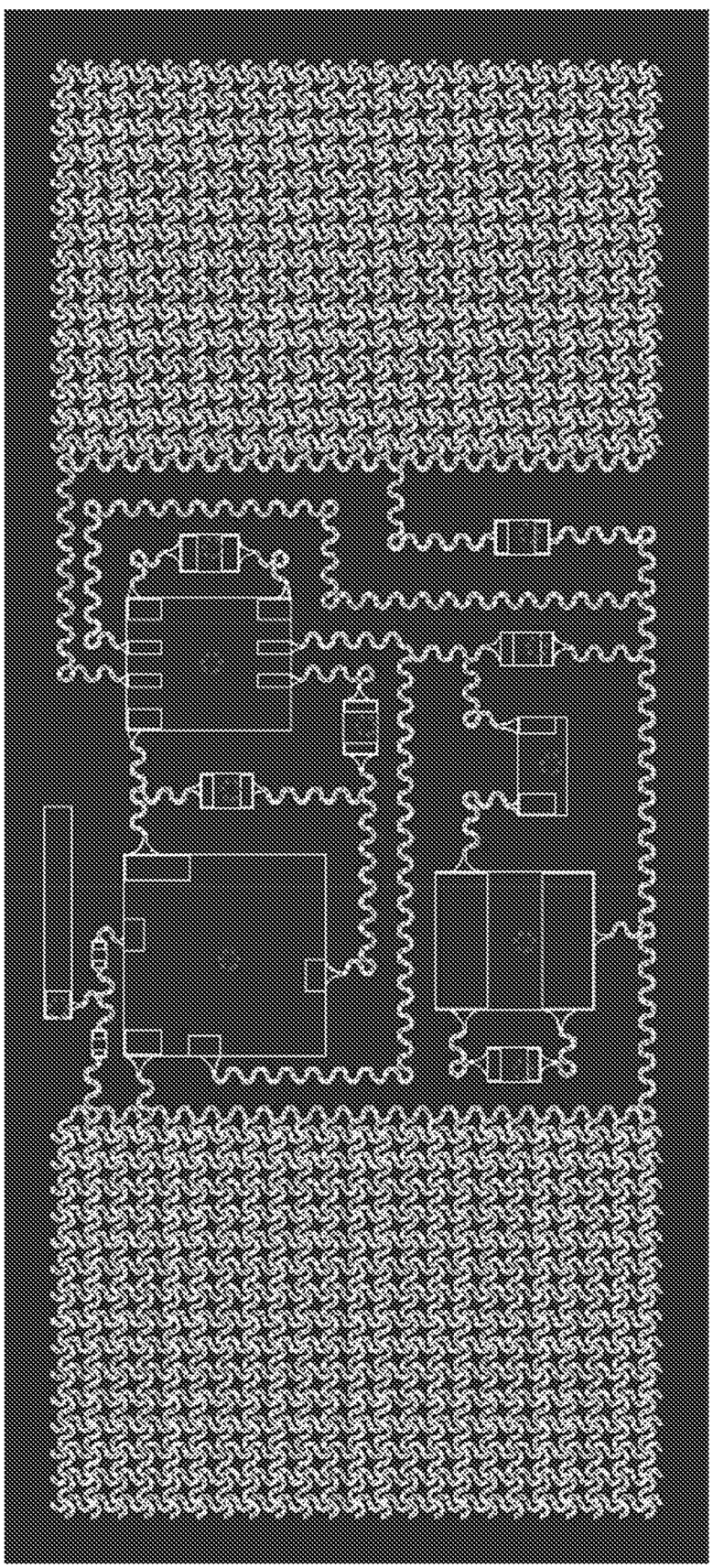
FIG. 32. Illustration of a circuit with selective bonding.
Figure 33:
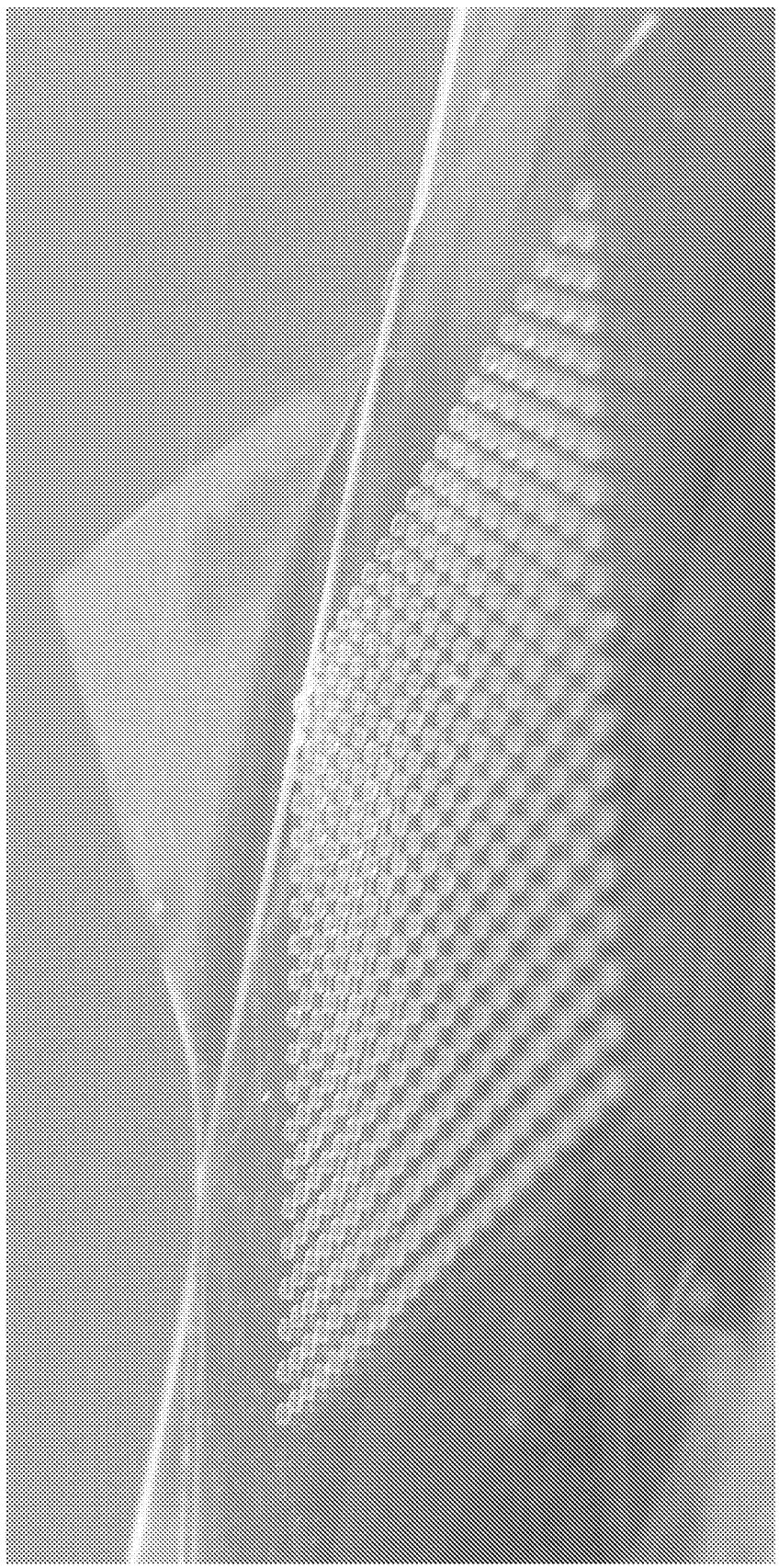
FIG. 33. An array of ECOFLEX® silicone elastomer pedestals.
Figure 34:
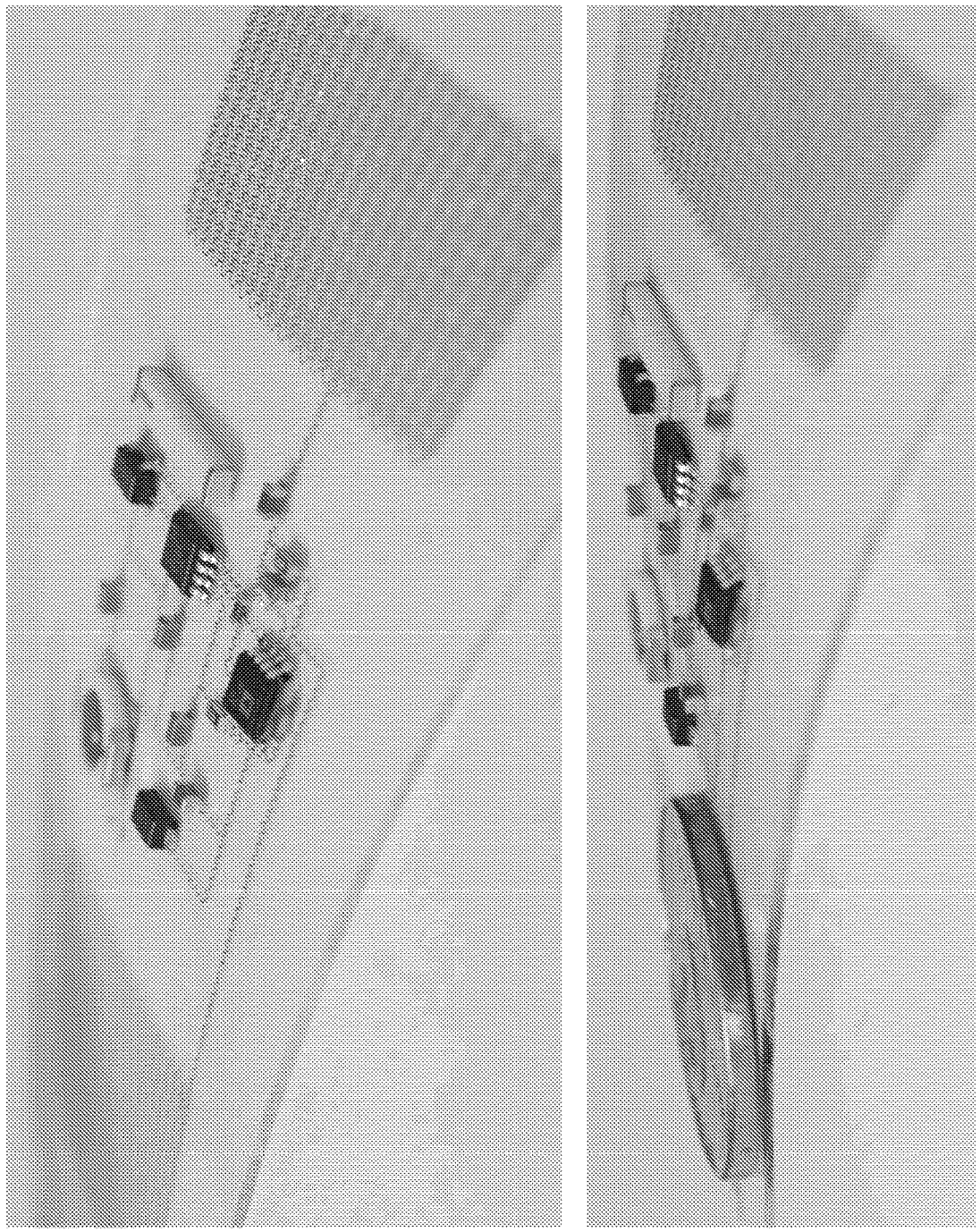
FIG. 34. Illustration of thin chips (<1 mm).
Figure 35:
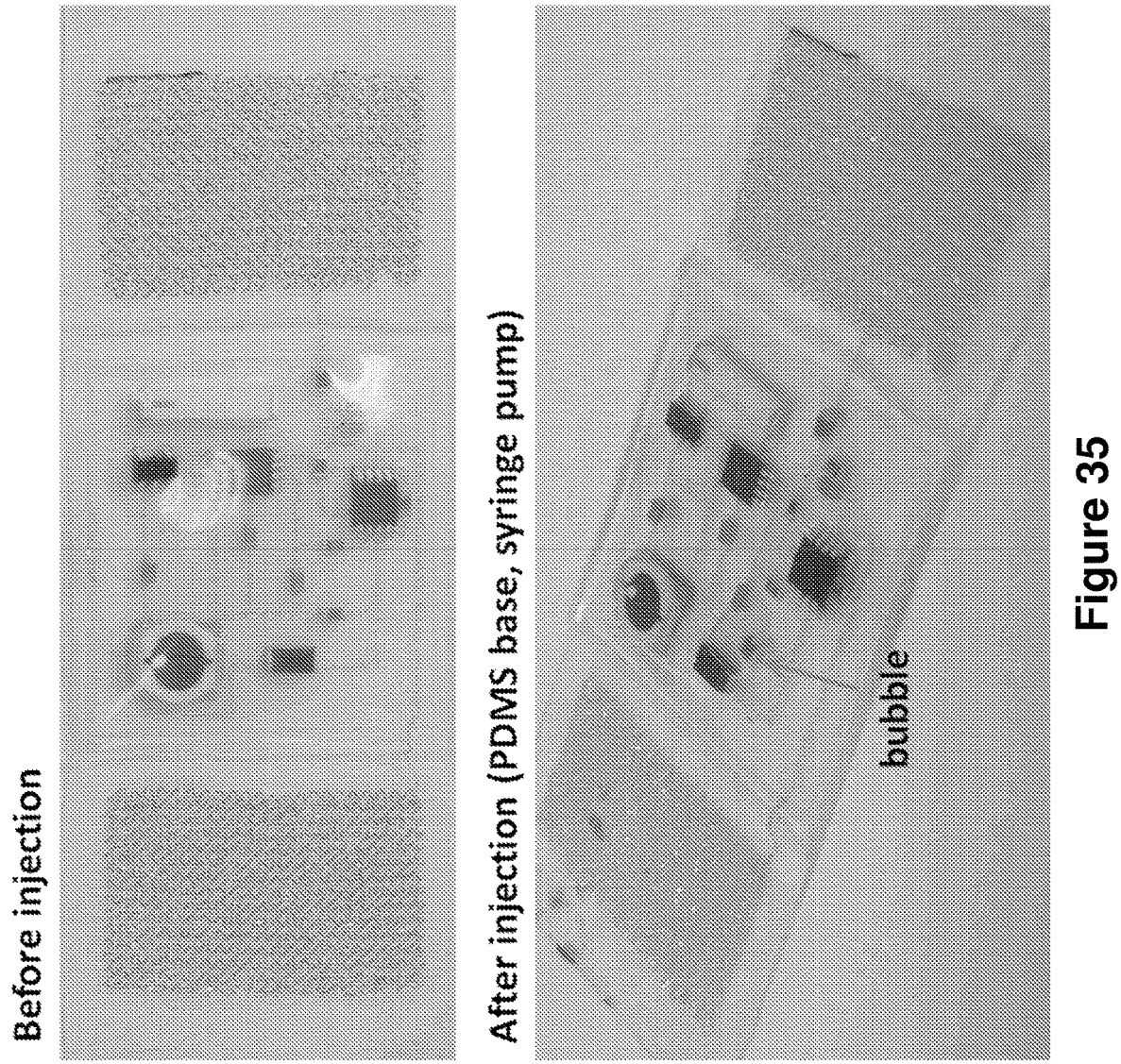
FIG. 35. A circuit having a liquid chamber, according to an embodiment of the present invention.
Figure 37:
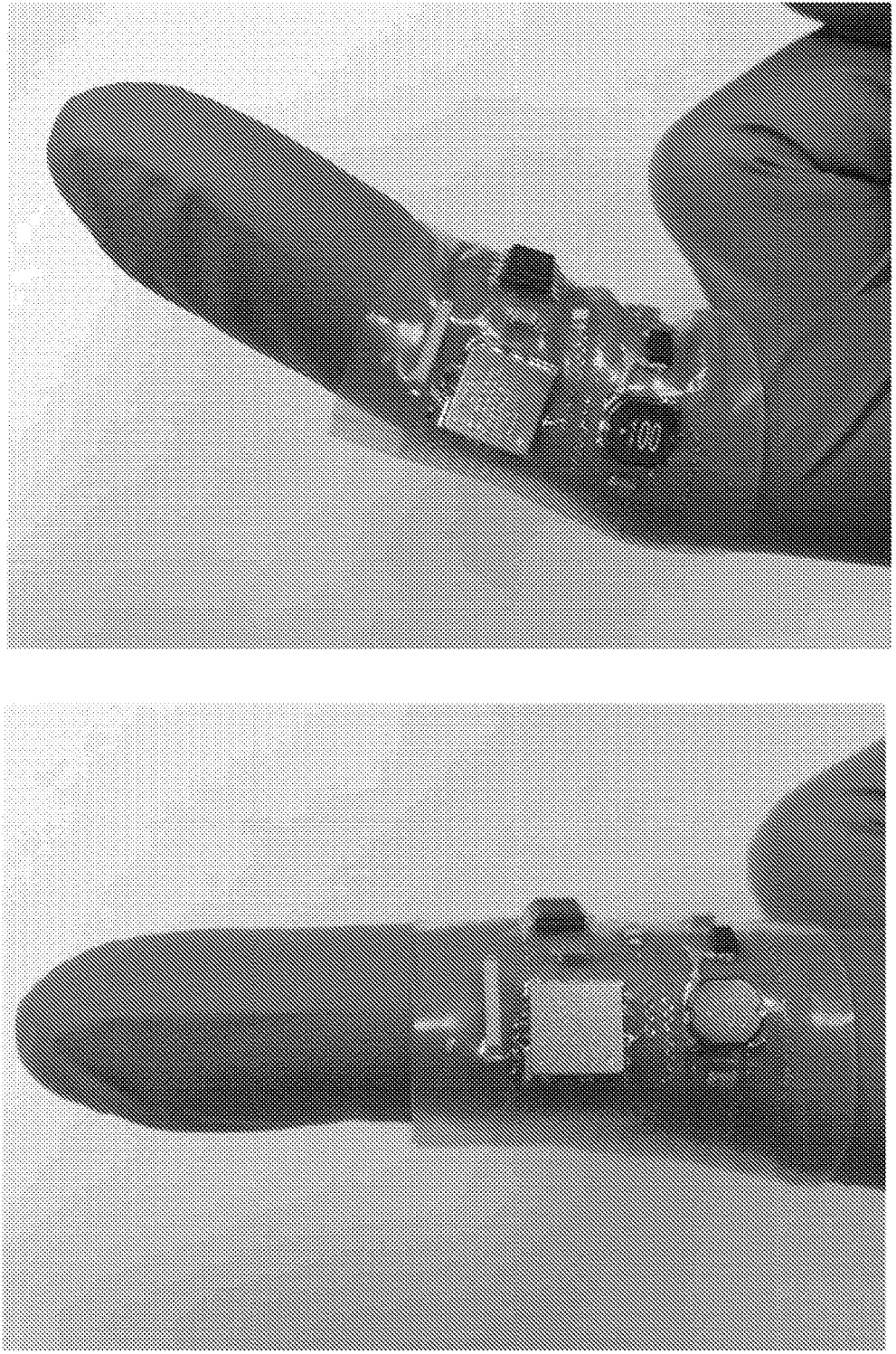
FIG. 37. Images demonstrating flexing of an electronic system.

FIG. 32 illustrates a stretchable format of the circuit in FIG. 30, where the red circles indicate places with selective bonding to the substrate. FIG. 33 shows an array of ECOFLEX® silicone elastomer pedestals mounted into etched Si wafer or patterned thick SU8. FIG. 34 illustrates the same circuit as FIG. 32 but with a thinner version of COTS chips (<1 mm). FIG. 35 shows the circuit in FIG. 34 but with a liquid chamber, where a bubble is intentionally left behind to indicate the presence of fluid. FIG. 36 provides images demonstrating stretching. FIG. 37 provides images demonstrating flexing at a radius of around 2 cm.

Figure 38:
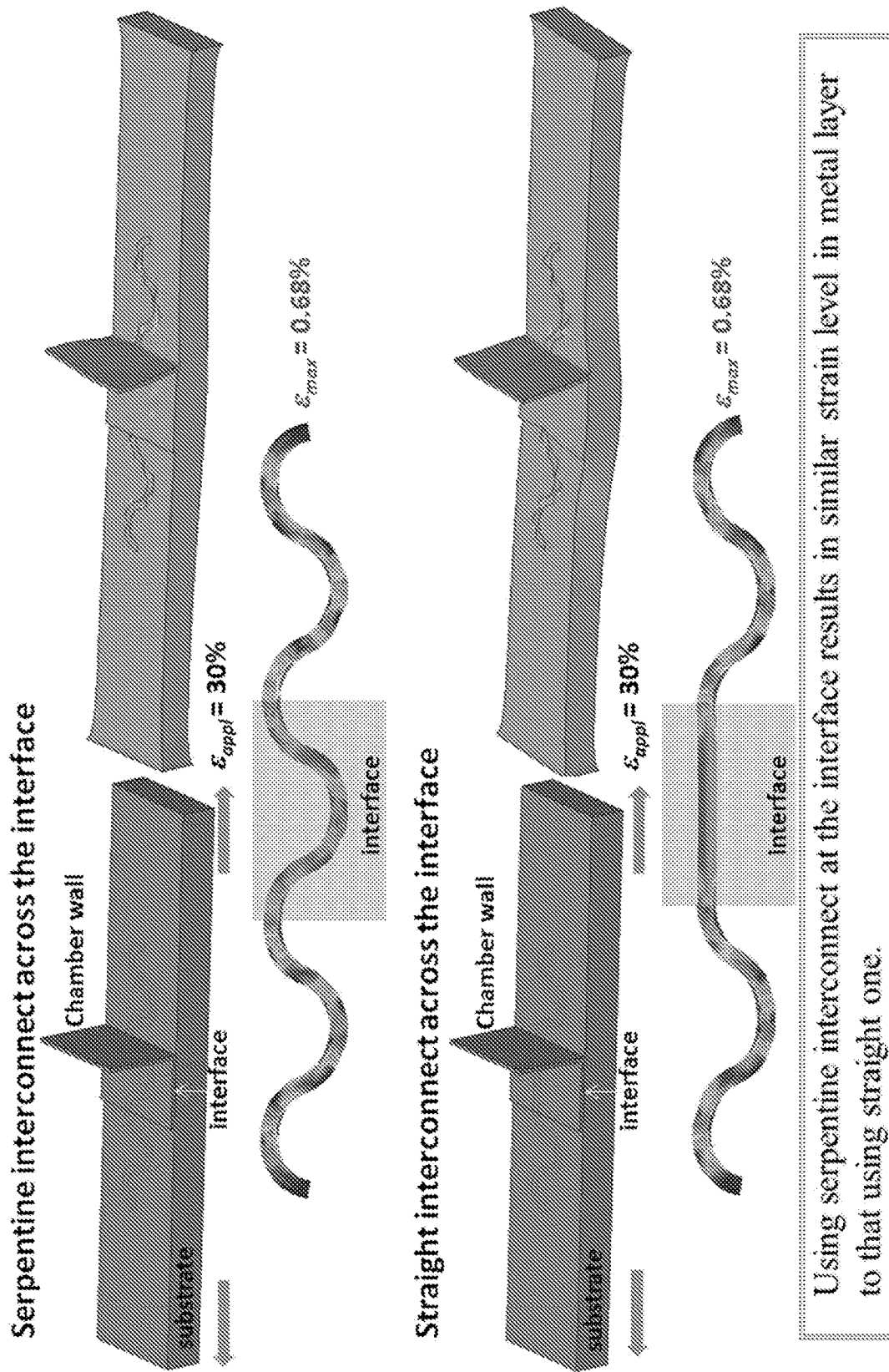
FIG. 38. Schematic diagrams illustrating interconnects at an interface.

FIG. 38 provides mechanical simulations illustrating the strain distribution in different geometries of the interconnects under a fully encapsulated case at the liquid chamber interface.

Figure 39:
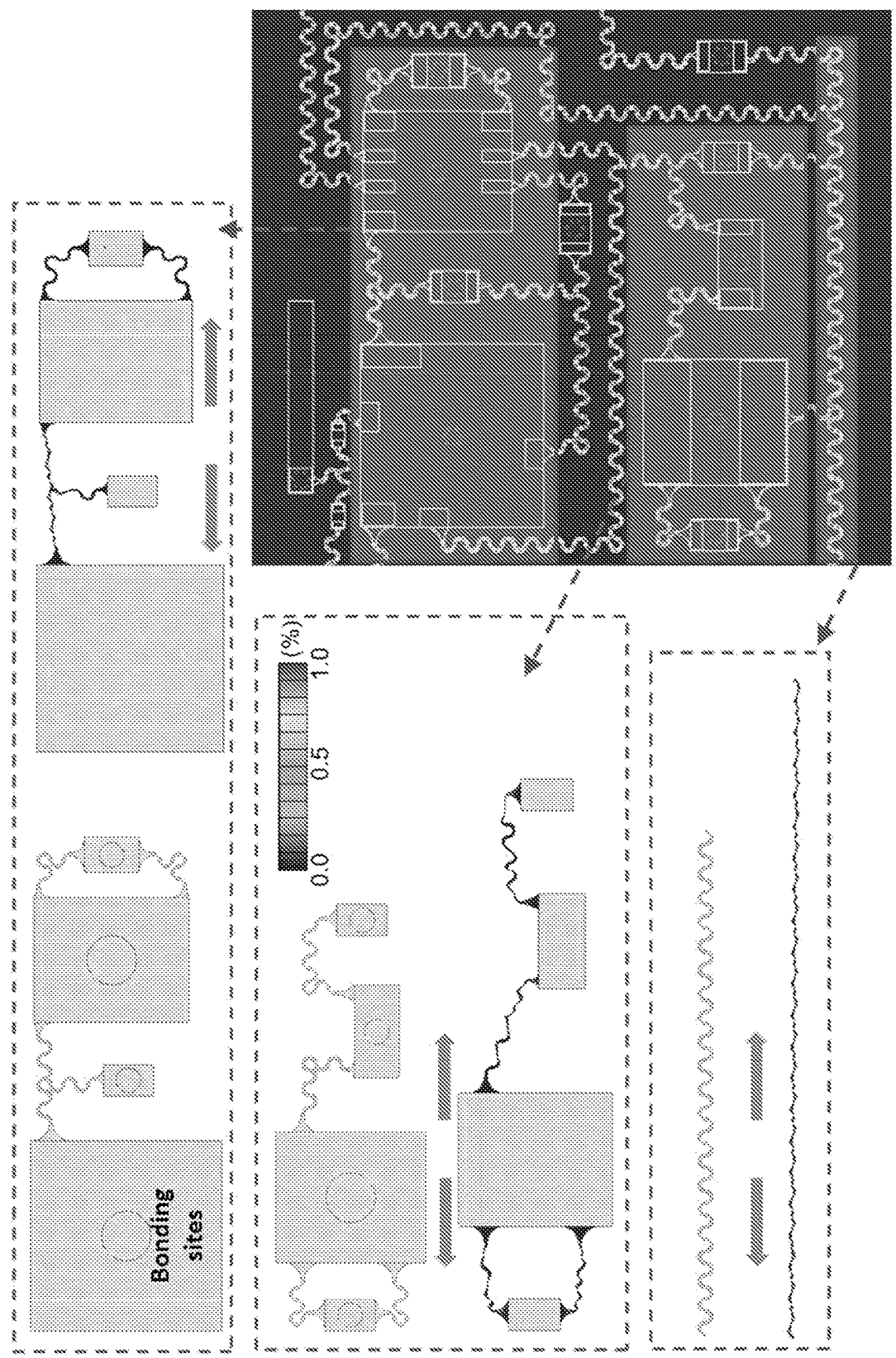
FIG. 39. Schematic diagrams illustrating system level mechanics-horizontal.
Figure 40:
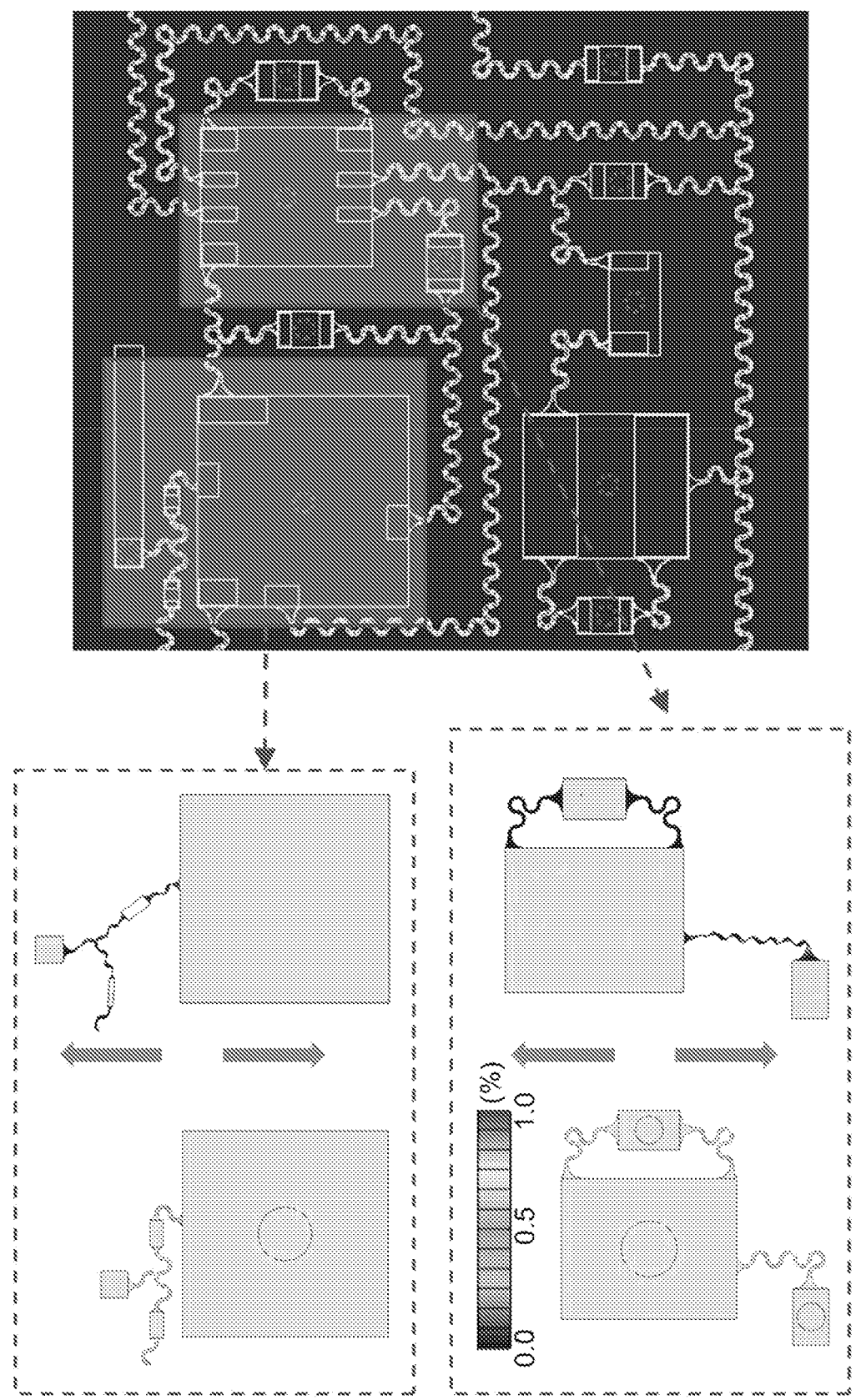
FIG. 40. Schematic diagrams illustrating system level mechanics-vertical.

FIG. 39 provides schematic diagrams illustrating system level strain distribution in the interconnects between the stiff islands-horizontal. FIG. 40 provides schematic diagrams illustrating system level strain distribution in the interconnects between the stiff islands-vertical.

Figure 41:
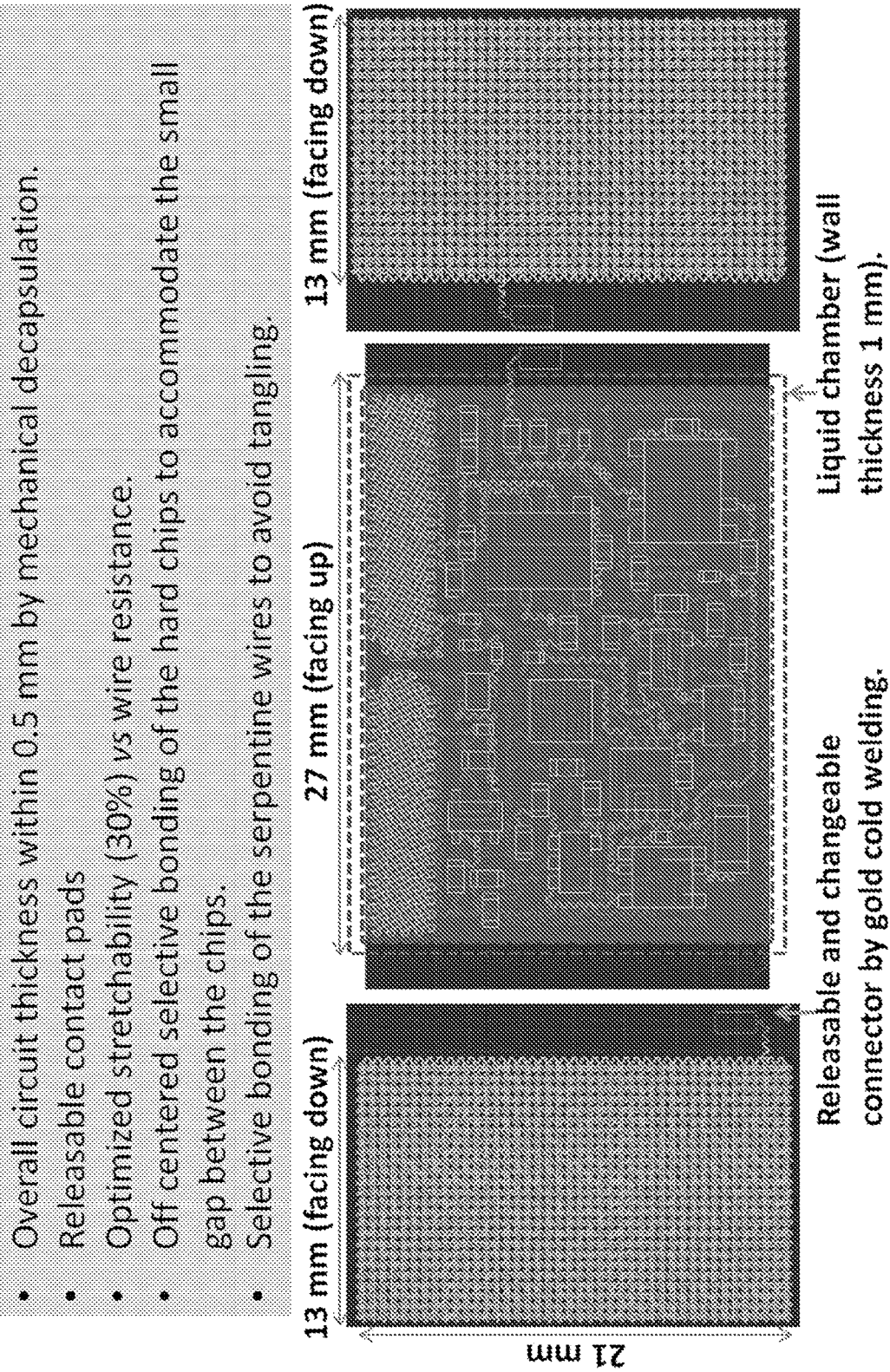
FIG. 41. An advanced multifunctional circuit with liquid chamber.
Figure 42:
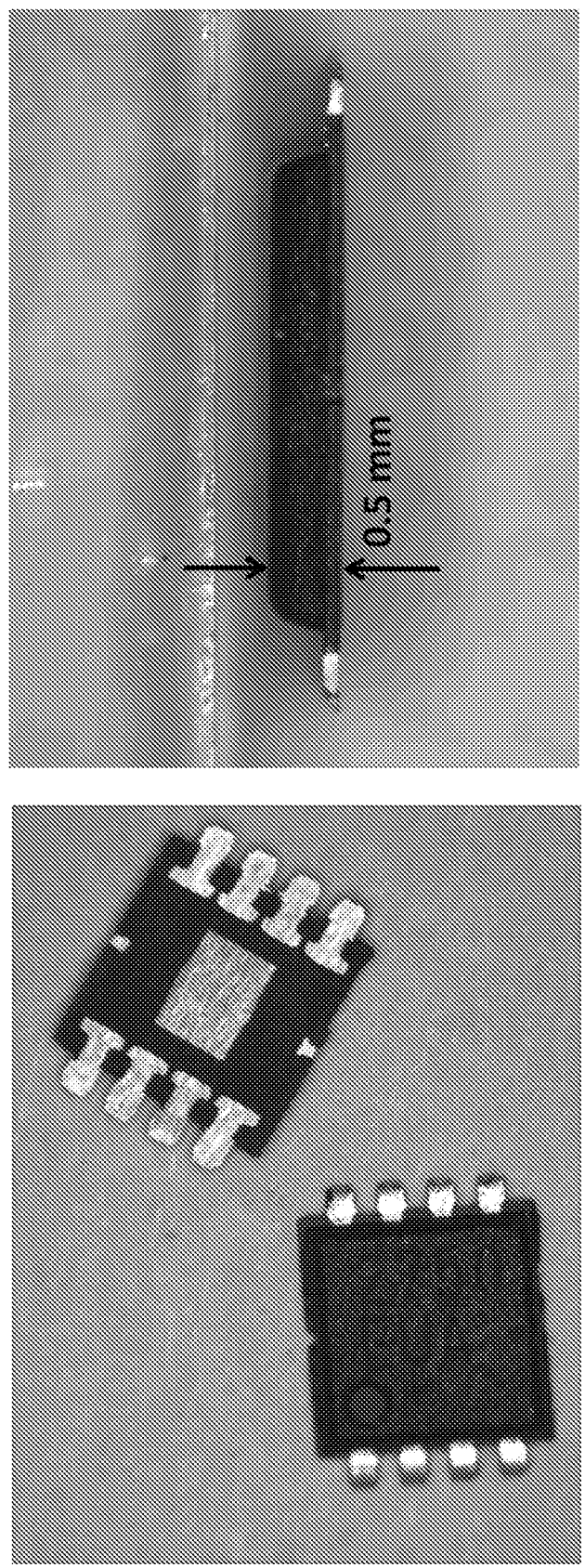
FIG. 42. Mechanically polished commercial off the shelf (COTS) chips.

FIG. 41 shows the overall layout of a multifunctional circuit with liquid chamber. The basic functions of this circuit include: wireless radiofrequency power harvesting, two-terminal electrophysiological sensors (electrocardiogram, electromyogram, electroencephalogram, and electrooculogram), temperature sensor, acceleration sensor, and wireless data transmission. FIG. 42 shows mechanically polished commercial off the shelf (COTS) chips with the electrical functionality intact and a thickness below 0.5 mm. FIG. 43 provides a list of example circuit functions.

Figure 44:
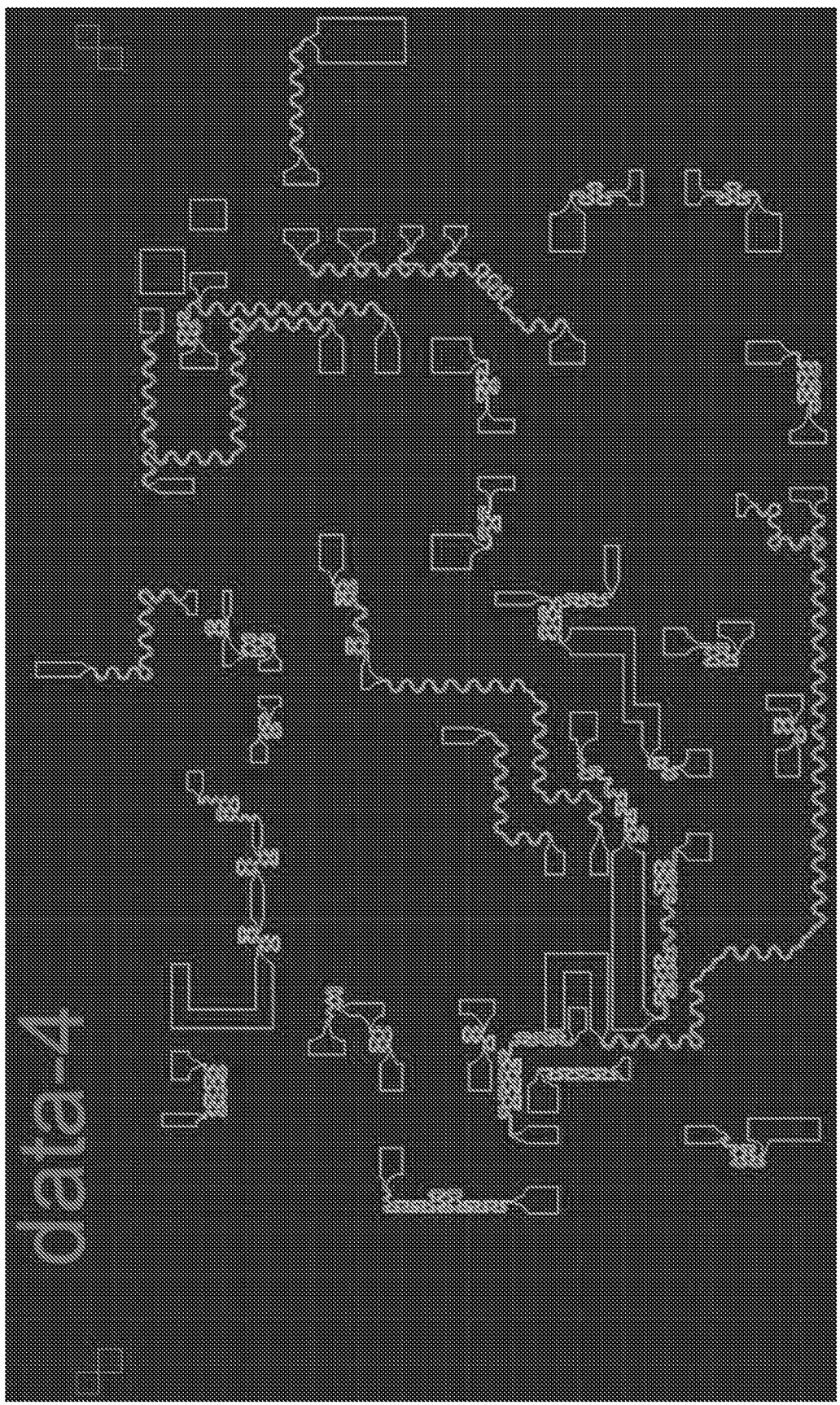
FIG. 44. Illustration of a multilayer—$1^{st}$.
Figure 45:
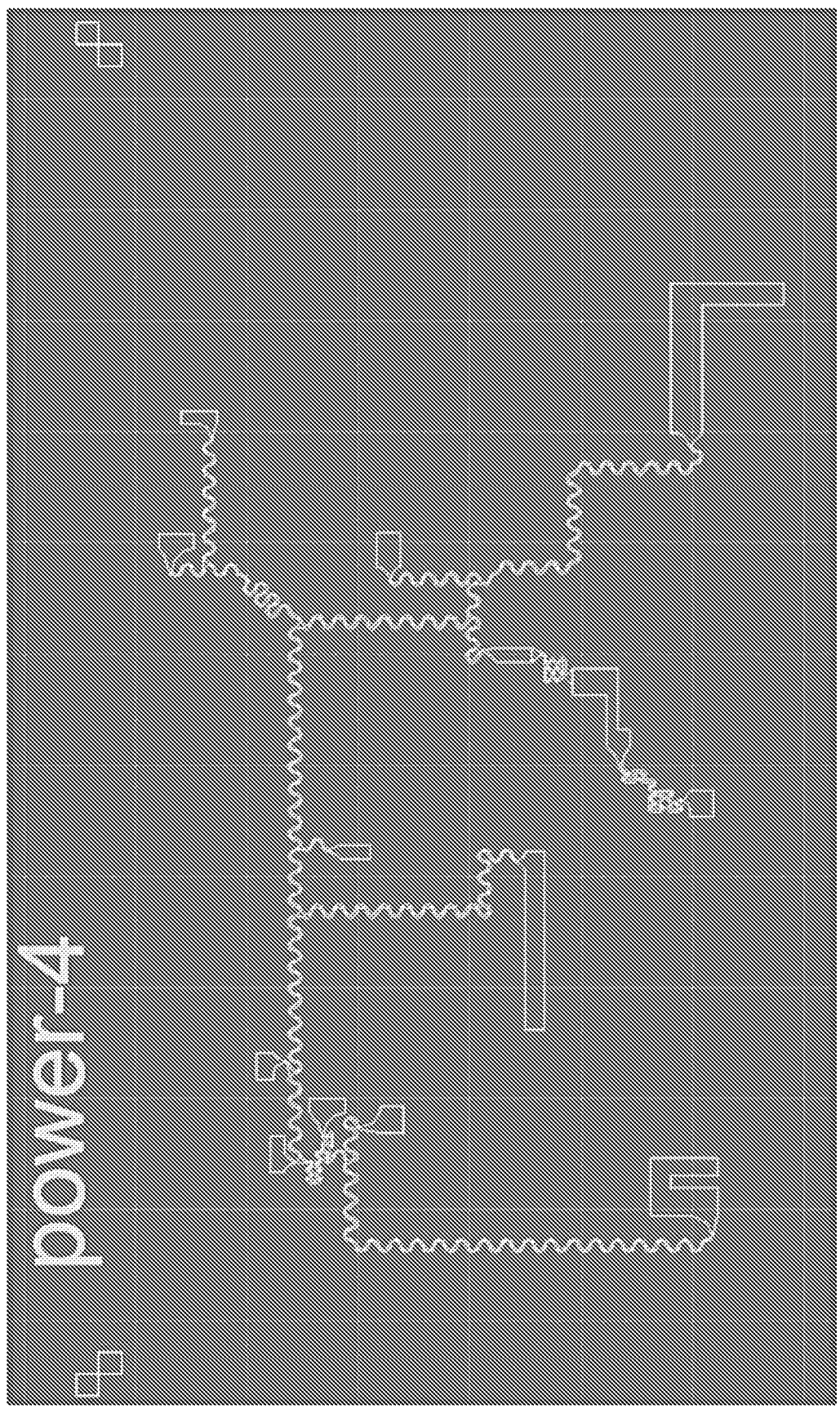
FIG. 45. Illustration of a multilayer—$2^{nd}$.
Figure 46:
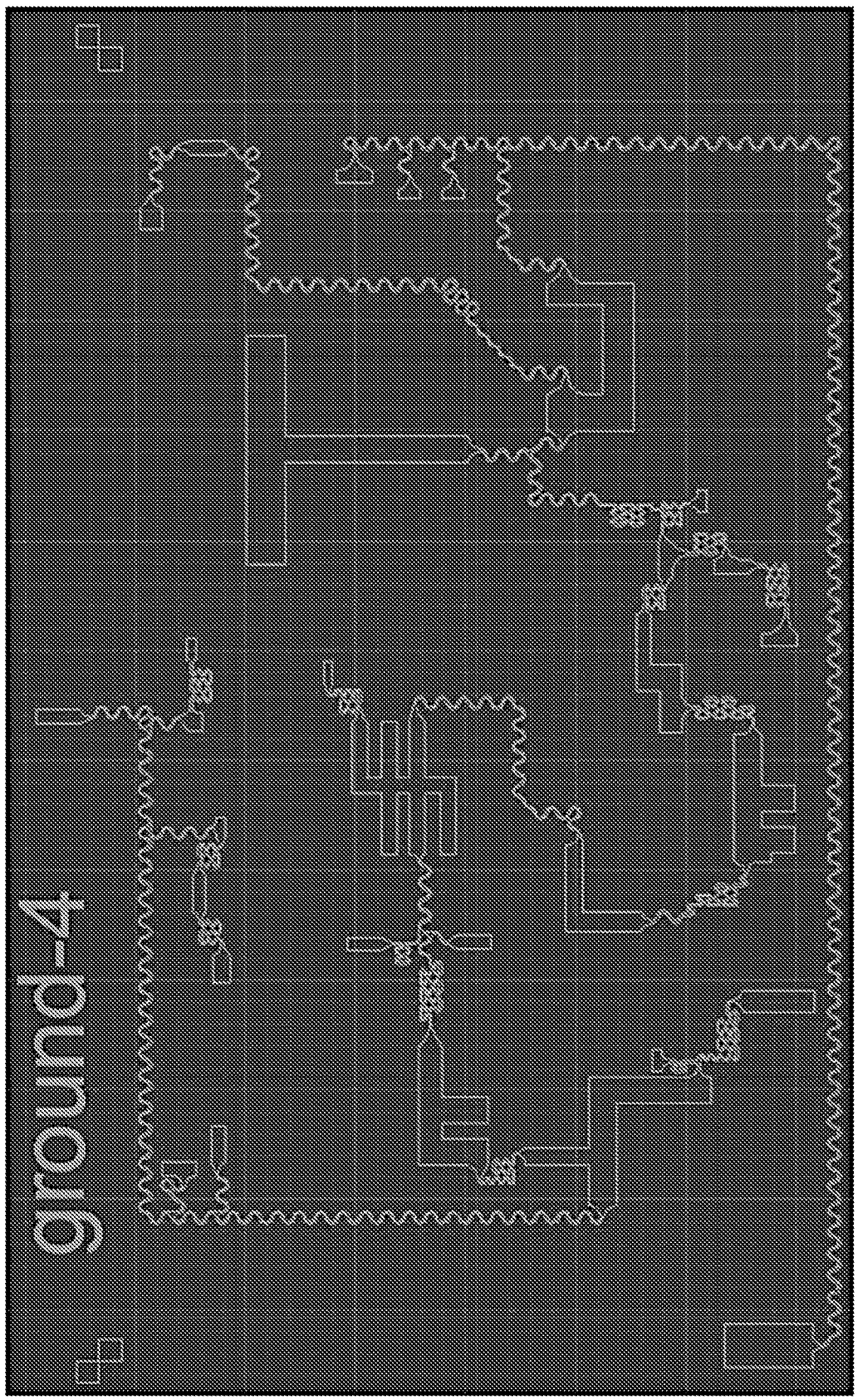
FIG. 46. Illustration of a Multilayer—$3^{rd}$.

FIG. 44 illustrates a multilayer—$1^{st}$ data transmission lines, FIG. 45 illustrates a multilayer—$2^{nd}$ power delivery lines and FIG. 46 illustrates a multilayer—$3^{rd}$ ground lines. At the cross points of these lines, they are insulated from each other by polymer, such as polyimide, parylene C, or SU8.

Figure 47:
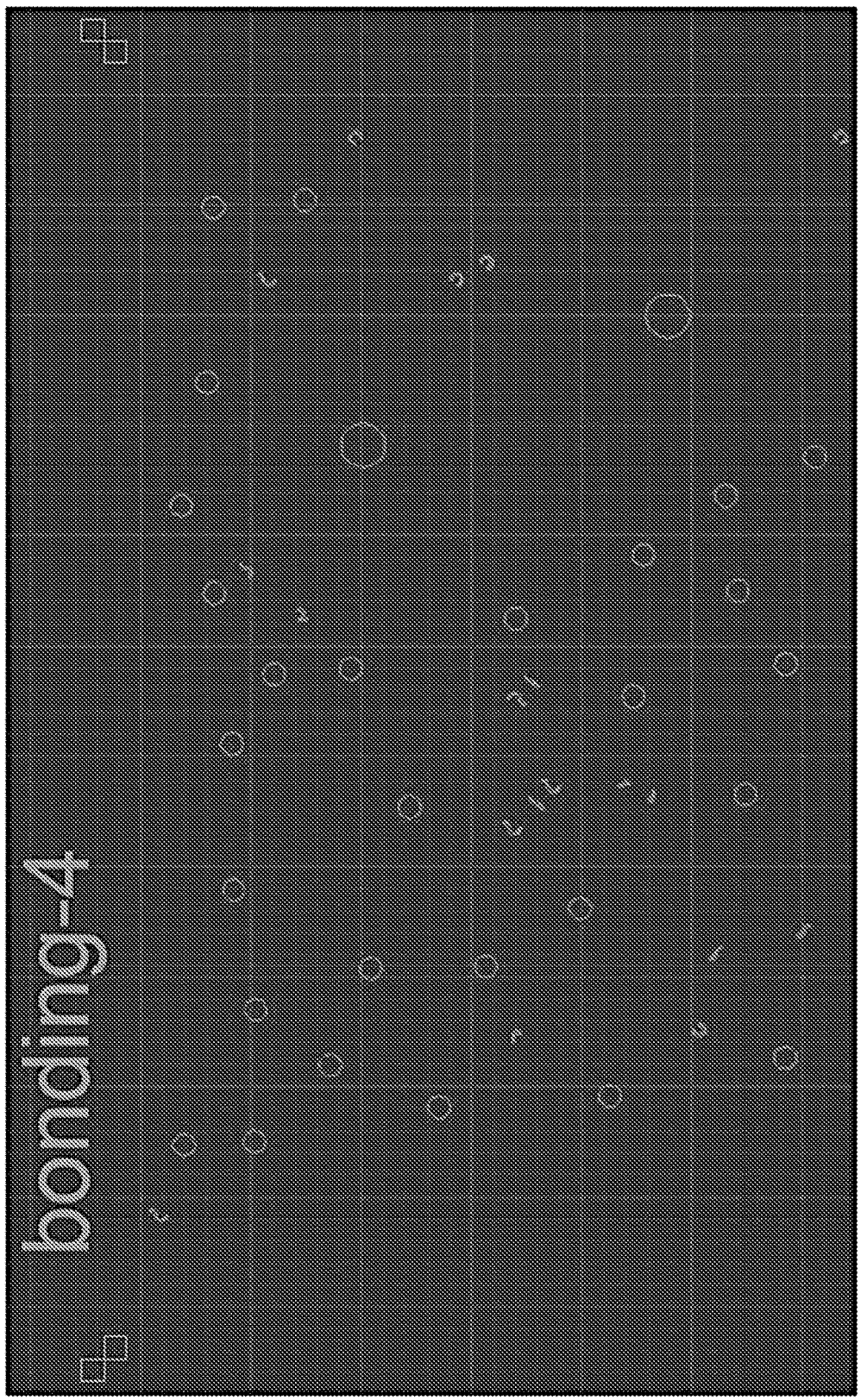
FIG. 47. Illustration of the location of precise selective bonding (1).
Figure 50:
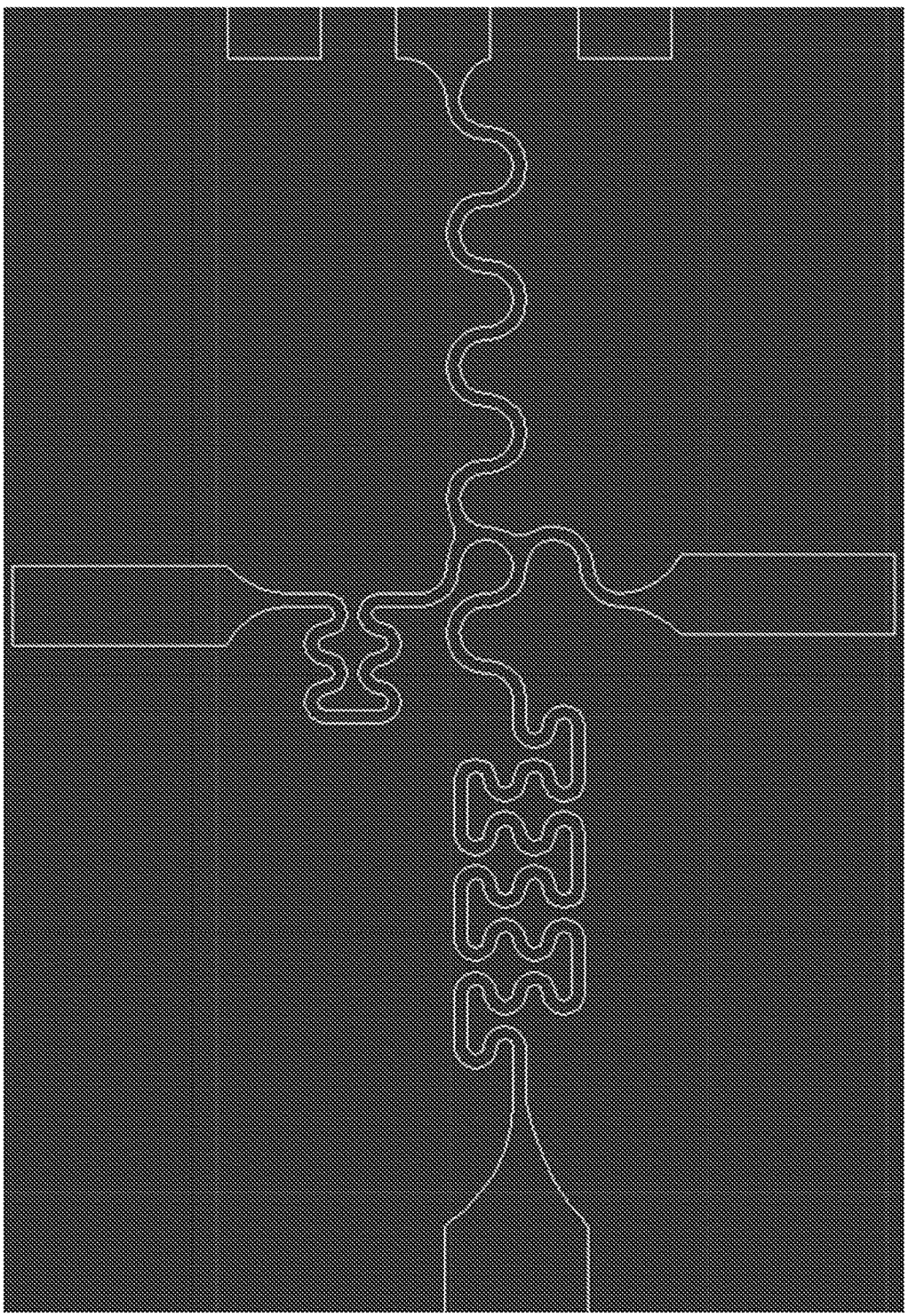
FIG. 50. Illustration of self-similar interconnects.
Figure 51:
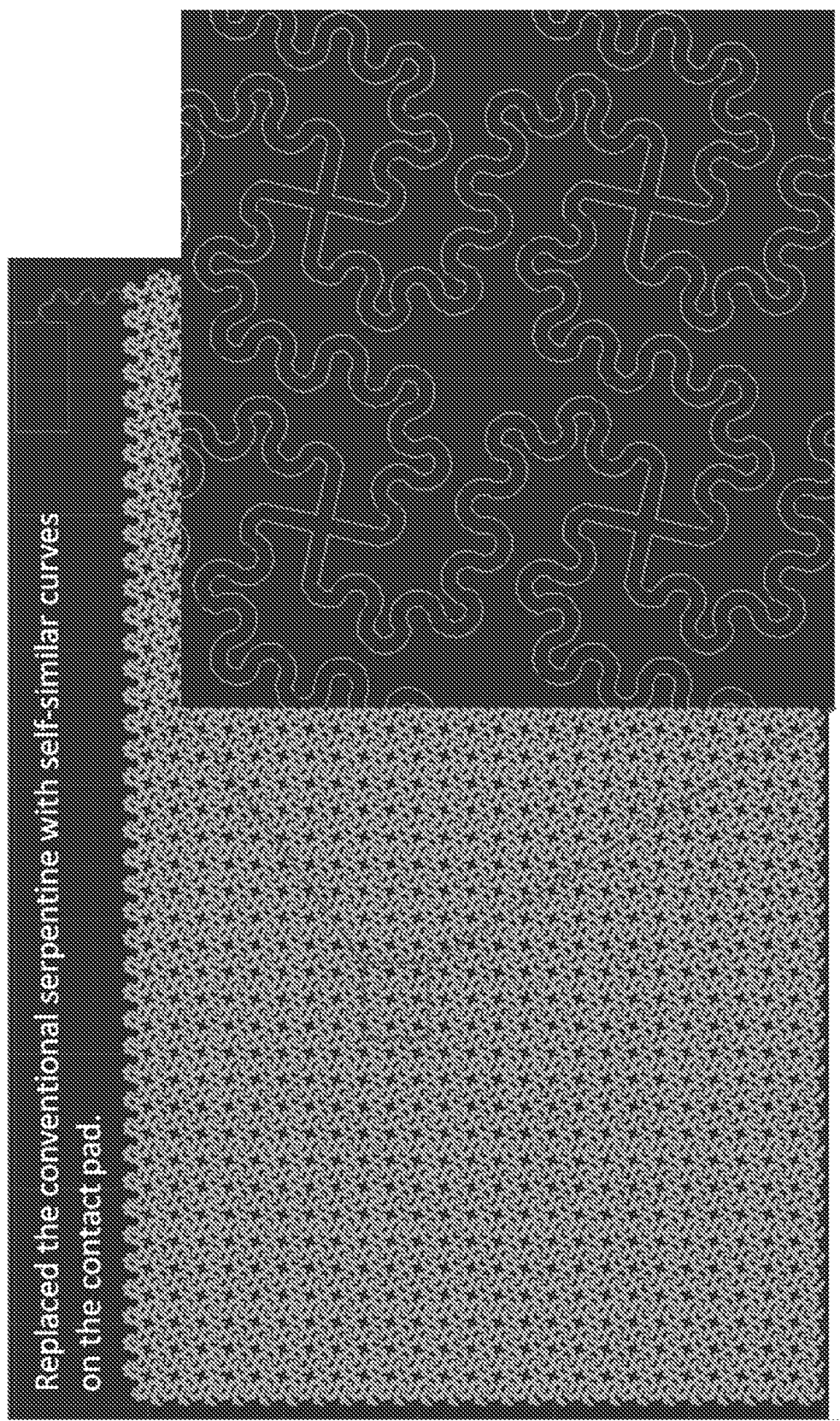
FIG. 51. Illustration of self-similar contact pads.

FIG. 47 illustrates the locations of precise selective bonding of the islands and the interconnects (1). FIG. 48 illustrates the fabrication processes to achieve precise selective bonding (2). FIG. 49 illustrates reduced sharp corners to increase the robustness of the interconnects. FIG. 50 illustrates the hybrid usage of self-similar interconnects and conventional serpentine interconnects (1). FIG. 51 illustrates self-similar interconnects of the contact pads to the skin (2).

Figure 52:
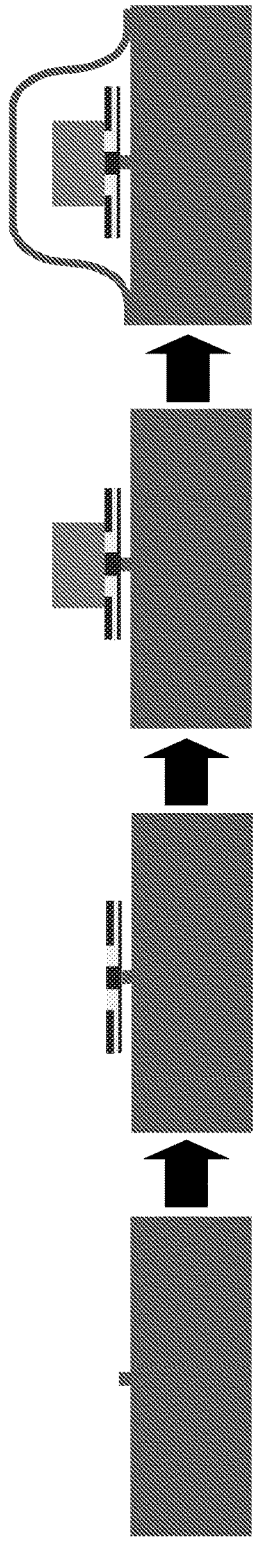
FIG. 52. Exemplary basic fabrication scheme.

FIGS. 52 and 53 illustrate an example of basic fabrication schemes, similar to FIGS. 25 and 26.

Figure 54:
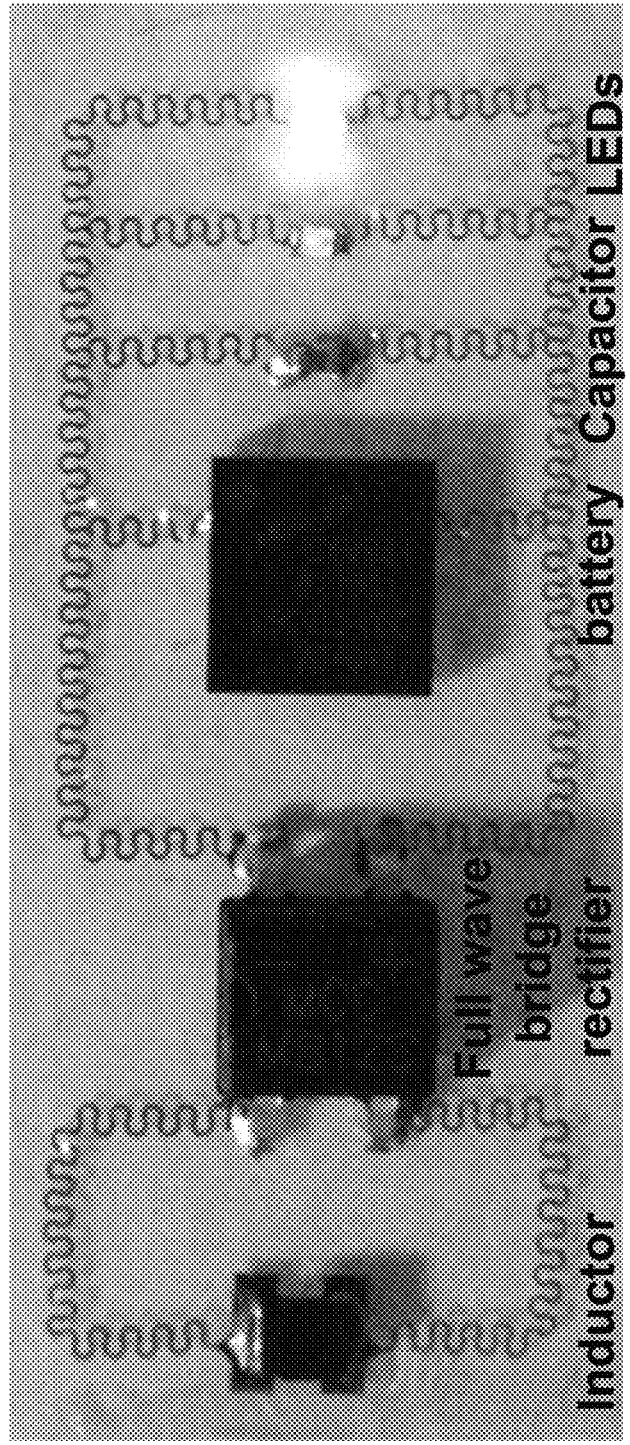
FIG. 54. An example of a wireless power circuit.

FIG. 54 provides an example of a wireless power circuit using a resonant inductive coil. FIG. 55 demonstrates wireless circuit stretching uniaxially to 100%.

Figure 56:
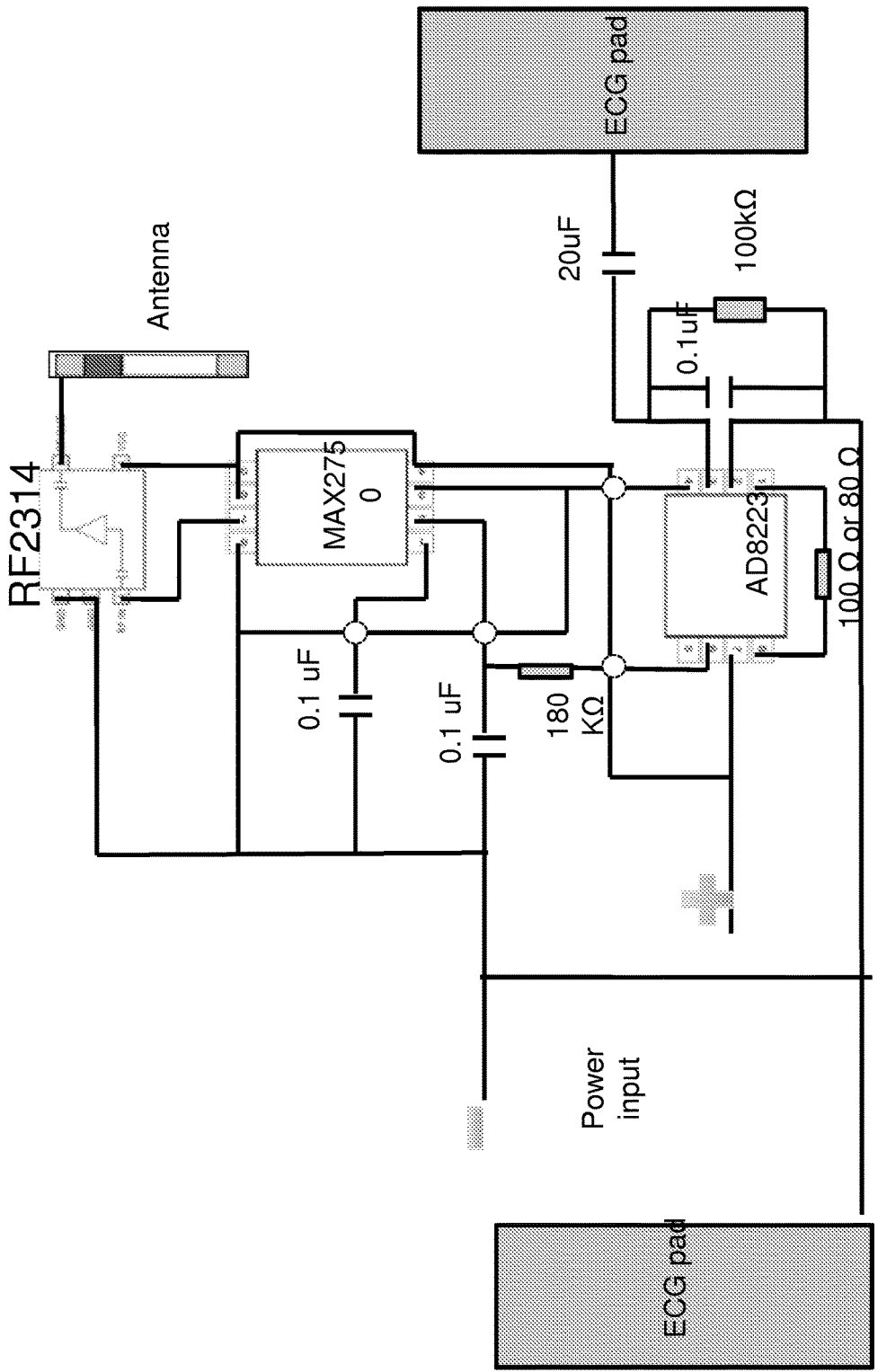
FIG. 56. Exemplary ECG circuit.

FIG. 56 illustrates an example ECG circuit similar to the circuit in FIG. 30.

Figure 58:
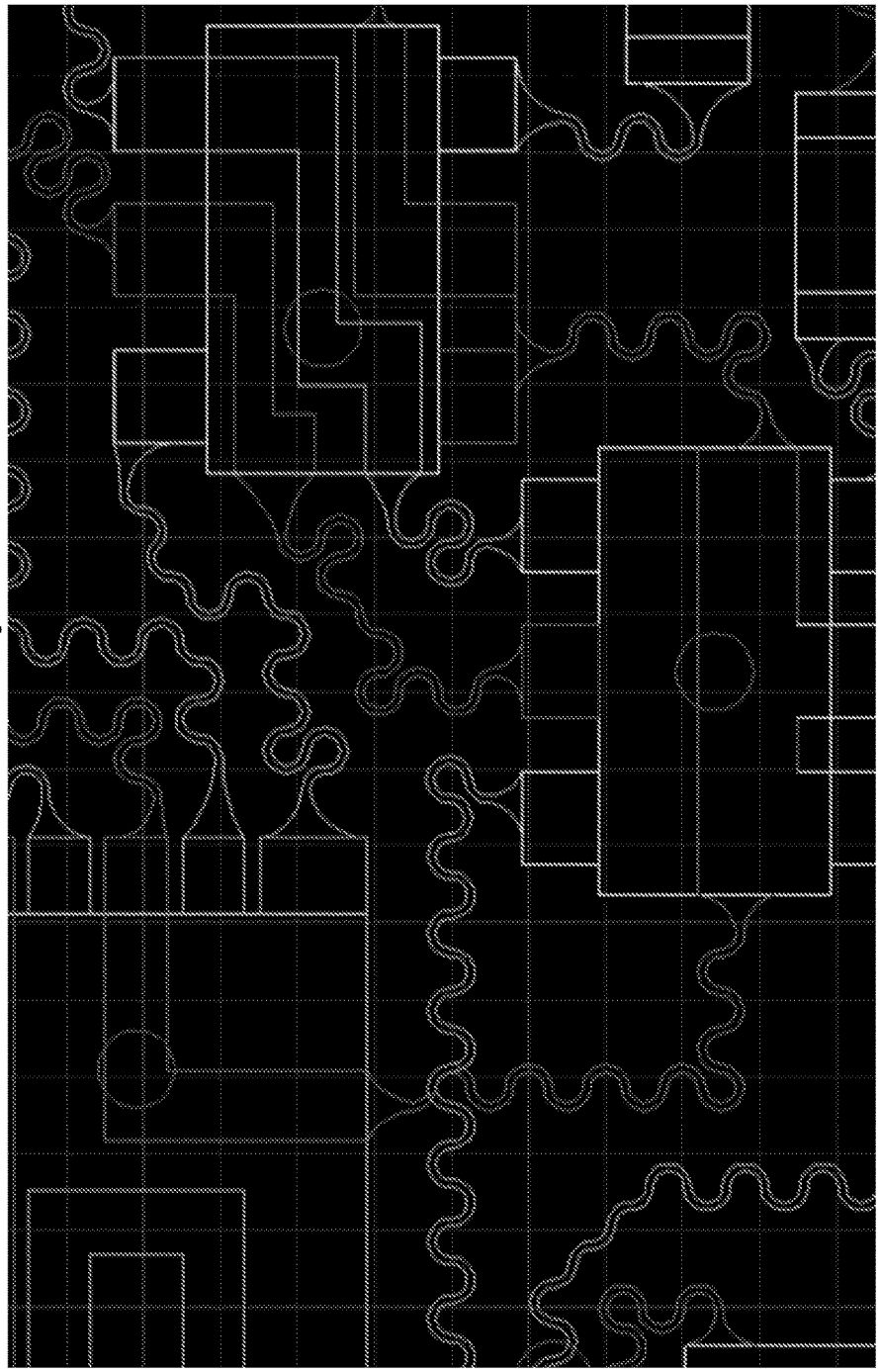
FIG. 58. Illustration of exemplary layout design considerations.
Figure 59:
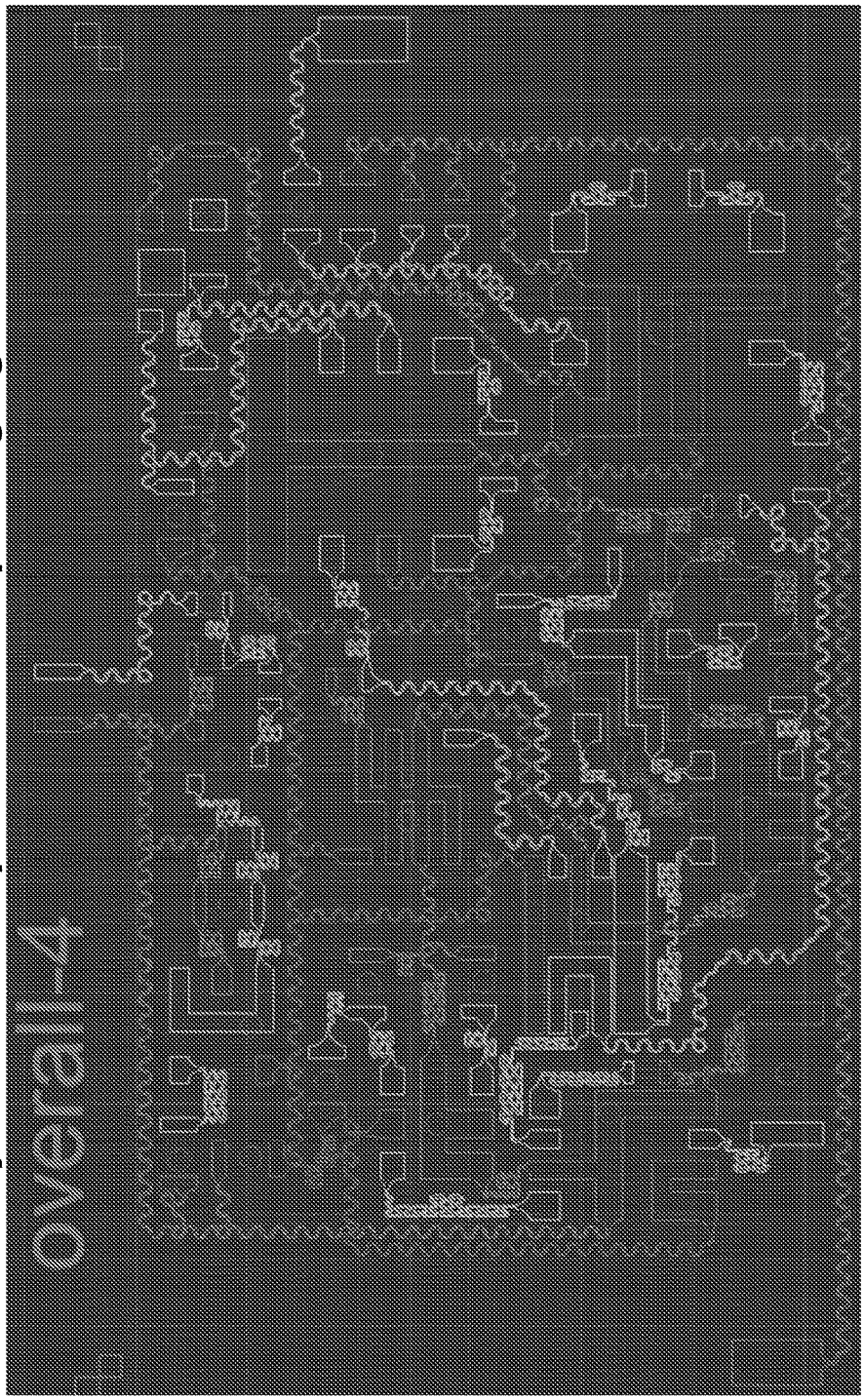
FIG. 59. Illustration of exemplary layout design considerations.

FIGS. 57, 58 and 59 illustrate examples of layout, selective bonding location under each rigid island, and interconnect geometry design considerations. FIG. 60 illustrates examples of fabricated interconnects with three layers of metals for data, power, and ground lines, respectively. These metal layers are separated by polyimide, in this case. The contact pads in the metal layers to the COTS chips are exposed.

Figure 62:
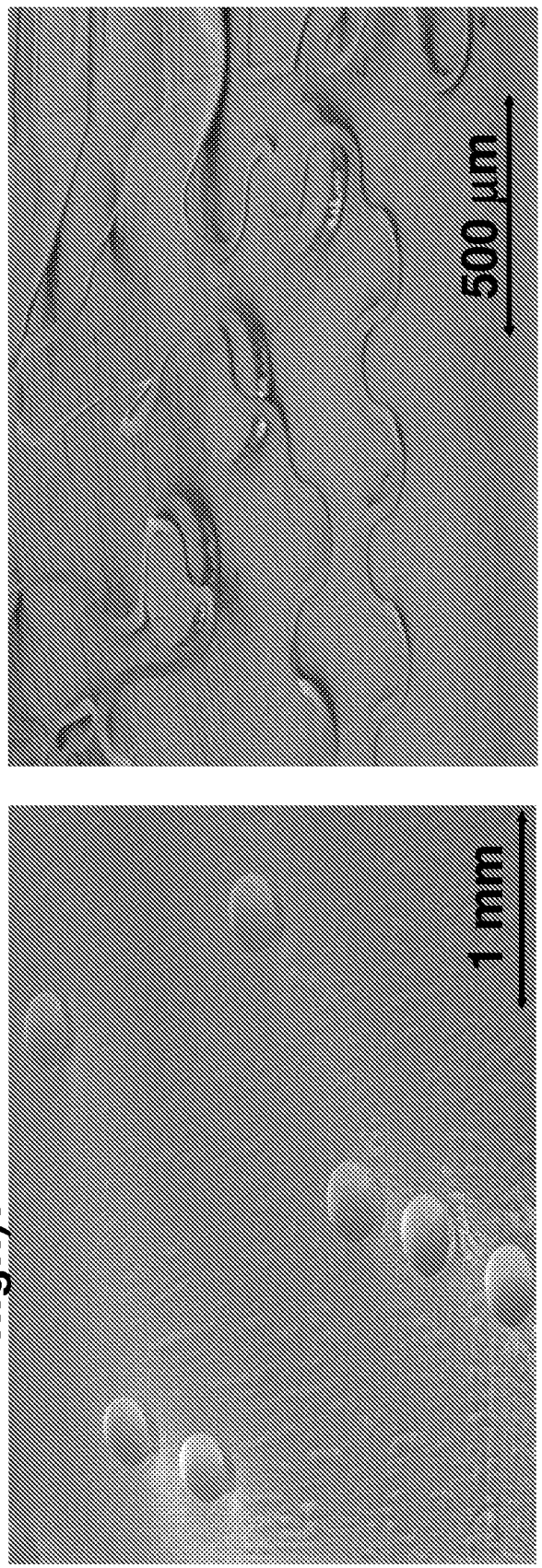
FIG. 62. Illustration of device tethered components comprising stretchable electrical interconnects bonded to pedestals.

FIG. 61 illustrates selective bonding using an unconventional fabrication process, along with optical microscope images showing the parts with selective bonding. FIG. 62 illustrates scanning electron microscope images with tethered device components comprising stretchable electrical interconnects bonded to pedestals. As shown, the interconnects are selectively bonded to the substrate at discrete locations, such that 5% or less of the surface area of a device component is in physical contact a tether, or 2% or less of the surface area of a device component is in physical contact with a tether, or 1% or less of the surface area of a device component is in physical contact with a tether. Tethering through selective bonding of interconnects and/or other device components at one or more positions may be used to reduce or prevent entanglement of interconnects, device components and/or devices.

FIG. 63 illustrates chip depackaging by purely mechanical polishing and acid etching by hot fuming nitric acid.

Figure 65:
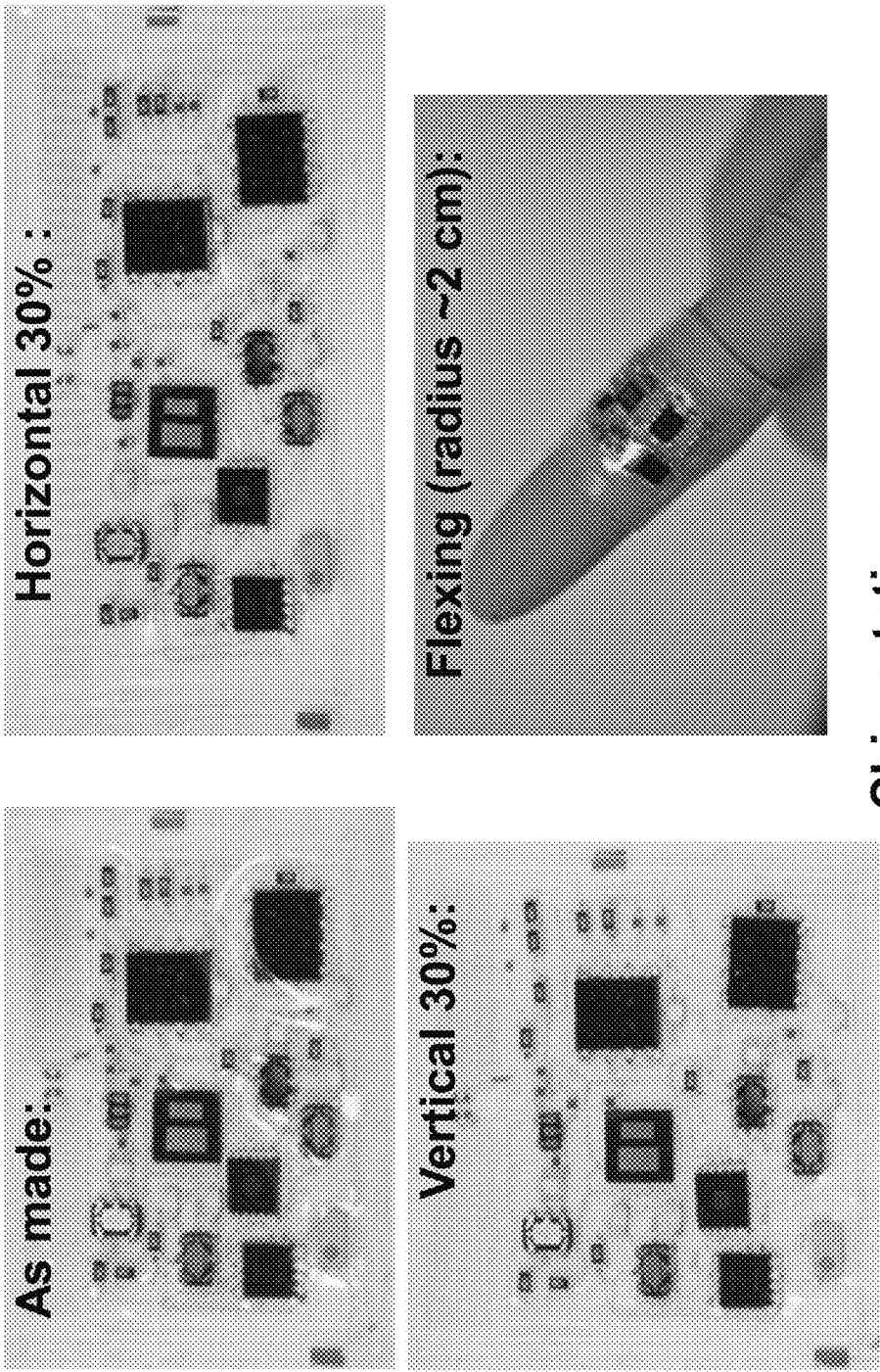
FIG. 65. Illustration of stretching and flexing of an electronic device.
Figure 66:
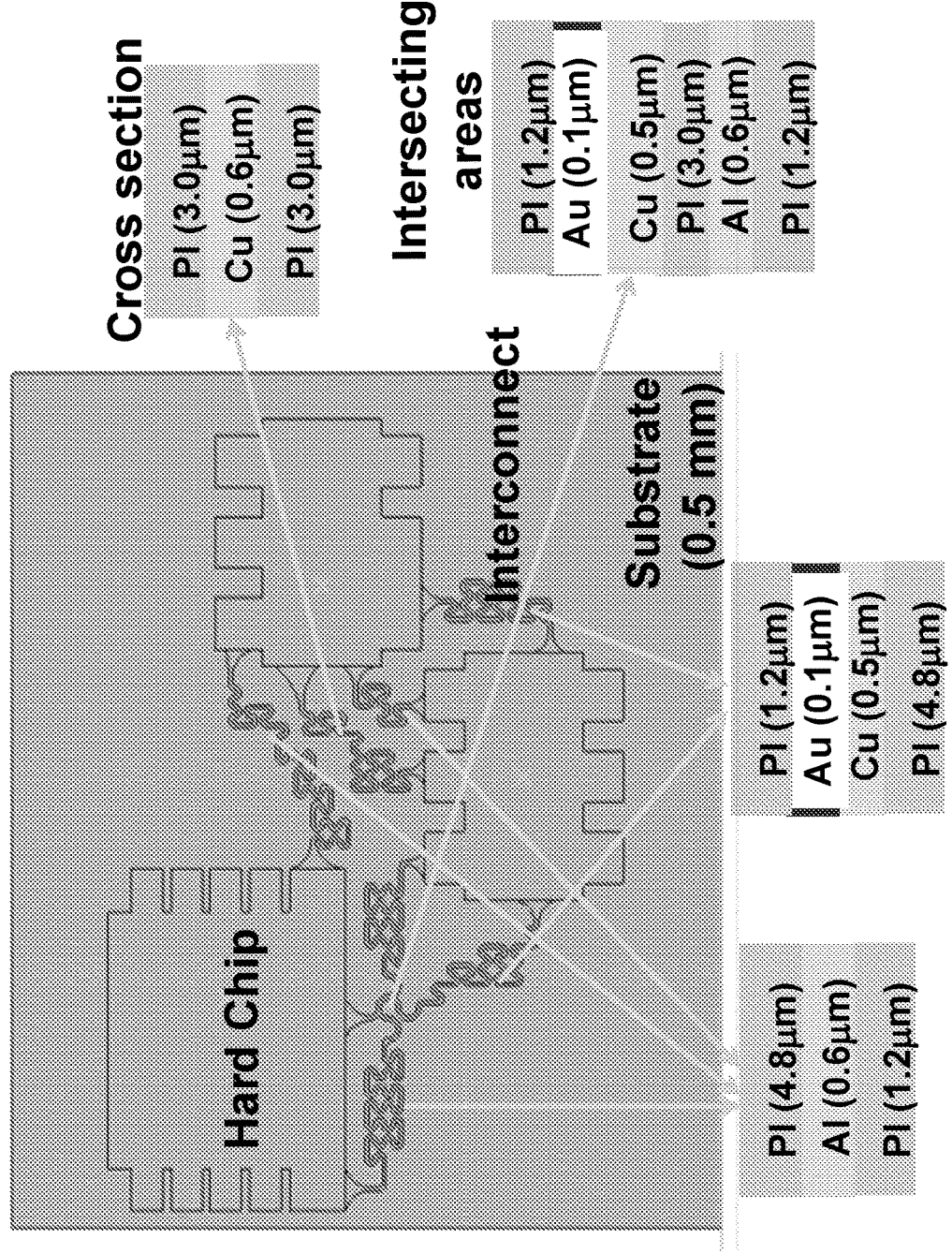
FIG. 66. Exemplary mechanical analyses.
Figure 67:
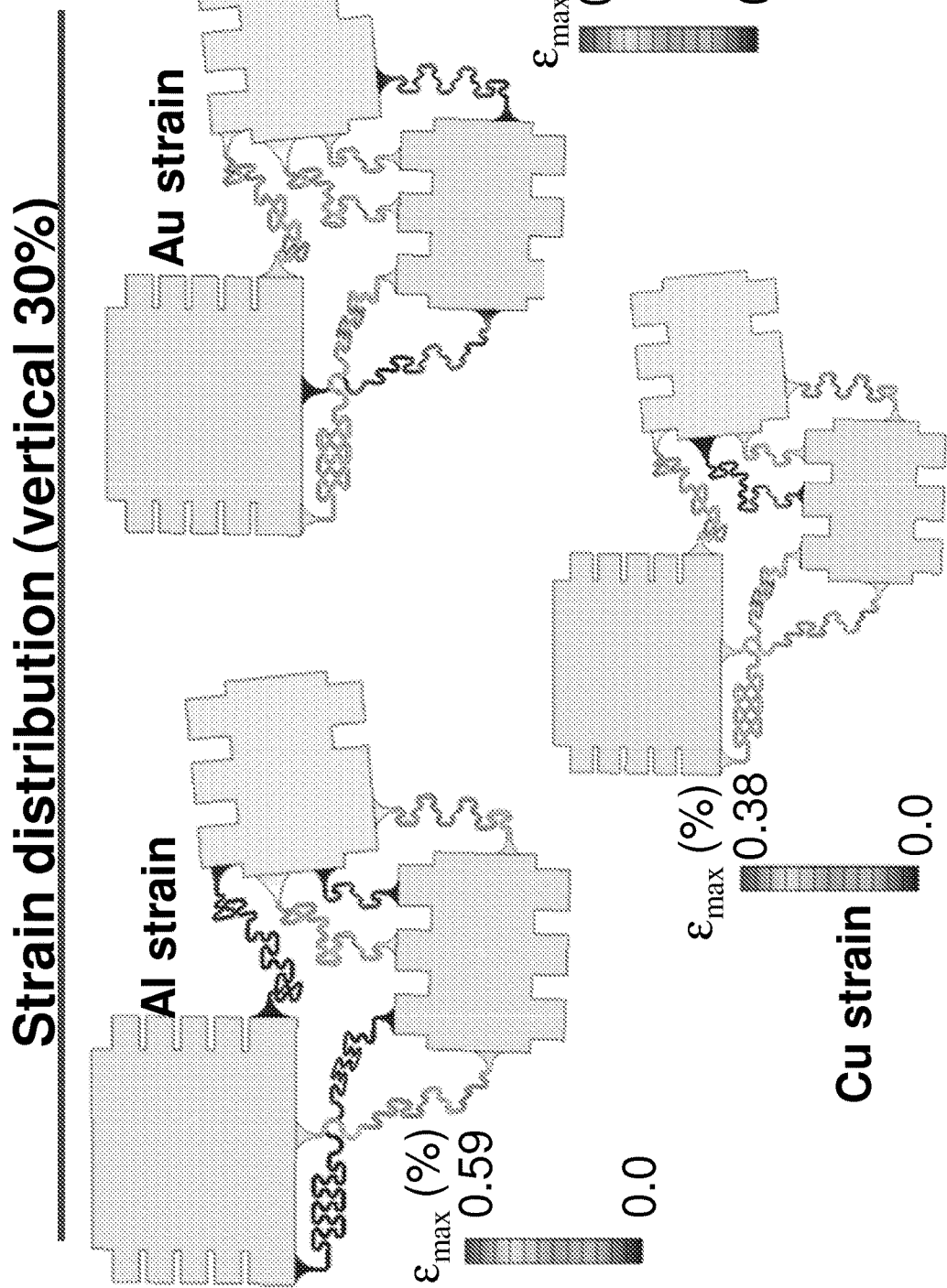
FIG. 67. Illustration of strain distribution.
Figure 68:
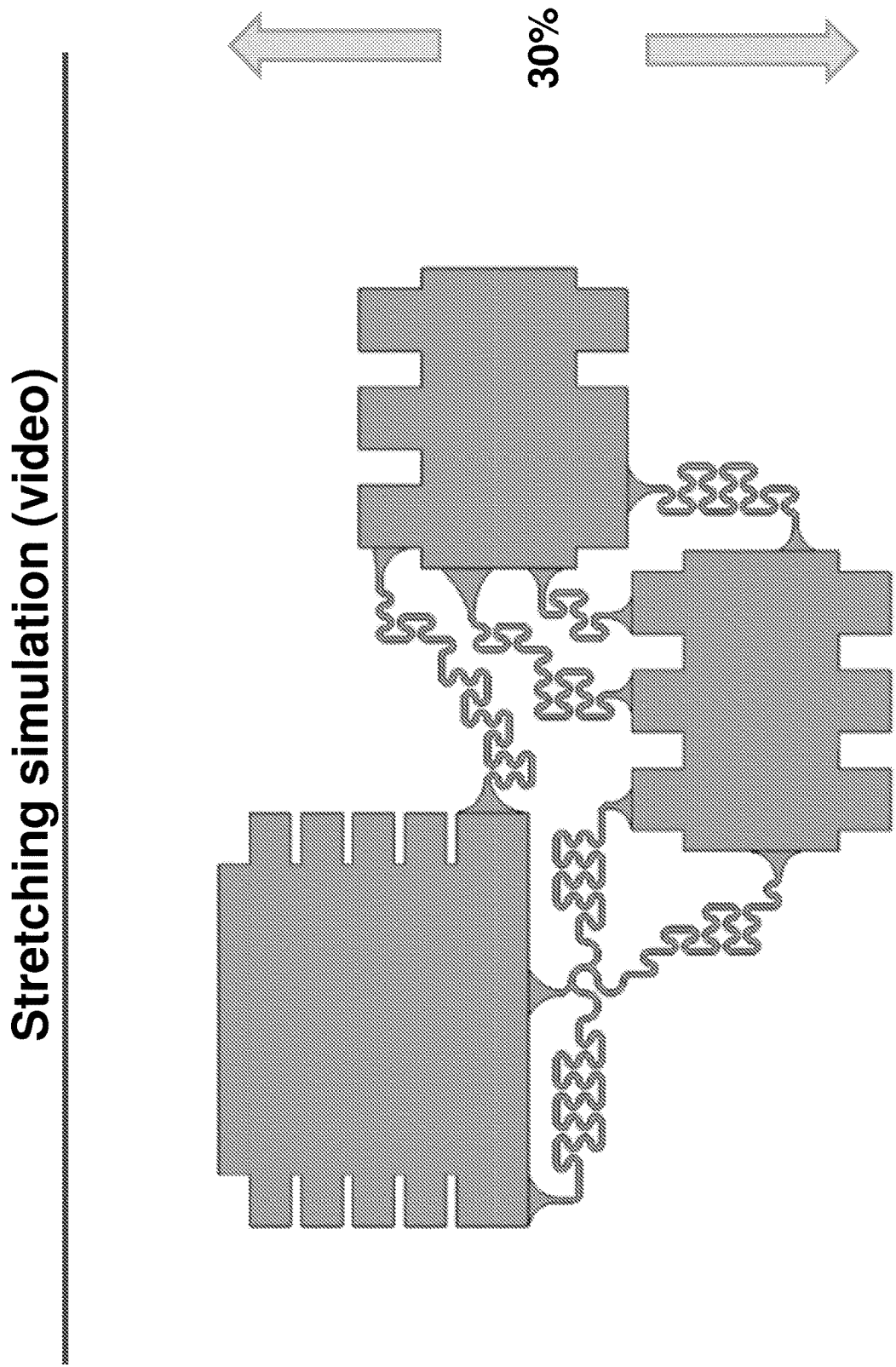
FIG. 68. Schematic illustration of stretching simulations.
Figure 69:
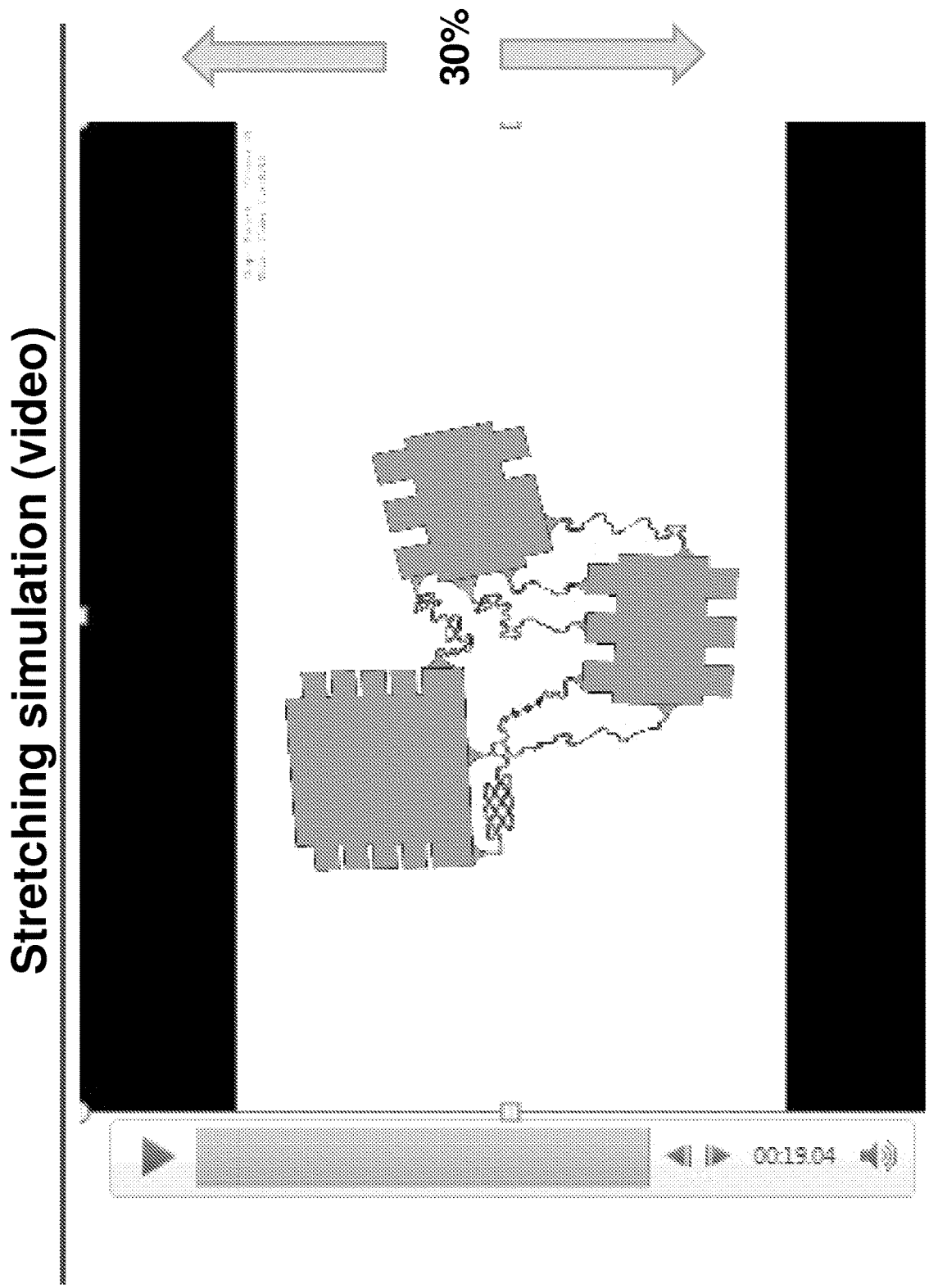
FIG. 69. Schematic illustration of stretching simulations.

FIG. 64 shows a fabricated multifunctional device with liquid chamber on a bent cylindrical surface with COTS chips as received and mechanically polished. FIG. 65 illustrates stretching and flexing of the device in FIG. 64. FIG. 66 shows example mechanical analyses of the multilayered interconnects. FIG. 67 shows strain distribution in the multilayered interconnects under vertical uniaxial strain of 30%. FIGS. 68 and 69 schematically illustrate stretching simulation video.

Example 3: Electronic Systems Having Fluid Containment

Electronic devices having fluid containment will now be described with reference to the figures, where reference numerals used to describe FIG. 70 show the same features in multiple embodiments, multiple items within a figure may not be labeled, and the figures may not be drawn to scale.

Figure 70A:
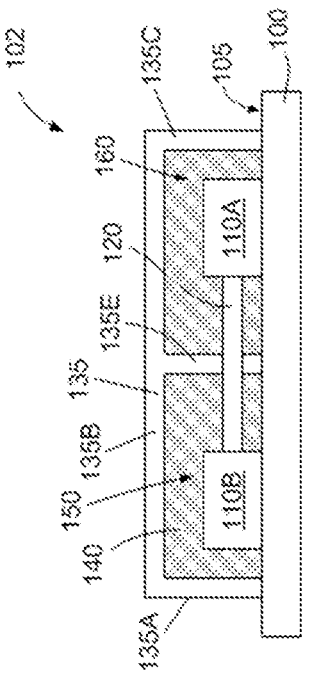
FIG. 70. Schematic illustrations of multiple embodiments of electronic devices and/or device components within containment chambers, according to multiple embodiments of the present invention.
Figure 70C:
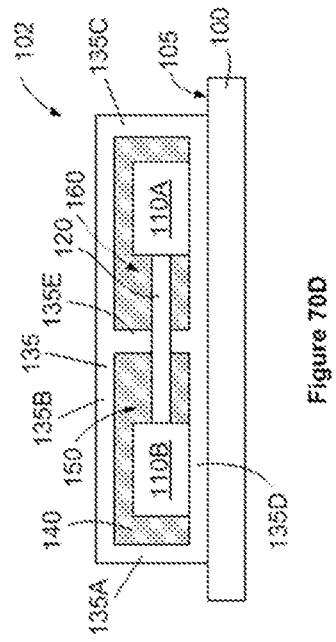
Figure 70B:
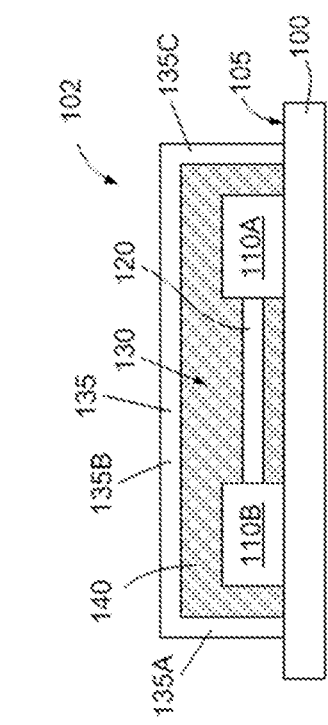
Figure 70D:
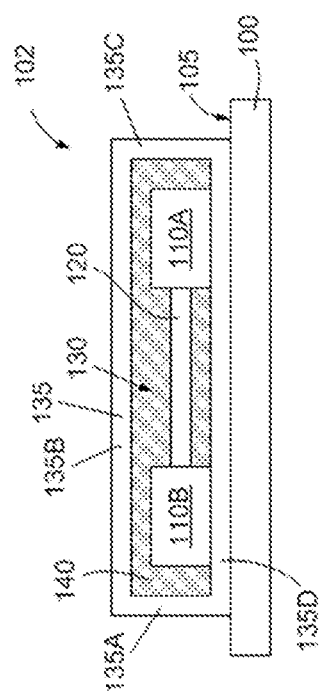
Figure 70K:
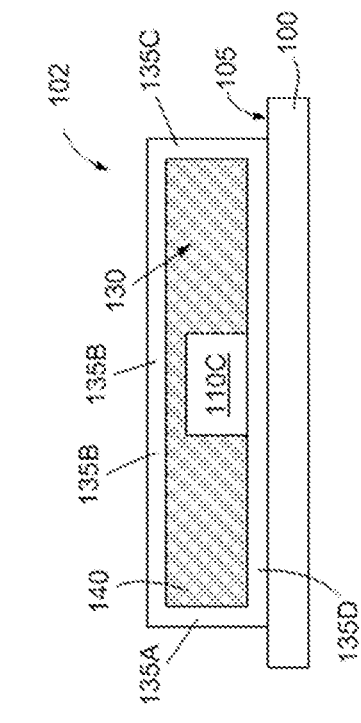
Figure 70L:
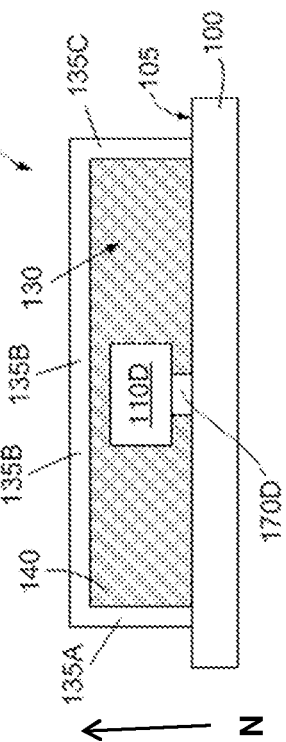

FIGS. 70A and 70L show side plan views of systems 102 comprising a substrate 100 with one or more electronic devices or device components 110A, 110B, 110C supported by a surface 105 of the substrate. In the embodiments shown, devices or device components 110A, 110B, 110C are free standing and a containment chamber 135 is formed by a plurality of enclosing structures, such as a top wall 135B and side walls 135A, 135C. The containment chamber 135 at least partially surrounds the devices/components 110A, 110B, 110C within a void space 130 of the chamber that is at least partially filled with a containment fluid 140. In the embodiment of FIG. 70A, the devices/components 110A, 110B are connected to one another by an electrical interconnect 120.

Figure 70M:
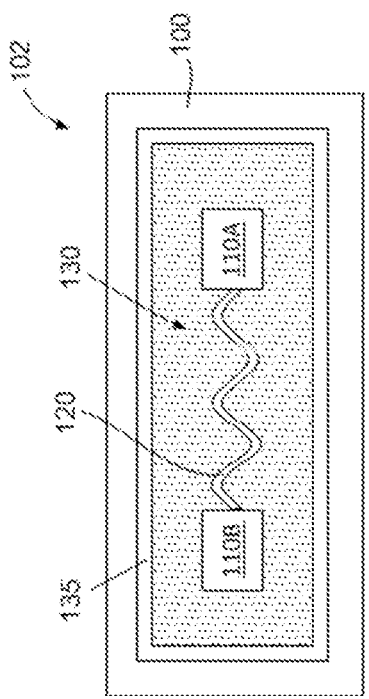

FIGS. 70B and 70M show embodiments similar to those of FIGS. 70A and 70L except that containment chamber 135 is formed in part by a bottom wall 135D in addition to top wall 135B and side walls 135A, 135C. In this embodiment, devices/components 110A, 110B, 110C and containment fluid 140 do not contact substrate 100. Instead, the devices/components 110A, 110B, 110C are free standing on bottom wall 135D.

FIG. 70C shows an embodiment where a containment chamber 135 contains an interior wall 135E that forms multiple void spaces 150, 160. In the embodiment shown, devices/components 110A and 110B are located in separate void spaces 150, 160, but they are in electrical contact through electrical interconnect 120, which is embedded within interior wall 135E. A containment fluid 140 at least partially fills each void space 150, 160.

FIG. 70D shows an embodiment of a system 102 comprising multiple void spaces 150, 160 formed by a containment chamber 135 having a top wall 135B, a bottom wall 135D, side walls 135A, 135C and an interior wall 135E. A containment fluid 140 at least partially fills each void space 150, 160. The devices or device components are located in separate void spaces 150, 160, but are connected to one another by electrical interconnect 120, which is embedded within interior wall 135E. The entire system is supported by a substrate 100.

Figure 70N:
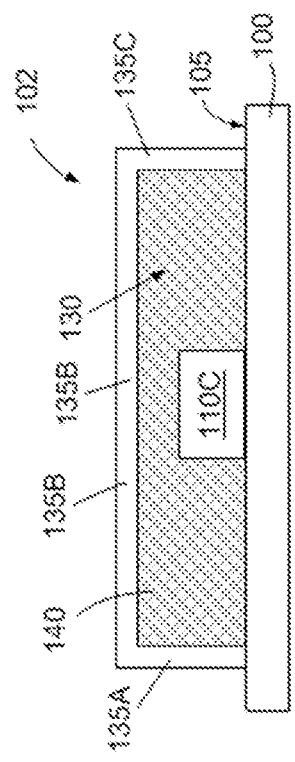

FIGS. 70E and 70N show embodiments of a system 102 comprising one or more devices or device components 110A, 110B, 110D that are tethered to a substrate 100 by a relief feature 170A, 170B, 170D. For example, in some embodiments, the relief feature 170A, 170B, 170D may be a pedestal. In the embodiment of FIG. 70E, devices/components 110A, 110B are connected to one another by an electrical interconnect 120, which may be a stretchable or serpentine electrical interconnect. Devices/components 110A, 110B, 110D, relief features 170A, 170B, 170D and optionally electrical interconnect 120 are enclosed within a void space 130 of a containment chamber 135 formed by a top wall 135B and side walls 135A, 135C that are laminated to substrate 100. Void space 130 is at least partially filled with a containment fluid 140.

FIG. 70F shows an embodiment where devices or device components 110A, 110B, which are each tethered to a substrate 100 by a relief feature 170A, 170B, are located in separate void spaces 150, 160 of a containment chamber 135 formed by a top wall 135B, side walls 135A, 135C, and an interior wall 135E. The tethered devices/components are connected to one another by an electrical interconnect 120 that passes through interior wall 135E.

FIG. 70G shows an embodiment comprising an array of relief features supporting each device or device component 110A, 110B. For example, device/component 110A is supported by relief features 170A1, 170A2 and 170A3, and device/component 110B is supported by relief features 170B1, 170B2 and 170B3. In this embodiment, containment fluid 140 is able to infiltrate between relief features 170A1-A3 and 170B1-B3.

FIG. 70H shows an embodiment of a system 102 comprising devices or device components 110A, 110B each supported by an array of relief features 170A1-A3 and 170B1-B3, where each device/component 110A, 110B is disposed in an independent void space 150, 160 of a containment chamber 135 formed by a top wall 135B, side walls 135A, 135C and an interior wall 135E. In the embodiment shown, containment chamber 135 is laminated to the surface 105 of substrate 100, but alternate embodiments could include a bottom wall 135D (not shown) of a containment chamber.

Figure 1B:
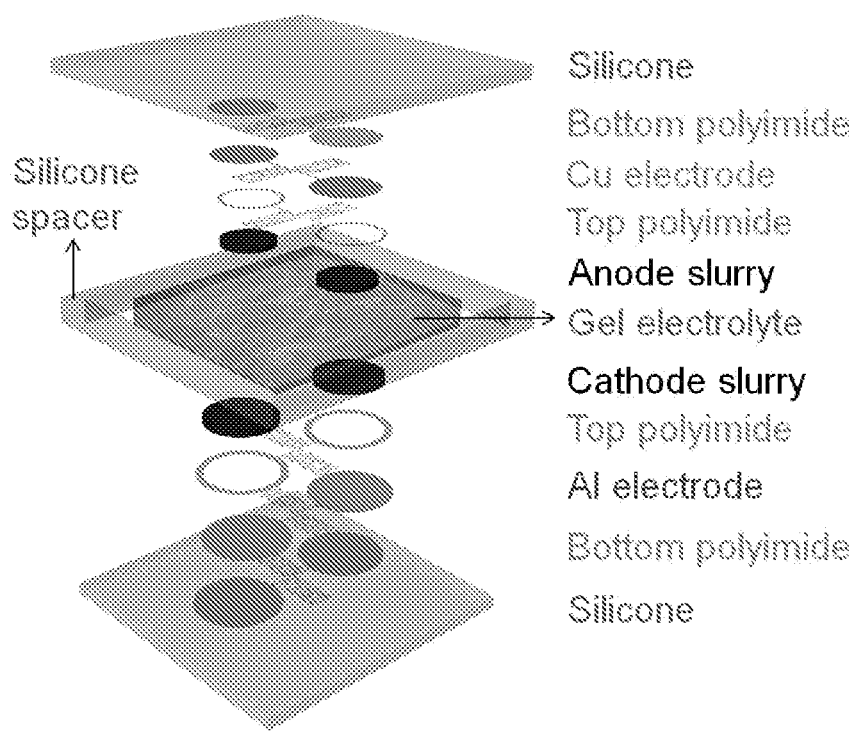
Figure 1C:
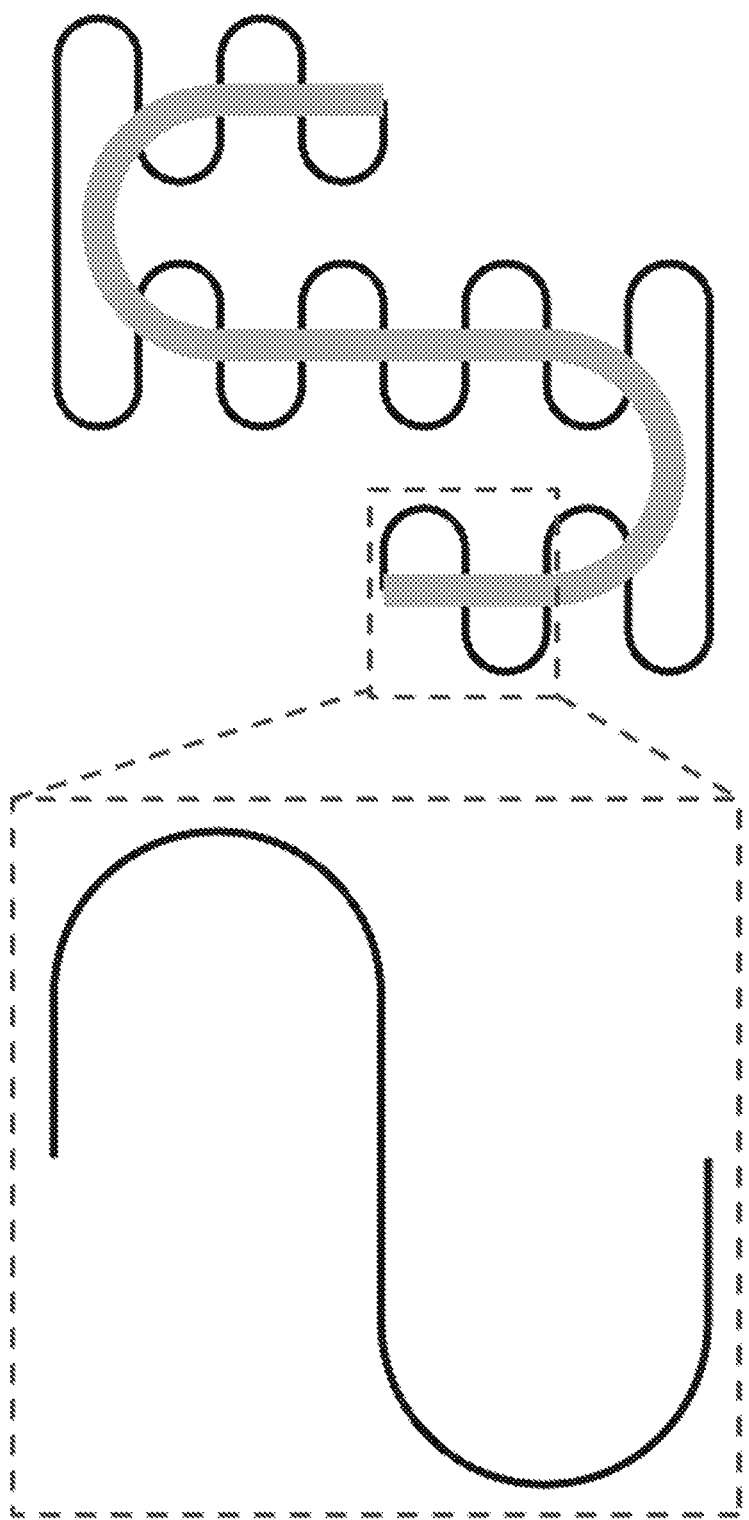

FIGS. 70I1 and 70I2 show the result of stretching substrate 100. FIG. 70I1 shows a system 102 without any external force on the system. FIG. 70I2 shows a force in the direction of arrow A on substrate 100. The applied force pulls the point of relief feature 170B bound to the substrate in the direction of arrow A. The tethered geometry of device/component 110B involving relief feature 170B functions to decouple motion and/or deformation of the substrate from device/component 110B. Containment fluid 140 within void space 130 of containment chamber 135 buffers device/component 110B.

FIGS. 70J1 and 70J2 show the result of contracting a substrate 100 of a system 102. FIG. 70J1 shows system 102 without any external force on the system. FIG. 70J2 shows forces in the directions of arrows B1 and B2 such that substrate 100 is being contracted or squeezed. The applied forces moves the bonding points of relief features 170B and 170A with the substrate in the directions of arrows B1 and B2, respectively. The tethered geometry of devices/components 110B and 110A involving relief features 170B and 170A functions to decouple motion and/or deformation of the substrate from device/components 110B and 110A.

FIG. 70K shows a top plan view of an embodiment of a system 102 comprising a stretchable serpentine electrical interconnect 120 connecting devices or device components 110A, 110B. The system further includes a containment chamber 135 having a void 130 that is at least partially filled with a containment fluid 140. The containment chamber 135 may include a top wall (not shown) and/or a bottom wall (not shown). The entire system is supported by a substrate 100.

Figure 70Q:
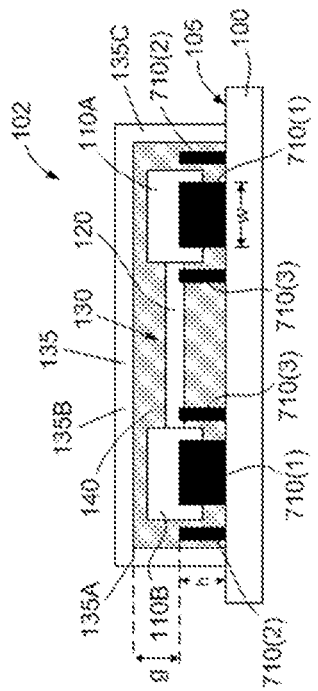
Figure 70R:
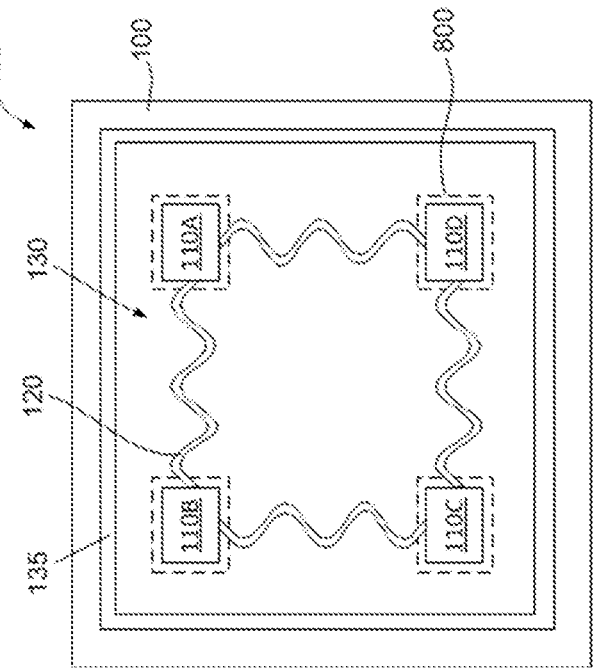
Figure 70O:
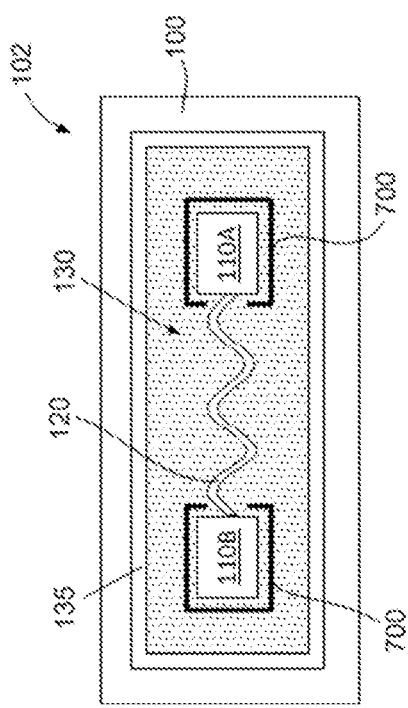
Figure 70P:
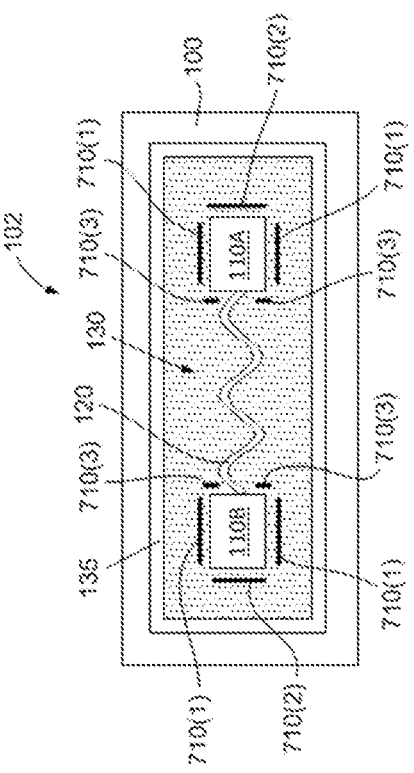

FIG. 70O shows a top plan view of an embodiment of an exemplary system 102 comprising a stretchable serpentine electrical interconnect 120 connecting devices or device components 110A, 110B. The system further includes a containment chamber 135 having a void 130 that is at least partially filled with a containment fluid 140. The containment chamber 135 may include a top wall (not shown) and/or a bottom wall (not shown). The entire system is supported by a substrate 100. The embodiment shown in FIG. 70O also includes barrier structures 700, in the form of corrals, which limit movement of a free standing device or device component. Corrals 700 are unitary structures having a height, h, that is less than the full height of containment chamber 135 and having an opening for interconnect 120 to access device or device component 110A, 110B. FIG. 70P shows a similar embodiment, where the barrier structures are formed as a plurality of bumpers 710(1)-710(3) including side walls 710(1), back walls 710(2) and front walls 710(3). Each bumper 710(1)-710(3) is positioned substantially parallel to an edge of a device or device component, and although bumper 710(1)-710(3) is shorter than the edge of the device or device component it is sufficiently long to constrain movement of the device or device component without preventing movement of containment fluid 140. Two front walls 710(3) form an opening for interconnect 120 to access device or device component 110A, 110B. FIG. 70Q shows a side plan view of the embodiment of FIG. 70P, wherein free standing devices or device components 110A, 110B are laterally constrained by bumpers 710(1)-710(3) having widths, w, less than a corresponding edge of device or device component 110A, 110B, and heights, h, at least sufficient to prevent device or device component 110A, 110B from moving vertically and escaping through a gap, g, between a bumper 710(1)-710(3) and top wall 135B of containment chamber 135.

FIG. 70R shows a top plan view of an embodiment of a system 102 comprising a plurality of stretchable serpentine electrical interconnects 120 connecting devices or device components 110A-110D. The system further includes a containment chamber 135 having a void 130 that is at least partially filled with a containment fluid (not shown). The containment chamber 135 may include a top wall (not shown) and/or a bottom wall (not shown). The entire system is supported by a substrate 100 comprising discrete areas 800 of higher elastic modulus material than other portions of the substrate. In an embodiment, the higher modulus areas may be localized under or near devices or device components 110A-110D to minimize strain at the junction of interconnect 120 and device or device component 110A-110D. In an embodiment, the substrate may be formed from alternating higher modulus areas and lower modulus areas (e.g., formed by discrete strips of material). The areas of higher modulus material may be provided by replacing the substrate materials with a higher modulus material, incorporating a higher modulus material (e.g., a mesh or glass wool) into the substrate material at discrete locations, layering a higher modulus material with the substrate material at discrete locations, thickening the substrate material at discrete locations, and other techniques known to those of skill in the art.

Figure 70S:
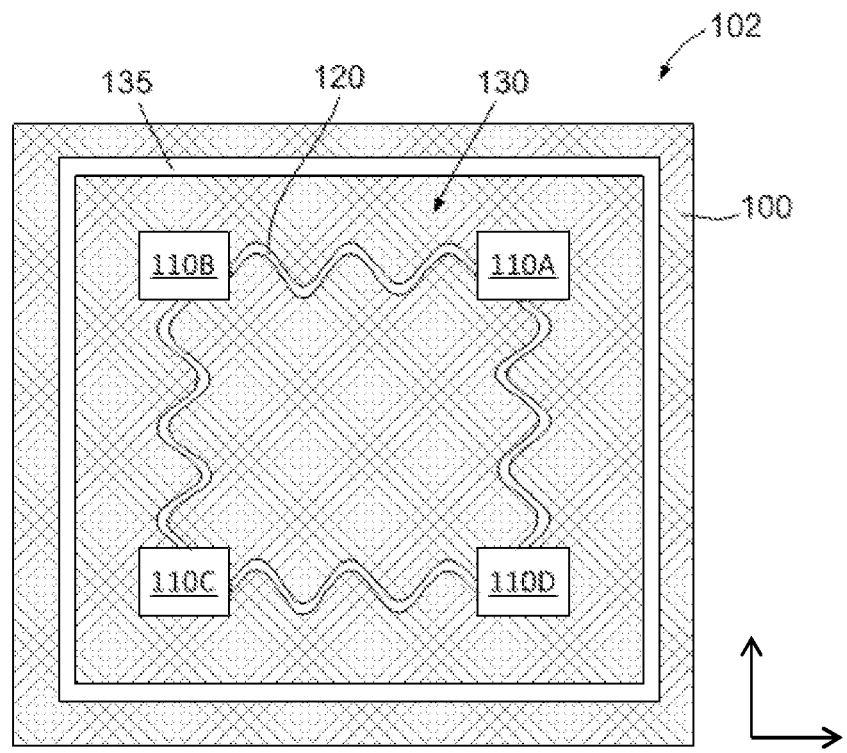

FIG. 70S shows a top plan view of an embodiment of a system 102 comprising a plurality of stretchable serpentine electrical interconnects 120 connecting devices or device components 110A-110D. The system further includes a containment chamber 135 having a void 130 that is at least partially filled with a containment fluid (not shown). The containment chamber 135 may include a top wall (not shown) and/or a bottom wall (not shown). The entire system is supported by a substrate 100 having a continuously varying elastic modulus (schematically represented by cross-hatching), where the elastic modulus is spatially varying within the plane of the substrate. In an embodiment, the elastic modulus of the substrate may spatially vary according to a continuous or smooth linear, parabolic or sinusoidal function. In an embodiment, the elastic modulus of the substrate may spatially vary from one edge or corner of the substrate to an opposite edge or corner of the substrate, or from a center of the substrate to an outer perimeter of the substrate, or according to a set frequency or pattern. A smooth or continuous spatial variation may be provided by incorporating a spatially varying concentration of higher modulus material (e.g., a mesh or glass wool) into the substrate, spatially varying substrate thickness (e.g., by molding or reductive processing), and other techniques known to those of skill in the art.

Figure 71:
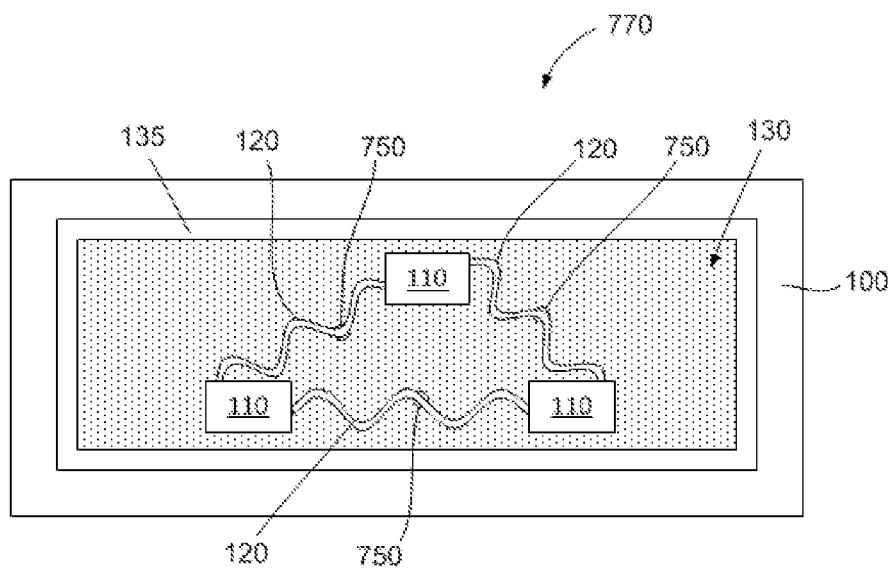
FIG. 71. Schematic illustration of an embodiment of an electronic device having device components that are selectively bonded (directly or indirectly) to a substrate, according to an embodiment of the present invention.

FIG. 71 shows a top plan view of an embodiment of an exemplary system 770 comprising stretchable serpentine electrical interconnects 120 connecting devices or device components 110, which may be free floating or tethered and optionally may be constrained within a barrier structure (not shown). The system further includes a containment chamber 135 having a void 130 that is at least partially filled with a containment fluid 140. The containment chamber 135 may include a top wall (not shown) and/or a bottom wall (not shown). The entire system is supported by a substrate 100. To reduce or prevent tangling, interconnects 120 are selectively bonded to the bottom wall or substrate 100 by a bonding pad 750, which may be a pedestal, adhesive bead, or other material for anchoring a device or device component to a bottom wall or substrate 100.

Example 4: Soft Systems of Sensors, Circuits and Radios for the Skin

When mounted on the skin, modern sensors, circuits, radios and power supply systems have the potential to provide clinical-quality health monitoring capabilities for continuous use, beyond the confines of traditional hospital or laboratory facilities. The most well-developed component technologies are, however, broadly available only in hard, planar formats. As a result, existing options in system design are unable to effectively accommodate integration with the soft, textured, curvilinear and time-dynamic surfaces of the skin. Here, we present combined strategies in materials, microfluidic systems, structural designs and mechanics theory for low modulus, stretchable systems that incorporate assemblies of high modulus, rigid, state-of-the-art functional elements. The outcome is a thin, conformable device technology that can softly laminate onto the surface of the skin, to enable advanced, multifunctional operation for physiological monitoring in a wireless mode. The versatility of these ideas and their compatibility with other approaches to flexible/stretchable electronics suggest a foundation for rapid progress in wearable devices that exploit intimate integration with the human body.

Successful development and deployment of electronic systems with precision capabilities in continuous physiological monitoring, intervention and therapy could have many important consequences, ranging from enhanced safety in sports to improved cost structures and outcomes in advanced health-care. Multi-modal, non-invasive access to the body can be accomplished through electrical/optical/fluidic interfaces established transcutaneously. Conventional hard electronic components and sensors adhere to the skin by use of straps, pins or tapes, thereby constraining natural motions in ways that cause discomfort, frustrate robust adhesion and prevent stable biotic/abiotic interfaces. 'Skin-like' devices, sometimes referred to as 'epidermal' electronic systems (1, 2), avoid these limitations by adopting thicknesses (3-5), moduli, levels of elastic stretchability and other basic physical properties that match those of the skin itself, to allow a soft, compliant type of integration. These ideal characteristics can be achieved even in components that incorporate established, high-performance semiconductor materials such as silicon, which are themselves hard and brittle (1, 6, 7). The required specialized, ultrathin device geometries can, however, create engineering impediments to quick design iterations and fast development. Alternative approaches that use soft active materials (3, 4, 8-13) and/or liquid metals (14-16) are valuable for certain sensors and individual components, but they cannot presently support the entire range of functions needed for practical applications nor are they immediately compatible with established methods for microfabrication and device integration. Here, we demonstrate ideas for compliant, skin-mounted systems that can incorporate not only these and other recently explored materials and devices but also commercial, chip-scale components, including integrated circuits, radio frequency hardware, microelectromechanical structures, physical/chemical sensors and power sources. Interconnected collections of such chips that float in thin microfluidic enclosures defined by elastomeric membranes offer soft, low modulus mechanics at the system level. Here, the influence of the high modulus components on the overall mechanics is negligible, even when they are present at high areal coverage. Such mechanical properties are qualitatively different from those achievable with solid constructs explored previously (17-20). The resulting systems can laminate softly and non-invasively onto the skin, to define highly functional interfaces with the ability to combine unusual devices with standard parts. These concepts enable rapid prototyping of broad classes of sophisticated bio-integrated electronic devices, as illustrated here through systems that offer wirelessly powered operation, precision measurement of biopotentials, acceleration and/or temperature, with radio frequency (RF) data transmission.

The layout involves a matrix of microfluidic spaces designed to decouple the mechanics of the constituent devices and associated interconnect network from a thin, elastomeric enclosure that simultaneously provides a supporting surface (i.e. substrate) and an encapsulation layer (i.e. superstrate). Each component bonds to the bottom surface of this enclosure selectively at small, localized cylindrical features of relief (i.e. support posts) molded onto the thin elastomer substrate. Except for these posts, the devices are suspended in the surrounding fluid and, as a result, are mechanically isolated. A free-floating network of interconnects in thin, serpentine shapes and multilayer, neutral mechanical plane layouts joins the devices into circuit architectures that provide system-level function. FIG. 72A presents an exploded view schematic illustration of an integrated device capable of wireless acquisition, filtering, amplification and RF transmission of electrophysiological (EP) data, for precision measurement of electrocardiograms (ECGs), electromyograms (EMGs), electrooculograms (EOGs) and electroencephalograms (EEGs).

Figure 73:
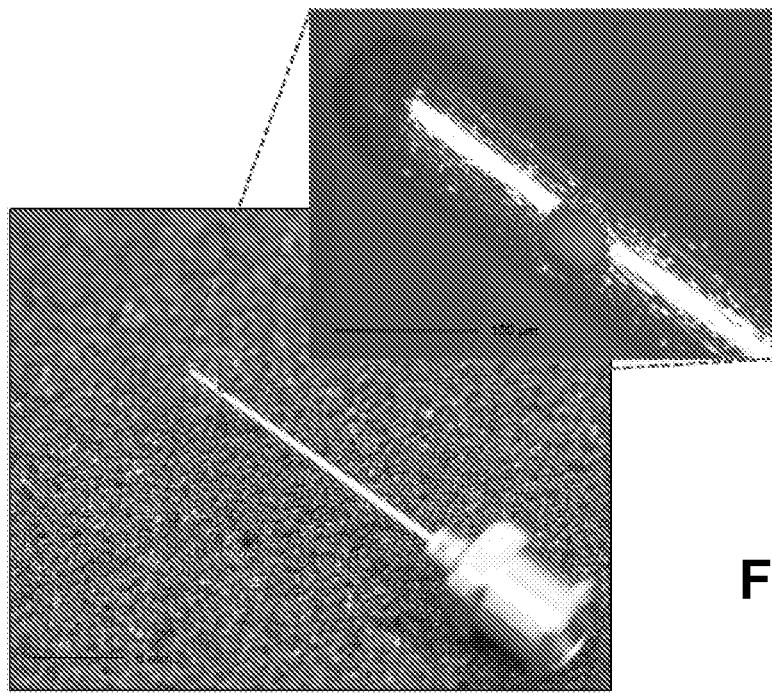
FIG. 73. Optical image of the non-coring needle, highlighting the inject pore on the side wall of the needle. This construction avoids removal of subject material during the injection process.
Figure 74:
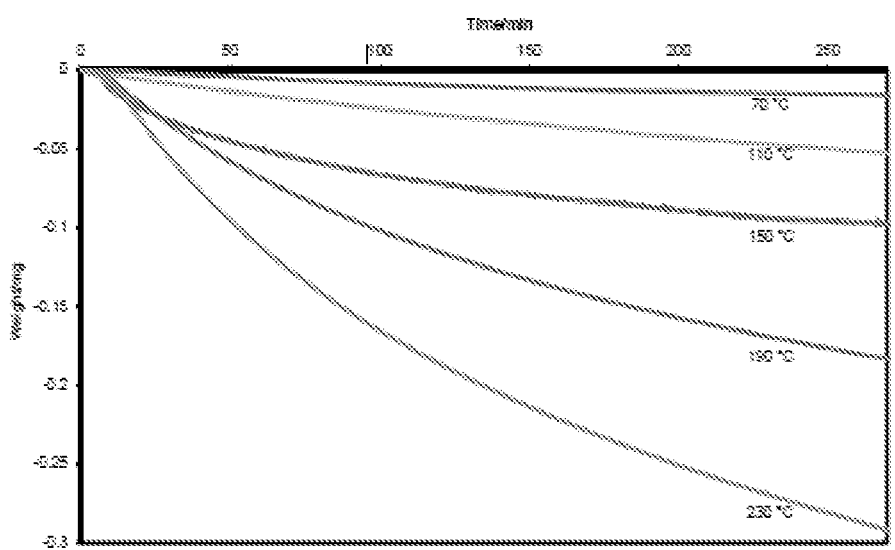
FIG. 74. Thermogravimetric analysis of PDMS base fluid at elevated temperatures for prolonged time.

Bonding the superstrate and substrate at their edges defines a microfluidic structure that is filled, in a second step, with a dielectric fluid using an injection needle (FIG. 72B). The elastomer self-seals after removal of the needle (FIG. 73); additional elastomer can be added to enhance the robustness of this seal. Selection criteria for the fluid include (1) wettability toward the electronic components and the substrate/superstrate, to facilitate the filling process, (2) large volume resistivity ($>1\times10^{14}$ Ohm*cm) to eliminate electrical crosstalk, (3) high dielectric strength (>10 kV/mm) to avoid electrical breakdown, (4) moderate viscosity (~5 Pa·s) to enhance impact resistance, (5) good thermal stability (weight loss<0.1% at 100° C. for 4 hours (FIG. 74) to allow reliable long-term operation, (7) low loss RF properties and small dielectric constant (<3), to minimize influence on RF operation, (8) low reactivity and chemical stability, to avoid corrosion or other forms of chemical degradation, (9) hydrophobic character, to expel moisture from the package and (10) optical transparency to enable rapid inspection of the components. Although many materials can be considered, the devices reported here use a soft, silicone elastomer (ECOFLEX® silicone elastomer, Smooth-On, Inc., Easton, Pa.) for the substrate/superstrate, and a high molecular weight silicone oligomer (Sylgard 184, without curing agent) for the fluid.

The free-floating interconnects can buckle, twist and deform, both in and out of the plane, with little constraint, in response to externally imposed deformations of the entire system. Likewise, the fluidic-based strain isolation strategy allows large-range motions of the substrate/superstrate with minimal coupling to the device components. This physics is apparent from the three dimensional (3D) finite element analysis (FEA) results of FIG. 72C. The ability of the interconnects to move freely increases their range of stretchability, relative to designs that involve bonding to or embedding in solid or porous elastomers (17-23). For the case of an interconnect shown in FIG. 72C, this increase in stretchability corresponds to a factor of ~10 and ~20 when compared to the case of bonding or embedding, respectively (FIG. 75). The maximum principal strain in the interconnect metal (in FIG. 72C) is less than ~0.2% for a biaxial stretch of 50% for the entire system. The support posts lead to differences in strains between the hard components and the elastomer immediately below that can be as large as ~64%, absolute, for the same level (50%) of biaxial stretch.

Figure 72:
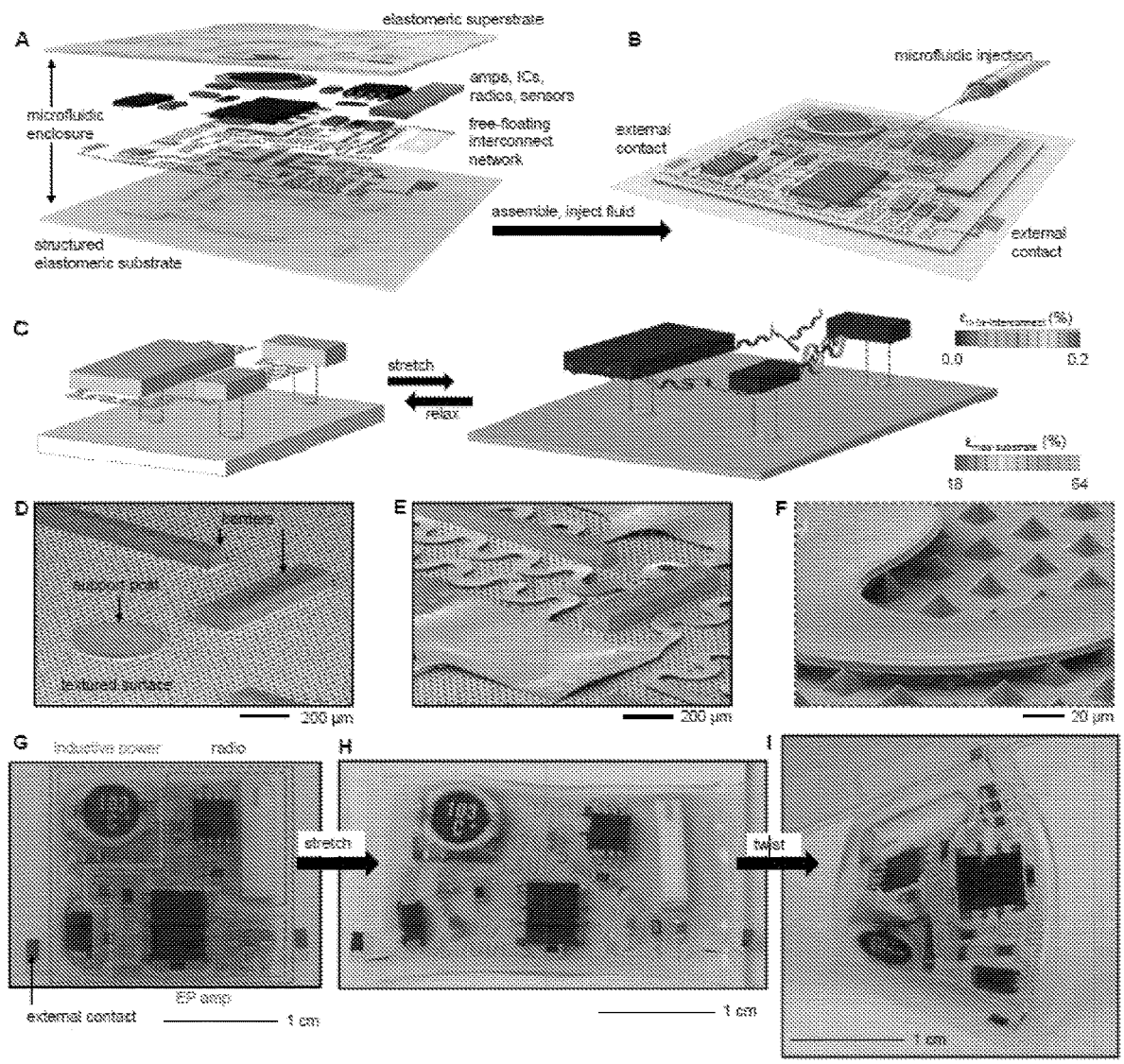
FIG. 72. Schematic illustrations, scanning electron micrographs (SEMs) and pictures of a soft, stretchable electronic system that integrates strain-isolated device components and a free-floating interconnect network in a thin elastomeric microfluidic enclosure. (A) Exploded view schematic illustration of the key components of the system. (B) Illustration of the system after assembly, during initial stages of microfluidic injection using a syringe. (C) 3D FEA results, in exploded view format, that show the physics associated with equal-biaxial stretching of a small region of this system, as indicated by the red dash box in B. The colors indicate the maximum principal strains. The buckling physics of the free-floating serpentine interconnects and the strain isolation mechanics of the suspended chips represent the key features. (D) Angled view SEM of a region of the substrate showing a textured surface formed by sharp pyramidal features of surface relief, along with structures for local bonding of the device components (support post) and for avoiding entanglements in the interconnect network (barriers). (E) Angled view SEM of the same region in (D), after transfer printing the interconnect network (colorized yellow). (F) Angled view SEM of the region of (E) indicated by the red dashed box. (G) Image of a system designed for acquisition, filtering, amplification and radio transmission of EP signals measured from the skin. An integrated module for inductive power provides a wireless source of power. The colored dashed boxes and labels identify the various sub-systems. The grey dashed box around the periphery indicates, approximately, the location of bonding of the superstrate. Image of this system in a stretched (F) and a twisted (G) configuration.
Figure 76:
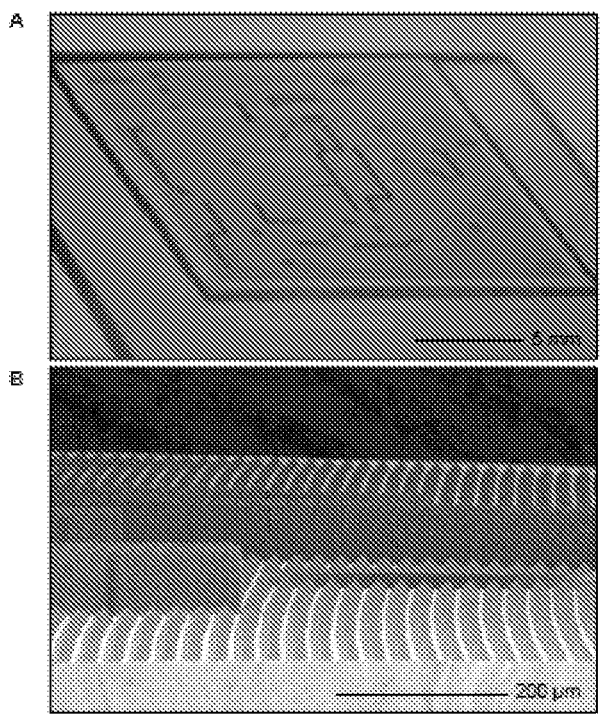
FIG. 76. Characterization of the hierarchical substrate. (A) Optical image of a substrate with multiple levels of embossed relief. (B) SEM image of a small region of the substrate to illustrate its hierarchical structure.
Figure 77:
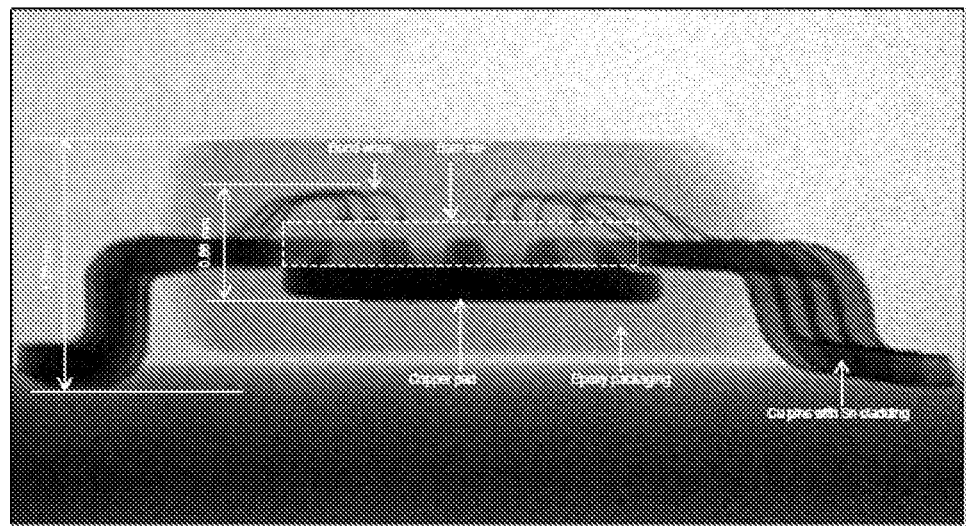
FIG. 77. X-ray side view image of a typical commercial chip with standard package design. The thickness of this chip can be reduced to 0.86 mm by grinding the excessive packaging epoxy away.
Figure 78:
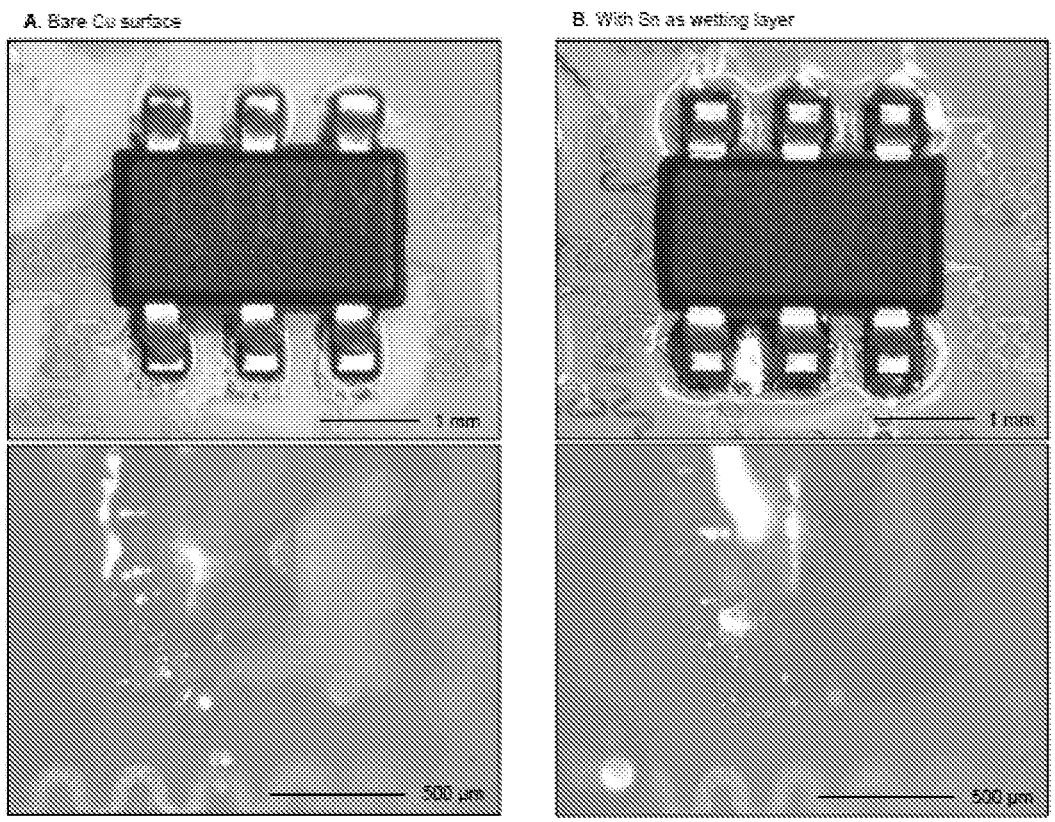
FIG. 78. Optical images of the interface wetting behavior of the interconnects. Chips bonded on the interconnects (A) before and (B) after electroless Sn plating. These images clearly show that after Sn plating, the solder can wet the interconnector surfaces well and thus allow a robust bonding interface.
Figure 79:
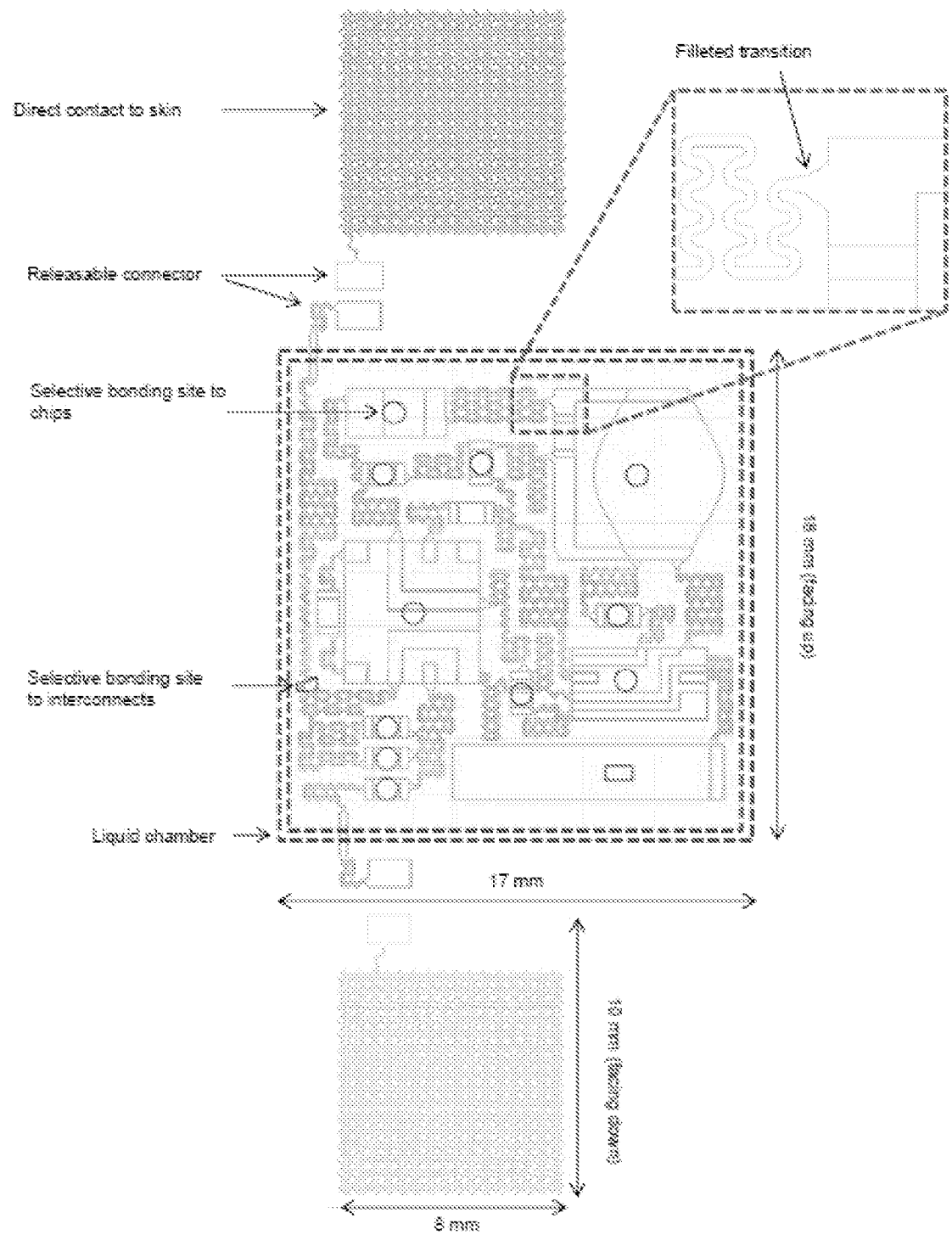
FIG. 79. Layout design of the single ECG system, with labels for different parts of the device. The design of the transition region between the interconnectors and the chip bonding pads is also highlighted in the dashed purple box.
Figure 80:
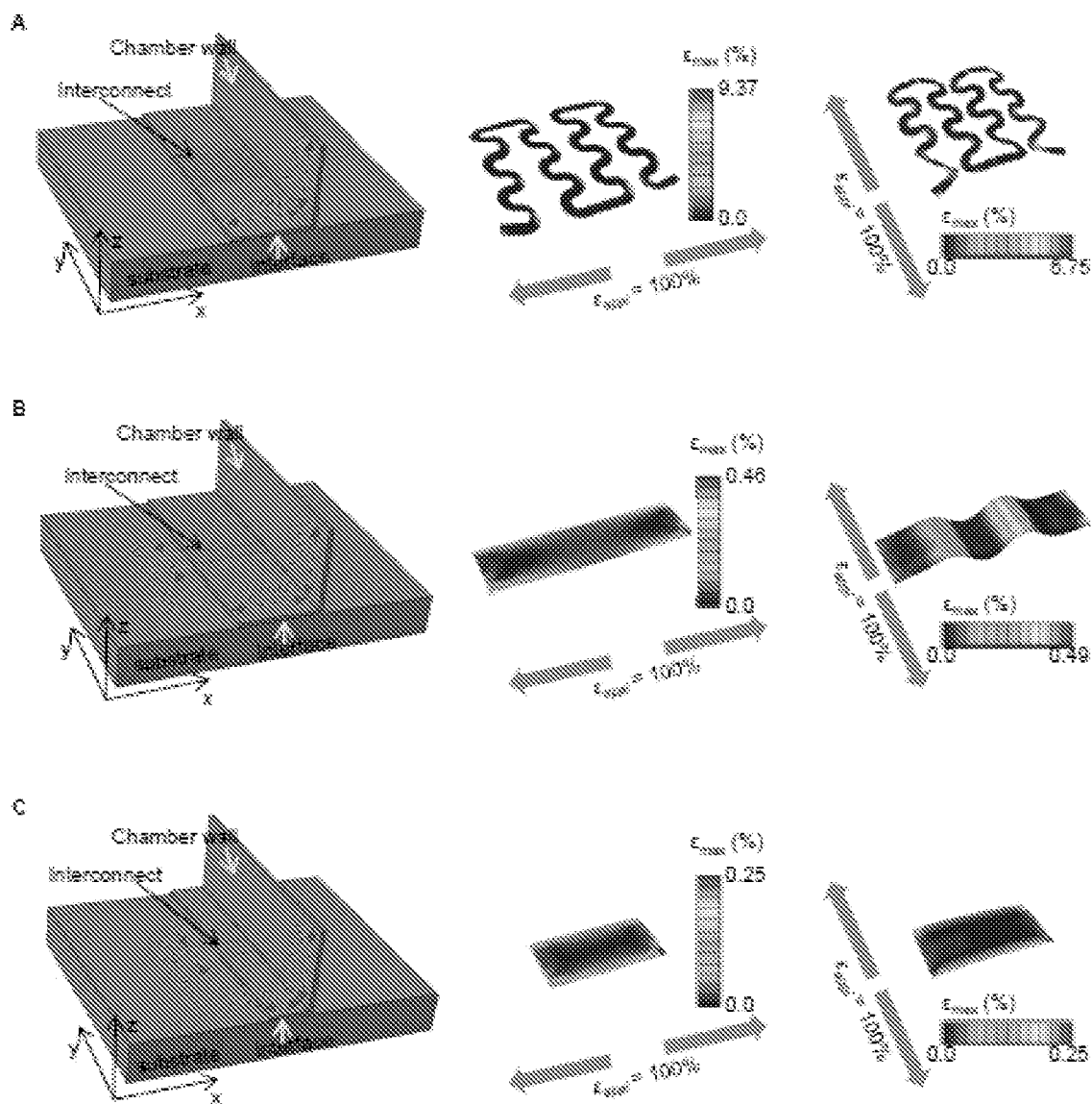
FIG. 80. Comparison of mechanical performance of three different interconnect designs at the point of the periphery of the microfluidic enclosure. (A) Schematic illustration (left panel) of a self-similar serpentine interconnect across the interface, and the distribution of maximum principal strain (middle panel for horizontal stretching along the x direction; right panel for vertical stretching along the y direction) in the metal layer for 100% uniaxial stretching. (B) Schematic illustration (left panel) of a straight interconnect (length 1 mm) across the interface, and the distribution of maximum principal strain (middle panel for horizontal stretching; right panel for vertical stretching) in the metal layer for 100% uniaxial stretching. (C) Schematic illustration (left panel) of a straight interconnect (length 0.5 mm) across the interface, and the distribution of maximum principal strain (middle panel for horizontal stretching; right panel for vertical stretching) in the metal layer for 100% uniaxial stretching. The simulation shows that the optimized straight interconnect at the interface avoids fracture inducing strains even under 100% biaxial stretching, in agreement with the FEA results, where the strain of interconnect remains well below the fracture limit (~5%).
Figure 81:
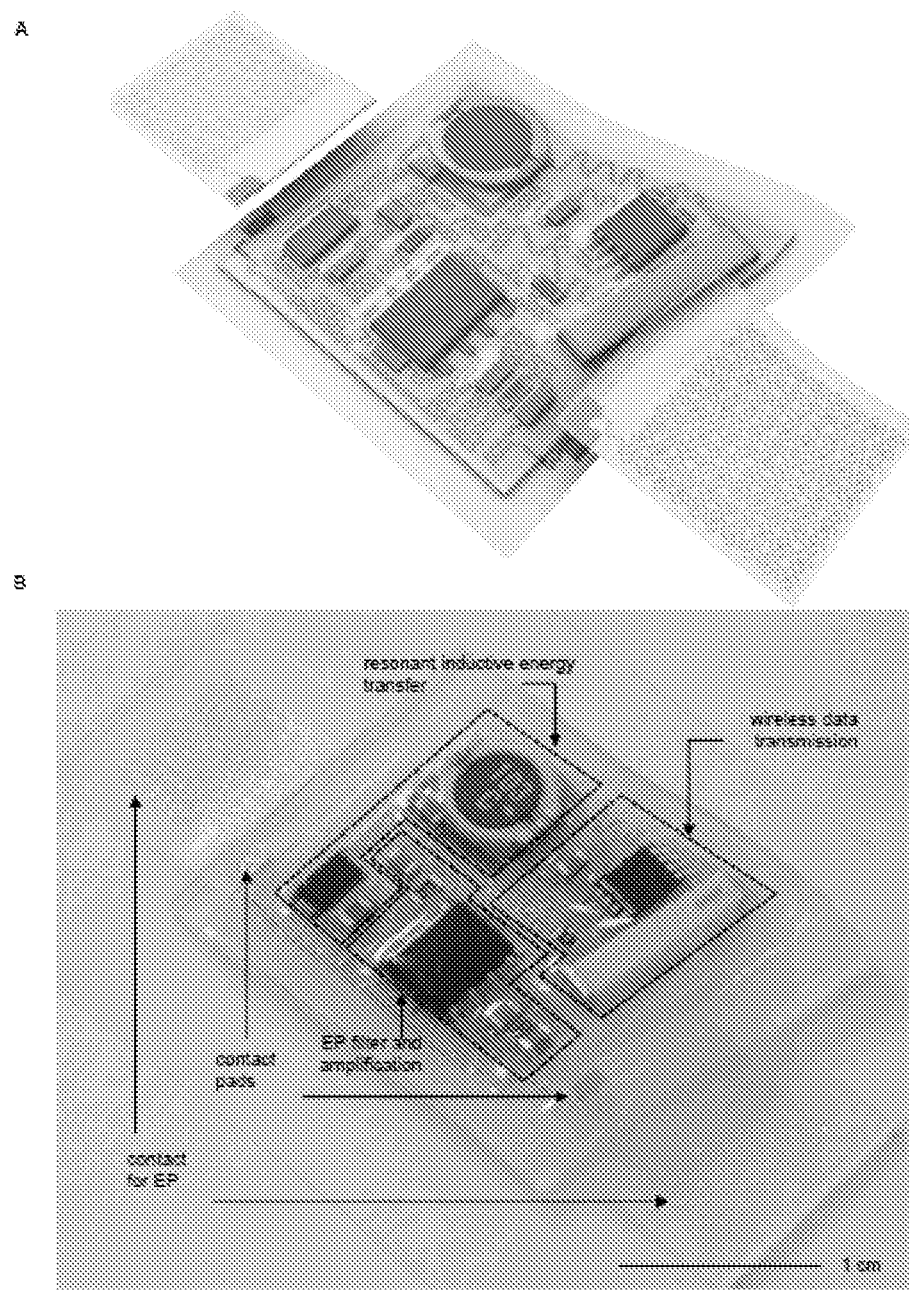
FIG. 81. Illustration of the fully integrated device. (A) Schematic illustration of a device in a slightly deformed configuration, and (B) optical image of an actual device in a similar state of deformation, with labels for different parts and modules in the circuit.
Figure 82:
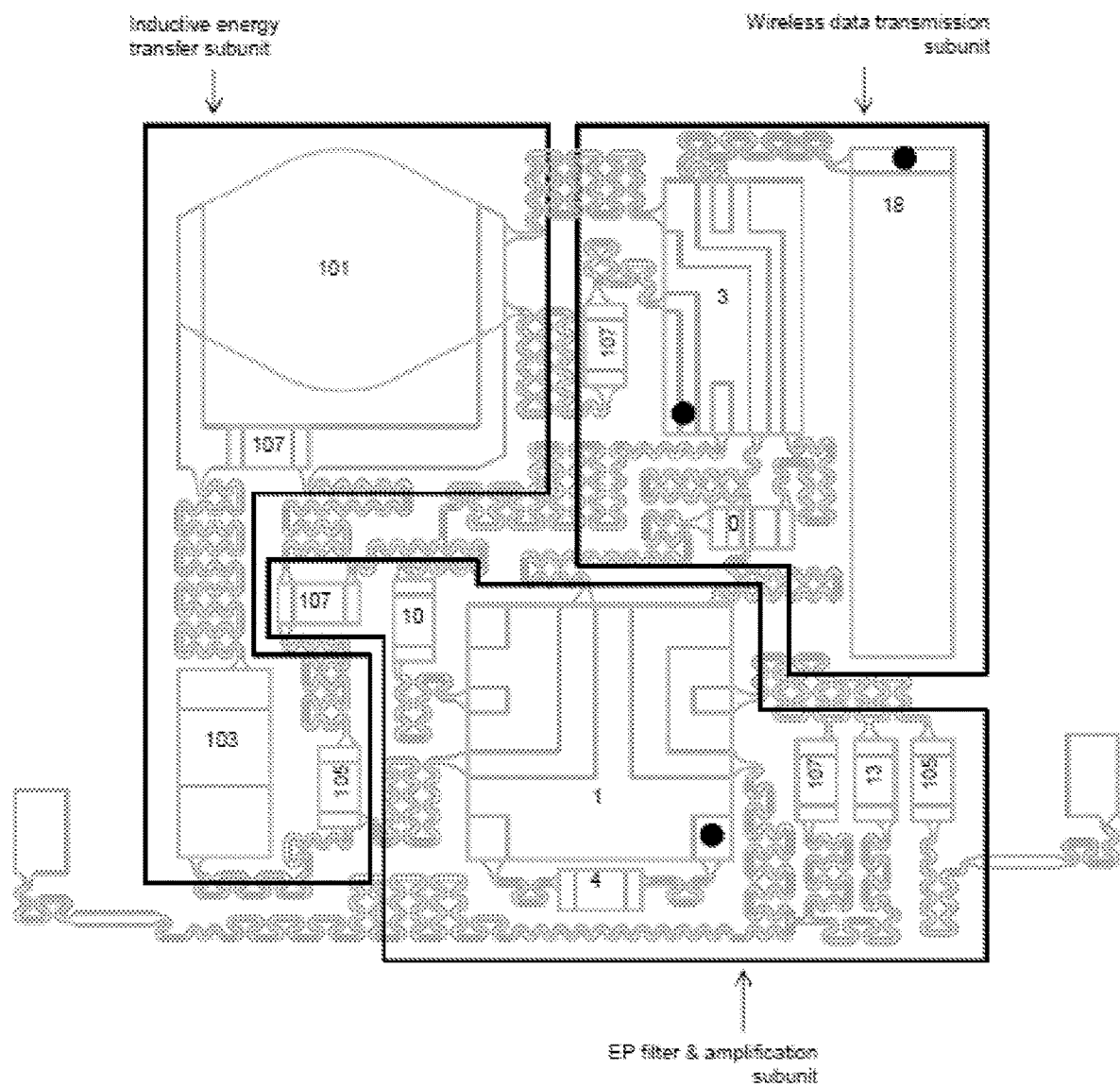
FIG. 82. Schematic layout of the ECG system with the chip positions and chip types (Table 1) labeled. Black dots indicate the number 1 pin of each individual chip.

A dense array of sharp, pyramidal features molded onto the superstrate/substrate prevent non-specific adhesion to the interconnects and the devices, to allow low friction, lubricated relative motions. This relief, as well as that associated with a support post to allow strain isolation of component chips and a physical barrier to prevent entanglement of adjacent interconnects, appear in the cross sectional scanning electron microscope (SEM) image of FIG. 72D and FIG. 76. FIGS. 72, E and F, show the same region after integration of the interconnect network by transfer printing, including a magnified view. Crossovers in the interconnect network can be accommodated either with interlayer dielectrics or chip-scale crossovers. All chips (all <1 mm in thickness, achieved by mechanical grinding (FIG. 77)) bond, electrically and mechanically, to this network via a low temperature solder ($Sn_{42}Bi_{58}$) applied by screen printing to metallized (electrolessly deposited Sn (FIG. 78)) regions of integrated pads with matching contacts. Adhesion to the substrate (thickness~0.4 mm) occurs selectively only at the locations of the supporting posts (~1 mm diameter). These pads incorporate tapered shapes at joints with the interconnects, to minimize stress concentrations (FIG. 79). Wide, straight traces (FIG. 80) pass through opposite edges of the microfluidic enclosure (microfluidic thickness~1 mm; superstrate thickness~0.1 mm), and terminate at external contact pads that provide locations for lamination of epidermal electrodes (FIG. 81), as interfaces to the skin. The completed system (FIG. 72G) includes modules for (1) wireless power supply by resonant inductive energy transfer, (2) low-noise amplification and filtering of EP signals and (3) frequency-modulated (FM) RF transmission of measured data. Table 1 and FIG. 82 summarize the components and the design rationale. The images in FIGS. 72, H and I, show the ability of the device to stretch (shown here to ~30% uniaxial strain) and twist (shown here to ~75 degrees), respectively. Detailed information on the materials and fabrication procedures are provided in the Supplementary Information section.

TABLE 1

Chip information of the ECG system.

| Device number | Type | Value | Manufacturer part number |
|---|---|---|---|
| 0 | Jumper | 0 Ω | CRCWO503COC0ZOEAHP |
| 1 | Operational amplifier | N/A | AD527BRZ-R7 |
| 3 | Voltage controlled oscilator | N/A | MAXZTECEUA+ |
| 4 | Resistor | 349 Ω | PAT0503E249CE3T1 |
| 10 | Resistor | 10 KΩ | ERJ-3EKF1CO2V |
| 13 | Resistor | 200 KΩ | RG1908N-204-W-T1 |
| 15 | Multilayer antenna | N/A | 7488310245 |
| 101 | Inductor | 10 μH | 277103C |
| 105 | Capacitor | 10 μF | C15OBXER1A105K |
| 107 | Capacitor | 0.1 μF | C0503C104-J4RACTU |

Figure 83:
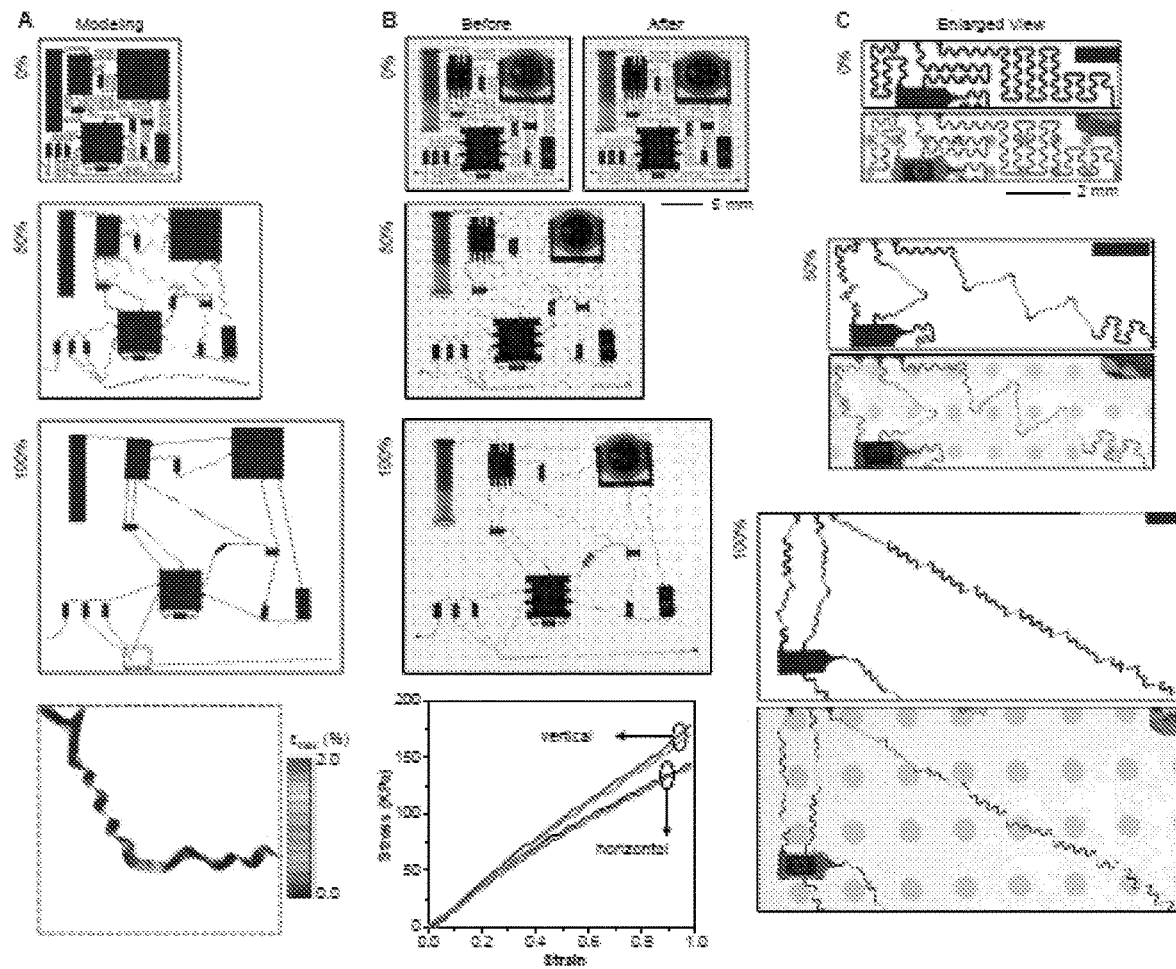
FIG. 83. Computational and experimental studies of the physics of buckling in free-floating interconnect networks and of strain isolation in suspended chips, for a device capable of acquisition, filtering, amplification and radio transmission of EP signals measured from the skin, with inductive power supply. (A) System-level 3D FEA results for various magnitudes of equal-biaxial tensile strain. The color shows the maximum principle strains across each part of the system. The bottom panel illustrates a small region of the interconnect network. (B) Optical images of the device at equal-biaxial strains that correspond to those evaluated by 3D FEA. An additional image shows the system after release of the strain, to illustrate reversibility in the responses. The bottom panel provides a graph of the stress/strain responses measured by uniaxial testing for the case of a system with (black: in horizontal; blue: in vertical) and without (red: in horizontal; pink: in vertical) the chips and interconnect network. The results indicate nearly complete decoupling of the mechanics of the chips/interconnects from the substrate. (C) Images and 3D FEA results for a local region.
Figure 84:
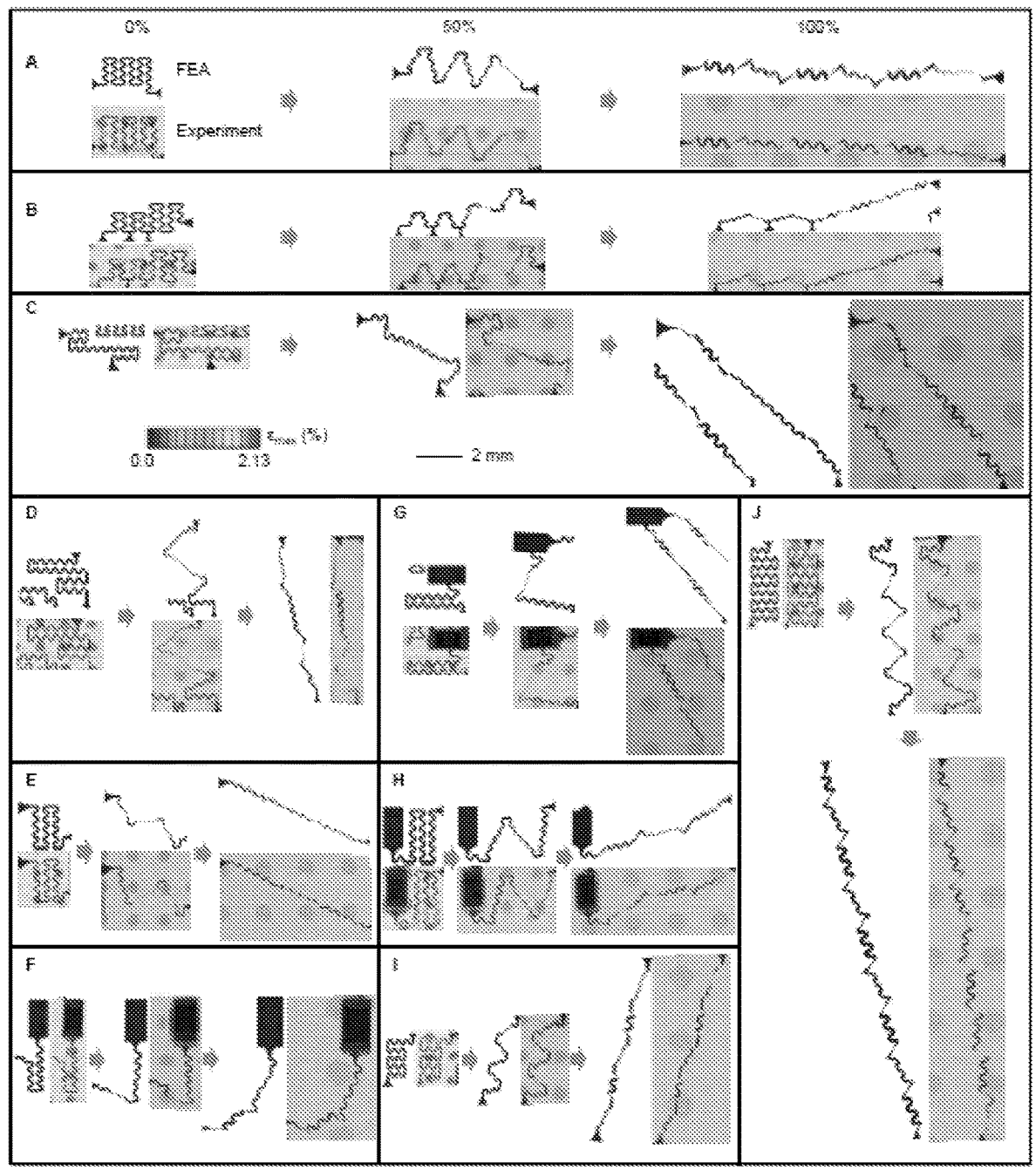
FIG. 84. Experimental and computational studies of localized deformations in various self-similar serpentine interconnects within the ECG system, under biaxial stretching. (A) to (J) show optical images and corresponding FEA results for ten self-similar serpentine interconnects as the entire circuit is biaxially stretched from 0% to 50% and 100%. The color in the FEA results represents the maximum principal strains of the metal layer.

Mechanical behaviors at the system level are critically important to overall design. FIG. 83 summarizes systematic computational and experimental studies of the device in FIG. 72, without the superstrate membrane to facilitate imaging. 3D finite element analysis (FEA) results (FIG. 83A) and experimental pictures (FIG. 83B) reveal the configurations of the chips and interconnects at various levels of equal-biaxial stretch. The good agreement observed here validates the models and establishes their utility as design tools for optimizing the layouts of the chips and the shapes of the interconnects. In particular, for any choice of system geometry, the computed results allow rapid identification of locations of (1) high principle strains, (2) entanglements in the interconnects and (3) collisions between the chips. An iterative process that involves coupled considerations in circuit and mechanics design, with 3D-FEA modeling as a guide, allows optimization of all relevant parameters (including positions of molded barriers) for a desired device size, degree of stretchability and effective modulus. The system shown here results from several iterations in the layouts of the chips and the geometries of the self-similar serpentine shapes that form the aperiodic interconnection network. Attention to the hierarchical mechanics of in- and out-of-plane bending and twisting in the serpentines and their dependence on geometry is paramount, subject to constraints set by requirements on their electrical properties. FIG. 83C and FIG. 84 show the subtle effects that can occur. An example of one of the many modifications introduced with guidance from theory is a small bonding site added at the midpoint of the long interconnect at the base edge, to ensure reversibility in its mechanics and to avoid entanglements (FIG. 79). The final design offers an effective modulus, at the system level, that is only slightly larger (by 3-5%) than the intrinsic value associated with the bare elastomeric substrate (Table 2). In fact, uniaxial testing of the substrate with and without the chips, interconnect network and surrounding fluid reveal almost identical stress/strain responses, as shown in the bottom frame of FIG. 83B. This outcome is notable, considering the large differences between the moduli of the electronic materials (~100 GPa) and the elastomers (~180 kPa).

TABLE 2

Computational model for the effective Young's modulus. The moduli for the experimental data are determined by using linear fits of the stress-strain curve in the range of [0%, 50%].

| FEA | Experiment | | | |
|---|---|---|---|---|
| | Modulus (x) | | Modulus (y) | |
| With chip | 172.05 kPa | 193.80 kPa | 171.25 kPa | 176.88 kPa |
| Without chip | 166.41 kPa | 185.15 kPa | 155.41 kPa | 165.41 kPa |
| Increased percentage | 3.4% | 4.7% | 2.9% | 5.3% |
| Average | 3.2% | | 5.5% | |

Figure 85:
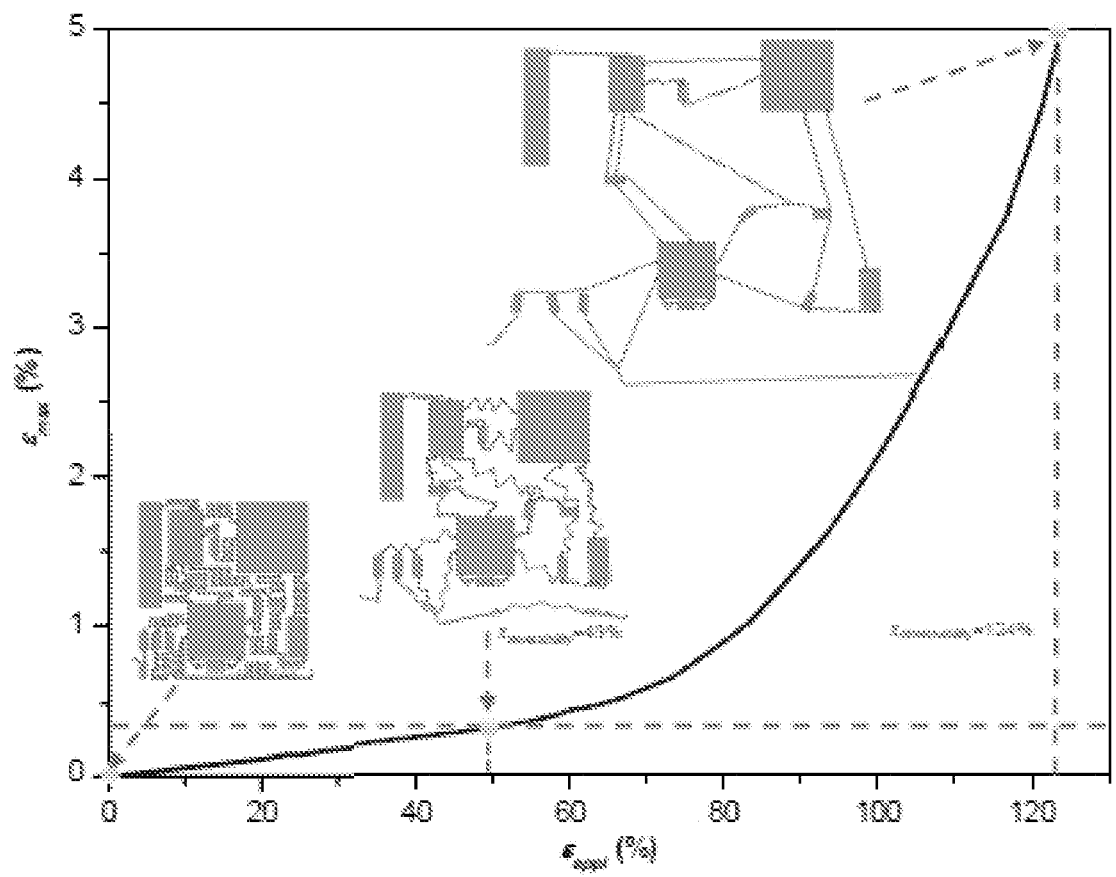
FIG. 85. Dependence of the strain in the interconnect metal (at the material level) on the applied strain (at the system level). The maximum value ($\varepsilon_{max}$) of the principal strain in the metal layer of the interconnect network as a function of the biaxial applied strain ($\varepsilon_{appl}$), together with illustrations of the evolution of the deformations.
Figure 86:
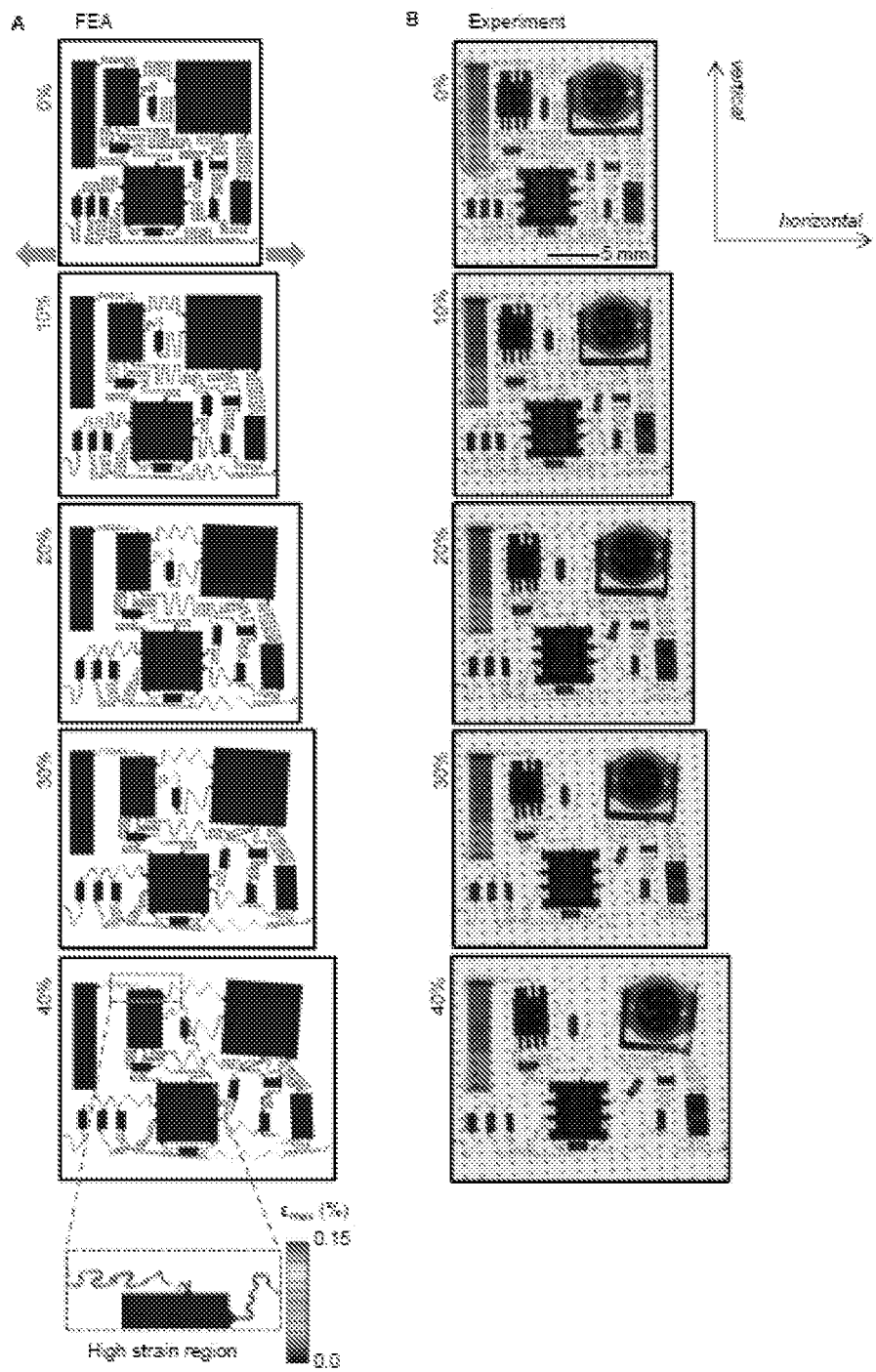
FIG. 86. Experimental and computational studies of buckling deformations across the entire circuits under uniaxial stretching along the horizontal direction. 3D-FEA results (A) and corresponding optical images (B) of the entire circuit when uniaxially stretched from 0% to 10%, 20%, 30% and 40%. The color in the FEA results represents maximum principal strains in the metal layer.
Figure 87:
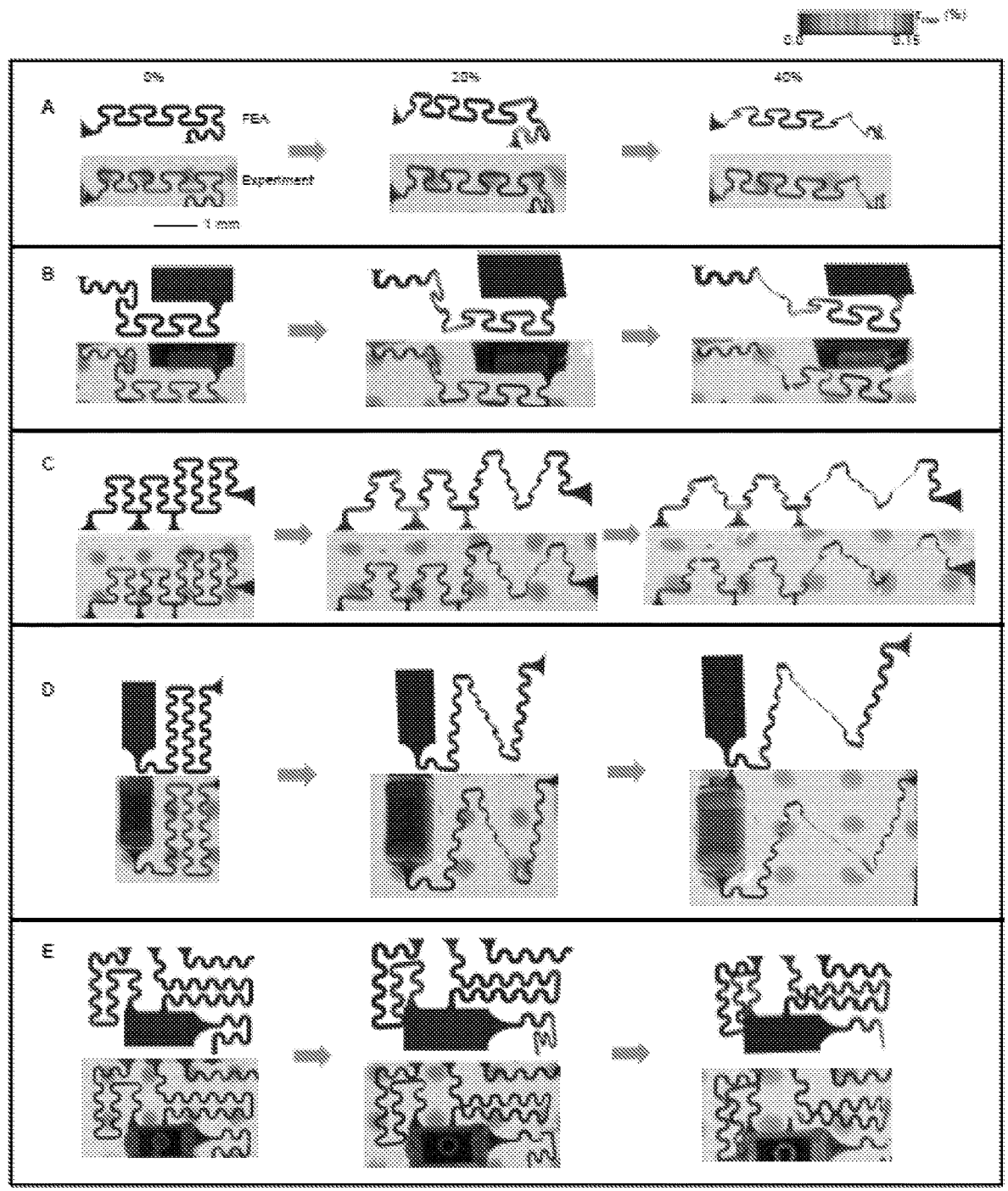
FIG. 87. Experimental and computational studies of localized deformations of self-similar serpentine interconnects with the circuits under uniaxial stretching along the horizontal direction. (A) to (E) show optical images and corresponding 3D-FEA results of five self-similar serpentine interconnects as the entire circuit is uniaxially stretched from 0% to 20% and 40%. The color in the FEA results represents the maximum principal strains of the metal layer.
Figure 88:
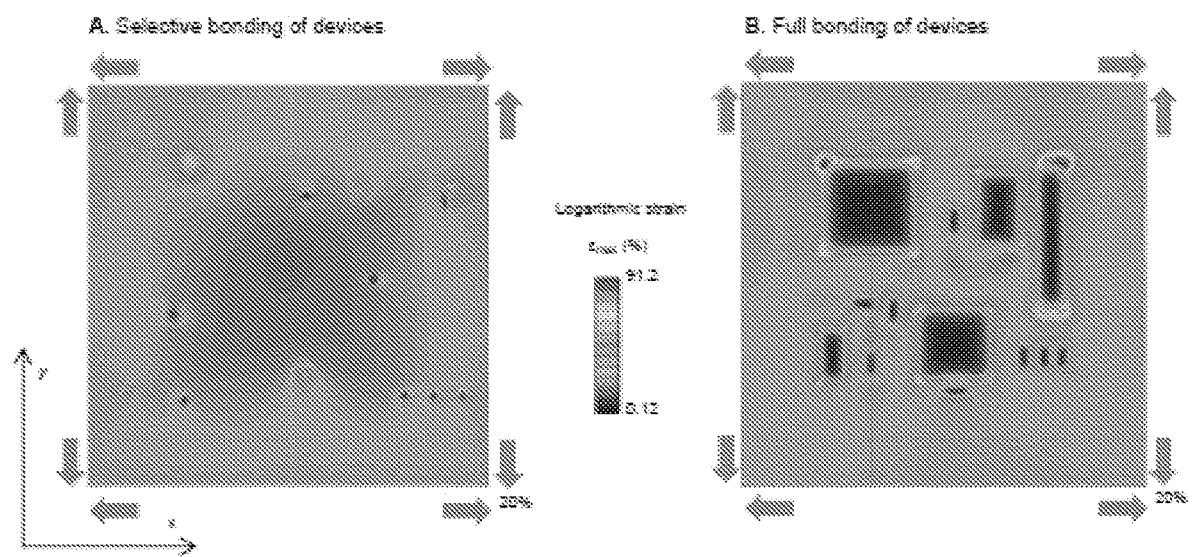
FIG. 88. Finite element simulations to illustrate the effects of rigid devices on the strain distribution across the soft substrate under biaxial stretching of $\varepsilon_{appl}$=20%. (A) The distribution of logarithmic strain in the substrate when the rigid devices are selectively bonded to the substrate (via small circular and rectangular pedestals). (B) The distribution of logarithmic strain in the substrate when the full regions of each device are bonded to the substrate.
Figure 89:
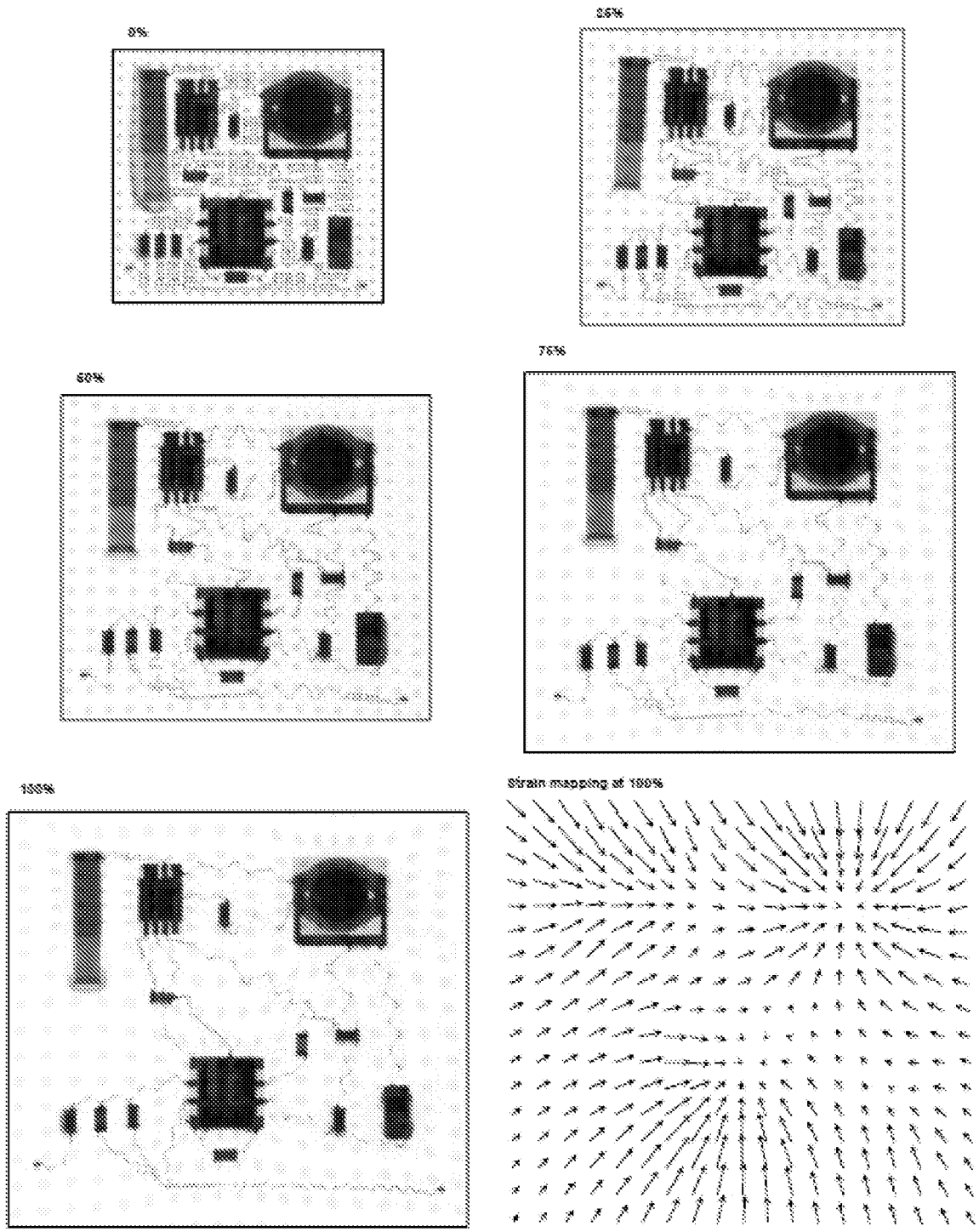
FIG. 89. Strain mapping at different levels of strain when all of the chips are fully bonded on the substrate. The strain localization can be clearly visualized under these chips.

In addition to a low modulus, the system offers a large range of stretchability. For example, 100% equal-biaxial strain induces maximum principle strains of only ~2% in the active materials (Cu of the interconnects), as highlighted by a segment of the interconnect network shown in the bottom frame of FIG. 83A. The maximum biaxial stretchability predicted by 3D-FEA is ~125%, limited by localized fracture of the Cu (failure strain ~5%) in the interconnect network, consistent with experimental observation (~100%). Reversible, elastic behaviors can be obtained (yield strain of Cu ~0.3%) for biaxial strains of ~49% (FIG. 85), even with the high (~46%) cumulative areal coverage of chips in this device layout. Practical limits in uniaxial stretching are ~40%, defined by collisions of adjacent chips caused by orthogonal contractions that arise from the Poisson effect (FIGS. 86 and 87). In all cases, deformations in the substrate show no evidence of constraints in motion associated with the chips or the interconnect network, as illustrated by the uniform separations between fiducial dots (Cr, 100 nm thick) deposited in a square array on the back surface of the substrate, visible in the images of FIG. 83. For quantitative analysis, see FIG. 88. This low modulus (~180 kPa, as soft as the skin (1)), isotropic stretchable response follows uniquely from the microfluidic strain-isolation approaches introduced here. Such properties are critically important for soft, reliable, non-invasive integration of state-of-the-art, commercially available electronic components onto the skin. Analogous systems that do not exploit strain isolation of the chips show highly non-uniform deformations in the substrate (FIG. 89); those that replace the microfluidics with solid elastomer show an elastic stretchability of only 6%, and local effective moduli that vary from values comparable to those of the chips themselves (>100 GPa) to the elastomer constrained by the bonded interconnects (~250 kPa). Such characteristics are poorly matched to requirements for mounting on the skin.

Figure 90:
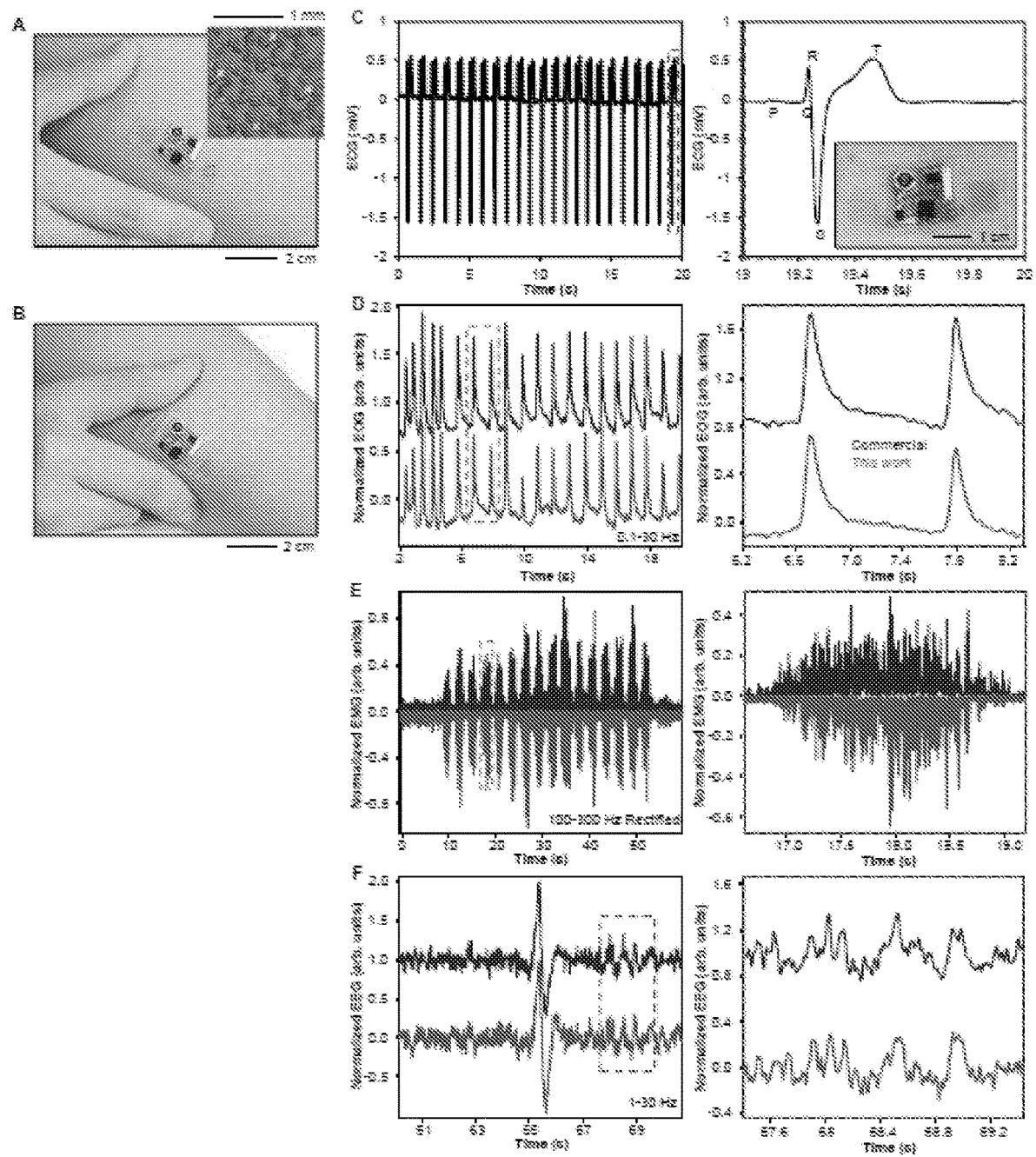
FIG. 90. Images and operational data from a device capable of measuring EP signals, filtering and amplifying them and then wirelessly transmitting the results, using inductive power supply. Optical images of the device on the forearm, with a pair of epidermal electrodes in self-similar serpentine mesh layouts (inset optical micrograph) for an undeformed state (A) and compressed and twisted state (B). (C) ECG acquired using a device mounted on the sternum. The graph on the right provides a detailed view that shows the expected QRS complex. (D) EOG acquired from the side of the left eye (green) and simultaneous measurement using a wired commercial device with commercial electrodes (blue) placed next to those of the wireless system. The right plot shows data during the time of two eye blinks. (E) EMG acquired using a device mounted over the left carpi radialis (green) and simultaneous measurement using a wired commercial device with commercial electrodes (blue) placed next to those of the wireless system. The data from the wireless device were inverted along the vertical axis, to facilitate comparison. The right plot shows data corresponding to a single muscle contraction. (F) EEG acquired from the left forehead during mental math and rest (green), and simultaneous measurement using a wired commercial device with Au plated Ag electrodes and conductive gel (blue), mounted next to the wireless system. The large deflection represents the eyes closing as the subject shifts from mental math to resting, as shown in detail in the right plot. Data are plotted in arbitrary units, normalized and offset in the vertical direction to facilitate comparisons.
Figure 91:
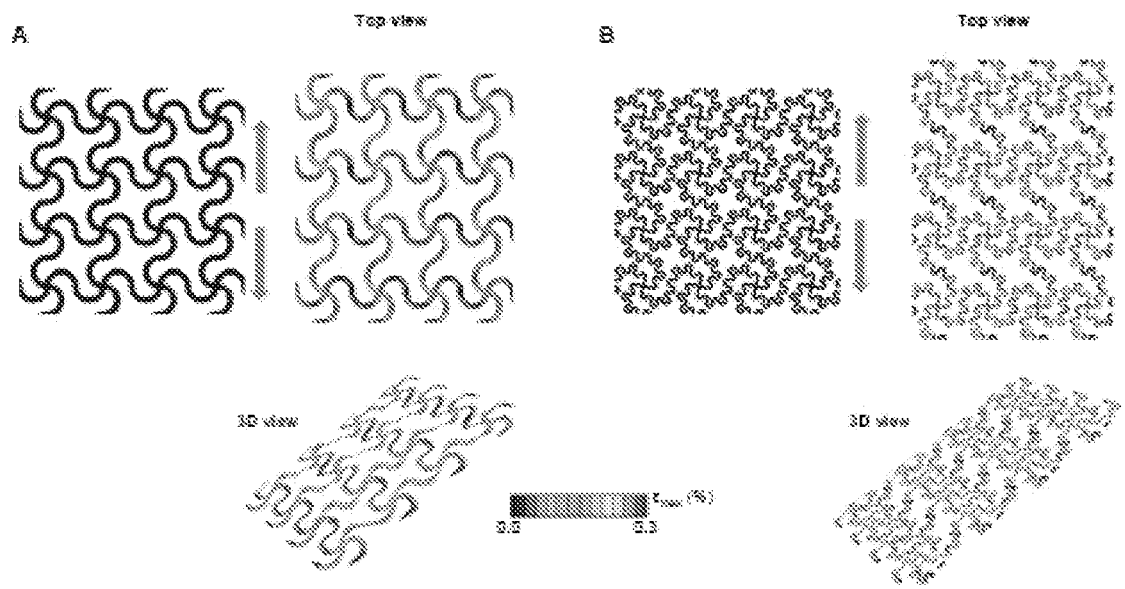
FIG. 91. 3D-FEA of epidermal electrodes with self-similar serpentine mesh designs. (A) A traditional serpentine mesh design with a filling ratio of ~31%, and the strain distribution when the applied strain reaches the elastic stretchability (12.5%). (B) The self-similar serpentine mesh design with a filling ratio of ~31%, and the strain distribution when the applied strain reaches the elastic stretchability (25.0%). Both the top view and angled views of the deformed configurations are shown in the figure, indicating smaller wrinkling wavelength for the self-similar serpentine mesh design on the right.
Figure 92:
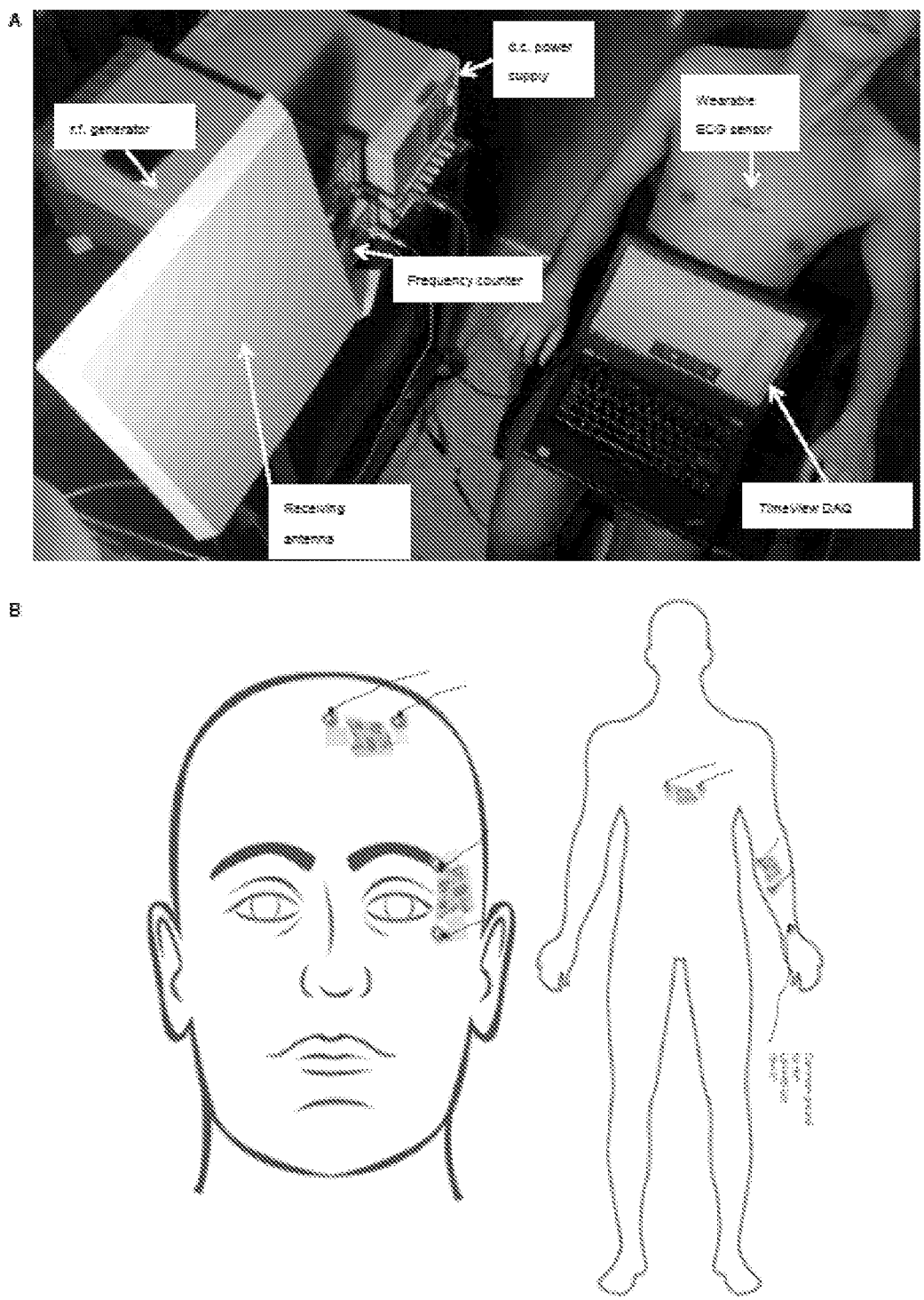
FIG. 92. Illustration of the experimental setup and measurement position on the human body. (A) Experimental setup to measure the ECG in a room designed to eliminate background electrical noise. (B) Different lamination positions on the human body for measuring the electrophysiological signals.
Figure 93:
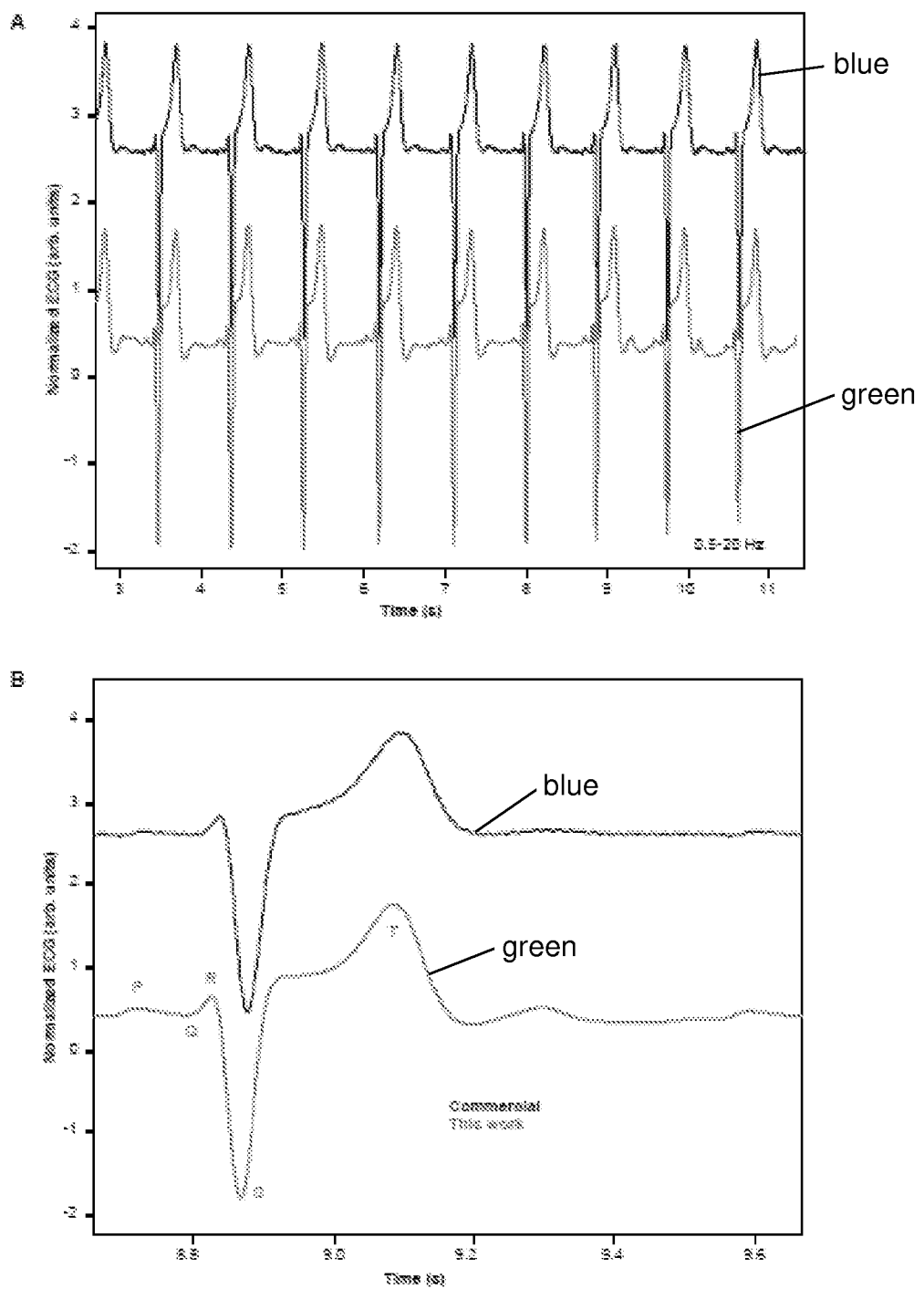
FIG. 93. Comparison of the ECG signals from this work and commercial systems. (A) ECG data acquired using a device mounted on the sternum (green) and simultaneous measurement using a wired commercial device with commercial electrodes (blue) placed next to those of the wireless system. (B) The expanded graph provides a detailed view that shows the expected QRS complex. The data are plotted in arbitrary units, normalized and offset in the vertical direction to facilitate comparisons.

FIGS. 90, A and B, shows a completed device (~1.7×1.8 cm$^2$), including a pair of epidermal electrodes (each ~0.8×1 cm$^2$, in filamentary, self-similar serpentine mesh designs; FIG. 91), laminated onto the skin of the forearm, in undeformed and deformed states, respectively. Here, low interface stresses associated with the low effective modulus of the device enable robust adhesion to the skin through van der Waals forces alone, facilitated by an ultralow modulus thin elastomer coating on the bottom surface of the substrate. Alternating voltage (10 $V_{p-p}$ at 150 kHz) applied to a primary coil in proximity (within mm's) to the device activates it by creating direct current output from the inductive power module, which consists of an LC oscillator, a Schottky diode rectifier and an integration capacitor (10 μF). The total power consumption is ~35 mW, which lies with a range accessible to near field communication (NFC) capabilities present in many modern cellular phones. An instrumentation amplifier provides a gain of up to 800. Capacitors remove high frequency and DC components of EP signals collected by the epidermal working and reference electrodes, with a floating ground. A voltage controlled RF oscillator transforms the amplified data into an FM RF signal at ~2.4 GHz that passes out of the device through a compact three dimensional antenna. A separate patch antenna, RF amplifier and frequency counter can receive the transmitted RF reliably at a distance of up to 1 m (FIG. 92), when operated in a room designed to eliminate background electrical noise, Laminating the device across the sternum with the electrodes in bi-lateral fourth intercostal spaces enables collection of ECG. Representative measurements, with clearly identifiable QRS complexes, appear in FIG. 90C. The fidelity of this system is similar to that of conventional commercial hardware (Brain Vision V-Amp) with wired connections. Results for ECG measured from standard adhesive electrodes placed next to the epidermal electrodes (with a nearby ground electrode on a distal position on the left forearm) are shown in FIG. 93.

Figure 94:
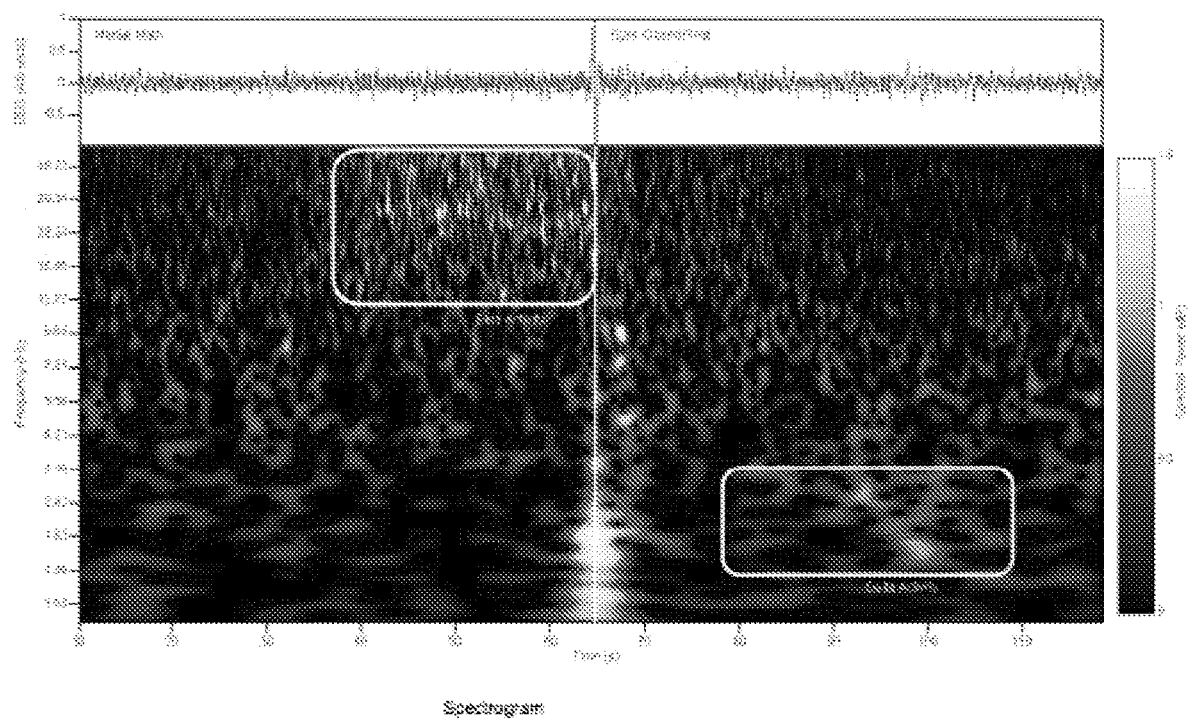
FIG. 94. A time-frequency spectrogram of the EEG computed with wavelet decomposition. EEG data from FIG. 90F, in normalized arbitrary units were decomposed using a 20 cycle wavelet transform. During mental math, an increase in high-frequency activity between 12-40 Hz (Beta band) is observed that dissipates with rest. During rest, the data show a clear peak in the lower frequency delta band that is larger than that during math.

FIG. 90D presents corresponding EOG recorded at positions superior and inferior to the left eye (and slightly lateral from the left outer canthus) as the subject blinks once per second. Similar levels of agreement occur in EMG and EEG, where the commercial system used a pair of Au plated Ag electrodes held against the head with adhesive stickers and conductive electrode gel, and a nearby ground electrode. EMG measured from the proximal left forearm over the flexor carpi radialis muscle during hand clenches appears in FIG. 90E, and FIG. 90F shows EEG measured on the forehead, with commercial electrodes placed inferior to the hairline at position Fpz referenced to a lateral electrode at location AF7. The epidermal electrodes were directly inferior, parallel, and the same distance apart. Here, the subject engaged in mental math (counting backwards by 7 from 200) for one minute, closed his eyes and remained at rest for another minute. EOG activity from the eyes closing separates the two tasks. The data reveal strong high-frequency activity during mental math, and strong low-frequency activity during rest (FIG. 94), as expected.

Figure 95:
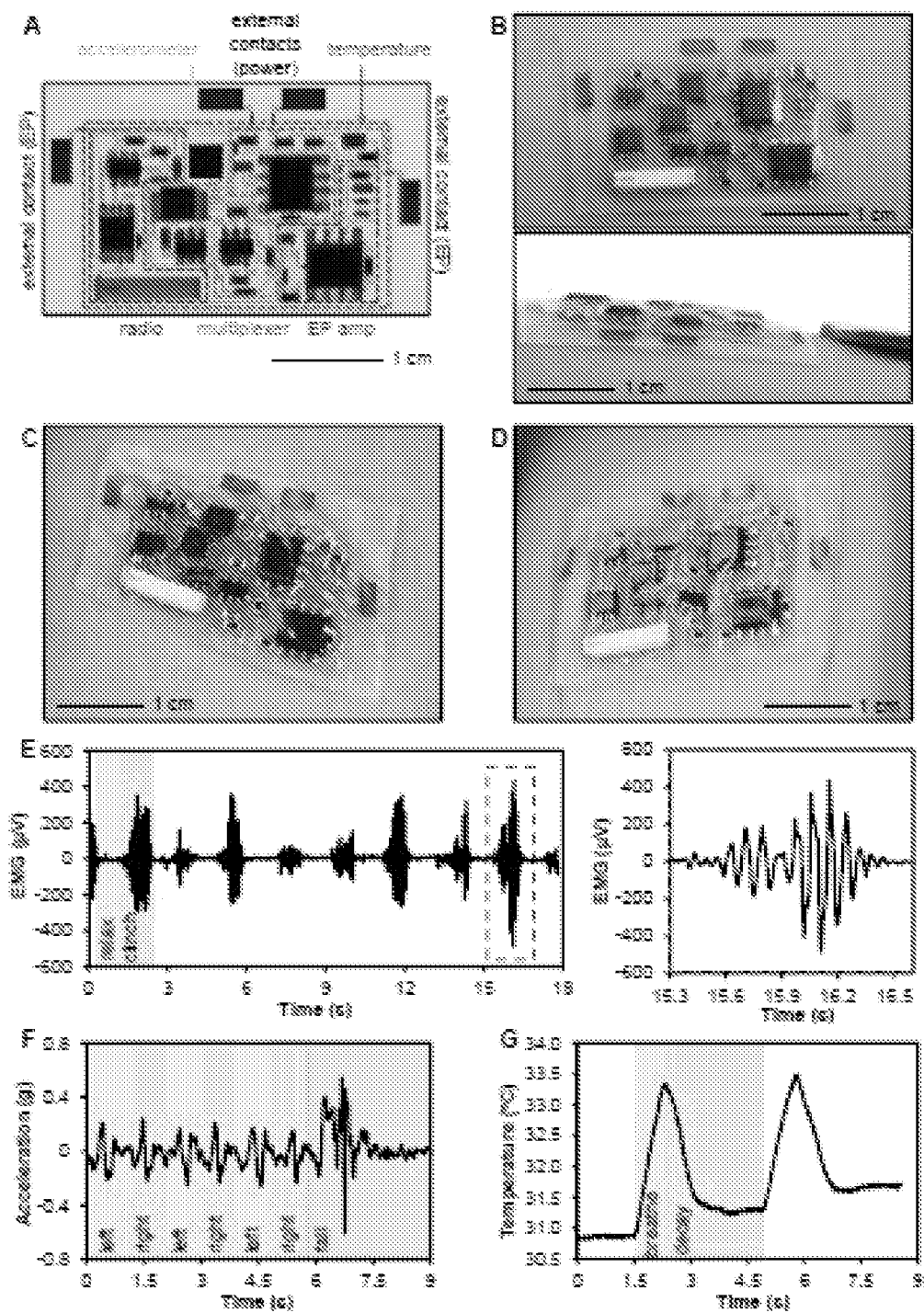
FIG. 95. Images and operational data from a device capable of measuring EP signals, acceleration and temperature, filtering and amplifying them and transmitting the results in a time-multiplexed wireless mode. Exposed contact pads at the periphery provide points for integrating a separate power supply and a pair of epidermal electrodes for the electrical interface to the skin. (A) Optical image of a representative device. The colored dashed boxes and labels identify the various sub-systems. The grey dashed box around the periphery indicates, approximately, the location of bonding of the superstrate. (B) Image of the device on the skin, with a perspective view to show its overall thickness (~1 mm) with reference to a coin (US quarter). Image of the device in a twisted and stretched state (C) and a compressed state (D) induced by pinching the skin. (E) EMG acquired from above the left carpi radialis during periodic clinching and relaxing of the fist. The right panel provides an enlarged view of the EMG for a single clinching motion. (F) Acceleration profiles corresponding to walking, with the device mounted on the forearm. The data near the end of this timeframe corresponds to an intentional fall. (G) Temperature response to breathing warm air onto the device. The data shown in this figure used a small coin cell battery as a source of power.
Figure 96:
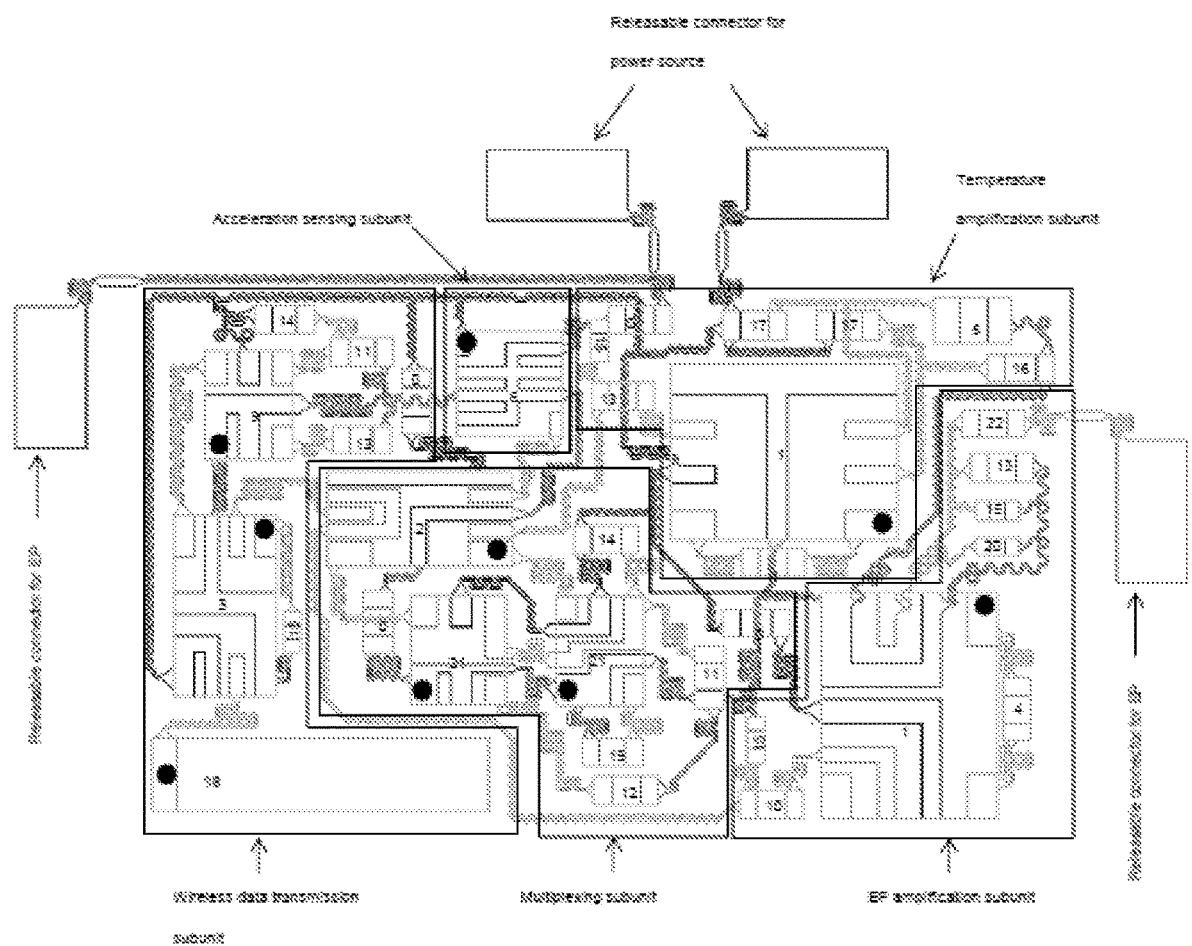
FIG. 96. The multifunctional sensor system with different parts and chip information (Table 3) labeled. Black dots indicate the number 1 pin of each individual chip.
Figure 97:
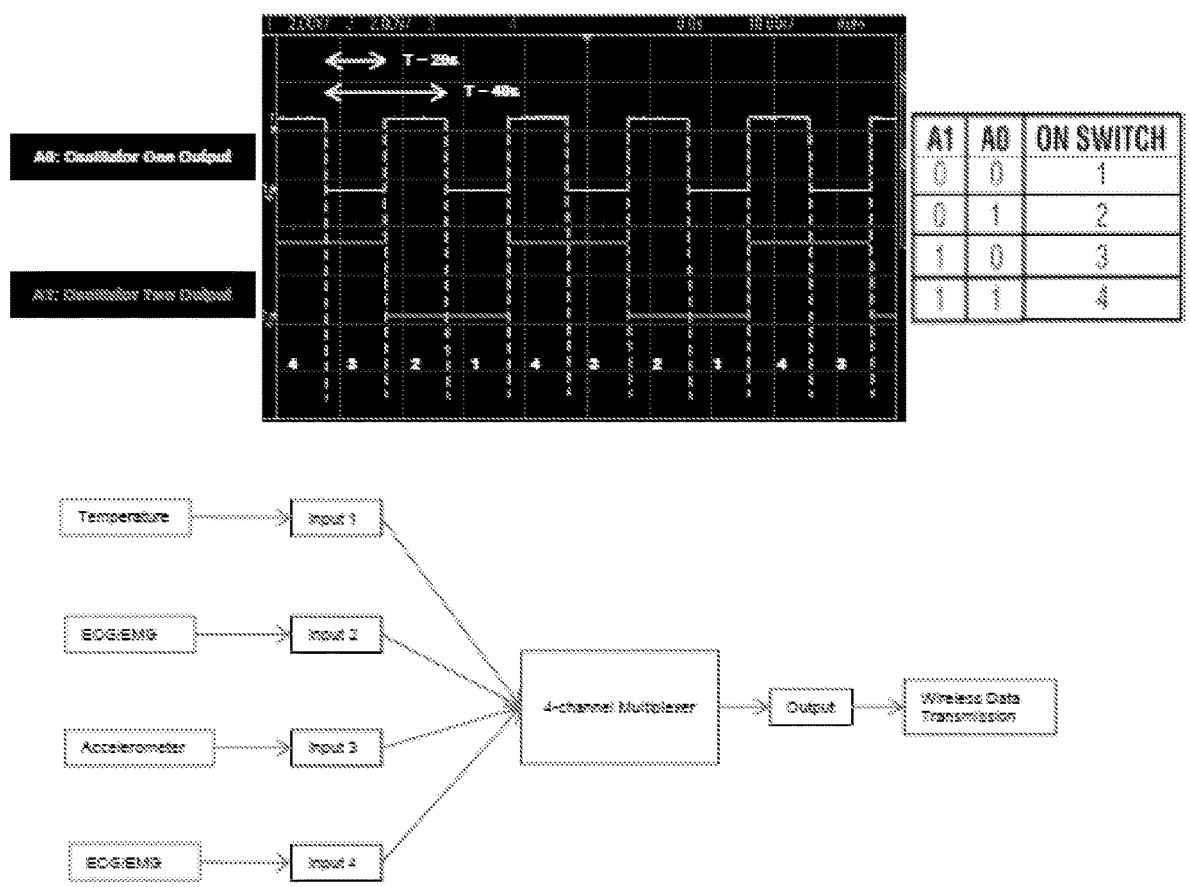
FIG. 97. Working principle of the multiplexer.
Figure 98:
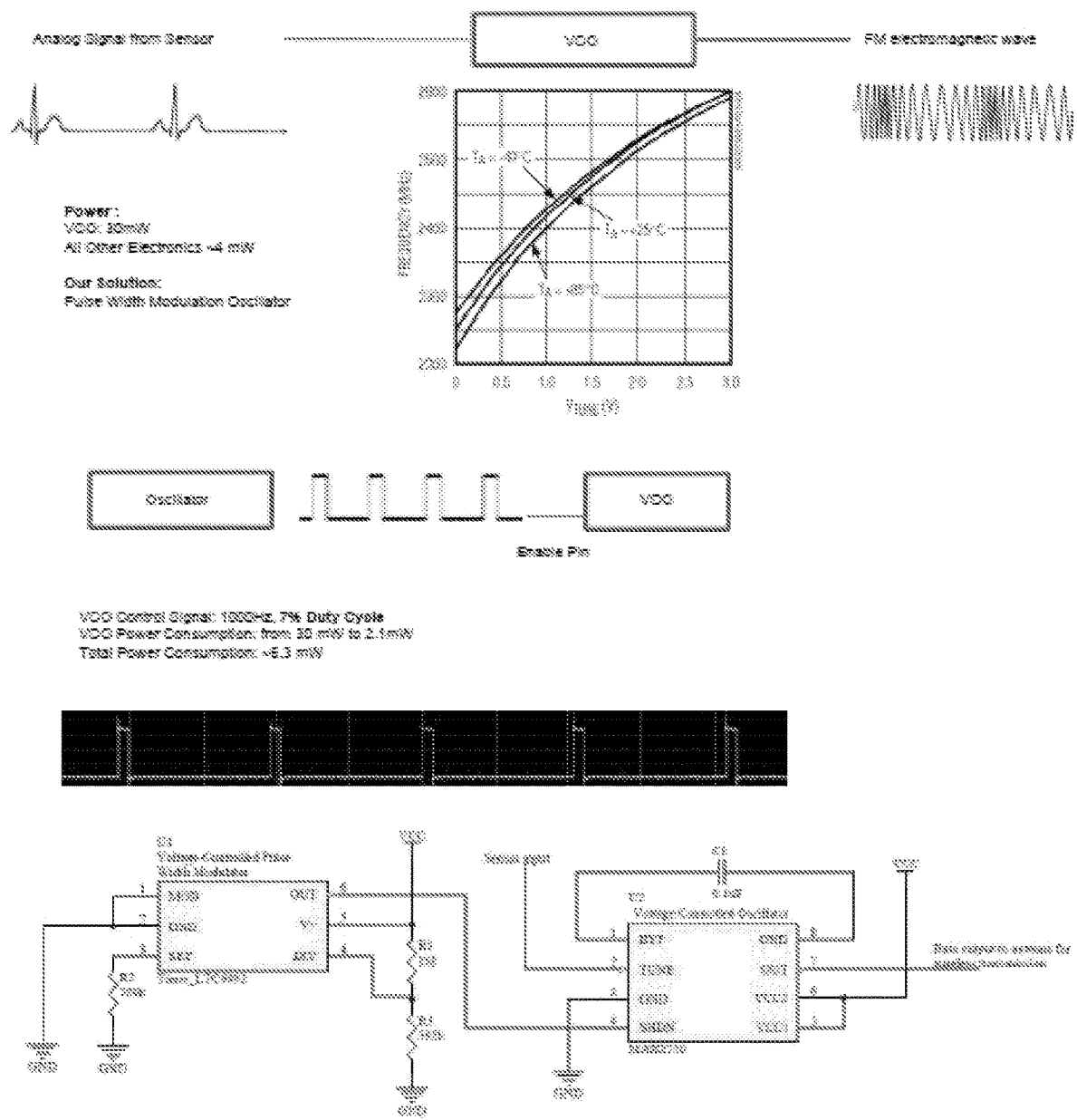
FIG. 98. Design strategy for reducing the power consumption of the voltage controlled oscillator (VCO), by adding a pulse modulator. When the VCO duty cycle is reduced to 7%, the power consumption of the entire system is about 6 mW.
Figure 99:
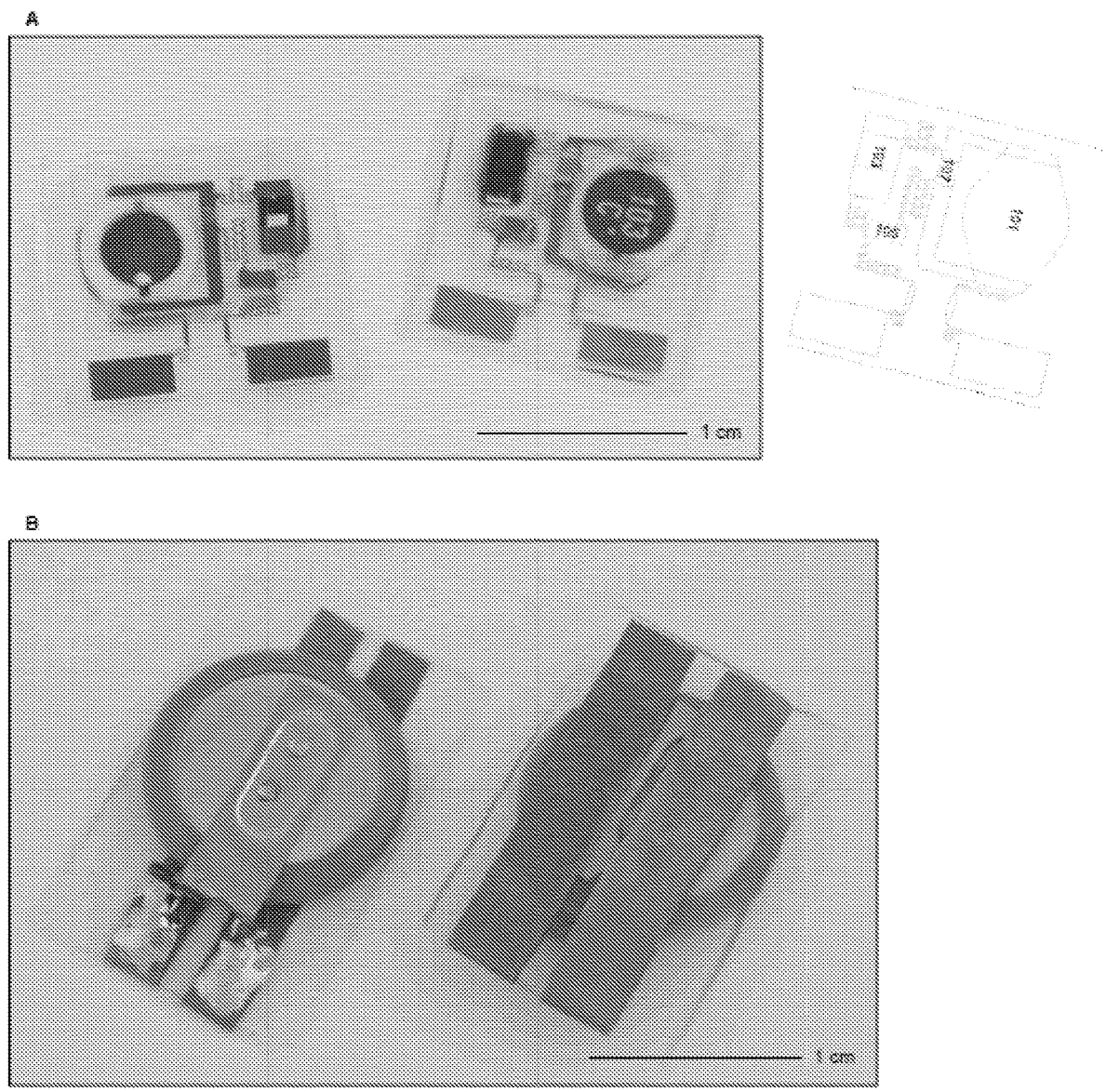
FIG. 99. Releasable power supplies for the multifunctional system. (A) Optical image of the NFC module from the front and back sides, and associated chip information (Table 1). (B) Optical image of the front and back sides of a small coin cell battery module. Both of these modules can laminate onto the power supply contact pads of the multifunctional device, to provide power for operation.
Figure 100:
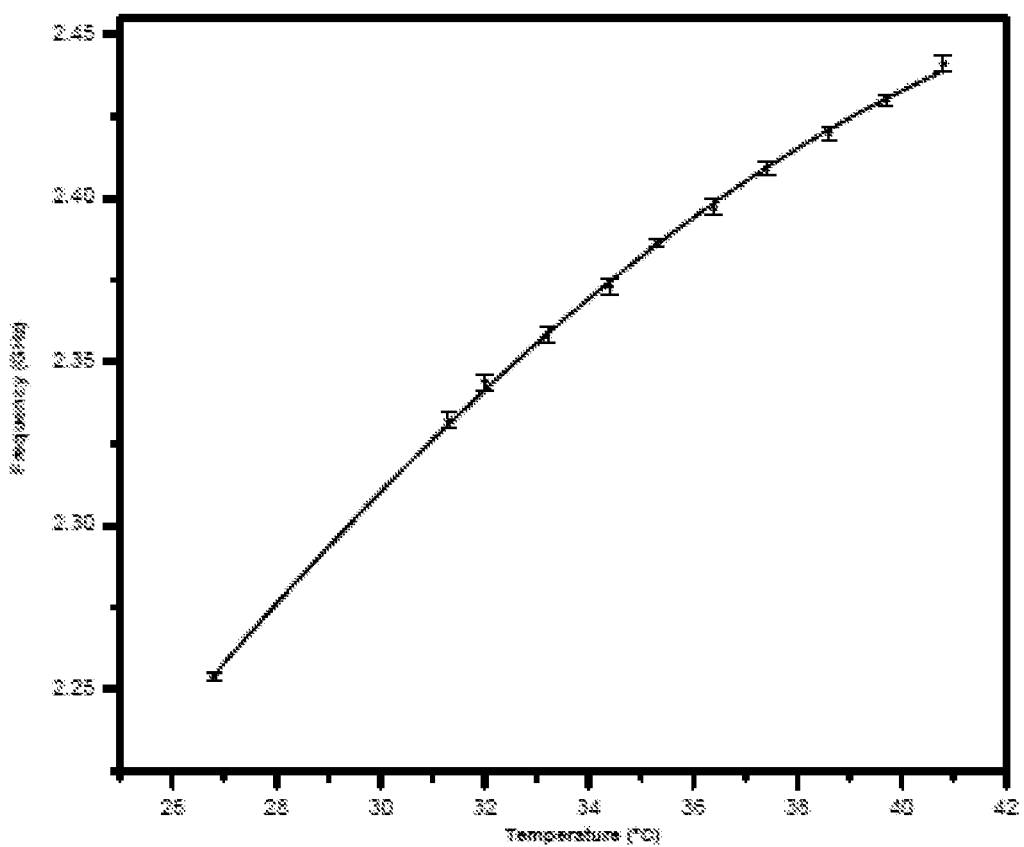
FIG. 100. Calibration curve for the temperature-frequency relationship in the multifunctional system.
Figure 101:
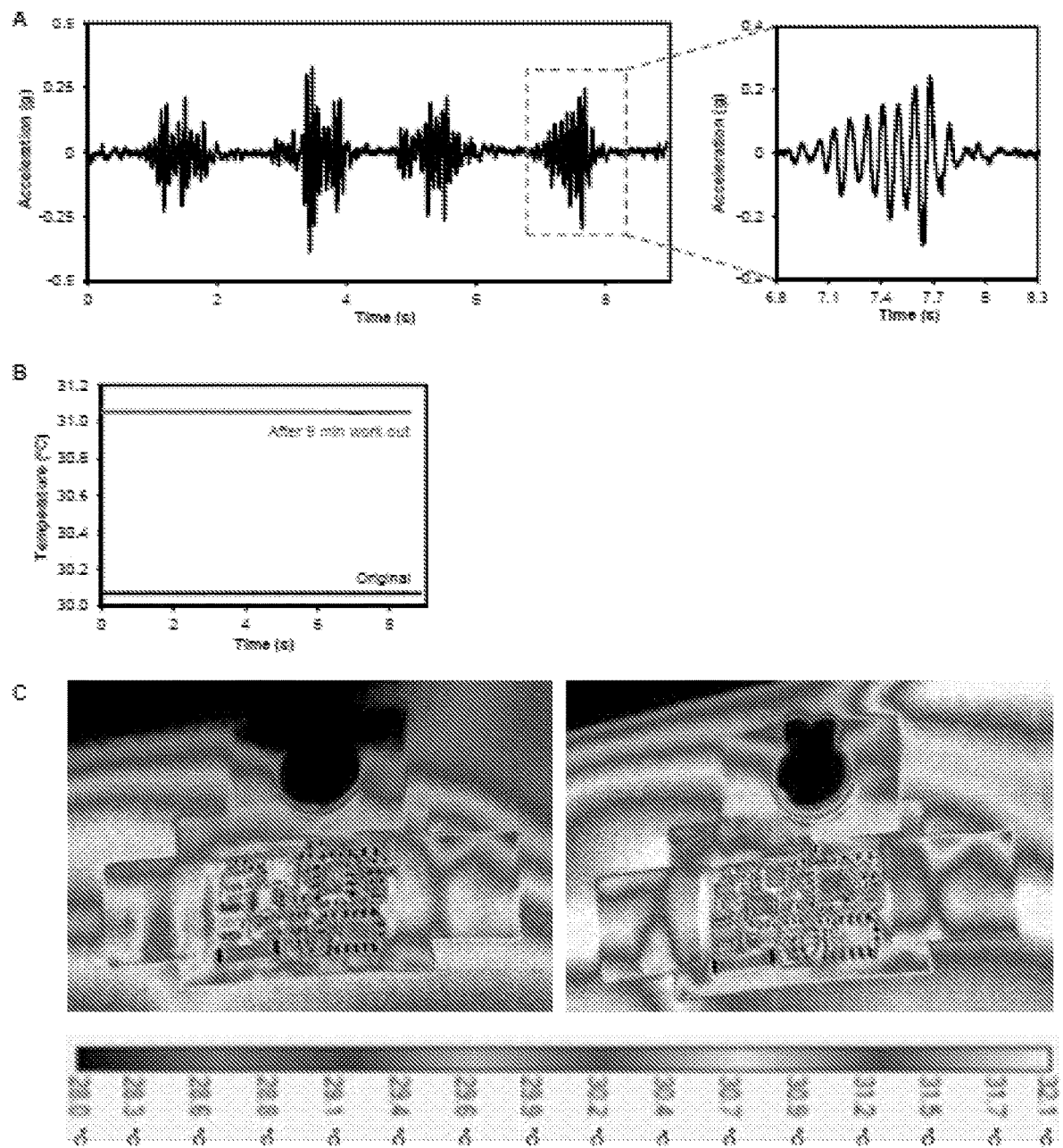
FIG. 101. Signal readouts from the multifunctional device when mounted on the forearm during periodic clinching and relaxing of the fist. (A) Acceleration signal and (B) temperature signal before and after 9 min of clinching and relaxing. (C) The temperature measured before (left panel) and after (right panel) this exercise, as confirmed by the commercial IR camera.

The core concepts in materials, mechanics and device integration have general applicability. A multi-modal measurement system, capable not only of EP sensing, but also of recording motion with a tri-axial accelerometer and temperature with a thermistor in a Wheatstone bridge configuration (FIG. 95A and FIG. 96) provides an example. This set of measurement capabilities is important for many applications, ranging from training in sports, to tracking in sleep apnea studies, to monitoring in neonatal care, to assessing cognitive state and awareness. A multiplexer switches sequentially among the outputs of the three sensor channels, to allow data transmission with a single voltage controlled oscillator. In particular, data from the EP, acceleration and temperature channels transmit for 18, 9 and 9 seconds, respectively, as determined by two oscillators that generate two bit control logic by tuning the ratio of their oscillation frequencies to 1:2 (FIG. 97). The device includes 31 component chips, and an interconnect network with 4 crossovers, with an overall size of 1.9×2.9 cm². Table 3 and FIG. 96 summarize the components and design rationale. A pulse width modulation oscillator periodically turns on and off the voltage controlled oscillator, for a duty cycle of ~7% at a frequency of 1000 Hz (FIG. 98), to reduce the average power consumption from ~40 mW (continuous operating mode) to ~6.3 mW. This power level lies in a range that can be addressed not only with NFC, but also by small coin-cell batteries or, potentially, far field RF power transfer. A pair of contact pads enables integration of these or other options in power supply (FIG. 95A). Examples of inductive and battery power appear in FIG. 99. A combined circuit and mechanics iterative design process, similar to that described for the single-channel device, enables a high level of stretchability, and low effective modulus. As a consequence, the system (FIG. 95B) can naturally integrate with the skin, and remain adhered by van der Waals forces during twisting, stretching, and pinching (FIGS. 95, C and D). FIG. 95E shows an EMG recorded from the forearm during repeated clenching and releasing of the fist. The output of the accelerometer during walking and falling appears in FIG. 95F. The temperature responses induced by breathing onto the device (FIG. 95G) and by physical exercise are consistent with those observed using a commercial IR camera FIGS. 100 and 101).

TABLE 3

Chip information for the multifunctional system.

| Device number | Type | Value | Manufacturer part number |
|---|---|---|---|
| 0 | Jumper | 0 Ω | CRCW0503C0C0ZOEAHP |
| 1 | Operational amplifier | N/A | AD527BRZ-R7 |
| 2 | ID multilayer | N/A | MAX4734EUB+ |
| 3 | Voltage controlled oscillator | N/A | MAX27EOEUA+ |
| 4 | Resistor | 249 Ω | PAT0503E249CE3T1 |

TABLE 3-continued

Chip information for the multifunctional system.

| Device number | Type | Value | Manufacturer part number |
|---|---|---|---|
| 5 | Temperature sensor | N/A | PTS350501550ORP100 |
| 6 | ID accelerometer | N/A | KXTH9-2093 |
| 9 | ID oscillator | N/A | KTC688213602TFWPBF |
| 10 | Resistor | 10 KΩ | ERJ-3EKF1CO2V |
| 11 | Resistor | 392 KΩ | ERJ-3AEE2153V |
| 12 | Resistor | 315 KΩ | ERA-3AEB2153V |
| 13 | Resistor | 200 KΩ | RG1908N-204-W-T1 |
| 14 | Resistor | 1 MΩ | ERJ-3EkF1004V |
| 15 | Capacitor | 0.1 μF | 0C402CB4KBRALTU |
| 16 | Resistor | 549 Ω | ERA-3AEB5450V |
| 17 | Resistor | 18 KΩ | RG150BN-183-W-T1 |
| 18 | Multilayer antenna | N/A | 7488910245 |
| 19 | Resistor | 430 KΩ | 1-1E79417-0 |
| 20 | Capacitor | 82 μF | VJ04020820JOCAS |
| 21 | ID oscillator | N/A | LTC5991185TFMP5F |
| 22 | Capacitor | 4.7 μF | C12608X5R1A575K0.50 |

The ideas illustrated here provide versatile routes to integrated assemblies of sensors, circuits, radios and devices for power supply into systems that exhibit uniformly soft, elastic mechanical responses. These physical characteristics allow direct lamination onto the skin to yield advanced modes of operation in wearable electronic devices, with capabilities that complement and extend those of other approaches. Other embodiments might, for example, combine epidermal transistors for amplified, multiplexed addressing of signals from distributed arrays of soft sensors, with compact, stretchable collections of chip-scale components for data storage, processing and RF transmission. Such opportunities, taken together with progress in power efficient radios (24-26), wireless energy transfer (27-29) and functional microfluidics (14-16), suggest promising body-integrated electronics.

Supplementary Information
Materials and Methods
Design Rationale for the Circuits.

For the inductive ECG system, Chip 105 (10 μF capacitor) is used to block the DC offset of the incoming ECG signal. Chip 107 (0.1 μF capacitor) and chip 13 (200 kΩ) form a high pass RC filter to remove low frequency noise from the incoming ECG signal. The instrumentation amplifier (AD627b, chip 1) amplifies the ECG signal by 800 times. Chip 107 (0.1 μF capacitor) and chip 10 (10 kΩ) form a low pass RC filter to remove high frequency noise from the amplified ECG signal. A voltage controlled oscillator (MAX2750, chip 3) generates high frequency signals that represent the ECG signal voltage. The output of this chip passes through a compact antenna (chip 18). The inductive power module is based on resonant inductive coupling: a 10 μH inductive coil (27T103C, chip 101) and 0.1 uF capacitor (chip 107) forms a LC loop.

For the multifunctional device, the EP amplification subunit is similar to that of the ECG system. The acceleration sensing module consists of chip 6 (KXTH9) which converts acceleration to an analog voltage output. The temperature sensing module uses a bridge circuit to convert temperature to an analog voltage output. Chip 5 (PTS080501B500RP100) is a RTD sensor. Chips 16 and 17 are paired resistors to form the bridge loop. In the multiplexing module, chip 21 (LTC6991) generates an oscillating signal that controls the multiplexer (MAX4734, chip 2), to switch between EP, temperature and acceleration sensing. The wireless data transmission subunit is similar to that of the ECG system.

Molding Structures of Surface Relief on the Elastomeric Device Substrate.

The process began with a piece of a clean (100) Si wafer, coated with a 100 nm thick $Si_3N_4$ film formed by plasma enhanced chemical vapor deposition (STS PECVD). Photolithography (AZ P4620, 3000 rpm, 30 s, soft bake at 110° C. for 3 min, 300 mJ/cm², 1:2 volume ratio of AZ 400K and DI water for 1 min) and reactive ion etching (RIE, 22.5 sccm CF4, 40 mT, 150 W, 8 min) defined an array of circles (20 μmØ) in the $Si_3N_4$. Wet chemical anisotropic etching of the silicon with KOH (100 ml 33% weight percent water solution, 20 ml isopropanol alcohol, 130° C., 45 min, with strong magnetic stirring) generated an array of pyramidal shaped recessed regions on the surface of the wafer. After removing the remaining $Si_3N_4$, a second photolithography step (AZ P4620) and inductively coupled plasma reactive ion etching process (ICP RIE, Bosch process) defined trenches (30 μm in depth) for the support posts for the chips. A third photolithography step (AZ P4620) and RIE process (STS ICP RIE, Bosch process) defined the trenches (100 μm in depth) for the isolation barriers. A layer of polytetrafluoroethylene (~200 nm) conformally deposited (STS ICP RIE) all exposed surfaces to minimize adhesion. Thin (300 μm) silicone substrates (ECOFLEX® silicone elastomer, Smooth-On, Inc., Easton, Pa.) were prepared by mixing the two components of a commercial kit in a 1:1 weight ratio, spin-casting (300 rpm for 30 s) the resulting material onto the processed Si wafer and then curing into a solid form (2 hours at room temperature).

Fabrication of the Interconnect Network.

The process began with spin casting of polydimethylsiloxane (PDMS, Sylgard 184), mixed at 10:1 ratio of base to curing agent, onto a clean glass slide at 3000 rpm for 30 s. After curing in an oven at 70° C. for 2 hours, the PDMS was exposed to oxygen plasma (20 sccm $O_2$, 300 mT, 200 W, 30 s). A 2.4 μm thick layer of polyimide (PI, from poly (pyromellitic dianhydride-co-4,4'-oxydianiline) amic acid solution was then applied by spin casting (2000 rpm for 60 s), baked on a hotplate at 150° C. for 4 mins and in a vacuum oven at 10 mT and 250° C. for 1 h. The interconnects and metal electrodes consisted of a 400 nm thick layer of Cu deposited by electron beam evaporation onto the PI. Photolithography (AZ P4620) and etching (CE-100 copper etchant, Transene Company) defined patterns in the Cu. Next, spin coating formed a second 2.4 μm thick layer of PI over the entire structure. A 50 nm thick layer of $SiO_2$ was then deposited using electron beam evaporation, to serve as an etching mask for the PI. Next, photolithography (AZ P4620), RIE etching (50 mT, 40 sccm $CF_4$, 100 W, 20 min), and oxygen plasma etching (20 sccm $O_2$, 300 mT, 200 W for 21 mins) patterned the layers of PI in a geometry matched to the metal traces. The residue $SiO_2$ mask was removed using buffered oxide etchant, and the overall circuit electrodes were immersed in electroless Sn plating solution (Transene Company) at 80° C. for ~10 s. The Sn deposited only onto the exposed Cu surfaces, for the purpose of ensuring good wettability of the solder on the bonding pads. Finally, the circuit electrodes were retrieved using water soluble tape (3M, Inc.) for aligned transfer to the device substrate.

Assembly of the Chip Components.

Electron beam evaporation of Ti (5 nm)/$SiO_2$ (50 nm) on the pads (mounting sites for the chips) of the interconnect network formed backside coatings (30). A shadow mask made of PI (Stencilunlimited corp.) with patterns matched to the support posts, was aligned and laminated onto the molded silicone substrate. The substrate was then activated by exposure to ultraviolet induced ozone for 5 mins. Aligning and laminating the interconnect network onto this surface led to irreversible strong bonding upon contact, only at the locations of the support posts. After aging for 10 mins, the water soluble tape was removed by immersion in tap water for 1 hour. Another shadow mask, the same as the one for electroless Sn plating, was then aligned and laminated onto the electrodes to selectively expose the contact pads for the pin contacts associated with each of the component chips. A $Sn_{42}Bi_{58}$ alloy solder paste (Chip Quik Inc. SMDLTFP250T3) was screen printed onto the contact pads. A combined lapping and polishing process with tripod polisher was used for thinning of the thickest chips, such that all chips had thicknesses<1 mm. The lapping process involved a fast back grinding step, followed by a polishing process to remove remaining rough surfaces. Each chip component was manually placed over the electrodes under an optical microscope. After all of the chips were in position, the solder paste was reflowed in an oven at ~180° C. for 5 mins. Good solder joints appeared smooth and shiny, with complete wetting to the contact pads. A thin silicone superstrate (~100 μm thick) encapsulated the entire chip region of the device. The edges were sealed with an additional application of partially cured silicone followed by baking on a hotplate at 120° C. for 10 min. A liquid PDMS base (Sylgard 184, without the curing agent), injected into the capped cavity through an edge, covered all of the chips and interconnects via capillary force.

Mechanical Testing and Simulation of the Devices.

An array of metal dots (100 nm Cr, 0.4 mmØ for each dot, 1 mm pitch) was deposited through a polyimide shadow mask mounted on the back side of the relief substrate. After integrating the interconnect network and chips and adding a thin layer of PDMS base, equal-biaxial stretching was applied to the device using a customized stage. Strain was added/removed gradually and simultaneously in both directions. Images of the device at various stages of deformation were collected with a digital single-lens reflex camera from the backside of the device so that the metal dots were clearly visible. The Young's moduli of the devices with and without the chips and interconnect network were measured in orthogonal directions using an INSTRON MINI44. The strain-stress curves were averaged over at least three individual measurements. Mechanical simulation was performed using FEA techniques.

Full three-dimensional (3D) FEA was adopted to analyze the postbuckling behaviors of the entire device under uniaxial and biaxial stretching. The chips were selectively bonded to the silicone substrate (ECOFLEX® silicone elastomer; thickness 0.5 mm) via small circular (diameter 1 mm) and rectangular (0.5 mm by 1.0 mm) pedestals. Each of the metal interconnect (Cu, thickness 400 nm) lines, was encased, top and bottom, by a thin layer of polyimide (PI, thickness 2.4 μm for each layer). The elastic modulus (E) and Poisson's ratio (ν) are $E_{Ecoflex}$=0.0623 MPa and $\nu_{Ecoflex}$=0.49 for ECOFLEX® silicone elastomer; $E_{Cu}$=119 GPa and $\nu_{Cu}$=0.34 for copper; and $E_{PI}$=2.5 GPa and $\nu_{PI}$=0.34 for PI. Eight-node 3D solid elements and four-node shell elements were used for the ECOFLEX® silicone elastomer and self-similar electrode, respectively, and refined meshes were adopted to ensure the accuracy. Linear buckling analyses were carried out to determine the critical buckling strain and lowest buckling mode for each interconnect, which were then implemented as initial geometric imperfections in the postbuckling simulation. The evolution of deformed configurations with applied strains were obtained from FEA for the entire device under both uniaxial and biaxial stretchings, as shown in FIGS. 83, 84, 86, and 87. Good agreement between FEA and experiment results can be found.

Functional Testing of the Devices on Human Subjects.

Prior to device integration, hairs were removed and the skin was cleaned using a mild abrasive and Scotch tape to exfoliate some of the stratum corneum and to remove sebaceous oils (31). Afterwards, the device was placed on the desired areas on the skin for recording of EP signals. For NFC powering, a high frequency alternating current source to the primary coil was generated using a KEITHLEY 3390 50 MHz arbitrary waveform generator. The input and output characteristics of the wireless coil were measured using an Agilent infiniium DSO8104A oscilloscope (1 GHz, 4 channels). The ECG data were received by a back end antenna, then filtered through a 2.2-2.7 GHz band pass filter (RF-lambda, RBPF2450, SN:12041902227), amplified by a 2.2-2.7 GHz low noise amplifier (ZQL-2700MLNW+), and read out by a frequency counter, where the frequency-modulated signals were processed and analyzed. For recordings with commercial equipment, we used a pair of Au/Ag ring electrodes, fixed with an adhesive sticker to the skin along with conductive electrode gel. A ground electrode was attached on a more proximal section of the right arm. The wireless system, placed directly adjacent to the electrodes used for measurement with the commercial system, utilized a floating ground. Recorded data were passed through band pass filters to remove line noise and other high frequency artifacts, as well as slow drifts in the signal. The mean voltage of each signal was subtracted to remove the DC offsets. The data were then normalized to their peak values, to facilitate comparisons.

REFERENCES

1. D. H. Kim et al., *Science* 333, 838-843 (2011).
2. J.-W. Jeong et al., *Adv. Mater.* 25, 6839-6846 (2013).
3. M. Kaltenbrunner et al., *Nature* 499, 458-463 (2013).
4. M. S. White et al., *Nature Photon.* 7, 811-816 (2013).
5. M. S. Mannoor et al., *Nat. Commun.* 3, 763 (2012).
6. J. A. Rogers, M. G. Lagally, R. G. Nuzzo, *Nature* 477, 45-53 (2011).
7. W. Z. Wu, X. N. Wen, Z. L. Wang, *Science* 340, 952-957 (2013).
8. C. Wang et al., *Nature Mater.* 12, 899-904 (2013).
9. S. C. B. Mannsfeld et al., *Nature Mater.* 9, 859-864 (2010).
10. D. J. Lipomi et al., *Nature Nanotech.* 6, 788-792 (2011).
11. T. Sekitani, T. Someya, *MRS Bull.* 37, 236-245 (2012).
12. G. Schwartz et al., *Nat. Commun.* 4, 1859 (2013).
13. C. Keplinger et al., *Science* 341, 984-987 (2013).
14. M. Kubo et al., *Adv. Mater.* 22, 2749-2752 (2010).
15. E. Palleau, S. Reece, S. C. Desai, M. E. Smith, M. D. Dickey, *Adv. Mater.* 25, 1589-1592 (2013).
16. D. M. Vogt, Y. L. Park, R. J. Wood, *IEEE Sensors J.* 13, 4056-4064 (2013).
17. S. Wagner, S. Bauer, *MRS Bull.* 37, 207-217 (2012).
18. T. Sterken et al., *Conf. Proc. IEEE Eng. Med. Biol. Soc.* (2011), pp. 6886-6889.
19. F. Axisa et al., *Conf. Proc. IEEE Eng. Med. Biol. Soc.* (2007), pp. 5687-5690.
20. M. Gonzalez et al., *Microelectron. Reliab.* 51, 1069-1076 (2011).
21. H. Vandeparre, Q. H. Liu, I. R. Minev, Z. G. Suo, S. P. Lacour, *Adv. Mater.* 25, 3117-3121 (2013).
22. A. Romeo, Q. H. Liu, Z. G. Suo, S. P. Lacour, *Appl. Phys. Lett.* 102, 131904 (2013).
23. S. P. Lacour, S. Wagner, R. J. Narayan, T. Li, Z. G. Suo, *J. Appl. Phys.* 100, 014913 (2006).
24. Y. Lee, B. Giridhar, Z. Foo, D. Sylvester, D. B. Blaauw, *IEEE J. Solid-State Circuits* 48, 2511-2521 (2013).
25. Y. Lee et al., *IEEE J. Solid-State Circuits* 48, 229-243 (2013).
26. Y. Sun, H. Luo, S. K. Das, *IEEE Trans. Dependable Secur. Comput.* 9, 785-797 (2012).
27. E. Y. Chow, M. M. Morris, P. P. Irazoqui, *IEEE Microw. Mag.* 14, 64-73 (2013).
28. S. Kim, J. S. Ho, A. S. Y. Poon, *Phys. Rev. Lett.* 110, 203905 (2013).
29. S. J. Thomas, R. R. Harrison, A. Leonardo, M. S. Reynolds, *IEEE Trans. Biomed. Circuit Syst.* 6, 424-436 (2012).
30. Y. G. Sun, W. M. Choi, H. Q. Jiang, Y. G. Y. Huang, J. A. Rogers, *Nature Nanotech.* 1, 201-207 (2006).
31. V. Medina, J. M. Clochesy, A. Omery, *Heart Lung* 18, 456-460 (1989).

Figure 102:
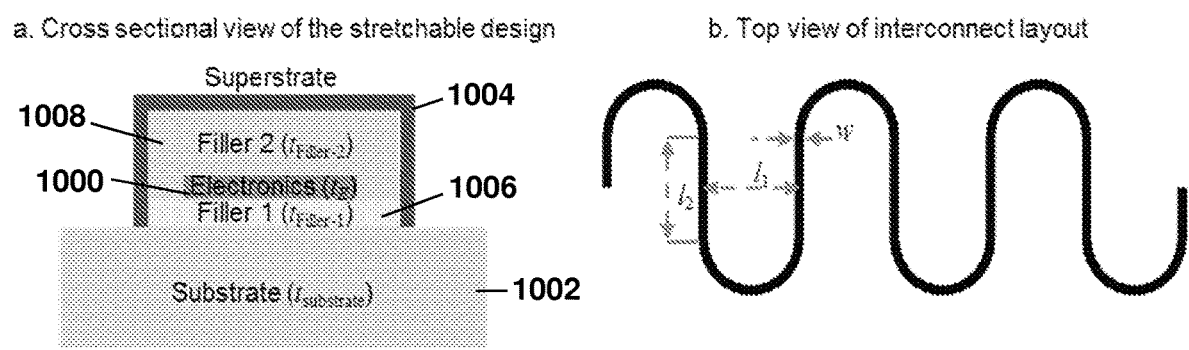
FIG. 102. Schematic of the stretchable design layout (a) and the serpentine interconnect (b) adopted in finite element analyses (FEA).

Example 5: Mechanics Modeling of Systems Using Containment with Low Modulus Solid Material FIG. 102*a* shows a schematic of a design layout for achieving high stretchability of electronic systems encapsulated within containment chambers. In the embodiment shown, an electronic system comprises an electronic device or component 1000 encapsulated within a containment chamber formed by a substrate 1002 and a superstrate 1004. The electronic device or component 1000 is supported by substrate 1002 and a first filler or low modulus solid 1006. A second filler or low modulus solid 1008 contacts top and side surfaces of electronic device or component 1000. In an embodiment, a thickness of the first filler is less than or equal to 1000 µm, or less than or equal to 500 µm, or less than or equal to 250 µm, or less than or equal to 100 µm. In an embodiment, the first and second fillers may be the same or different low modulus solid materials. In an embodiment, the Young's moduli of the first filler and the second filler may be the same or different. In an embodiment, more than two filler materials (e.g., 3, 4, 5, 6 filler materials) may be present (e.g., mixed or layered) within a containment chamber.

In an embodiment, electronic device or component 1000 may be completely bonded, partially bonded or tethered to the first filler. In an embodiment, electronic device or component 1000 is free-standing on the first filler.

In an embodiment, electronic device or component 1000 is tethered to substrate 1002 but at least partially supported by first filler 1006. For example, in an embodiment, first filler 1006 naturally fills a space beneath an electronic device or component that is at least partially supported by a pedestal.

One important mechanics concept is isolation of the deformation of electronics from that of the substrate, which may be accomplished in some embodiments by filling soft materials between the electronics and substrate. We adopted full three-dimensional (3D) FEA to analyze the mechanical performance using different low modulus solid filling materials. We studied an electrical interconnect in the serpentine layout (as shown in FIG. 102*b*), with the ultrathin copper layer (0.3 µm) sandwiched by two polyimide (PI, 1.2 µm) layers. This interconnect is encapsulated in a soft elastomer (i.e., filler in FIG. 102a, with the thickness $t_{Filler-1}=100$ μm, $t_{Filler-2}=400$ μm) that is laminated onto a substrate (ECO-FLEX® silicone elastomer, 200 μm). The superstrate has negligible effect on the deformation of the electronics, and therefore, is not taken into account in the FEA. The material parameters adopted in the FEA are shown in Table 4. Eight-node 3D solid elements were used for the substrate and filler, and four-node shell elements were used for the serpentine interconnect, with refined meshes to ensure accuracy.

The calculated elastic stretchabilities are summarized in Table 5 for various exemplary filler materials, with modulus values ranging from 0 to 1.0 MPa. The elastic stretchability increases as the Young's modulus of the filler material decreases. When ultra low modulus elastomers, such as silbione (Silbione® RT Gel 4717 A/B, Bluestar Silicones) and PDMS (1:50), are adopted, the predicted elastic stretchabilities (115.6% and 108.4%) are very close to the limit (120.0%) of a freestanding interconnect stretched from two ends (which is similar to the environment provided by fluidic systems). This set of simulations clearly shows the mechanical advantage of the stretchable design using low modulus solid fillers.

TABLE 4

Material parameters adopted in FEA

| | Materials | | | |
|---|---|---|---|---|
| | Cu | PI | Substrate | Filler |
| Young's Modulus (MPa) | 119,000 | 2,500 | 0.06 | 0.0-1.0 |
| Poisson ratio | 0.34 | 0.34 | 0.49 | 0.49 |

TABLE 5

Elastic stretchability of the interconnect using different filler materials

| Material | Fluid or Air | Silbione | PDMS (1:50)* | Ecoflex | Solaris | PDMS (1:20) | PDMS (1:10) |
|---|---|---|---|---|---|---|---|
| Modulus of filler (kPa) | 0 | 3 | 20 | 60 | 170 | 500 | 1000 |
| Elastic stretchability | 120.0% | 115.6% | 108.4% | 69.0% | 39.3% | 11.9% | 8.0% |

*PDMS ratios represent 1 part curing agent to 10/20/50 parts monomer or pure PDMS base.

Example 6: Fabrication of Systems Using Containment with Low Modulus Solid Material In one embodiment, containment systems comprising a low modulus solid may be fabricated by bonding a superstrate and a substrate to form a cavity. The superstrate may, for example, comprise a plurality of side walls and a top wall. A low modulus solid, such as silbione, is then injected into the cavity using a needle, e.g., through an edge between the superstrate and substrate. Generally, the injection hole self-seals after removal of the needle, but additional elastomer can be added at the injection site to enhance the robustness of the seal.

In an alternate embodiment, containment systems comprising a low modulus solid may be fabricated by bonding a plurality of side walls to a substrate to form an open cavity. A low modulus solid is then added to the cavity via the opening. Lastly, a top wall is positioned on and sealed to the side walls to enclose the low modulus solid.

Example 7: Fabrication of Systems in Containment Chambers Filled with Fluids and/or Low Modulus Solid Materials An interconnect having a self-similar structure is fabricated by conventional photolithography using PI (1.2 micron) coated Cu foil (5 micron). It is then picked up with water soluble tape and a Cr (5 nm)/SiO$_x$ (60 nm) layer is deposited on it by e-beam evaporation. Finally, the interconnect is transferred onto a desired substrate and an individual solar cell, battery or other electronic device or component is attached to the interconnect with In-based solder.

In an embodiment, the substrate (e.g., ECOFLEX® silicone elastomer) has a layer of low modulus solid (e.g., Silbione) on the surface of the substrate that receives the interconnect. In one method for forming this structure, Silbione is mixed in a 2:1 ratio of base to curing agent, then spin coated onto a 0.5 mm thick layer of ECOFLEX® silicone elastomer and cured at room temperature for 2 days before the interconnects and other components are contacted with the low modulus solid. An ECOFLEX® silicone elastomer superstrate or cap is bonded to the substrate, and a fluid or low modulus solid is injected into the cavity of the containment chamber.

In an embodiment, an interconnect is bonded directly to the substrate. In one method for forming this structure, the interconnect is transferred onto a 0.5 mm thick layer of ECOFLEX® silicone elastomer. After assembly of the electronic device(s), the substrate is covered by a silicone cap and sealed with ECOFLEX® silicone elastomer. After complete sealing, PDMS base is injected into the cap.

Figure 103A:
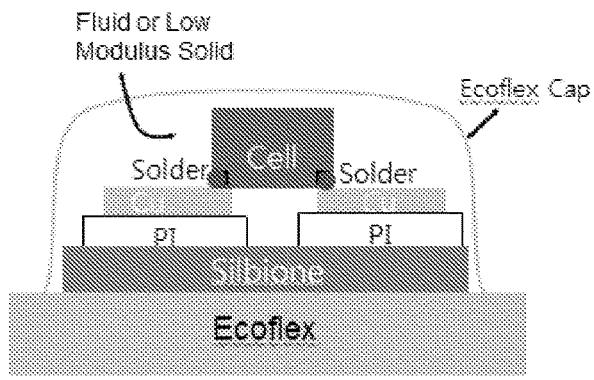
FIG. 103. (A) Schematic of a design layout comprising a first low modulus material and a fluid or second low modulus material. (B) Schematic of a design layout comprising a fluid or low modulus solid filled containment chamber housing a solar cell soldered to two electronic devices or components on dielectric materials in contact with a substrate.
Figure 103B:
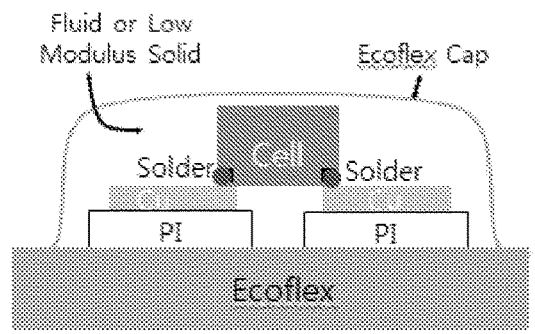
Figure 104:
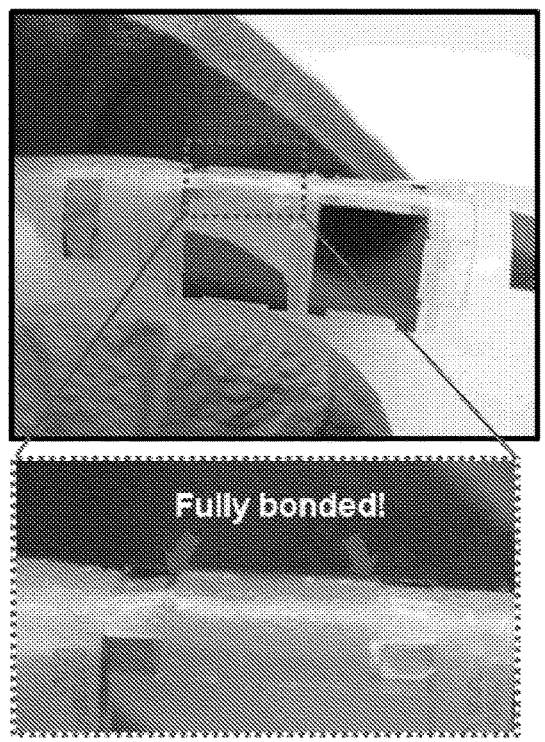
FIG. 104. Photograph, and exploded view, of the device of FIG. 103B.

FIG. 103A shows a schematic of a design layout comprising a first low modulus material and a fluid or second low modulus material. FIG. 103B shows a schematic of a design layout comprising a fluid or low modulus solid filled containment chamber housing a solar cell soldered to two electronic devices or components on dielectric materials in contact with a substrate. FIG. 104 is a photograph, and exploded view, of the device of FIG. 103B.

STATEMENTS REGARDING INCORPORATION BY REFERENCE AND VARIATIONS

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, and methods steps set forth in the present description. As will be obvious to one of skill in the art, methods and devices useful for the present methods can include a large number of optional composition and processing elements and steps.

When a group of substituents is disclosed herein, it is understood that all individual members of that group and all subgroups, including any isomers, enantiomers, and diastereomers of the group members, are disclosed separately. When a Markush group or other grouping is used herein, all individual members of the group and all combinations and subcombinations possible of the group are intended to be individually included in the disclosure. When a compound is described herein such that a particular isomer, enantiomer or diastereomer of the compound is not specified, for example, in a formula or in a chemical name, that description is intended to include each isomer and enantiomer of the compound described individually or in any combination. Additionally, unless otherwise specified, all isotopic variants of compounds disclosed herein are intended to be encompassed by the disclosure. For example, it will be understood that any one or more hydrogens in a molecule disclosed can be replaced with deuterium or tritium. Isotopic variants of a molecule are generally useful as standards in assays for the molecule and in chemical and biological research related to the molecule or its use. Methods for making such isotopic variants are known in the art. Specific names of compounds are intended to be exemplary, as it is known that one of ordinary skill in the art can name the same compounds differently.

Whenever a range is given in the specification, for example, a range of integers, a temperature range, a time range, a composition range, or concentration range, all intermediate ranges and subranges, as well as all individual values included in the ranges given are intended to be included in the disclosure. As used herein, ranges specifically include the values provided as endpoint values of the range. As used herein, ranges specifically include all the integer values of the range. For example, a range of 1 to 100 specifically includes the end point values of 1 and 100. It will be understood that any subranges or individual values in a range or subrange that are included in the description herein can be excluded from the claims herein.

Many of the molecules disclosed herein contain one or more ionizable groups [groups from which a proton can be removed (e.g., —COOH) or added (e.g., amines) or which can be quaternized (e.g., amines)]. All possible ionic forms of such molecules and salts thereof are intended to be included individually in the disclosure herein. With regard to salts of the compounds herein, one of ordinary skill in the art can select from among a wide variety of available counterions those that are appropriate for preparation of salts of this invention for a given application. In specific applications, the selection of a given anion or cation for preparation of a salt may result in increased or decreased solubility of that salt.

Every formulation or combination of components described or exemplified herein can be used to practice the invention, unless otherwise stated.

Whenever a range is given in the specification, for example, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when compositions of matter are claimed, it should be understood that compounds known and available in the art prior to Applicant's invention, including compounds for which an enabling disclosure is provided in the references cited herein, are not intended to be included in the composition of matter claims herein.

It must be noted that as used herein and in the appended claims, the singular forms "a", "an", and "the" include plural reference unless the context clearly dictates otherwise. Thus, for example, reference to "a cell" includes a plurality of such cells and equivalents thereof known to those skilled in the art, and so forth. As well, the terms "a" (or "an"), "one or more" and "at least one" can be used interchangeably herein. It is also to be noted that the terms "comprising", "including", and "having" can be used interchangeably. The expression "of any of claims XX-YY" (wherein XX and YY refer to claim numbers) is intended to provide a multiple dependent claim in the alternative form, and in some embodiments is interchangeable with the expression "as in any one of claims XX-YY."

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, biological materials, reagents, synthetic methods, purification methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

We claim:

1. An electronic system comprising:
   a substrate;
   a plurality of electronic devices or device components supported by said substrate; wherein said electronic devices or device components are free standing or tethered to said substrate;
   one or more containment chambers at least partially enclosing one or more of said plurality of electronic devices or device components; wherein said one or more containment chambers are at least partially filled with a containment fluid or a low modulus solid and said one or more containment chambers comprise an elastomer and one or more relief features that are pedestals that tether at least one electronic devices or device component to the substrate so that the tethered electronic devices or device components are configured to move relative to the substrate;
   an ultra low modulus layer, wherein the substrate is supported by said ultra low modulus layer, wherein the containment chamber comprises a plurality of side walls and a top wall, at least partially enclosing said plurality of electronic devices or device components, and wherein said substrate has a Young's modulus greater than a Young's modulus of said ultra low modulus layer and said top wall has a Young's modulus greater than a Young's modulus of said containment fluid or said low modulus solid such that a Young's modulus profile of the system spatially varies along an axis substantially perpendicular to the ultra low modulus layer;
   an electrical interconnect that connects adjacent electronic devices or device components, wherein the adjacent electronic devices or device components are both at least partially enclosed by said containment chamber or are at least partially enclosed by adjacent containment chambers and the electronic devices or device components are at least partially immersed in the containment fluid or low modulus solid.

2. The system of claim 1, wherein said ultra low modulus layer comprises a silicone elastomer.

3. The system of claim 1, wherein said ultra low modulus layer has a Young's modulus less than or equal to 150 KPa.

4. The system of claim 1, wherein said ultra low modulus layer has a Young's modulus selected from the range of 50 KPa to 150 Pa.

5. The system of claim 1, wherein said free standing or tethered configuration of the electronic device or device component at least partially decouples motion or deformation of said substrate from said electronic device or device component.

6. The system of claim 1, wherein said free standing or tethered configuration of the electronic device or device component at least partially decouples forces generated by elongation, compression or deformation of said substrate from said electronic device or device component.

7. The system of claim 1, wherein said electronic device or device component is provided on a receiving surface of said substrate or on an intermediate structure provided between said substrate and said electronic device or device component.

8. The system of claim 7, wherein said containment chamber comprises one or more enclosing structures positioned to surround an exterior portion of said electronic device or device component.

9. The system of claim 8, wherein said one or more enclosing structures of said containment chamber are operationally coupled to said receiving surface or an intermediate structure provided between said receiving surface and said one or more enclosing structures.

10. The system of claim 8, wherein said one or more enclosing structures of said containment chamber are not in physical contact with said electronic device or device component.

11. The system of claim 8, wherein said enclosing structures comprise one or more chamber walls or barrier structures each positioned at least 10 microns from a side of the electronic device or device component.

12. The system of claim 8, wherein at least a portion of said enclosing structures of said containment chamber is laminated to said substrate or an intermediate structure provided between said substrate and said enclosing structure.

13. The system of claim 8, further comprising one or more stretchable electrical interconnects in electrical contact with said electronic device or device component.

14. The system of claim 8, wherein said enclosing structures of said containment chamber have a Young's modulus selected from the range of 1 KPa to 1 GPa.

15. The system of claim 1, wherein said containment chamber comprises a material that is not permeable to said containment fluid.

16. The system of claim 1, wherein said containment chamber comprises a material selected form the group consisting of PDMS, and a silicone.

17. The system of claim 1, wherein said containment chamber has a height selected from the range of 10 µm to 10 cm.

18. The system of claim 1, wherein at least 50% of the volume of said containment chamber is occupied by said containment fluid.

19. The system of claim 1, wherein at least 0.1% of the volume of said containment chamber is occupied by said electronic device or device component.

20. The system of claim 1, wherein said containment chamber is structurally self-supporting.

21. The system of claim 1, wherein the containment chamber is filled with the containment fluid.

22. The system of claim 21, wherein said containment fluid is in physical contact with said electronic device or device component.

23. The system of claim 21, wherein said electronic device or device component is entirely immersed in said containment fluid.

24. The system of claim 21, wherein said containment fluid is a lubricant.

25. The system of claim 21, wherein said containment fluid has a viscosity selected from the range of 0.1 cP-10000 cP.

26. The system of claim 21, wherein said containment fluid is an electrolyte.

27. The system of claim 21, wherein said containment fluid has an ionic conductivity greater than or equal to 0.001 S cm$^{-1}$.

28. The system of claim 21, wherein said containment fluid has a high ionic resistance.

29. The system of claim 21, wherein said containment fluid has a vapor pressure less than or equal to 760 Torr at 298 K.

30. The system of claim 21, wherein said containment fluid is a liquid, colloid, gel or gas.

31. The system of claim 21, wherein said containment fluid is a material selected from the group consisting of a prepolymer, a solvent, a nonaqueous electrolyte, a silicone, a natural oil, a synthetic oil, a polyolefin and a fluorocarbon.

32. The system of claim 1, wherein the containment chamber is filled with the low modulus solid.

33. The system of claim 32, wherein said low modulus solid is a gel, a prepolymer, a silicone, a silicone rubber, a natural oil, a synthetic oil, a polyolefin or a fluorocarbon.

34. The system of claim 32, wherein said low modulus solid has a Young's modulus less than or equal to 200 KPa.

35. The system of claim 32, wherein said low modulus solid has a Young's modulus selected from the range of 2 KPa to 200 KPa.

36. The system of claim 32, wherein said low modulus solid has a Young's modulus that is lower than a Young's modulus of said substrate or said top wall by a factor of 10 or more.

37. The system of claim 1, wherein said electronic device or device component is a partially free standing structure supported by said substrate or said low modulus solid by the pedestal.

38. The system of claim 37, wherein said partially free standing structure undergoes an associative interaction with said substrate; wherein said associative interaction is a dipole-dipole interaction or a Van der Waals interaction.

39. The system of claim 1, wherein said electronic device or device component tethered to the pedestal comprises an interconnect that is partially bonded to said pedestal.

40. The system of claim 39, wherein said pedestals comprise an array of pedestals.

41. The system of claim 1, wherein said pedestals comprise an array of at least 10 pedestals.

42. The system of claim 1, wherein a portion of said electronic device or device component tethered to said pedestal is bonded to said pedestal, wherein said bonded portion corresponds to 30% or less than an area of a bottom surface of the device or device component.

43. The system of claim 1, wherein said pedestal comprises a material formed from an elastomer, PDMS, or a silicone.

44. The system of claim 1, wherein each of said one or more pedestals independently extend a length selected over the range of 100 nm to 1 mm and independently have one or more cross sectional physical dimensions selected over the range of 100 nm to 1 mm.

45. The system of claim 1, wherein said electronic device or device component comprises a single crystalline inorganic semiconductor structure.

46. The system of claim 1, wherein said electronic device or device component comprises a single crystalline inorganic semiconductor structure operationally connected to at least one additional device component or structure selected from the group consisting of a conducting structure, a dielectric structure, an electrode, a cathode, an anode, and an additional semiconductor structure.

47. The system of claim 1, wherein said electronic device or device component has a thickness selected from the range of 10 nanometers to about 100 microns, a width selected from the range of 100 nanometers to about 1 millimeter and a length selected from the range of 1 micron to about 1 millimeter.

48. The system of claim 1, wherein said electronic device or device component comprises a single crystalline semiconductor electronic device.

49. The system of claim 48, wherein said single crystalline semiconductor electronic device or device component comprises one or more electronic devices selected from the group consisting of a transistor, an electrochemical cell, a fuel cell, an integrated circuit, a solar cell, a laser, a light emitting diode, a nanoelectromechanical device, a microelectromechanical device, a photodiode, a P-N junction, a sensor, a memory device, an integrated circuit and a complementary logic circuit.

50. The system of claim 1, wherein said system further comprises one or more additional electronic devices or device components at least partially enclosed by said containment chamber or at least partially enclosed by one or more additional containment chambers.

51. The system of claim 1, wherein said substrate is a flexible substrate or a stretchable substrate.

52. The system of claim 1, wherein said substrate is a polymer substrate.

53. The system of claim 1, wherein said substrate comprises one or more materials selected from the group consisting of an elastomer, PDMS, and a silicone.

54. The system of claim 1, wherein said substrate has a Young's modulus selected from the range of 20 KPa to 1 MPa.

55. The system of claim 1, wherein said substrate has a thickness selected from the range of 100 microns to 100 mm.

56. The system of claim 1, further comprising a plurality of electrical interconnects in electrical contact with said electronic device or device component.

57. The system of claim 56, wherein said electronic device or device component, said one or more additional electronic devices or device components and said one or more electrical interconnects are provided in an island bridge geometry, wherein said electronic devices or device components comprise said islands and wherein said electrical interconnects comprise said bridges.

58. The system of claim 56, wherein said one or more electrical interconnects are individually connected to said substrate at least one point.

59. The system of claim 56, wherein said one or more electrical interconnects are stretchable electrical interconnects.

60. The system of claim 59, wherein said one or more stretchable electrical interconnects are configured to provide elasticity, bendability, or both of said electronic system.

61. The system of claim 59, wherein at least a portion of said one or more stretchable electrical interconnects has a bent, buckled, folded, curved or serpentine geometry.

62. The system of claim 59, wherein at least a portion of said one or more stretchable electrical interconnects has a geometry that is in plane, out of plane, or both in plane and out of plane, relative to a plane defined by a supporting surface of said substrate.

63. The system of claim 62, wherein said supporting surface is curved.

64. The system of claim 62, wherein said supporting surface is substantially flat.

65. The system of claim 62, wherein at least a portion of said one or more electrical interconnects has an in plane serpentine geometry.

66. The system of claim 56, wherein at least one of said electrical interconnects electrically connects said device component comprising a first rigid device island with a second device component comprising a second rigid device island.

67. The system of claim 66, further comprising an array of device components comprising rigid device islands, wherein said one or more electrical interconnects electrically connect adjacent rigid device islands.

68. The system of claim 67, further comprising a plurality of device components, wherein each of said rigid device islands corresponds to a device component.

69. The system of claim 1, wherein said electronic device or device component is a free standing or tethered fully formed integrated circuit.

70. The system of claim 1 comprising a transistor, an electrochemical cell, a fuel cell, an integrated circuit, a solar cell, a laser, a light emitting diode, a nanoelectromechanical device, a microelectromechanical device, a photodiode, a P-N junction, a sensor, a memory device, a complementary logic circuit or an array of any of these.

71. An array of electronically interconnected devices of claim 1.

72. A method of making an electronic system comprising:
providing a substrate;
providing at least two electronic devices or device components that are tethered to said substrate by one or more pedestals in a containment chamber or adjacent containment chambers on said substrate such that said containment chamber or containment chambers at least partially encloses said electronic devices or device components and said containment chamber or containment chambers comprise an elastomer; and said pedestals are configured to allow movement of the electronic devices or device components relative to the substrate;
at least partially filling said containment chamber or containment chambers with a containment fluid or low modulus solid to at least partially immerse the electronic devices or device components in the containment fluid or low modulus solid, and
electrically interconnecting said two electronic devices or device components with an electrical interconnect.

73. An electronic system comprising:
a substrate;
a plurality of electronic devices or device components supported by said substrate; wherein said electronic devices or device components are free standing or tethered to said substrate;
one or more containment chambers at least partially enclosing said electronic devices or device components; wherein said one or more containment chambers are at least partially filled with a containment fluid or a low modulus solid and said one or more containment chambers comprise an elastomer and an interior wall that forms multiple barriers configured to constrain movement of the electronic devices or device components and at least partially mechanically decouple device or device component from the substrate;
an ultra low modulus layer, wherein the substrate is supported by said ultra low modulus layer, wherein the containment chamber comprises a plurality of side walls and a top wall, at least partially enclosing said plurality of electronic devices or device components, and wherein said substrate has a Young's modulus greater than a Young's modulus of said ultra low modulus layer and said top wall has a Young's modulus greater than a Young's modulus of said containment fluid or said low modulus solid such that a Young's modulus profile of the system spatially varies along an axis substantially perpendicular to the ultra low modulus layer;
an electrical interconnect that connects adjacent electronic devices or device components, wherein the adjacent electronic devices or device components are both at least partially enclosed by said containment chamber or are at least partially enclosed by adjacent containment chambers and the electronic devices or device components are at least partially immersed in the containment fluid or low modulus solid.

\* \* \* \* \*